United States Patent
Yoshida

(10) Patent No.: US 11,831,433 B2
(45) Date of Patent: Nov. 28, 2023

(54) ERROR CORRECTION ENCODING DEVICE AND METHOD FOR REDUCING THE NUMBER OF BITS TO BE PROTECTED BY SOFT DECISION ERROR CORRECTION

(71) Applicant: Mitsubishi Electric Corporation, Tokyo (JP)

(72) Inventor: Tsuyoshi Yoshida, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/857,403

(22) Filed: Jul. 5, 2022

(65) Prior Publication Data

US 2023/0006769 A1 Jan. 5, 2023

Related U.S. Application Data

(63) Continuation of application No. PCT/JP2020/006955, filed on Feb. 21, 2020.

(51) Int. Cl.
  *H04L 1/00* (2006.01)
  *H03M 13/00* (2006.01)

(52) U.S. Cl.
  CPC .......... *H04L 1/0063* (2013.01); *H04L 1/0057* (2013.01)

(58) Field of Classification Search
  CPC ..... H04L 1/0063; H04L 1/0057; H03M 13/00
  See application file for complete search history.

(56) References Cited

U.S. PATENT DOCUMENTS

| 10,091,046 B1 | 10/2018 | Lefevre |
| 2015/0091742 A1* | 4/2015 | Lonita ................ H03M 5/18 341/57 |
| 2017/0250780 A1 | 8/2017 | Ge et al. |

FOREIGN PATENT DOCUMENTS

| JP | 2016-192747 A | 11/2016 |
| JP | 2017-152979 A | 8/2017 |

OTHER PUBLICATIONS

International Search Report, issued in PCT/JP2020/006955, dated Apr. 7, 2020.
Sugitani et al., "Partial Multilevel Coding with Probabilistic Shaping for Low-power Optical Transmission", IEICE Proc. OECC/PSC 2019, Paper TuB1-5, total 3 pages.

(Continued)

*Primary Examiner* — Justin R Knapp
(74) *Attorney, Agent, or Firm* — Birch, Stewart, Kolasch & Birch, LLP

(57) ABSTRACT

An error correction encoding device includes an encoding unit to generate soft decision error correction frame information including a bit array of m rows and N columns obtained by combining first bit string group information and second bit string group information, the first bit string group information including a bit array of m rows and N1 columns in which it is enabled to perform pulse amplitude modulation of a combination of bit values of each column of the first bit string group information into a modulation symbol by using a first symbol mapping rule, the second bit string group information including a bit array of m rows and N2 columns in which it is enabled to perform pulse amplitude modulation of a combination of bit values of each column of the second bit string group information into a modulation symbol by using a second symbol mapping rule.

16 Claims, 60 Drawing Sheets

(56) References Cited

OTHER PUBLICATIONS

Written Opinion of the International Searching Authority, issued in PCT/JP2020/006955, dated Apr. 7, 2020.
Yoshida et al., "Hierarchical Distribution Matching for Probabilistically Shaped Coded Modulation", IEEE Journal of Lightwave Technology, Mar. 15, 2019, vol. 37, No. 6, pp. 1579-1589.
Extended European Search Report dated Nov. 30, 2022 in corresponding European Patent Application No. 20919734.2.
European Communication pursuant to Article 94(3) EPC for corresponding European Application No. 20919734.2, dated Jun. 29, 2023.

\* cited by examiner

FIG. 4A

First Symbol Mapping Rule

| PAM Symbol X[1][k] | Combination of Bits B[1:m][1][k] |
|---|---|
| 15 | 0101 |
| 13 | 0100 |
| 11 | 0111 |
| 9 | 0110 |
| 7 | 0011 |
| 5 | 0010 |
| 3 | 0001 |
| 1 | 0000 |
| -1 | 1001 |
| -3 | 1000 |
| -5 | 1011 |
| -7 | 1010 |
| -9 | 1111 |
| -11 | 1110 |
| -13 | 1101 |
| -15 | 1100 |

FIG. 4B

Second Symbol Mapping Rule

| PAM Symbol X[2][k] | Combination of Bits B[1:m][2][k] |
|---|---|
| 15 | 0101 |
| 13 | 0100 |
| 11 | 0111 |
| 9 | 0110 |
| 7 | 0011 |
| 5 | 0010 |
| 3 | 0001 |
| 1 | 0000 |
| -1 | 1000 |
| -3 | 1001 |
| -5 | 1010 |
| -7 | 1011 |
| -9 | 1110 |
| -11 | 1111 |
| -13 | 1100 |
| -15 | 1101 |

FIG. 6C
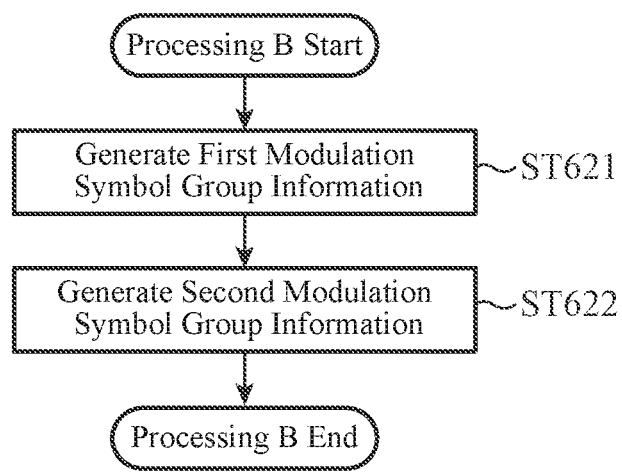
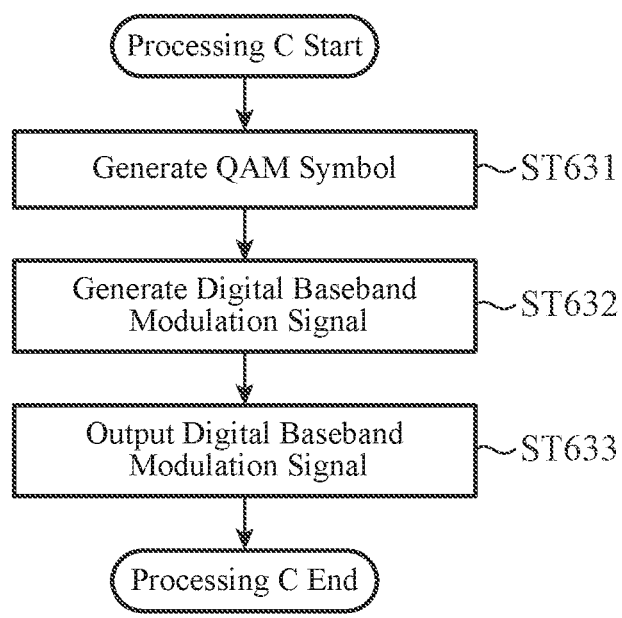

FIG. 10C
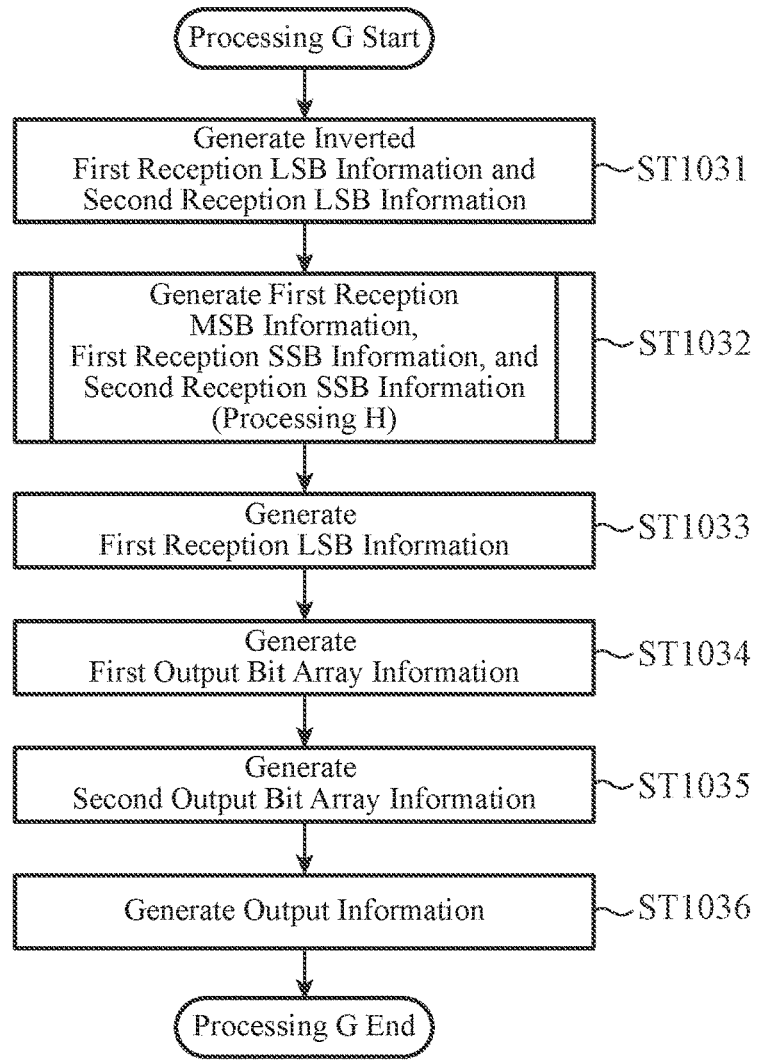
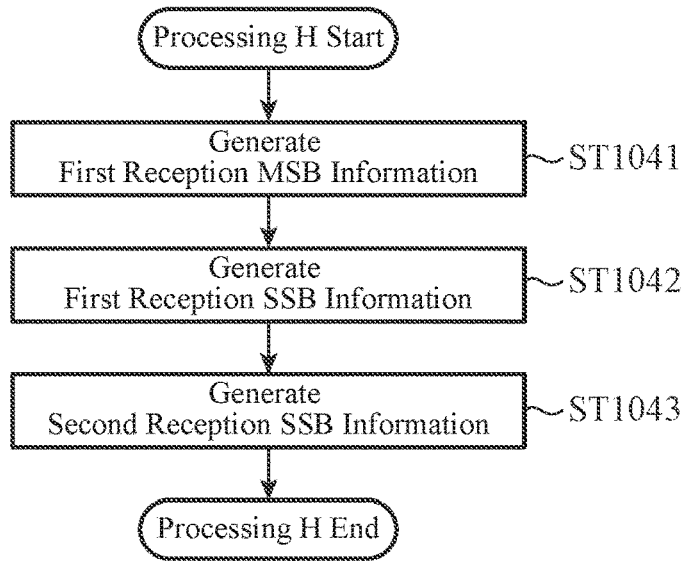

FIG. 14C
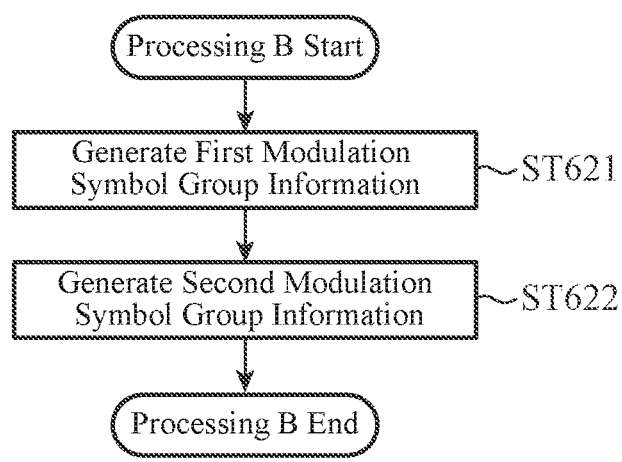
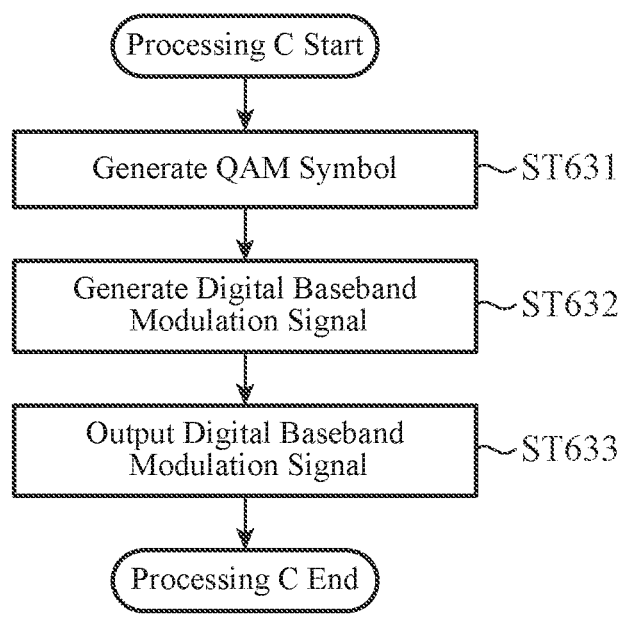

FIG. 21C
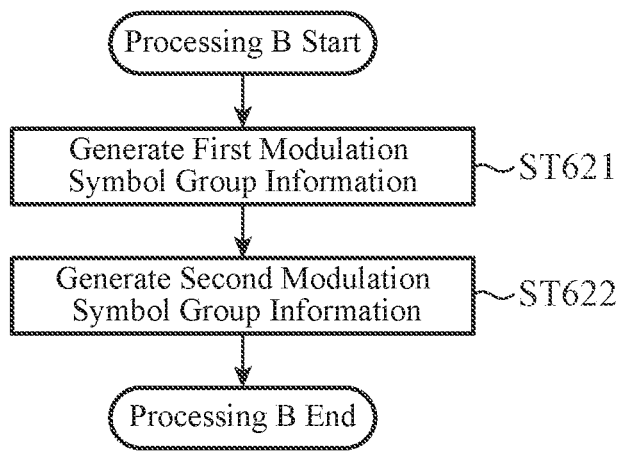
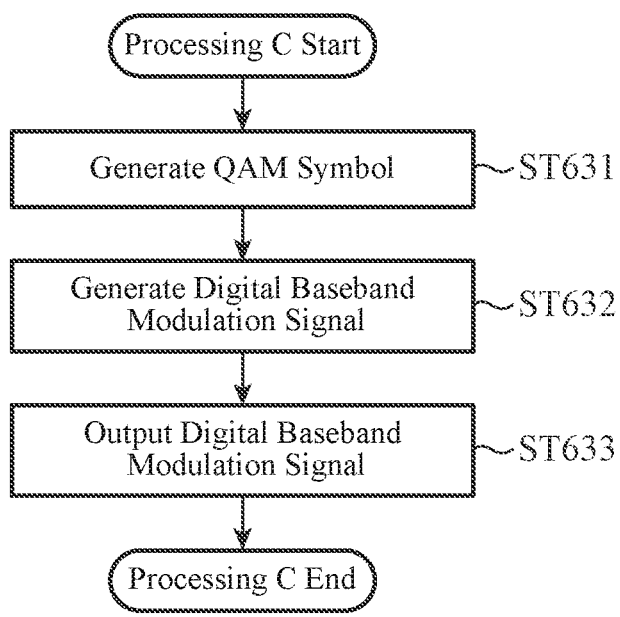

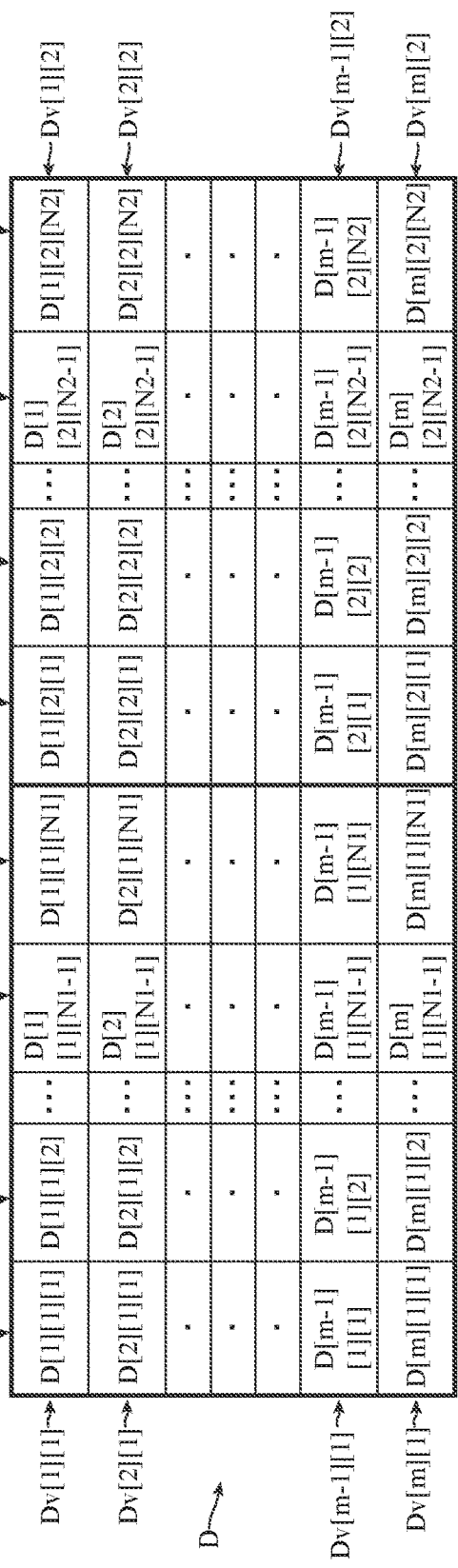

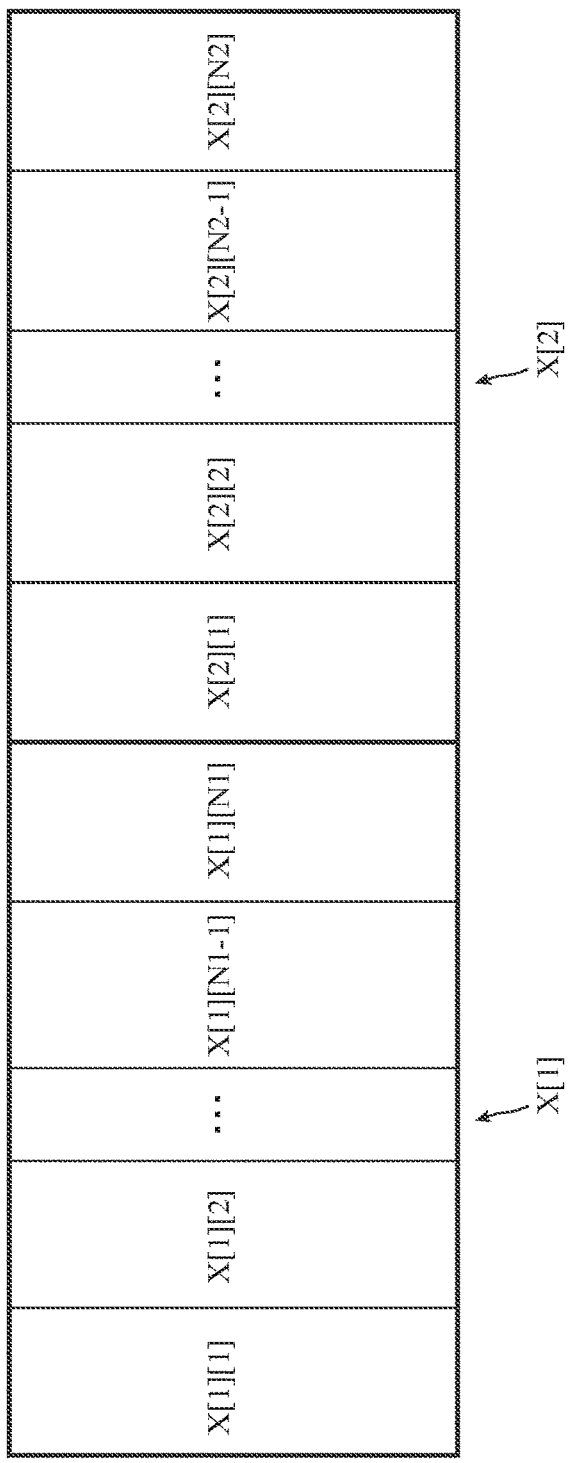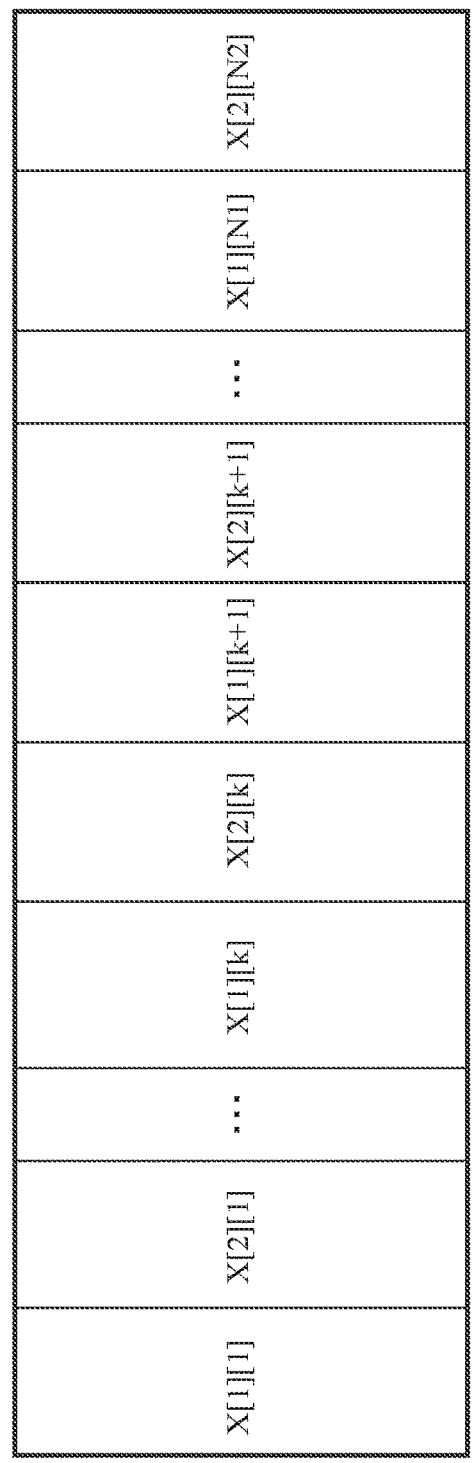
FIG. 26A
FIG. 26B

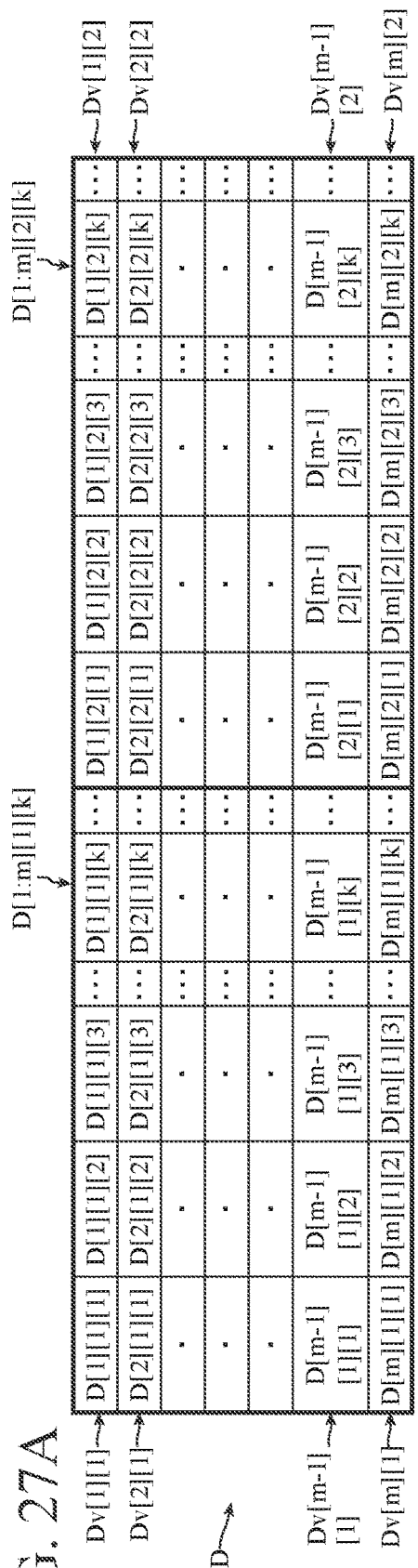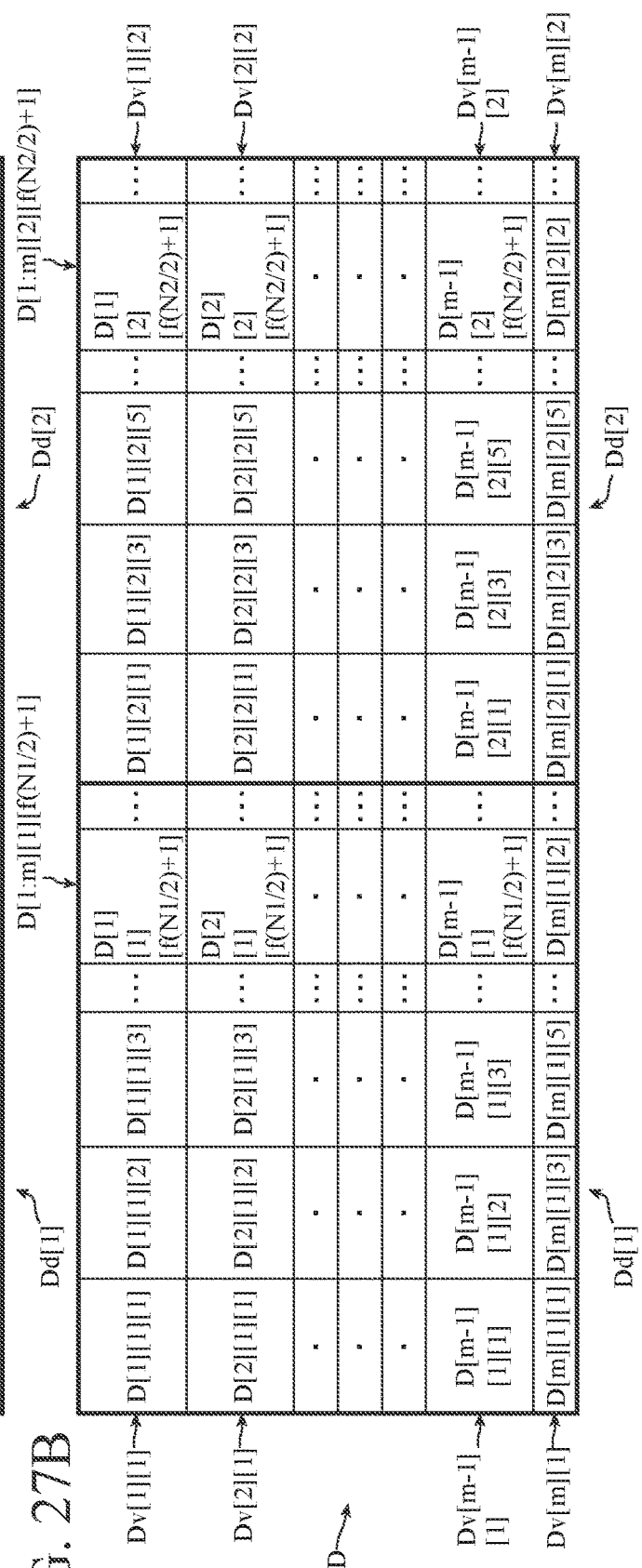
FIG. 27A
FIG. 27B

FIG. 31C
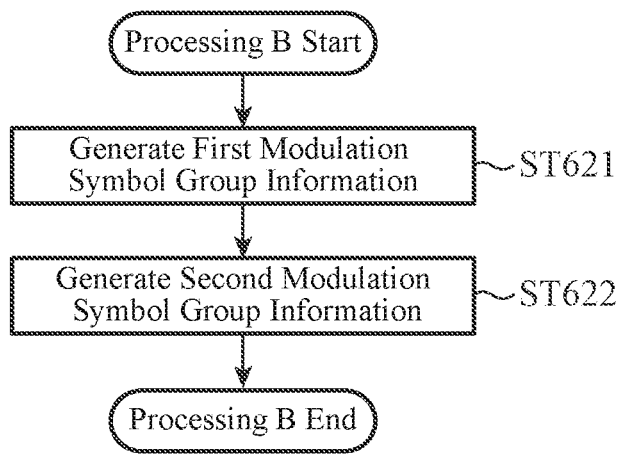
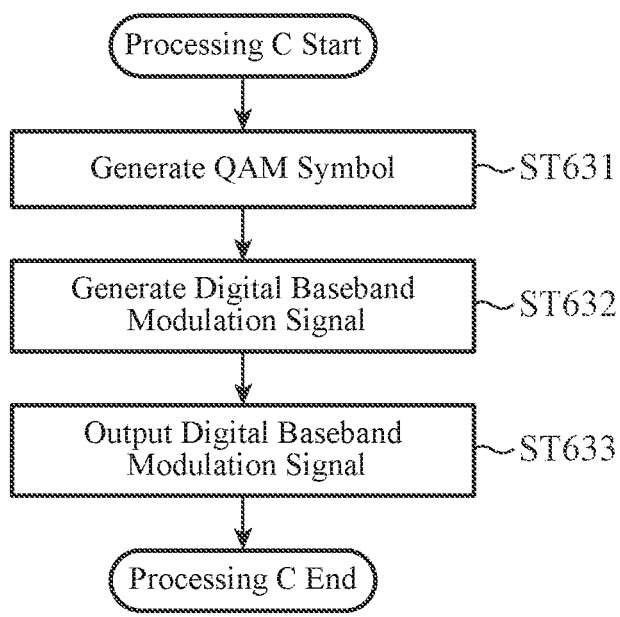

FIG. 34C
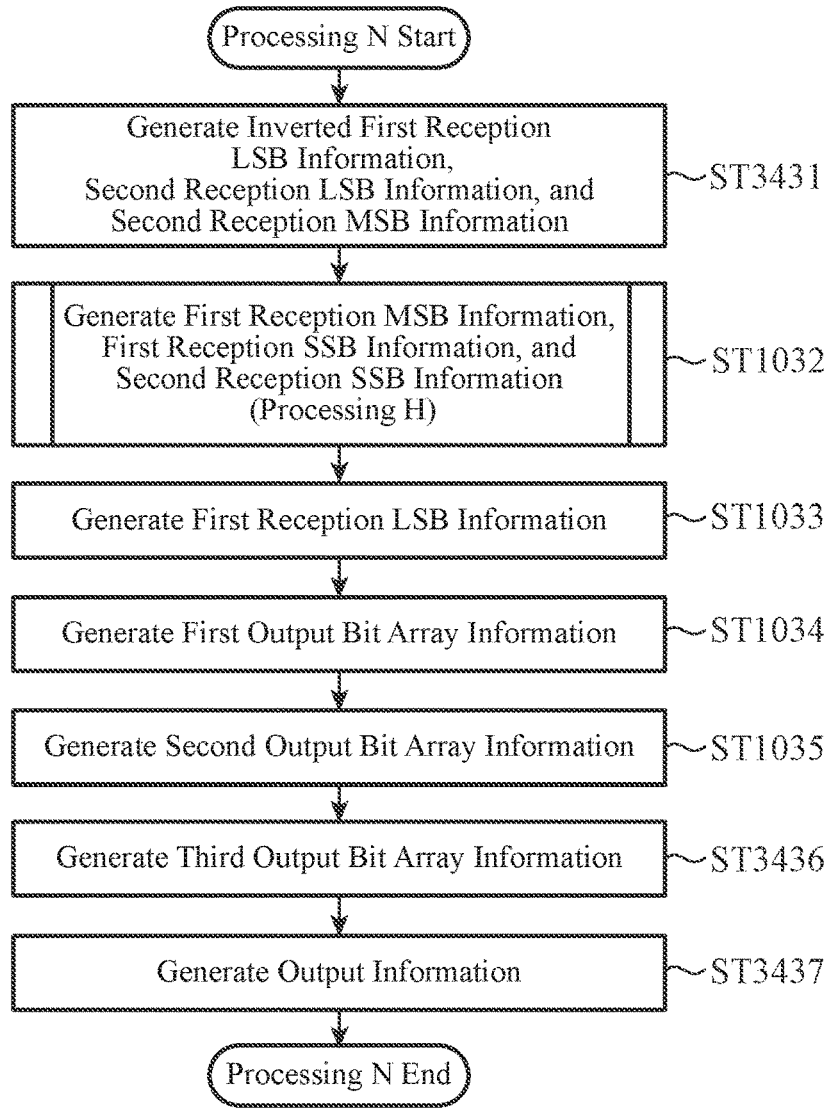
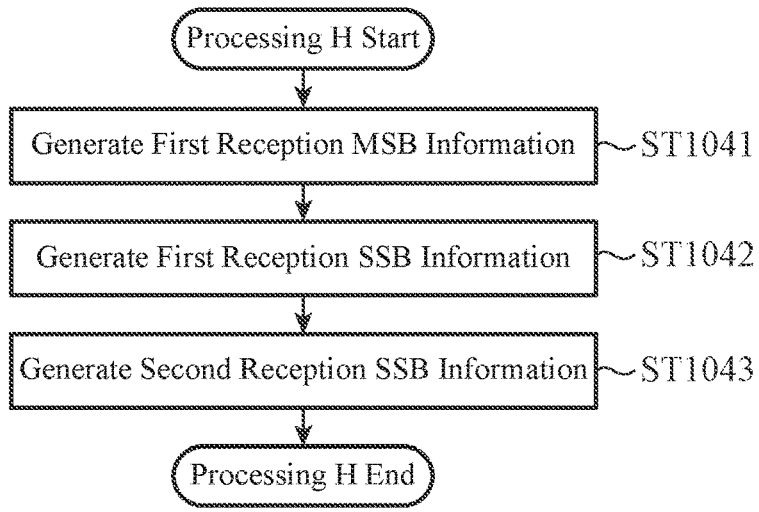

FIG. 38C
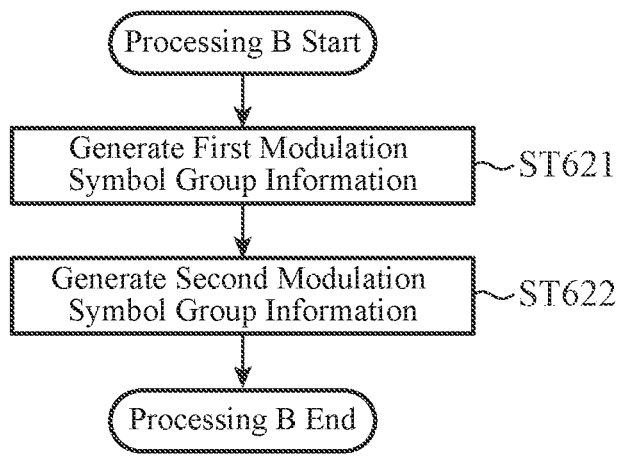
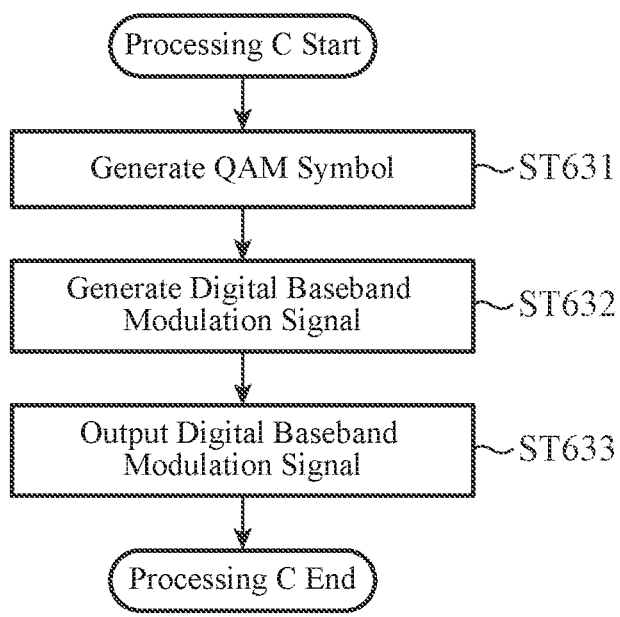

ERROR CORRECTION ENCODING DEVICE AND METHOD FOR REDUCING THE NUMBER OF BITS TO BE PROTECTED BY SOFT DECISION ERROR CORRECTION

CROSS REFERENCE TO RELATED APPLICATIONS

This application is a Continuation of PCT International Application No. PCT/JP2020/006955, filed on Feb. 21, 2022, which is hereby expressly incorporated by reference into the present application.

TECHNICAL FIELD

The present disclosure relates to an error correction encoding device, an error correction encoding method, an error correction device, an error correction method, a communication method, an optical communication system, and a soft decision error correction frame data structure.

BACKGROUND ART

There is a communication system in which a transmission device performs error correction encoding on input information input to the transmission device and transmits a signal based on information after the error correction encoding to a reception device, and the reception device outputs output information corresponding to the input information by receiving the signal transmitted from the transmission device and performing error correction on information based on the signal.

For example, Non-Patent Literature 1 discloses a communication method using information generated by combining probability distribution shaping encoding processing and multi-level encoding processing in a field of optical communication systems, the information having a predetermined data structure in which multi-level modulation of a combination on a plurality of bits can be performed by selectively using two symbol mappings, first and second.

Specifically, a transmission device described in Non-Patent Literature 1 (Hereinafter, it is referred to as a "conventional transmission device".) generates information having the above-described data structure on the basis of the input information. More specifically, the conventional transmission device generates information having the above-described data structure by performing soft decision error correction encoding processing by using the least significant bit, and a plurality of middle bits that is a target of Gray encoding processing and disposing a soft decision parity bit acquired by the soft decision error correction encoding processing in the most significant bit. Further, the conventional transmission device performs division into a first symbol group in which the most significant bit is the soft decision parity bit and a second symbol group in which the most significant bit is not the soft decision parity bit. The conventional transmission device performs first symbol mapping with Gray code on symbols belonging to the first symbol group, and performs second symbol mapping different from the first symbol mapping on symbols belonging to the second symbol group.

In addition, a reception device described in Non-Patent Literature 1 (Hereinafter, it is referred to as a "conventional reception device".) acquires output information corresponding to input information by receiving a signal generated by the conventional transmission device on the basis of information having the above-described data structure and performing multi-stage decoding processing on information based on the signal. More specifically, the conventional reception device performs error correction on the least significant bit, and the plurality of middle bits that are the target of the Gray encoding processing by performing soft decision error correction processing using the soft decision parity bit. Further, the conventional reception device performs hard decision processing on a plurality of middle bits of a symbol and the most significant bit of the symbol by using a bit value of the least significant bit of the symbol after the soft decision error correction processing with respect to the symbol in which the most significant bit is not the soft decision parity bit, that is, a symbol corresponding to the symbol belonging to the first symbol group in the conventional transmission device.

CITATION LIST

Non-Patent Literature

Non-Patent Literature 1: K. Sugitani et al., "Partial multi-level coding with probabilistic shaping for low-power optical transmission", Proc. OECC/PSC 2019, Paper TuB1-5.

SUMMARY OF INVENTION

Technical Problem

In general, as the number of bits to be protected by soft decision error correction increases, the amount of calculation is required more, in the soft decision error correction encoding processing. Thus, in the soft decision error correction encoding processing, it is desirable to reduce the number of bits to be protected by the soft decision error correction.

The soft decision error correction encoding processing described in Non-Patent Literature 1 (Hereinafter, it is referred to as "conventional soft decision error correction encoding processing".) uses the least significant bit, and the plurality of middle bits that is the target of the Gray encoding processing. For that reason, there has been a problem in the conventional soft decision error correction encoding processing that all bits other than the most significant bit are to be protected by the soft decision error correction.

The present disclosure is for solving the above-described problem, and is intended to provide an error correction encoding device capable of reducing the number of bits to be protected by the soft decision error correction as compared with the conventional soft decision error correction encoding processing.

Solution to Problem

An error correction encoding device according to the present disclosure includes: an input information acquirer to acquire input information; an encoder to generate soft decision error correction frame information including a bit array of m rows and N columns on a basis of the input information acquired by the input information acquirer, the bit array being obtained by combining first bit string group information and second bit string group information, the first bit string group information including a bit array of m rows and N1 columns in which it is enabled to perform pulse amplitude modulation of a combination of bit values of each column of the first bit string group information into a modulation symbol by using a predetermined first symbol mapping rule, the second bit string group information including a bit array of m rows and N2 columns in which it is enabled to perform pulse amplitude modulation of a combination of bit values of each column of the second bit string group information into a modulation symbol by using a predetermined second symbol mapping rule, where m is a natural number of greater than or equal to 2, N1 is a natural number of greater than or equal to 2, N2 is a natural number of greater than or equal to 1, and N is a number obtained by adding N1 and N2 together; a modulation symbol convertor to generate modulation symbol group information including N pieces of the modulation symbols by performing pulse amplitude modulation of a combination of bit values of each column of the soft decision error correction frame information generated by the encoder into the modulation symbol for each column of the soft decision error correction frame information by using the first symbol mapping rule or the second symbol mapping rule; and a transmission waveform shaper to generate a digital baseband modulation signal on a basis of the modulation symbol group information generated by the modulation symbol convertor and output the digital baseband modulation signal generated, wherein the encoder generates the soft decision error correction frame information by: generating first input bit array information including a bit array of m−1 rows and N columns and second input bit array information including a bit array of one row and N3 columns on the basis of the input information acquired by the input information acquirer, where N3 is a natural number of greater than or equal to 1 and less than N1; storing the second input bit array information generated as a part of first MSB information including a bit array of one row and N1 columns in a predetermined area of a first row in the first bit string group information; generating shaped bit array information including a bit array of m−1 rows and N columns by performing probability distribution shaping encoding processing on the first input bit array information generated; generating first group bit array information including a combination of N1 predetermined columns and second group bit array information including a combination of N2 predetermined columns by separating the shaped bit array information generated; generating first LSB information including a bit array of one row and N1 columns by extracting, from the first group bit array information generated, a bit array of an (m−1)-th row in the first group bit array information, generating inverted first LSB information including a bit array of one row and N1 columns by calculating exclusive ORs of bit values of each columns in the first LSB information generated and each bit values of each columns in information of the first row in the first bit string group information after storing the second input bit array information, the columns in the information of the first row in the first bit string group information each corresponding to the columns in the first LSB information, and storing the inverted first LSB information generated in an m-th row in the first bit string group information; generating second LSB information including a bit array of one row and N2 columns by extracting a bit array of the (m−1)-th row in the second group bit array information from the second group bit array information generated, and storing the second LSB information generated in the m-th row in the second bit string group information; generating a soft decision parity bit by performing systematic soft decision error correction encoding processing by using the inverted first LSB information generated and the second LSB information generated, and storing the soft decision parity bit generated, in the first row in the second bit string group information as second MSB information including a bit array of one row and N2 columns; in a case where m is greater than or equal to 3, generating first SSB information including a bit array of m−2 rows and N1 columns by extracting, from the first group bit array information generated, the first row to an (m−2)-th row in the first group bit array information, and storing the first SSB information generated, in a second row to the (m−1)-th row in the first bit string group information; and in the case where m is greater than or equal to 3, generating second SSB information including a bit array of m−2 rows and N2 columns by extracting, from the second group bit array information generated, the first row to the (m−2)-th row in the second group bit array information, and storing the second SSB information generated, in the second row to the (m−1)-th row in the second bit string group information.

Advantageous Effects of Invention

According to the present disclosure, the number of bits to be protected by the soft decision error correction can be reduced as compared with the conventional soft decision error correction encoding processing.

BRIEF DESCRIPTION OF DRAWINGS

FIG. 4A is an explanatory diagram for describing an example of a first symbol mapping rule according to the first embodiment.

FIG. 4B is an explanatory diagram for describing an example of a second symbol mapping rule according to the first embodiment.

FIG. 6C is a remaining part of the flowchart illustrating the example of the processing performed by the error correction encoding device according to the first embodiment.

FIG. 10C is a remaining part of the flowchart illustrating the example of the processing performed by the error correction device according to the first embodiment.

FIG. 14C is a remaining part of the flowchart illustrating the example of the processing performed by the error correction encoding device according to the second embodiment.

FIG. 21C is a remaining part of the flowchart illustrating the example of the processing performed by the error correction encoding device according to the third embodiment.

FIG. 25A is an explanatory diagram illustrating an example of a bit array space in which soft decision error correction frame information before an interleaving unit according to the third embodiment performs switching is stored.

FIG. 25B is an explanatory diagram illustrating an example of the bit array space in which soft decision error correction frame information after the interleaving unit according to the third embodiment performs switching is stored.

FIG. 26A is an explanatory diagram illustrating an example of modulation symbol group information in a case where the error correction encoding device according to the third embodiment does not include the interleaving unit.

FIG. 26B is an explanatory diagram illustrating an example of the modulation symbol group information in a case where the error correction encoding device according to the third embodiment includes the interleaving unit.

FIG. 27A is an explanatory diagram illustrating an example of a bit array space in which soft decision error correction frame information before an LSB interleaving unit according to the third embodiment performs switching is stored.

FIG. 27B is an explanatory diagram illustrating an example of the bit array space in which soft decision error correction frame information after the LSB interleaving unit according to the third embodiment performs switching is stored.

FIG. 31C is a remaining part of the flowchart illustrating the example of the processing performed by the error correction encoding device according to the modification of the first embodiment.

FIG. 34C is a remaining part of the flowchart illustrating the example of the processing performed by the error correction device according to the modification of the first embodiment.

FIG. 38C is a remaining part of the flowchart illustrating the example of the processing performed by the error correction encoding device according to the modification of the second embodiment.

DESCRIPTION OF EMBODIMENTS

Hereinafter, to explain the present disclosure in more detail, embodiments for carrying out the present disclosure will be described with reference to the accompanying drawings.

First Embodiment

A configuration of a main part of a communication system 1 according to a first embodiment will be described with reference to FIG. 1.

Figure 1:
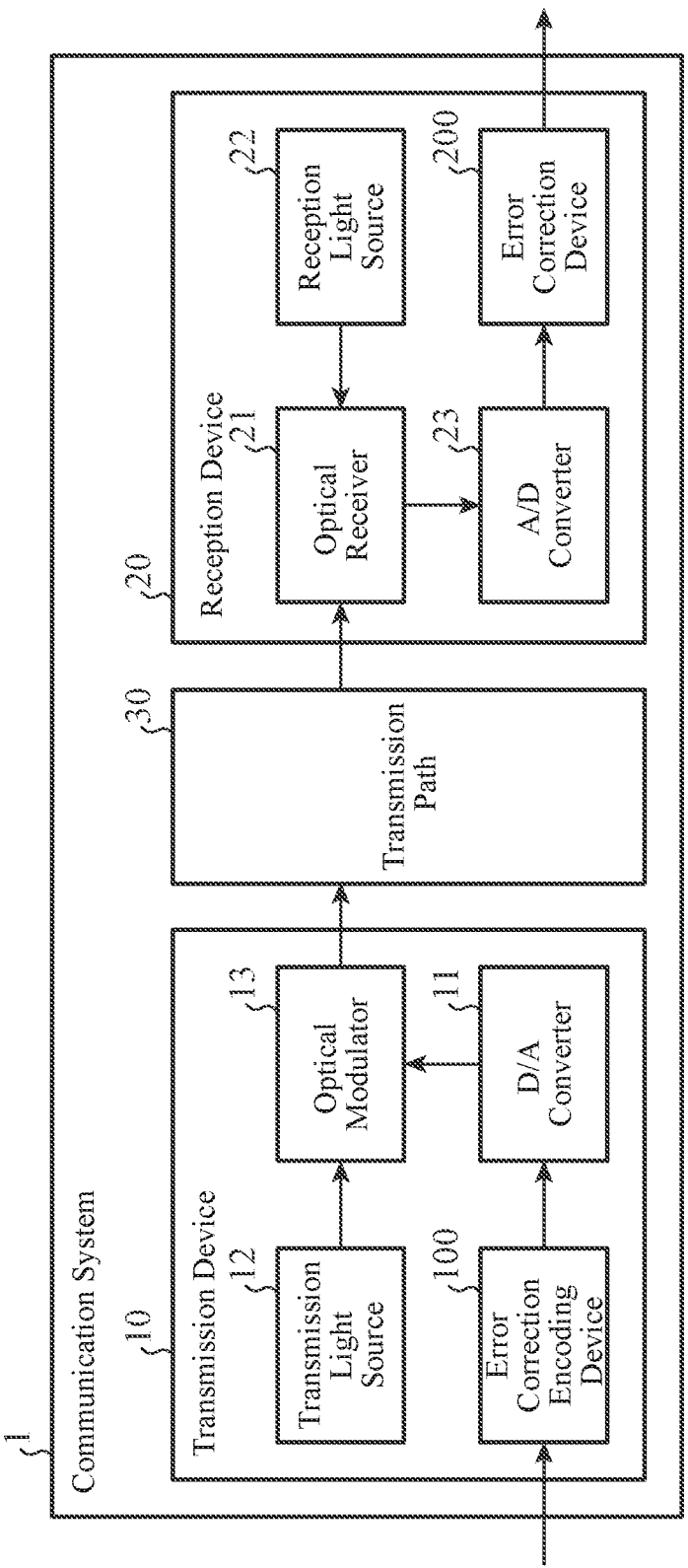
FIG. 1 is a configuration diagram illustrating an example of a configuration of a main part of a communication system according to a first embodiment.

FIG. 1 is a configuration diagram illustrating an example of the configuration of the main part of the communication system 1 according to the first embodiment.

In the first embodiment, as an example, the communication system 1 is described as an optical communication system, but the optical communication system is merely an example, and the communication system 1 is not limited to the optical communication system. For example, the communication system 1 may be a communication system by wireless communication, metal communication, or the like.

The communication system 1 includes a transmission device 10, a transmission path 30, and a reception device 20.

The transmission device 10 acquires input information and outputs a signal based on the acquired input information. Since the communication system 1 illustrated in FIG. 1 is the optical communication system, the transmission device 10 illustrated in FIG. 1 is an optical transmission device to output an optical signal.

The transmission path 30 transmits the signal output by the transmission device 10 to the reception device 20. Since the communication system 1 illustrated in FIG. 1 is the optical communication system, the transmission path 30 illustrated in FIG. 1 is an optical transmission path capable of transmitting the optical signal output by the transmission device 10 to the reception device 20. The transmission path 30 includes, for example, an optical cross-connect device, a transmission optical fiber, and an optical amplifier, all of which are not illustrated. The optical cross-connect device includes a wavelength selective switch, a wavelength multiplexing device, a wavelength separation device, an optical coupler, or the like. The transmission optical fiber includes a single-core single-mode fiber, a spatial multiplexing fiber, or the like. The optical amplifier includes an erbium-doped optical amplifier, a Raman optical amplifier, or the like.

The reception device 20 receives the signal output by the transmission device 10 via the transmission path 30, generates output information corresponding to the input information on the basis of the signal, and outputs the generated output information. Since the communication system 1 illustrated in FIG. 1 is the optical communication system, the reception device 20 illustrated in FIG. 1 is an optical reception device to receive the optical signal.

The transmission device 10 includes an error correction encoding device 100, a D/A converter 11, a transmission light source 12, and an optical modulator 13. The D/A converter 11, the transmission light source 12, and the optical modulator 13 constitute a transmission unit.

The error correction encoding device 100 acquires the input information input from the outside of the device, and generates a digital baseband modulation signal on the basis of the acquired input information. The error correction encoding device 100 outputs the generated digital baseband modulation signal to the D/A converter 11.

The D/A converter 11 receives the digital baseband modulation signal output from the error correction encoding device 100, converts the digital baseband modulation signal into a transmission electrical signal that is an analog baseband modulation signal, and outputs the transmission electrical signal after conversion. The D/A converter 11 may convert the digital baseband modulation signal into the analog baseband modulation signal, electrically amplify the analog baseband modulation signal, and output an amplified analog baseband modulation signal as the transmission electrical signal.

The transmission light source 12 outputs unmodulated light having a single wavelength. The transmission light source 12 includes an external resonator type wavelength tunable light source or the like. The transmission light source 12 generates, for example, unmodulated light having a center wavelength of 1550 nanometers (Hereinafter, it is denoted as "nm".), and outputs the generated unmodulated light to the optical modulator 13.

The optical modulator 13 receives the transmission electrical signal output by the D/A converter 11 and the unmodulated light output by the transmission light source 12, modulates the unmodulated light with the transmission electrical signal to generate modulated light, and outputs the generated modulated light to the transmission path 30 as a modulated optical signal. The optical modulator 13 includes a polarization multiplexing quadrature phase modulator or the like.

The reception device 20 includes a reception light source 22, an optical receiver 21, an A/D converter 23, and an error correction device 200. The reception light source 22, the optical receiver 21, and the A/D converter 23 constitute a reception unit.

The reception light source 22 outputs unmodulated light having a single wavelength corresponding to the center wavelength of the modulated light that is the modulated optical signal output from the transmission device 10 to the transmission path 30. The reception light source 22 includes an external resonator type wavelength tunable light source or the like, generates unmodulated light having a center wavelength of 1550 nm, for example, and outputs the generated unmodulated light to the optical receiver 21.

The optical receiver 21 receives the modulated optical signal output by the transmission device 10 to the transmission path 30 and the unmodulated light output by the reception light source 22. The optical receiver 21 generates a reception electrical signal that is a reception analog baseband modulation signal by performing coherent detection using the modulated light that is modulated optical signal, and unmodulated light, and outputs the generated reception electrical signal to the A/D converter 23.

The A/D converter 23 receives the reception electrical signal output by the optical receiver 21, converts the reception electrical signal into a reception digital baseband modulation signal, and outputs the reception digital baseband modulation signal after conversion. Specifically, the A/D converter 23 samples the reception analog baseband modulation signal that is the reception electrical signal, converts the signal into the digital baseband modulation signal, and outputs the digital baseband modulation signal to the error correction device 200. The A/D converter 23 may amplify the reception electrical signal and convert an amplified reception electrical signal into the reception digital baseband modulation signal.

The error correction device 200 receives the reception digital baseband modulation signal output by the A/D converter 23, generates the output information corresponding to the input information on the basis of the reception digital baseband modulation signal, and outputs the generated output information.

A configuration of a main part of the error correction encoding device 100 according to the first embodiment will be described with reference to FIG. 2.

Figure 2:
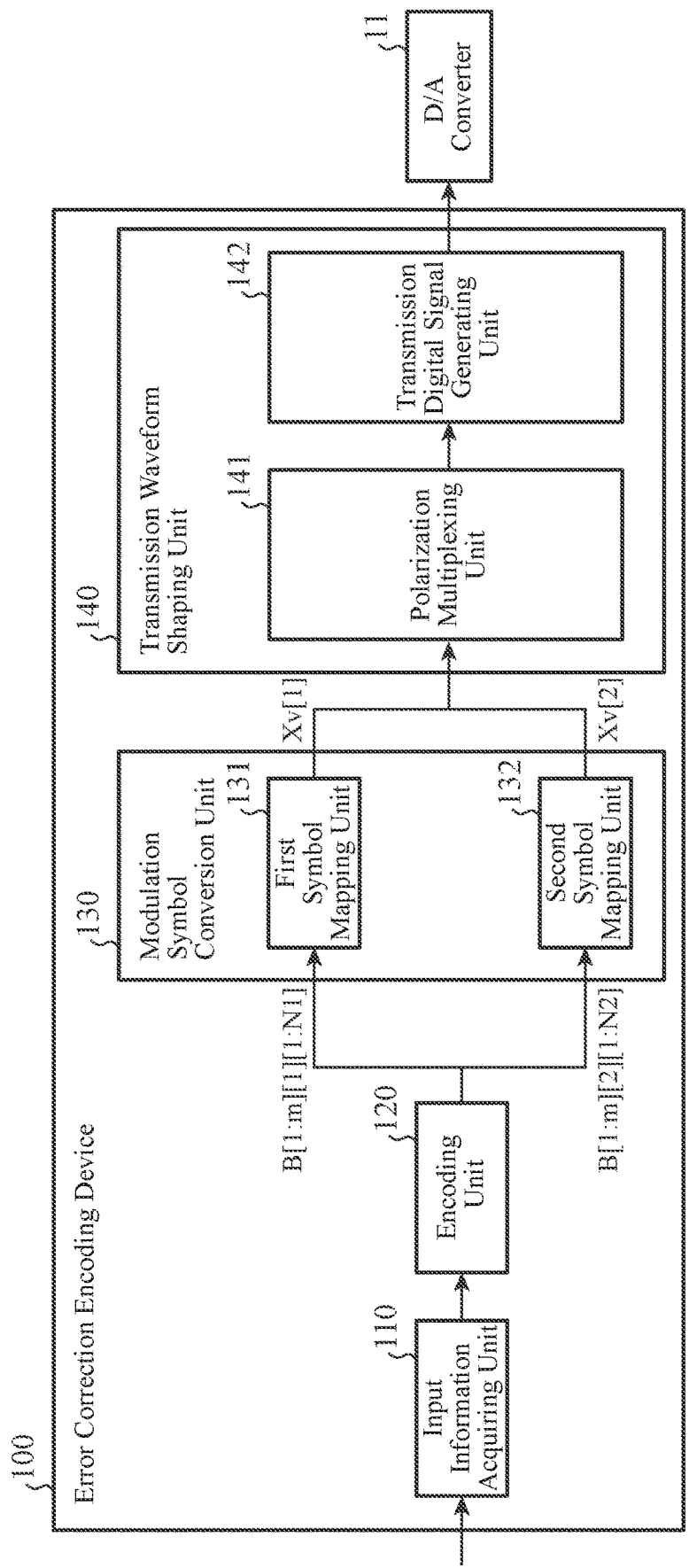
FIG. 2 is a configuration diagram illustrating an example of a configuration of a main part of an error correction encoding device according to the first embodiment.

FIG. 2 is a configuration diagram illustrating an example of the configuration of the main part of the error correction encoding device 100 according to the first embodiment.

The error correction encoding device 100 includes an input information acquiring unit 110, an encoding unit 120, a modulation symbol conversion unit 130, and a transmission waveform shaping unit 140.

The input information acquiring unit 110 acquires input information.

The encoding unit 120 generates soft decision error correction frame information obtained by combining first bit string group information and second bit string group information on the basis of the input information acquired by the input information acquiring unit 110.

The first bit string group information is information including a bit array of m (m is a natural number of greater than or equal to 2) rows and N1 (N1 is a natural number of greater than or equal to 2) columns, and is information in which it is enabled to perform pulse amplitude modulation of a combination of bit values of each column of the first bit string group information into a modulation symbol by using a predetermined first symbol mapping rule.

The second bit string group information is information including a bit array of m rows and an N2 (N2 is a natural number of greater than or equal to 1) column, and is information in which it is enabled to perform pulse amplitude modulation of a combination of bit values of each column of the second bit string group information into a modulation symbol by using a predetermined second symbol mapping rule.

The soft decision error correction frame information is information obtained by combining the first bit string group information and the second bit string group information, and is information including a bit array of m rows and N columns (N is a number obtained by adding N1 and N2 together).

Details of the encoding unit 120 will be described later.

In the following description, it is assumed that the soft decision error correction frame information is stored in "D" that is a bit array space of m rows and N columns.

In addition, in D that is a bit array space, a bit array space of m rows and N1 columns in which the first bit string group information is stored is denoted as "Dd[1]", and a bit array space of m rows and N2 columns in which the second bit string group information is stored is denoted as "Dd[2]".

In addition, in the following description, q−p+1 elements from p (p is a natural number of greater than or equal to 1) to q (q is a natural number of greater than or equal to p) are denoted as "p:q".

In addition, in Dd[1:m] that is a bit array space, a bit array space of one row and N columns in which the most significant bit (MSB) is stored is denoted as "Dv[1][1:2]". In the following description, information stored in Dv[1][1] is referred to as first MSB information, and information stored in Dv[1][2] is referred to as second MSB information.

In addition, in Dd[1:m] that is a bit array space, a bit array space of one row and N columns in which the least significant bit (LSB) is stored is denoted as "Dv[m][1:2]". In the following description, information stored in Dv[m][1] is referred to as first LSB information, and information stored in Dv[m][2] is referred to as second LSB information.

In addition, in Dd[1:m] that is a bit array space, a bit array space of m−2 rows and N columns in which a middle bit other than the MSB and the LSB is stored is denoted as "Dv[2:m−1][1:2]". In the following description, information stored in Dv[2:m−1][1] is referred to as first SSB information, and information stored in Dv[2:m−1][2] is referred to as second SSB information.

Note that, in a case where m is 2, the first bit string group information includes only the first MSB information and the first LSB information, and the second bit string group information includes only the second MSB information and the second LSB information. Thus, in the case where m is 2, since the first SSB information and the second SSB information do not exist, Dv[2:m−1][1:2] is omitted.

In addition, in Dd[1:m] that is a bit array space, a bit space of the k-th (k is a natural number of greater than or equal to 1 and less than or equal to N1 in Dd[1], and is a natural number of greater than or equal to 1 and less than or equal to N2 in Dd[2]) column is denoted as "D[1:m][1:2][k]".

In addition, a bit value of the soft decision error correction frame information stored in D[1:m][1:2][k] that is a bit space is denoted as "B[1:m][1:2][k]".

The modulation symbol conversion unit 130 performs pulse amplitude modulation of a combination of bit values of each column of the soft decision error correction frame information generated by the encoding unit 120 into a modulation symbol for each column of the soft decision error correction frame information, by using the first symbol mapping rule or the second symbol mapping rule. The modulation symbol conversion unit 130 generates modulation symbol group information including N modulation symbols by performing pulse amplitude modulation for each column of the soft decision error correction frame information.

Specifically, for example, the modulation symbol conversion unit 130 includes a first symbol mapping unit 131 and a second symbol mapping unit 132.

The first symbol mapping unit 131 performs pulse amplitude modulation of a combination of bit values of each column of the first bit string group information in the soft decision error correction frame information generated by the encoding unit 120 into a modulation symbol for each column of the first bit string group information, by using the predetermined first symbol mapping rule. The first symbol mapping unit 131 generates first modulation symbol group information including N1 modulation symbols by performing pulse amplitude modulation for each column of the first bit string group information.

The second symbol mapping unit 132 performs pulse amplitude modulation of a combination of bit values of each column of the second bit string group information in the soft decision error correction frame information generated by the encoding unit 120 into a modulation symbol for each column of the second bit string group information, by using the predetermined second symbol mapping rule. The second symbol mapping unit 132 generates second modulation symbol group information including N2 modulation symbols by performing pulse amplitude modulation for each column of the second bit string group information.

In the following description, a modulation symbol after the pulse amplitude modulation is referred to as a pulse-amplitude modulation (PAM) symbol.

In addition, the modulation symbol group information generated by the modulation symbol conversion unit 130 is denoted as [X], the first modulation symbol group information is denoted as "Xv[1]", and the second modulation symbol group information is denoted as "Xv[2]".

In addition, among PAM symbols belonging to Xv[1] that is the first modulation symbol group information, a PAM symbol corresponding to B[1:m][1][k] that is a combination of bit values of the k-th column of the first bit string group information is denoted as "X[1][k]".

In addition, among PAM symbols belonging to Xv[2] that is the second modulation symbol group information, a PAM symbol corresponding to B[1:m][2][k] that is a combination of bit values of the k-th column of the second bit string group information is denoted as "X[2][k]".

That is, the first symbol mapping unit 131 converts B[1:m][1][k] that is a combination of bit values of the k-th column of the first bit string group information into X[1][k] by using the first symbol mapping rule, and the second symbol mapping unit 132 converts B[1:m][2][k] that is a combination of bit values of the k-th column of the second bit string group information into X[2][k] by using the second symbol mapping rule, whereby the modulation symbol conversion unit 130 generates modulation symbol group information including N PAM symbols.

Details of the first symbol mapping rule and the second symbol mapping rule will be described later.

The transmission waveform shaping unit 140 generates a digital baseband modulation signal on the basis of the modulation symbol group information including the N PAM symbols generated by the modulation symbol conversion unit 130, and outputs the generated digital baseband modulation signal to the D/A converter 11.

Specifically, for example, the transmission waveform shaping unit 140 includes a polarization multiplexing unit 141 and a transmission digital signal generating unit 142.

The polarization multiplexing unit 141 generates polarization multiplexing modulation symbols (Hereinafter, the symbol is referred to as a "quadrature amplitude modulation (QAM) symbol".) on the basis of the modulation symbol group information generated by the modulation symbol conversion unit 130.

Specifically, for example, the polarization multiplexing unit 141 generates the QAM symbol by performing quadrature amplitude modulation on X[1][1:N1] that is the first modulation symbol group information and X[2][1:N2] that is the second modulation symbol group information on the basis of the modulation symbol group information generated by the modulation symbol conversion unit 130.

Note that, a method of performing quadrature amplitude modulation processing is known, and thus detailed description of the method will be omitted.

The transmission digital signal generating unit 142 generates a digital baseband modulation signal based on the polarization multiplexing modulation symbol generated by the polarization multiplexing unit 141. The transmission digital signal generating unit 142 outputs the generated digital baseband modulation signal.

Note that, a method of generating a digital baseband modulation signal based on a QAM symbol is known, and thus detailed description of the method will be omitted.

Specifically, the transmission digital signal generating unit 142 outputs the digital baseband modulation signal generated on the basis of the QAM symbol to the D/A converter 11.

When generating the digital baseband modulation signal, the transmission digital signal generating unit 142 may perform up-sampling such as double up-sampling, or processing such as root raised cosine low-pass filtering. In addition, when generating the digital baseband modulation signal, the transmission digital signal generating unit 142 may perform band compensation, delay difference compensation, amplitude adjustment, or the like for the optical modulator 13, the transmission path 30, the optical receiver 21, or the like.

Note that, a processing method for up-sampling, root raised cosine low-pass filtering, band compensation, delay difference compensation, amplitude adjustment, or the like performed when the digital baseband modulation signal is generated on the basis of the QAM symbol is known, and thus detailed description of the method will be omitted.

For example, in a case where the transmission path 30 has a noise characteristic such as additive white Gaussian noise (Hereinafter, it is referred to as "additive white Gaussian noise (AWGN)".), a signal such as a modulated optical signal transmitted via the transmission path 30 needs to have a signal to noise ratio (Hereinafter, it is referred to as a "signal-to-noise ratio (SNR)".) necessary for obtaining desired communication quality. When generating the digital baseband modulation signal, to generate a signal having a desired SNR, the transmission digital signal generating unit 142 shapes the QAM symbol by adjusting a value of the QAM symbol so that an absolute value of the QAM symbol has a distribution close to a predetermined distribution such as a discrete Gaussian distribution.

Note that, the discrete Gaussian distribution is merely an example, and when generating the digital baseband modulation signal, the transmission digital signal generating unit 142 only needs to adjust the value of the QAM symbol so that the QAM symbol has a distribution conforming to a noise characteristic of the transmission path 30, and a method of adjusting the value of the QAM symbol by the transmission digital signal generating unit 142 is not limited to the method in which the QAM symbol is adjusted to have a distribution close to the discrete Gaussian distribution.

As described above, the error correction encoding device 100 acquires the input information input from the outside of the device, and generates the soft decision error correction frame information on the basis of the acquired input information. Further, the error correction encoding device 100 generates the digital baseband modulation signal based on the generated soft decision error correction frame information, and outputs the generated digital baseband modulation signal to the D/A converter 11.

In addition, the transmission device 10 converts the digital baseband modulation signal generated on the basis of the soft decision error correction frame information based on the input information into the modulated light that is the modulated optical signal via the D/A converter 11 and the optical modulator 13, and outputs the modulated light to the reception device 20.

A configuration of a main part of the encoding unit 120 according to the first embodiment will be described with reference to FIG. 3.

Figure 3:
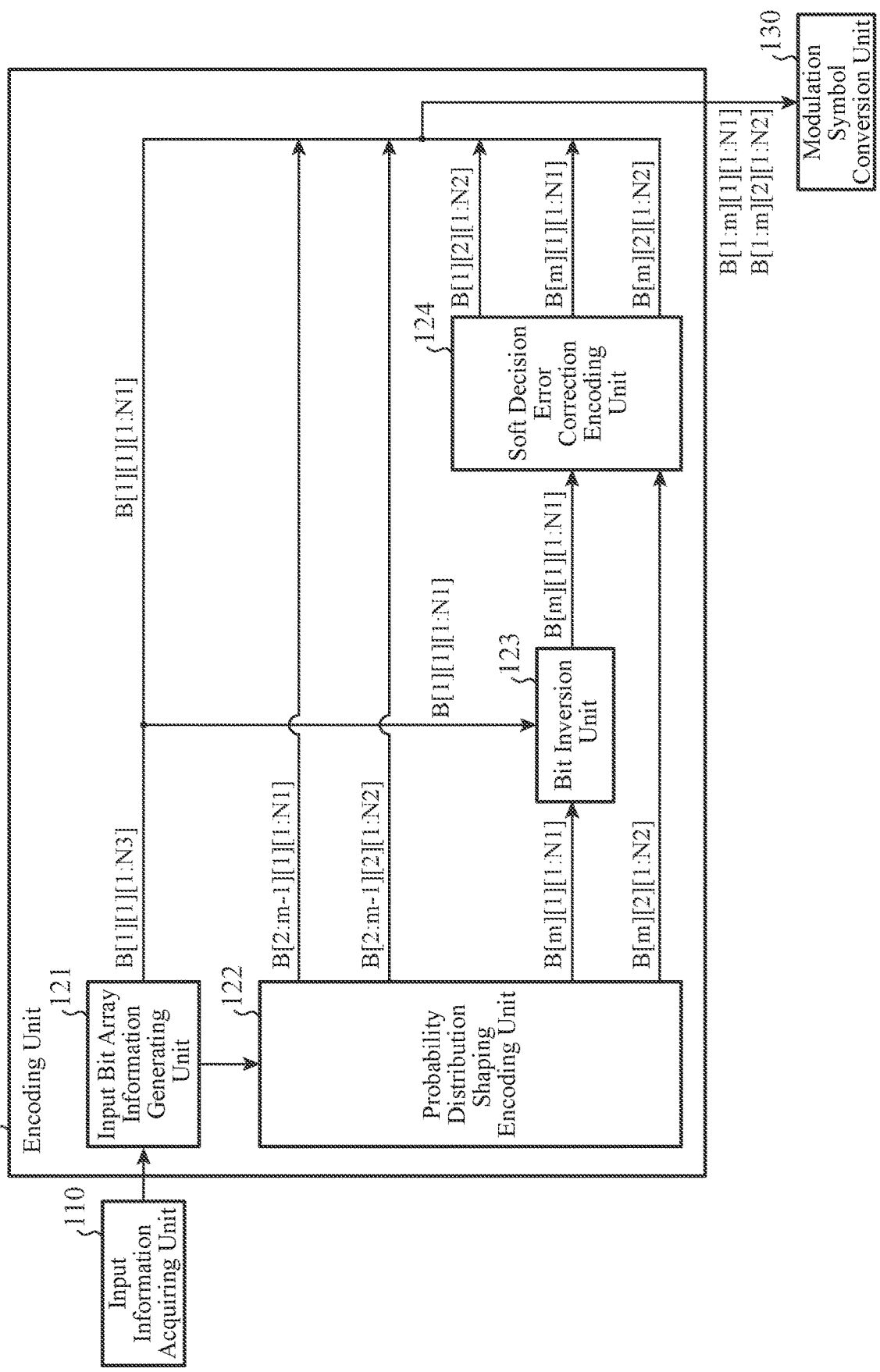
FIG. 3 is a configuration diagram illustrating an example of a configuration of a main part of an encoding unit according to the first embodiment.

FIG. 3 is a configuration diagram illustrating an example of the main part of the encoding unit 120 according to the first embodiment.

The encoding unit 120 includes an input bit array information generating unit 121, a probability distribution shaping encoding unit 122, a bit inversion unit 123, and a soft decision error correction encoding unit 124.

On the basis of the input information acquired by the input information acquiring unit 110, the input bit array information generating unit 121 generates first input bit array information including a bit array of m−1 rows and N columns and second input bit array information including a bit array of one row and N3 (N3 is a natural number of greater than or equal to 1 and less than N1) columns.

In a case where the input information is information including the first input bit array information including the bit array of m−1 rows and N columns and the second input bit array information including the bit array of one row and N3 columns, the input bit array information generating unit 121 generates the first input bit array information and the second input bit array information by extracting each of the first input bit array information and the second input bit array information from the input information, or separating the input information into the first input bit array information and the second input bit array information.

In a case where the input information is information corresponding to the first input bit array information and the information includes information of the number of bits less than (m−1)×N, the input bit array information generating unit 121 may generate the first input bit array information by extracting the information from the input information and shaping the extracted information into a bit array of m−1 rows and N columns. For example, when shaping the information into the bit array of m−1 rows and N columns, the input bit array information generating unit 121 generates the first input bit array information by setting a part of bit values in the bit array of m−1 rows and N columns as the information and setting remaining bit values to predetermined values (for example, "0").

In a case where the input information is information corresponding to the second input bit array information and the information includes information of the number of bits less than N3, the input bit array information generating unit 121 may generate the second input bit array information by extracting the information from the input information and shaping the extracted information into a bit array of one row and N3 columns. For example, when shaping the information into the bit array of one row and N3 columns, the input bit array information generating unit 121 generates the second input bit array information by setting a part of bit values in the bit array of one row and N3 columns as the information and setting remaining bit values to predetermined values (for example, "0").

In a case where the input information does not include the information corresponding to the first input bit array information or the second input bit array information, the input bit array information generating unit 121 may generate the first input bit array information or the second input bit array information not included in the input information by setting all the bit values of the first input bit array information or the second input bit array information not included in the input information to predetermined values (for example, "0").

In a case where the input information is information corresponding to the first input bit array information and the information includes information of the number of bits greater than (m−1)×N, the input bit array information generating unit 121 may divide the information into a plurality of pieces of the first input bit array information having the number of bits of less than or equal to (m−1)×N. For example, the error correction encoding device 100 generates a plurality of pieces of soft decision error correction frame information each corresponding to the plurality of pieces of first input bit array information divided, generates a plurality of digital baseband modulation signals each corresponding to the plurality of pieces of soft decision error correction frame information, and sequentially outputs the plurality of digital baseband modulation signals generated.

In a case where the input information is information corresponding to the second input bit array information and the information includes information of the number of bits greater than N3, the input bit array information generating unit 121 may divide the information into a plurality of pieces of the second input bit array information having the number of bits of less than or equal to N3. For example, the error correction encoding device 100 generates a plurality of pieces of soft decision error correction frame information each corresponding to the plurality of pieces of second input bit array information divided, generates a plurality of digital baseband modulation signals each corresponding to the plurality of pieces of soft decision error correction frame information, and sequentially outputs the plurality of digital baseband modulation signals generated.

With the above configuration, the error correction encoding device 100 can generate the soft decision error correction frame information for the input information having any number of bits and output the digital baseband modulation signal based on the generated soft decision error correction frame information.

The input bit array information generating unit 121 stores the generated second input bit array information as a part of the first MSB information including a bit array of one row and N1 columns in a predetermined area (Hereinafter, the area is referred to as a "second input bit area".) of the first row in the first bit string group information.

Specifically, the input bit array information generating unit 121 stores the second input bit array information in the second input bit area of Dv[1][1] that is a bit array space in which the first MSB is stored. Hereinafter, the description will be given assuming that the second input bit area is D[1][1][1:N3].

The probability distribution shaping encoding unit 122 generates shaped bit array information including a bit array of m−1 rows and N columns by performing probability distribution shaping encoding processing on the generated first input bit array information.

The probability distribution shaping encoding unit 122 may collectively perform the probability distribution shaping encoding processing on the first input bit array information, or may divide the first input bit array information into a plurality of pieces of information and perform the probability distribution shaping encoding processing on each divided piece of information.

The probability distribution shaping encoding unit 122 performs the probability distribution shaping encoding processing by using, for example, a method described in "Hierarchical Distribution Matching for Probabilistically Shaped Coded Modulation" (Journal of Lightwave Technology, vol. 37, no. 6, pp. 1579-1589, March 2019.) by T. Yoshida et al.

The probability distribution shaping encoding unit 122 stores the generated shaped bit array information in Dv[2:m][1:2] in D that is a bit array space.

Specifically, for example, the probability distribution shaping encoding unit 122 generates the first LSB information, the second LSB information, the first SSB information, and the second SSB information by performing processing as described below. The probability distribution shaping encoding unit 122 stores the shaped bit array information in Dv[2:m][1:2] by storing the generated first LSB information, second LSB information, first SSB information, and second SSB information in areas in Dv[2:m][1:2] respectively corresponding to the first LSB information, the second LSB information, the first SSB information, and the second SSB information.

First, the probability distribution shaping encoding unit 122 generates first group bit array information including a combination of N1 predetermined columns and second group bit array information including a combination of N2 predetermined columns by separating the generated shaped bit array information.

Further, the probability distribution shaping encoding unit 122 generates the first LSB information including a bit array of one row and N1 columns by extracting information of the (m−1)-th row in the first group bit array information from the generated first group bit array information, and stores the first LSB information in the m-th row in the first bit string group information.

Specifically, the probability distribution shaping encoding unit 122 stores the generated first LSB information in Dv[m][1] that is a bit array space.

In addition, the probability distribution shaping encoding unit 122 generates the second LSB information including a bit array of one row and N2 columns by extracting information of the (m−1)-th row in the second group bit array information from the generated second group bit array information, and stores the generated second LSB information in the m-th row in the second bit string group information.

Specifically, the probability distribution shaping encoding unit 122 stores the generated second LSB information in Dv[m][2] that is a bit array space.

In addition, in a case where m is greater than or equal to 3, the probability distribution shaping encoding unit 122 generates the first SSB information including a bit array of m−2 rows and N1 columns by extracting information from the first row to the (m−2)-th row in the first group bit array information from the generated first group bit array information, and stores the generated first SSB information from the second row to the (m−1)-th row in the first bit string group information.

Specifically, the probability distribution shaping encoding unit 122 stores the generated first SSB information in Dv[2:m−1][1] that is a bit array space.

In addition, in the case where m is greater than or equal to 3, the probability distribution shaping encoding unit 122 generates the second SSB information including a bit array of m−2 rows and N2 columns by extracting information from the first row to the (m−2)-th row in the second group bit array information from the generated second group bit array information, and stores the generated second SSB information from the second row to the (m−1)-th row in the second bit string group information.

Specifically, the probability distribution shaping encoding unit 122 stores the generated second SSB information in Dv[2:m−1][2] that is a bit array space.

The bit inversion unit 123 generates inverted first LSB information including a bit array of one row and N1 columns by calculating exclusive ORs of bit values of each columns in the first LSB information and each bit values of each columns in the first MSB information, the columns in the first MSB information each corresponding to the columns in the first LSB information.

Specifically, the bit inversion unit 123 calculates an exclusive OR of B[m][1][k] that is a bit value of each column in Dv[m][1] storing the first LSB information and B[1][1][k] that is a bit value of each column in Dv[1][1] storing the second input bit array information. The bit inversion unit 123 stores the inverted first LSB information that is a calculation result of the exclusive OR of all the columns from the first column to the N1-th column, in the m-th row in the first bit string group information. Specifically, the bit inversion unit 123 stores the inverted first LSB information that is the calculation result of the exclusive OR in Dv[m][1] storing the first LSB information, and overwrites B[m][1][1:N1] with the inverted first LSB information.

The soft decision error correction encoding unit 124 generates a soft decision parity bit by performing systematic soft decision error correction encoding processing by using the inverted first LSB information generated by the bit inversion unit 123 and the second LSB information generated by the probability distribution shaping encoding unit 122. The soft decision error correction encoding unit 124 stores the generated soft decision parity bit as second MSB information including a bit array of one row and N2 columns in the first row of the second bit string group information.

Specifically, the soft decision error correction encoding unit 124 generates the soft decision parity bit by performing the systematic soft decision error correction encoding processing by using B[m][1][1:N1] that is a bit value of each column in Dv[m][1] storing the inverted first LSB information and B[m][2][1:N2] that is a bit value of each column in Dv[m][2] storing the second LSB information. The soft decision error correction encoding unit 124 stores the generated soft decision parity bit as the second MSB information in Dv[1][2] that is a bit array space.

As the systematic soft decision error correction encoding processing, a turbo product code, a low density parity check code, a polar code, or the like is used.

With the above configuration, the encoding unit 120 generates the soft decision error correction frame information by storing the soft decision error correction frame information in Dv[1:m][1:2] that is a bit array space.

As described above, the encoding unit 120 performs the systematic soft decision error correction encoding processing by using the bit value of each column in Dv[m][1] and the bit value of each column in Dv[m][2]. For that reason, a bit to be protected by the soft decision error correction encoding processing is only the least significant bit of each column in Dd[1:2] in the soft decision error correction frame information.

Thus, the encoding unit 120 can reduce the number of bits to be protected by soft decision error correction as compared with the conventional soft decision error correction encoding processing.

The first symbol mapping rule and the second symbol mapping rule according to the first embodiment will be described with reference to FIG. 4.

FIG. 4A is an explanatory diagram for describing an example of the first symbol mapping rule according to the first embodiment. Specifically, FIG. 4A is a diagram illustrating a correspondence between B[1:m][1][k] that is a combination of bit values of D[1:m][1][k] that is a bit array space and X[1][k] that is a PAM symbol. Hereinafter, a correspondence between a combination of B[1:m][1][k] and X[1][k] that is a PAM symbol will be referred to as the first symbol mapping rule and described.

FIG. 4B is an explanatory diagram for describing an example of the second symbol mapping rule according to the first embodiment. Specifically, FIG. 4B is a diagram illustrating a correspondence between B[1:m][2][k] that is a combination of bit values of D[1:m][2][k] that is a bit array space and X[2][k] that is a PAM symbol. Hereinafter, a correspondence between a combination of B[1:m][2][k] and X[2][k] that is a PAM symbol will be referred to as the second symbol mapping rule.

FIG. 4 illustrates, as an example, a case where m is 4, and a case where the modulation symbol conversion unit 130 performs 16-value pulse amplitude modulation (Hereinafter, it is referred to as "16-PAM: 16-ary PAM".) processing by using a combination of four bit values.

The modulation symbol conversion unit 130 performs one-dimensional pulse amplitude modulation on a combination of bit values of each column of the soft decision error correction frame information generated by the encoding unit 120 into a modulation symbol for each column of the soft decision error correction frame information, by using the first symbol mapping rule or the second symbol mapping rule indicated in FIG. 4 as an example of the symbol mapping rule.

In the following description, it is assumed that modulation symbol conversion unit 130 performs 16-PAM processing by using a combination of four bit values as an example, but the modulation symbol conversion unit 130 is not limited thereto. That is, m only needs to be greater than or equal to 2, and the modulation symbol conversion unit 130 only needs to perform $2^m$-value pulse amplitude modulation processing.

In the first symbol mapping rule indicated in FIG. 4A, the relationship between B[1:m−1][1][k] and X[1][k] is equivalent to the binary reflected Gray code (Hereinafter, it is referred to as "Binary Reflected Gray Coding (BRGC)".). In addition, the relationship between B[m][1][k] and X[1][k] is one in which values of B[m][1][k] each corresponding to two adjacent X[1][k] are different from each other.

On the other hand, in the second symbol mapping rule indicated in FIG. 4B, the relationship between B[1:m−1][2][k] and X[2][k] is equivalent to BRGC. In addition, the relationship between B[m][2][k] and X[2][k] is one in which B[m][2][k] corresponding to X[2][k] of a positive value has the same value as B[m][1][k] corresponding to X[1][k] having the same value as the value of X[2][k], and B[m][2][k] corresponding to X[2][k] of a negative value has a value obtained by inverting the value of B[m][1][k] corresponding to X[1][k] having the same value as the value of X[2][k].

Note that, the first symbol mapping rule and the second symbol mapping rule indicated in FIG. 4 are merely examples, and the first symbol mapping rule and the second symbol mapping rule are not limited to those indicated in FIG. 4. A combination of m bit values in the first symbol mapping rule and the second symbol mapping rule is any combination of m bit values as long as the first symbol mapping rule and the second symbol mapping rule are those described above, and a value of the PAM symbol is uniquely determined by the combination of m bit values.

As indicated in FIG. 4, in a case where the maximum value of the number of PAM symbols is 16, the number of PAM symbols can be set to 8 or 4. In other words, 16-PAM can be used as 8-PAM or 4-PAM.

For example, in the case where m is greater than or equal to 3, in a case where the number of valid bits is me (me is a natural number of greater than or equal to 2 and less than or equal to m) among combinations of m bit values, the modulation symbol conversion unit 130 only needs to perform $2^{me}$-value pulse amplitude modulation processing by using a combination of me bit values.

Specifically, for example, in a case where m is 4 and me is 3, by setting the value of B[2][1:2][k] among B[1:m][1:2][k] indicated in FIG. 4 to "0", the modulation symbol conversion unit 130 can perform $2^3$-value pulse amplitude modulation processing that can perform conversion into eight PAM symbols from −7 to 7, that is, 8-value pulse amplitude modulation processing.

In addition, for example, in a case where m is 4 and me is 2, by setting the value of B[2:3][1:2][k] among B[1:m][1:2][k] indicated in FIG. 4 to "0", the modulation symbol conversion unit 130 can perform $2^2$-value pulse amplitude modulation processing that can perform conversion into four PAM symbols from −3 to 3, that is, 4-value pulse amplitude modulation processing.

Note that, in a case where there is an invalid bit among the combinations of m bit values, for example, in a case where the value of B[2][1:2][k] or the value of B[2:3][1:2][k] described in the above example is set to "0", the probability distribution shaping encoding unit 122 included in the encoding unit 120 may set information corresponding to a row in which all the values are set to "0" in the first input bit array information to be out of a target of the probability distribution shaping encoding.

Regarding X[2][k], referring to the first symbol mapping rule and the second symbol mapping rule indicated in FIG. 4, if absolute values of amplitude values of X[2][k] are the same, combinations of bit values of B[2:m][2][k] are the same, and B[1][2][k] indicates positive and negative polarities of X[2][k].

Thus, the probability distribution shaping encoding unit 122 performs the probability distribution shaping coding on information corresponding to B [2:m][2][k] in the first input bit array information, whereby the error correction encoding device 100 can control an appearance probability of a combination of bit values of B[2:m][2][k], that is, an appearance probability of an absolute value of X[2][k].

On the other hand, regarding X[1][k], referring to the first symbol mapping rule and the second symbol mapping rule indicated in FIG. 4, in a case where X[1][k] is a positive value, the combination of bit values of B[1:m][1][k] corresponding to the value of X[1][k] is the same as the combination of bit values of B[1:m][2][k] corresponding to X[2][k] having the same value as X[1][k]. In addition, in a case where X[1][k] is a negative value, regarding X[1][k], the combination of bit values of B[2:m][1][k] corresponding to the value of X[1][k] and the combination of bit values of B[2:m][2][k] corresponding to X[2][k] having the same value as X[1][k] are the same, and the bit value of B[1][1][k] corresponding to X[1][k] is a value obtained by inverting the bit value of B[1][2][k] corresponding to X[2][k] having the same value as X[1][k].

Thus, the probability distribution shaping encoding unit 122 performs the probability distribution shaping coding on information corresponding to B[2:m][1][k] in the first input bit array information, and, further an exclusive OR of B[1][1][k] and B[m][1][k] after the probability distribution shaping coding by the bit inversion unit 123 is set as B[2:m][1][k], whereby the error correction encoding device 100 can control an appearance probability of a combination of bit values of B[2:m][1][k], that is, an appearance probability of an absolute value of X[1][k].

A hardware configuration of the main part of the error correction encoding device 100 according to the first embodiment will be described with reference to FIG. 5.

Figure 5A:
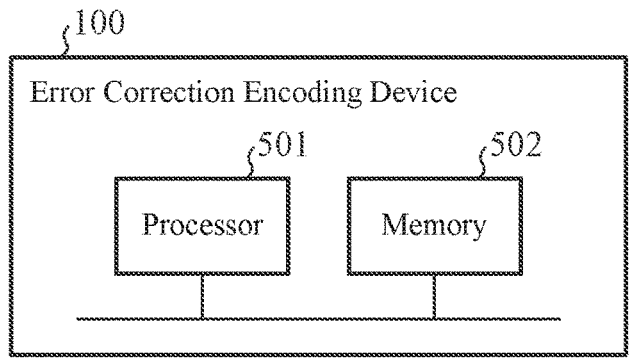
FIGS. 5A and 5B are diagrams illustrating examples of a hardware configuration of the error correction encoding device according to the first embodiment.
Figure 5B:
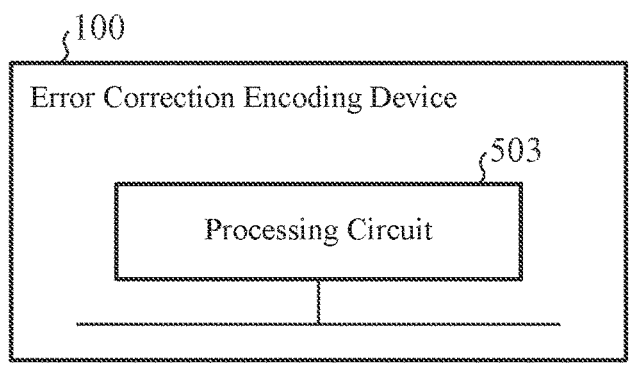

FIGS. 5A and 5B are diagrams illustrating examples of the hardware configuration of the error correction encoding device 100 according to the first embodiment.

As illustrated in FIG. 5A, the error correction encoding device 100 includes a computer, and the computer includes a processor 501 and a memory 502. The memory 502 stores a program for causing the computer to function as the input information acquiring unit 110, the encoding unit 120, the modulation symbol conversion unit 130, and the transmission waveform shaping unit 140. The processor 501 reads and executes the program stored in the memory 502, whereby functions of the input information acquiring unit 110, the encoding unit 120, the modulation symbol conversion unit 130, and the transmission waveform shaping unit 140 are implemented.

In addition, as illustrated in FIG. 5B, the error correction encoding device 100 may include a processing circuit 503. In this case, the functions of the input information acquiring unit 110, the encoding unit 120, the modulation symbol conversion unit 130, and the transmission waveform shaping unit 140 may be implemented by the processing circuit 503.

In addition, the error correction encoding device 100 may include the processor 501, the memory 502, and the processing circuit 503 (not illustrated). In this case, some of the functions of the input information acquiring unit 110, the encoding unit 120, the modulation symbol conversion unit 130, and the transmission waveform shaping unit 140 may be implemented by the processor 501 and the memory 502, and remaining functions may be implemented by the processing circuit 503.

The processor 501 uses, for example, a central processing unit (CPU), a graphics processing unit (GPU), a microprocessor, a microcontroller, or a digital signal processor (DSP).

The memory 502 uses, for example, a semiconductor memory or a magnetic disk. Specifically, the memory 502 uses, for example, a random access memory (RAM), a read only memory (ROM), a flash memory, an erasable programmable read only memory (EPROM), an electrically erasable programmable read only memory (EEPROM), a solid state drive (SSD), or a hard disk drive (HDD).

The processing circuit 503 uses, for example, an application specific integrated circuit (ASIC), a programmable logic device (PLD), a field-programmable gate array (FPGA), a system-on-a-chip (SoC), or a system large-scale integration (LSI).

Operation of the error correction encoding device 100 according to the first embodiment will be described with reference to FIGS. 6A, 6B, and 6C.

Figure 6A:
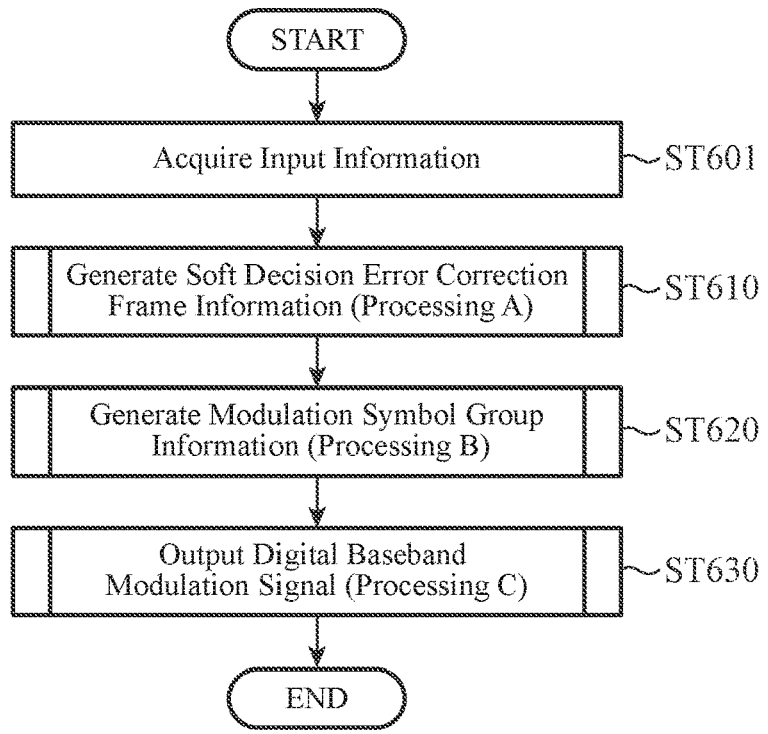
FIG. 6A is a part of a flowchart illustrating an example of processing performed by the error correction encoding device according to the first embodiment.

FIG. 6A is a part of a flowchart illustrating an example of processing performed by the error correction encoding device 100 according to the first embodiment.

Figure 6B:
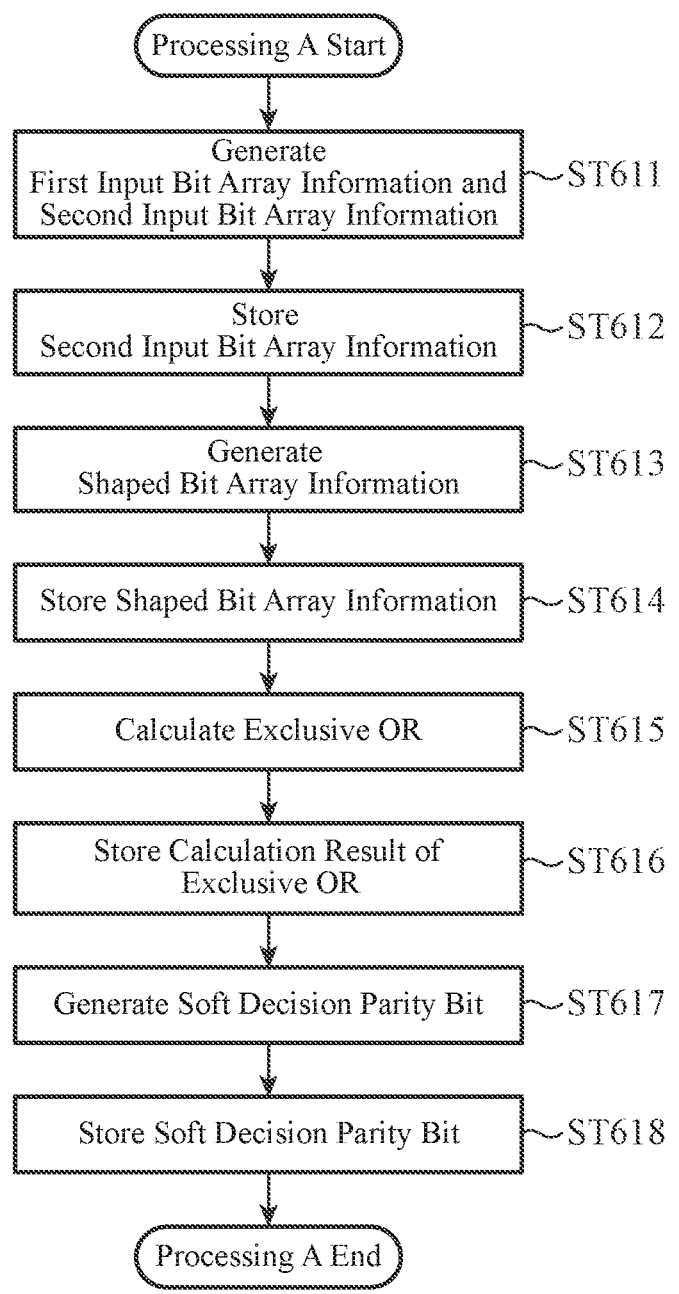
FIG. 6B is another part of the flowchart illustrating the example of the processing performed by the error correction encoding device according to the first embodiment.

FIG. 6B is another part of the flowchart illustrating the example of the processing performed by the error correction encoding device 100 according to the first embodiment.

FIG. 6C is a remaining part of the flowchart illustrating the example of the processing performed by the error correction encoding device 100 according to the first embodiment.

Hereinafter, FIGS. 6A, 6B, and 6C are collectively denoted as FIG. 6.

The error correction encoding device 100 repeatedly executes the processing of the flowchart illustrated in FIG. 6.

First, in step ST601, the input information acquiring unit 110 acquires the input information.

Next, in step ST610, the encoding unit 120 generates the soft decision error correction frame information.

Specifically, the encoding unit 120 performs processing of step ST610 by performing processing from step ST611 to step ST618 in processing A below.

First, in step ST611, the input bit array information generating unit 121 included in the encoding unit 120 generates the first input bit array information and the second input bit array information.

Next, in step ST612, the input bit array information generating unit 121 included in the encoding unit 120 stores the second input bit array information in the second input bit area of Dv[1][1].

Next, in step ST613, the probability distribution shaping encoding unit 122 included in the encoding unit 120 generates the shaped bit array information.

Next, in step ST614, the probability distribution shaping encoding unit 122 included in the encoding unit 120 stores the shaped bit array information in Dv[2:m][1:2].

Next, in step ST615, the bit inversion unit 123 included in the encoding unit 120 calculates exclusive ORs of bit values of each columns in Dv[m][1] and bit values of each columns in Dv[1][1].

Next, in step ST616, the bit inversion unit 123 included in the encoding unit 120 stores calculation results of the exclusive ORs in Dv[m][1] by overwriting the bit values of each columns in Dv[m][1] with the calculation results of the exclusive ORs.

Next, in step ST617, the soft decision error correction encoding unit 124 included in the encoding unit 120 generates the soft decision parity bit by performing the systematic soft decision error correction encoding processing by using the bit value of each column in Dv[m][1] and the bit value of each column in Dv[m][2].

Next, in step ST618, the soft decision error correction encoding unit 124 included in the encoding unit 120 stores the soft decision parity bit in Dv[1][2].

After step ST618, the encoding unit 120 ends the processing A. That is, after step ST618, the encoding unit 120 ends the processing of step ST610.

After step ST610, in step ST620, the modulation symbol conversion unit 130 generates the modulation symbol group information including the N PAM symbols.

Specifically, the modulation symbol conversion unit 130 performs processing of step ST620 by performing processing from step ST621 to step ST622 in processing B below.

In step ST621, the first symbol mapping unit 131 included in the modulation symbol conversion unit 130 generates the first modulation symbol group information including N1 PAM symbols.

Next, in step ST622, the second symbol mapping unit 132 included in the modulation symbol conversion unit 130 generates the second modulation symbol group information including N2 PAM symbols.

After step ST622, the modulation symbol conversion unit 130 ends the processing B. That is, after step ST622, the modulation symbol conversion unit 130 ends the processing of step ST620.

Note that, the order of the processing in steps ST621 and ST622 is any order.

After step ST620, in step ST630, the transmission waveform shaping unit 140 outputs the digital baseband modulation signal.

Specifically, the transmission waveform shaping unit 140 performs processing of step ST630 by performing processing from step ST631 to step ST633 in processing C below.

In step ST631, the polarization multiplexing unit 141 included in the transmission waveform shaping unit 140 generates the QAM symbol.

Next, in step ST632, the transmission digital signal generating unit 142 included in the transmission waveform shaping unit 140 generates the digital baseband modulation signal.

Next, in step ST633, the transmission digital signal generating unit 142 included in the transmission waveform shaping unit 140 outputs the digital baseband modulation signal.

After step ST633, the transmission waveform shaping unit 140 ends the processing C. That is, after step ST633, the transmission waveform shaping unit 140 ends the processing of step ST630.

After step ST630, the error correction encoding device 100 ends the processing of the flowchart illustrated in FIG. 6, and the error correction encoding device 100 returns to the processing of step ST601 and repeatedly executes the processing of the flowchart illustrated in FIG. 6.

A configuration of a main part of the error correction device 200 according to the first embodiment will be described with reference to FIG. 7.

Figure 7:
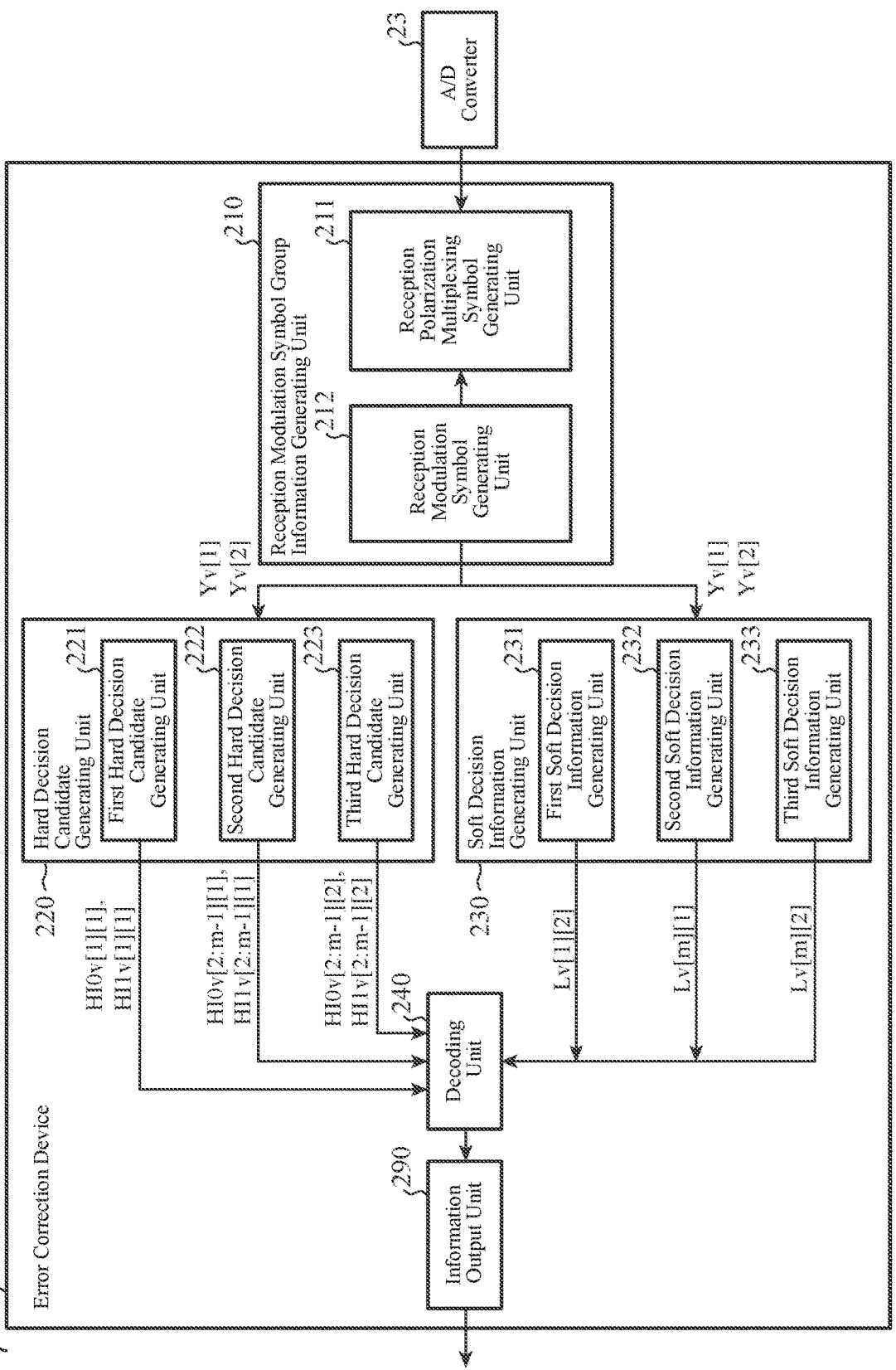
FIG. 7 is a configuration diagram illustrating an example of a configuration of a main part of an error correction device according to the first embodiment.

FIG. 7 is a configuration diagram illustrating an example of the main part of the error correction device 200 according to the first embodiment.

The error correction device 200 includes a reception modulation symbol group information generating unit 210, a hard decision candidate generating unit 220, a soft decision information generating unit 230, a decoding unit 240, and an information output unit 290.

The reception modulation symbol group information generating unit 210 receives the reception digital baseband modulation signal that is the digital baseband modulation signal output by the A/D converter 23. The reception modulation symbol group information generating unit 210 generates reception modulation symbol group information including N reception modulation symbols (Hereinafter, the symbol is referred to as a "reception PAM symbol".) that is modulation symbol group information including N modulation symbols, on the basis of the reception digital baseband modulation signal.

The reception digital baseband modulation signal received by the reception modulation symbol group information generating unit 210 is a signal corresponding to the digital baseband modulation signal output by the transmission waveform shaping unit 140 included in the error correction encoding device 100.

In addition, the reception modulation symbol group information generated by the reception modulation symbol group information generating unit 210 is information corresponding to the modulation symbol group information including the N modulation symbols generated by the modulation symbol conversion unit 130 included in the error correction encoding device 100.

That is, the reception modulation symbol group information generating unit 210 restores the reception modulation symbol group information corresponding to the modulation symbol group information generated by the modulation symbol conversion unit 130 on the basis of the reception digital baseband modulation signal.

The reception modulation symbol group information generating unit 210 outputs the generated reception modulation symbol group information to the hard decision candidate generating unit 220 and the soft decision information generating unit 230.

Specifically, for example, the reception modulation symbol group information generating unit 210 includes a reception polarization multiplexing symbol generating unit 211 and a reception modulation symbol generating unit 212.

The reception polarization multiplexing symbol generating unit 211 receives the reception digital baseband modulation signal output by the A/D converter 23, and generates a reception polarization multiplexing modulation symbol (Hereinafter, it is referred to as "reception QAM symbol".) that is the polarization multiplexing modulation symbol, from the reception digital baseband modulation signal.

The reception QAM symbol generated by the reception polarization multiplexing symbol generating unit 211 corresponds to the QAM symbol generated by the polarization multiplexing unit 141 included in the transmission waveform shaping unit 140 in the error correction encoding device 100.

That is, the reception polarization multiplexing symbol generating unit 211 restores the reception PAM symbol corresponding to the QAM symbol generated by the polarization multiplexing unit 141 from the reception digital baseband modulation signal.

Note that, a method of generating a QAM symbol from a digital baseband modulation signal is known, and thus detailed description of the method will be omitted.

The reception modulation symbol generating unit 212 generates reception modulation symbol group information including N reception PAM symbols on the basis of the reception QAM symbol restored by the reception polarization multiplexing symbol generating unit 211.

Specifically, the reception modulation symbol generating unit 212 generates first reception modulation symbol group information including N1 reception PAM symbols and second reception modulation symbol group information including N2 reception PAM symbols.

The first reception modulation symbol group information generated by the reception modulation symbol generating unit 212 is information corresponding to the first modulation symbol group information generated by the first symbol mapping unit 131 included in the modulation symbol conversion unit 130.

In addition, the second reception modulation symbol group information generated by the reception modulation symbol generating unit 212 is information corresponding to the second modulation symbol group information generated by the second symbol mapping unit 132 included in the modulation symbol conversion unit 130.

In the following description, the reception modulation symbol group information generated by the reception modulation symbol generating unit 212 is denoted as "Y", the first reception modulation symbol group information is denoted as "Yv[1]", and the second reception modulation symbol group information is denoted as "Yv[2]".

In addition, among the reception PAM symbols belonging to Yv[1] that is the first reception modulation symbol group information, a reception PAM symbol corresponding to X[1][k] that is the PAM symbol belonging to the first modulation symbol group information generated by the first symbol mapping unit 131 is denoted as "Y[1][k]".

In addition, among the reception PAM symbols belonging to Yv[2] that is the second reception modulation symbol group information, a reception PAM symbol corresponding to X[2][k] that is the PAM symbol belonging to the second modulation symbol group information generated by the second symbol mapping unit 132 is denoted as "Y[2][k]".

The reception modulation symbol generating unit 212 outputs the generated first reception modulation symbol group information and second reception modulation symbol group information to the hard decision candidate generating unit 220 and the soft decision information generating unit 230.

Note that, a method of generating a PAM symbol from a QAM symbol is known, and thus detailed description of the method will be omitted.

The hard decision candidate generating unit 220 generates first hard decision candidate bit array information, second hard decision candidate bit array information, and third hard decision candidate bit array information by using the reception modulation symbol group information generated by the reception modulation symbol group information generating unit 210 on the basis of the first symbol mapping rule or the second symbol mapping rule.

Specifically, for example, the hard decision candidate generating unit 220 includes a first hard decision candidate generating unit 221 to generate the first hard decision candidate bit array information, a second hard decision candidate generating unit 222 to generate the second hard decision candidate bit array information, and a third hard decision candidate generating unit 223 to generate the third hard decision candidate bit array information.

The first hard decision candidate generating unit 221 generates HI0v[1][1] and HI1v[1][1] each of which is the first hard decision candidate bit array information including a bit array of one row and N1 columns, by using Y[1][1:N1] that is the first reception modulation symbol group information, on the basis of the first symbol mapping rule.

A bit value of the k-th column of HI0v[1][1] is a hard decision value obtained by performing hard decision on a value of Y[1][k] in a case where the bit value of B[m][1][k] that is the LSB of B[1:m][1][k] that is a combination of bit values corresponding to X[1][k] corresponding to Y[1][k] is "0".

Specifically, for example, the first hard decision candidate generating unit 221 determines the bit value of the k-th column of HI0v[1][1] on the basis of the first symbol mapping rule indicated in FIG. 4A.

More specifically, in a case where the bit value of B[m][1][k] is "0", referring to the first symbol mapping rule indicated in FIG. 4A, X[1][k] can take any one of eight values of −15, −11, −7, −3, 1, 5, 9, and 13. The first hard decision candidate generating unit 221 compares the above-described eight values with the value of Y[1][k], and determines that the value of X[1][k] having the maximum posterior probability among the above-described eight values is the value of Y[1][k]. The first hard decision candidate generating unit 221 generates HI0v[1][1] by setting B[m][1][k] that is the LSB of B[1:m][1][k] that is a combination of bit values corresponding to the value of X[1][k] having the maximum posterior probability as the bit value of the k-th column of HI0v[1][1].

Similarly, a bit value of the k-th column of HI1v[1][1] is a hard decision value obtained by performing hard decision on the value of Y[1][k] in a case where the bit value of B[m][1][k] that is the LSB of B[1:m][1][k] that is a combination of bit values corresponding to X[1][k] corresponding to Y[1][k] is "1".

Specifically, for example, the first hard decision candidate generating unit 221 determines the bit value of the k-th column of HI1v[1][1] on the basis of the first symbol mapping rule indicated in FIG. 4A.

More specifically, in a case where the bit value of B[m][1][k] is "1", referring to the first symbol mapping rule indicated in FIG. 4A, X[1][k] can take any one of eight values of −13, −9, −5, −1, 3, 7, 11, and 15. The first hard decision candidate generating unit 221 compares the above-described eight values with the value of Y[1][k], and determines that the value of X[1][k] having the maximum posterior probability among the above-described eight values is the value of Y[1][k]. The first hard decision candidate generating unit 221 generates HI1v[1][1] by setting B[m][1][k] that is the LSB of B[1:m][1][k] that is a combination of bit values corresponding to the value of X[1][k] having the maximum posterior probability as the bit value of the k-th column of HI1v[1][1].

In the case where m is greater than or equal to 3, the second hard decision candidate generating unit 222 generates HI0v[2:m−1][1] and HI1v[2:m−1][1] each of which is hard decision candidate bit array information of m−2 rows and N1 columns, by using Y[1][1:N1] that is the first reception modulation symbol group information, on the basis of the first symbol mapping rule.

A bit value of the k-th column of HI0v[2:m−1][1] is a hard decision value obtained by performing hard decision on the value of Y[1][k] in a case where the bit value of B[m][1][k] that is the LSB of B[1:m][1][k] that is a combination of bit values corresponding to X[1][k] corresponding to Y[1][k] is "0".

Specifically, for example, the second hard decision candidate generating unit 222 determines the bit value of the k-th column of HI0v[2:m−1][1] on the basis of the first symbol mapping rule indicated in FIG. 4A.

More specifically, in a case where the bit value of B[m][1][k] is "0", referring to the first symbol mapping rule indicated in FIG. 4A, X[1][k] can take any one of eight values of −15, −11, −7, −3, 1, 5, 9, and 13. The second hard decision candidate generating unit 222 compares the above-described eight values with the value of Y[1][k], and determines that the value of X[1][k] having the maximum posterior probability among the above-described eight values is the value of Y[1][k]. The second hard decision candidate generating unit 222 generates HI0v[2:m−1][1] by setting B[2:m−1][1][k] as bit values of the k-th column of HI0v[2:m−1][1] of B[1: m][1][k] that is a combination of bit values corresponding to the value of X[1][k] having the maximum posterior probability.

Similarly, a bit value of the k-th column of HI1v[2:m−1][1] is a hard decision value obtained by performing hard decision on the value of Y[1][k] in a case where the bit value of B[m][1][k] that is the LSB of B[1:m][1][k] that is a combination of bit values corresponding to X[1][k] corresponding to Y[1][k] is "1".

Specifically, for example, the second hard decision candidate generating unit 222 determines a bit value of the k-th column of HI1v[2:m−1][1] on the basis of the first symbol mapping rule indicated in FIG. 4A.

More specifically, in a case where the bit value of B[m][1][k] is "1", referring to the first symbol mapping rule indicated in FIG. 4A, X[1][k] can take any one of eight values of −13, −9, −5, −1, 3, 7, 11, and 15. The second hard decision candidate generating unit 222 compares the above-described eight values with the value of Y[1][k], and determines that the value of X[1][k] having the maximum posterior probability among the above-described eight values is the value of Y[1][k]. The second hard decision candidate generating unit 222 generates HI1v[2:m−1][1] by setting B[2:m−1][1][k] as bit values of the k-th column of HI1v[2:m−1][1] of B[1:m][1][k] that is a combination of bit values corresponding to the value of X[1][k] having the maximum posterior probability.

In the case where m is greater than or equal to 3, the third hard decision candidate generating unit 223 generates HI0v[2:m−1][2] and HI1v[2:m−1][2] each of which is hard decision candidate bit array information of m−2 rows and N2 columns, by using Y[2] that is the second reception modulation symbol group information, on the basis of the second symbol mapping rule.

A bit value of the k-th column of HI0v[2:m−1][2] is a hard decision value obtained by performing hard decision on the value of Y[2][k] in a case where the bit value of B[m][2][k] that is the LSB of B[1:m][2][k] that is a combination of bit values corresponding to X[2][k] corresponding to Y[2][k] is "0".

Specifically, for example, the third hard decision candidate generating unit 223 determines a bit value of the k-th column of HI0v[2:m−1][2] on the basis of the second symbol mapping rule indicated in FIG. 4B.

More specifically, in a case where the bit value of B[m][2][k] is "0", referring to the second symbol mapping rule indicated in FIG. 4B, X[2][k] can take any one of eight values of −13, −9, −5, −1, 1, 5, 9, and 13. The third hard decision candidate generating unit 223 compares the above-described eight values with the value of Y[2][k], and determines that the value of X[2][k] having the maximum posterior probability among the above-described eight values is the value of Y[2][k]. The third hard decision candidate generating unit 223 generates HI0v[2:m−1][2] by setting B[2:m−1][2][k] as the bit value of the k-th column of HI0v[2:m−1][2] of B[1: m][2][k] that is a combination of bit values corresponding to the value of X[2][k] having the maximum posterior probability.

Similarly, a bit value of the k-th column of HI1v[2:m−1][2] is a hard decision value obtained by performing hard decision on the value of Y[2][k] in a case where the bit value of B[m][2][k] that is the LSB of B[1:m][2][k] that is a combination of bit values corresponding to X[2][k] corresponding to Y[2][k] is "1".

Specifically, for example, the third hard decision candidate generating unit 223 determines a bit value of the k-th column of HI1v[2:m−1][2] on the basis of the second symbol mapping rule indicated in FIG. 4B.

More specifically, in a case where the bit value of B[m][2][k] is "1", referring to the second symbol mapping rule indicated in FIG. 4B, X[2][k] can take any one of eight values of −15, −11, −7, −5, 3, 7, 11, and 15. The third hard decision candidate generating unit 223 compares the above-described eight values with the value of Y[2][k], and determines that the value of X[2][k] having the maximum posterior probability among the above-described eight values is the value of Y[2][k]. The third hard decision candidate generating unit 223 generates HI1v[2:m−1][2] by setting B[2:m−1][2][k] that is the LSB of B[1:m][2][k] that is a combination of bit values corresponding to the value of X[2][k] having the maximum posterior probability as the bit value of the k-th column of HI1v[2:m−1][2].

The soft decision information generating unit 230 generates a first posterior L value sequence, a second posterior L value sequence, and a third posterior L value sequence that are posterior L value sequences in which posterior L values are arranged, on the basis of the reception modulation symbol group information generated by the reception modulation symbol group information generating unit 210.

Specifically, for example, the soft decision information generating unit 230 includes a first soft decision information generating unit 231 to generate the first posterior L value sequence, a second soft decision information generating unit 232 to generate the second posterior L value sequence, and a third soft decision information generating unit 233 to generate the third posterior L value sequence.

The posterior L value is a posterior logarithmic probability ratio, and the posterior L value is calculated on the basis of a value indicated by Y[1:2][k] that is a reception PAM symbol.

Specifically, the posterior L value is a logarithmic value of a ratio between a posterior probability that a target bit value is "0" and a posterior probability that the target bit value is "1", of B[1:m][1][k] or B[1:m][2][k] that is a combination of bit values corresponding to X[1][k] or X[1][k] corresponding to Y[1][k] or Y[2][k], that is, a soft decision value. The posterior L value is expressed by a combination of a plurality of bit values of about three bits to six bits.

For example, in a case where the posterior L value is a positive value, the hard decision value of the target bit is "0", and in a case where the posterior L value is a negative value, the hard decision value of the target bit is "1".

The magnitude of the absolute value of the posterior L value indicates a degree of reliability when hard decision of the target bit is performed.

The soft decision information generating unit 230 generates a posterior L value sequence by calculating a posterior L value corresponding to a target bit for each reception PAM symbol.

The first soft decision information generating unit 231 generates the first posterior L value sequence in which N2 posterior L values are arranged by calculating a posterior L value for each reception PAM symbol on the basis of a value indicated by the reception PAM symbol belonging to the second reception modulation symbol group information.

Specifically, a posterior L value of the k-th column in the first posterior L value sequence generated by the first soft decision information generating unit 231 corresponds to B[1][2][k] that is the MSB of B[1:m][2][k] that is a combination of bit values corresponding to X[2][k] corresponding to Y[2][k].

Hereinafter, the first posterior L value sequence is expressed as Lv[1][2], and the k-th posterior L value of Lv[1][2] that is the first posterior L value sequence is expressed as L[1][2][k].

That is, the k-th posterior L value L[1][2][k] of Lv[1][2] that is the first posterior L value sequence corresponds to B[1][2][k] of B[1:m][2][k] that is a combination of bit values corresponding to X[2][k] corresponding to Y[2][k].

The second soft decision information generating unit 232 generates the second posterior L value sequence in which N1 posterior L values are arranged by calculating a posterior L value for each reception PAM symbol on the basis of a value indicated by the reception PAM symbol belonging to the first reception modulation symbol group information.

Specifically, a posterior L value of the k-th column in the second posterior L value sequence generated by the second soft decision information generating unit 232 corresponds to B[m][1][k] that is the LSB of B[1:m][1][k] that is a combination of bit values corresponding to X[1][k] corresponding to Y[1][k].

Hereinafter, the second posterior L value sequence is expressed as Lv[m][1], and the k-th posterior L value of Lv[m][1] that is the second posterior L value sequence is expressed as L[m][1][k].

That is, the k-th posterior L value L[m][1][k] of Lv[m][1] that is the second posterior L value sequence corresponds to B[m][2][k] of B[1:m][1][k] that is a combination of bit values corresponding to X[1][k] corresponding to Y[1][k].

The third soft decision information generating unit 233 generates the third posterior L value sequence in which N2 posterior L values are arranged by calculating a posterior L value for each reception PAM symbol on the basis of a value indicated by the reception PAM symbol belonging to the second reception modulation symbol group information.

Specifically, a posterior L value of the k-th column in the third posterior L value sequence generated by the third soft decision information generating unit 233 corresponds to B[m][1][k] that is the LSB of B[1:m][2][k] that is a combination of bit values corresponding to X[2][k] corresponding to Y[2][k].

Hereinafter, the third posterior L value sequence is expressed as Lv[m][2], and the k-th posterior L value of Lv[m][2] that is the third posterior L value sequence is expressed as L[m][2][k].

That is, the k-th posterior L value L[m][2][k] of Lv[m][2] that is the third posterior L value sequence corresponds to B[m][2][k] of B[1:m][2][k] that is a combination of bit values corresponding to X[2][k] corresponding to Y[2][k].

The decoding unit 240 generates output information by performing multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230.

Details of the decoding unit 240 will be described later.

The information output unit 290 outputs the output information generated by the decoding unit 240.

A configuration of a main part of the decoding unit 240 according to the first embodiment will be described with reference to FIG. 8.

Figure 8:
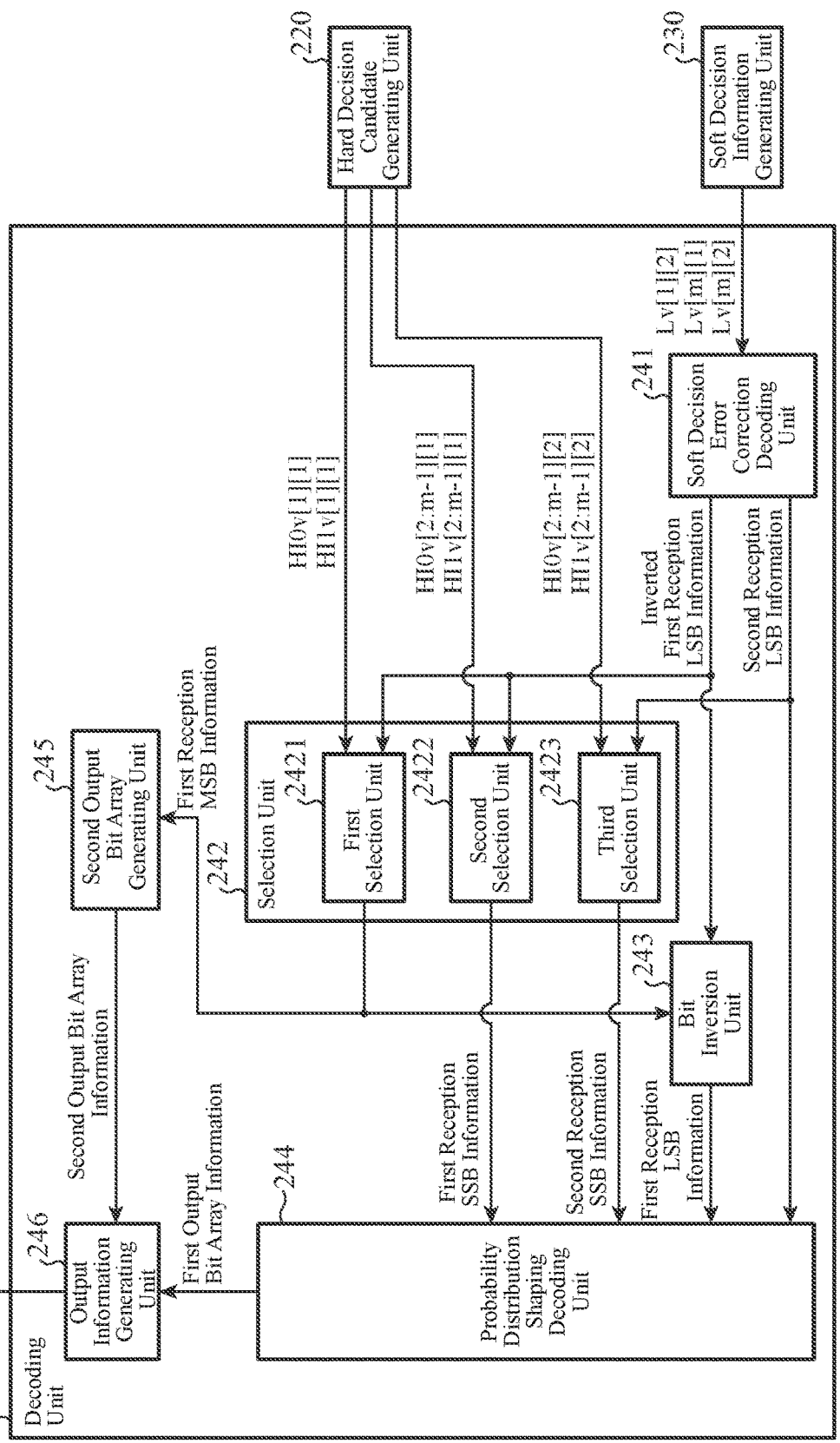
FIG. 8 is a configuration diagram illustrating an example of a configuration of a main part of a decoding unit according to the first embodiment.

FIG. 8 is a configuration diagram illustrating an example of the configuration of the main part of the decoding unit 240 according to the first embodiment.

The decoding unit 240 includes a soft decision error correction decoding unit 241, a selection unit 242, a reception side bit inversion unit 243, a probability distribution shaping decoding unit 244, a second output bit array generating unit 245, and an output information generating unit 246.

The soft decision error correction decoding unit 241 performs first decoding processing in the multi-stage error correction processing.

Specifically, the soft decision error correction decoding unit 241 performs soft decision error correction processing by using the first posterior L value sequence, the second posterior L value sequence, and the third posterior L value sequence.

The soft decision error correction decoding unit 241 generates inverted first reception LSB information including a bit array of one row and N1 columns corresponding to the inverted first LSB information generated by the bit inversion unit 123 by performing the soft decision error correction processing.

In addition, the soft decision error correction decoding unit 241 generates second reception LSB information including a bit array of one row and N2 columns corresponding to the second LSB information generated by the probability distribution shaping encoding unit 122 by performing the soft decision error correction processing.

A method of performing the soft decision error correction processing by using the posterior L value sequence is known, and thus detailed description of the method will be omitted.

The selection unit 242 performs second decoding processing in the multi-stage error correction processing.

Specifically, for example, a first selection unit 2421, a second selection unit 2422, and a third selection unit 2423 are included.

The first selection unit 2421 generates first reception MSB information including a bit array of one row and N1 columns corresponding to the first MSB information on the basis of the first hard decision candidate bit array information and the inverted first reception LSB information.

Specifically, in a case where a bit value of the k-th column in the inverted first reception LSB information generated by the soft decision error correction decoding unit 241 is "0", the first selection unit 2421 selects HI0v[1][1] out of HI0v[1][1] and HI1v[1][1] each being the first hard decision candidate bit array information generated by the first hard decision candidate generating unit 221. The first selection unit 2421 substitutes the bit value of the k-th column of HI0v[1][1] for a bit of the k-th column of the first reception MSB information.

In addition, in a case where the bit value of the k-th column in the inverted first reception LSB information generated by the soft decision error correction decoding unit 241 is "1", the first selection unit 2421 selects HI1v[1][1] out of HI0v[1][1] and HI1v[1][1] each being the first hard decision candidate bit array information generated by the first hard decision candidate generating unit 221. Further, the first selection unit 2421 substitutes the bit value of the k-th column of HI1v[1][1] for the bit of the k-th column of the first reception MSB information.

The first selection unit 2421 generates the first reception MSB information by substituting a bit value of a column of HI0v[1][1] or HI1v[1][1] corresponding to a column of the first reception MSB information for each column of the first reception MSB information.

In the case where m is greater than or equal to 3, the second selection unit 2422 generates first reception SSB information including a bit array of m−2 rows and N1 columns corresponding to the first SSB information on the basis of the second hard decision candidate bit array information and the inverted first reception LSB information.

Specifically, in the case where the bit value of the k-th column in the inverted first reception LSB information generated by the soft decision error correction decoding unit 241 is "0", the second selection unit 2422 selects HI0v[2:m−1][1] out of HI0v[2:m−1][1] and HI1v[2:m−1][1] each being the second hard decision candidate bit array information generated by the second hard decision candidate generating unit 222. The second selection unit 2422 substitutes each of m−2 bit values of the k-th column of HI0v[2:m−1][1] for each of m−2 bits of the k-th column of the first reception SSB information.

In addition, in the case where the bit value of the k-th column in the inverted first reception LSB information generated by the soft decision error correction decoding unit 241 is "1", the second selection unit 2422 selects HI1v[2:m−1][1] out of HI0v[2:m−1][1] and HI1v[2:m−1][1] each being the second hard decision candidate bit array information generated by the second hard decision candidate generating unit 222. The second selection unit 2422 substitutes each of m−2 bit values of the k-th column of HI1v[2:m−1][1] for each of m−2 bits of the k-th column of the first reception SSB information.

The second selection unit 2422 generates the first reception SSB information by substituting a bit value of a column of HI0v[2:m−1][1] or HI1v[2:m−1][1] corresponding to a column of the first reception SSB information for each column of the first reception SSB information.

In the case where m is greater than or equal to 3, the third selection unit 2423 generates second reception SSB information including a bit array of m−2 rows and N2 columns corresponding to the second SSB information on the basis of the third hard decision candidate bit array information and the second reception LSB information.

Specifically, in a case where a bit value of the k-th column in the second reception LSB information generated by the soft decision error correction decoding unit 241 is "0", the third selection unit 2423 selects HI0v[2:m−1][2] out of HI0v[2:m−1][2] and HI1v[2:m−1][2] each being the third hard decision candidate bit array information generated by the third hard decision candidate generating unit 223. The third selection unit 2423 substitutes each of m−2 bit values of the k-th column of HI0v[2:m−1][2] for each of m−2 bits of the k-th column of the second reception SSB information.

In addition, in a case where the bit value of the k-th column in the second reception LSB information generated by the soft decision error correction decoding unit 241 is "1", the third selection unit 2423 selects HI1v[2:m−1][2] out of HI0v[2:m−1][2] and HI1v[2:m−1][2] each being the third hard decision candidate bit array information generated by the third hard decision candidate generating unit 223. The third selection unit 2423 substitutes each of m−2 bit values of the k-th column of HI1v[2:m−1][2] for each of m−2 bits of the k-th column of the second reception SSB information.

The third selection unit 2423 generates the second reception SSB information by substituting a bit value of a column of HI0v[2:m−1][2] or HI1v[2:m−1][2] corresponding to a column of the second reception SSB information for each column of the second reception SSB information.

As described above, HI0v[1][1] and HI0v[1][1], HI0v[2:m−1][1] and HI0v[2:m−1][1], and HI0v[2:m−1][2] and HI0v[2:m−1][2] are generated by the hard decision candidate generating unit 220 by performing case classification between a case where the bit value of B[m][1:2][k] is "0" and a case where the bit value is "1".

For example, in a case where the first symbol mapping rule and the second symbol mapping rule are the first symbol mapping rule and the second symbol mapping rule indicated in FIG. 4 as examples of the first symbol mapping rule and the second symbol mapping rule, in the same symbol mapping rule, the minimum Euclidean distance between two PAM symbols adjacent to each other is "2", whereas the minimum Euclidean distance in the case of performing the case classification as described above is "4" that is twice as large. When the Euclidean distance is doubled, the SNR is improved by four times that is $2^2$ times.

Thus, by performing the case classification as described above, as compared with a case where the case classification is not performed, accuracy of determination of the bit value selected when the selection unit 242 substitutes the bit value of the first reception MSB information, the first reception SSB information, or the second reception SSB information can be improved by four times.

The reception side bit inversion unit 243 performs third decoding processing in the multi-stage error correction processing.

Specifically, the reception side bit inversion unit 243 generates the first reception LSB information corresponding to the first LSB information by calculating exclusive ORs of bit values of each columns in the inverted first reception LSB information generated by the soft decision error correction decoding unit 241 and each bit values of each columns in the first reception MSB information generated by the first selection unit 2421 each corresponding to the columns in the inverted first reception LSB information.

The probability distribution shaping decoding unit 244 performs fourth decoding processing in the multi-stage error correction processing.

Specifically, the probability distribution shaping decoding unit 244 generates first output bit array information including a bit array of m−1 rows and N columns corresponding to the first input bit array information by performing probability distribution shaping decoding processing on the first reception SSB information generated by the second selection unit 2422, the second reception SSB information generated by the third selection unit 2423, the first reception LSB information generated by the reception side bit inversion unit 243, and the second reception LSB information generated by the soft decision error correction decoding unit 241.

Specifically, for example, the probability distribution shaping decoding unit 244 prepares DRv[1:m−1][1:2] that is a bit array space of m−1 rows and N columns including DRv[1:m−1][1] that is a bit array space of m−1 rows and N1 columns and DRv[1:m−1][2] that is a bit array space of m−1 rows and N2 columns.

In the following description, a bit value of the k-th column of DRv[1:m−1][1] is denoted as "BR[1:m−1][1][1(]", and a bit value of the k-th column of DRv[1:m−1][2] is denoted as "BR[1:m−1][2][k]".

The probability distribution shaping decoding unit 244 stores the first reception SSB information in DRv[1:m−2][1], stores the second reception SSB information in DRv[1:m−2][2], stores the first reception LSB information in DRv[m−1][1], and stores the second reception LSB information in DRv[m−1][2].

The probability distribution shaping decoding unit 244 performs the probability distribution shaping decoding processing on BR[1:m−1][1:2][k].

The probability distribution shaping decoding unit 244 overwrites BR[1:m−1][1:2][k] with a processing result of the probability distribution shaping decoding processing.

BR[1:m−1][1:2][k] after the probability distribution shaping decoding unit 244 overwrites BR[1:m−1][1:2][k] with the processing result of the probability distribution shaping decoding processing is the first output bit array information.

Note that, the probability distribution shaping decoding processing is processing paired with the probability distribution shaping encoding processing, and a method of performing the probability distribution shaping decoding processing is known, and thus detailed description of the method will be omitted.

The second output bit array generating unit 245 performs fifth decoding processing in the multi-stage error correction processing.

Specifically, the second output bit array generating unit 245 generates second output bit array information including a bit array of one row and N3 columns corresponding to the second input bit array information by extracting information of an area corresponding to the second input bit array in the first MSB information, of the first reception MSB information.

The output information generating unit 246 performs sixth decoding processing in the multi-stage error correction processing.

Specifically, the output information generating unit 246 generates the output information corresponding to the input information on the basis of the first output bit array information and the second output bit array information.

A hardware configuration of the main part of the error correction device 200 according to the first embodiment will be described with reference to FIG. 9.

Figure 9A:
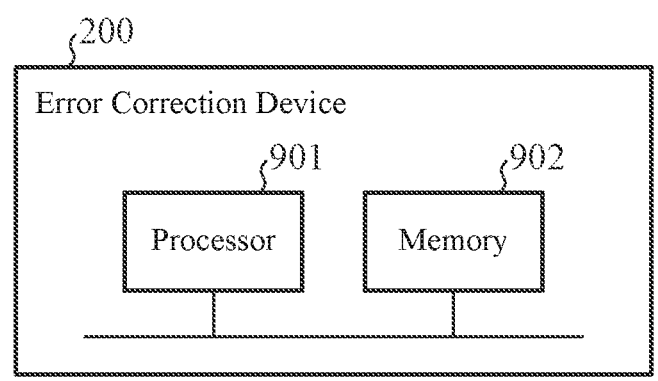
FIGS. 9A and 9B are diagrams illustrating examples of a hardware configuration of the error correction device according to the first embodiment.
Figure 9B:
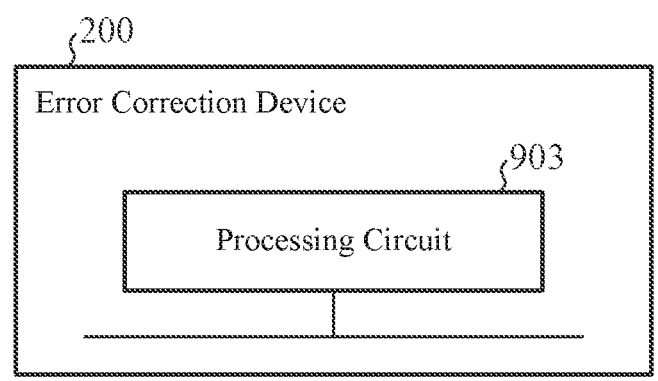

FIGS. 9A and 9B are diagrams illustrating examples of a hardware configuration of the error correction device 200 according to the first embodiment.

As illustrated in FIG. 9A, the error correction device 200 includes a computer, and the computer includes a processor 901 and a memory 902. The memory 902 stores a program for causing the computer to function as the reception modulation symbol group information generating unit 210, the hard decision candidate generating unit 220, the soft decision information generating unit 230, the decoding unit 240, and the information output unit 290. The processor 901 reads and executes the program stored in the memory 902, whereby functions of the reception modulation symbol group information generating unit 210, the hard decision candidate generating unit 220, the soft decision information generating unit 230, the decoding unit 240, and the information output unit 290 are implemented.

In addition, as illustrated in FIG. 9B, the error correction device 200 may include a processing circuit 903. In this case, the functions of the reception modulation symbol group information generating unit 210, the hard decision candidate generating unit 220, the soft decision information generating unit 230, the decoding unit 240, and the information output unit 290 may be implemented by the processing circuit 903.

In addition, the error correction device 200 may include the processor 901, the memory 902, and the processing circuit 903 (not illustrated). In this case, some of the functions of the reception modulation symbol group information generating unit 210, the hard decision candidate generating unit 220, the soft decision information generating unit 230, the decoding unit 240, and the information output unit 290 may be implemented by the processor 901 and the memory 902, and remaining functions may be implemented by the processing circuit 903.

Note that, the processor 901, the memory 902, and the processing circuit 903 are similar to the processor 501, the memory 502, and the processing circuit 503 illustrated in FIG. 5, and thus description thereof will be omitted.

Operation of the error correction device 200 according to the first embodiment will be described with reference to FIGS. 10A, 10B, and 10C.

Figure 10A:
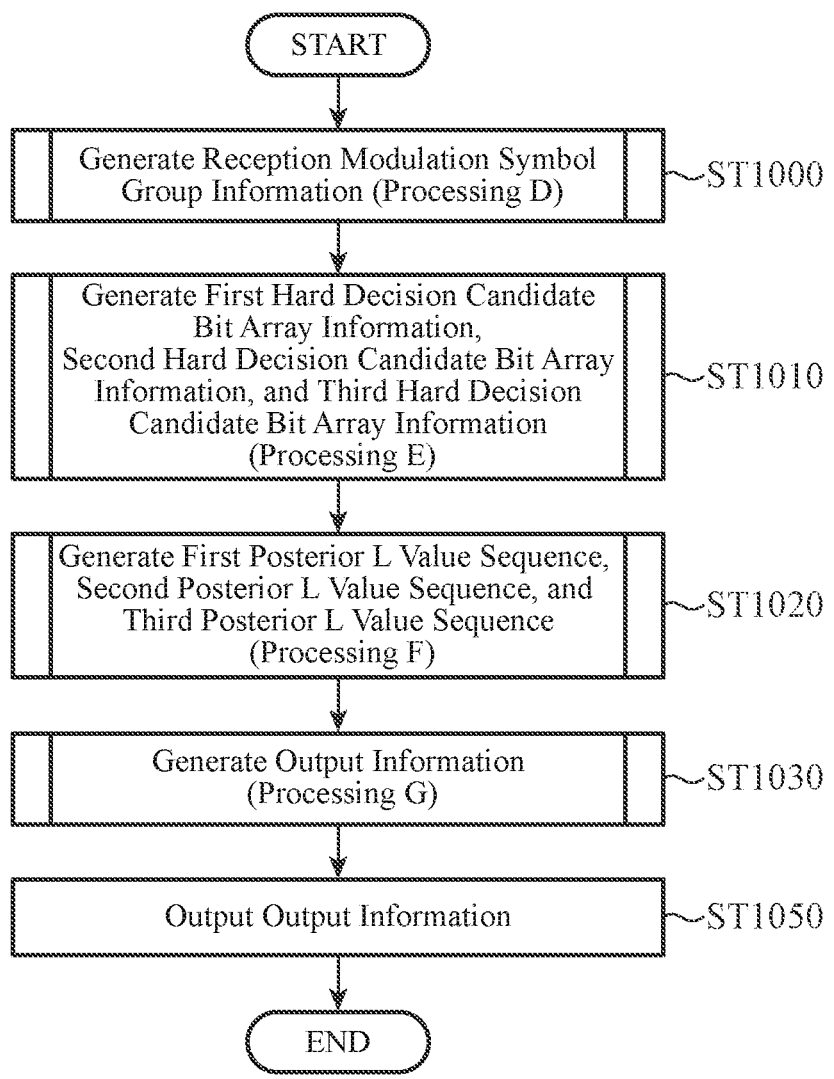
FIG. 10A is a part of a flowchart illustrating an example of processing performed by the error correction device according to the first embodiment.

FIG. 10A is a part of a flowchart illustrating an example of processing performed by the error correction device 200 according to the first embodiment.

Figure 10B:
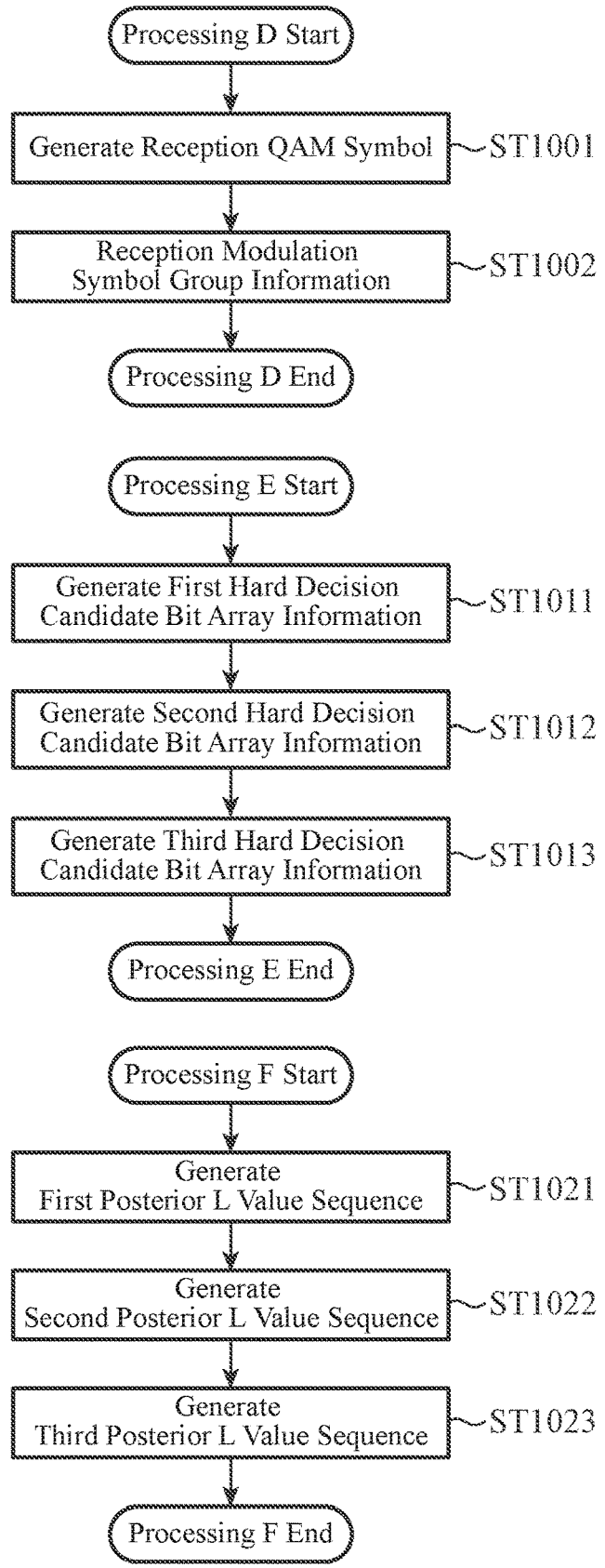
FIG. 10B is another part of the flowchart illustrating the example of the processing performed by the error correction device according to the first embodiment.

FIG. 10B is another part of the flowchart illustrating the example of the processing performed by the error correction device 200 according to the first embodiment.

FIG. 10C is a remaining part of the flowchart illustrating the example of the processing performed by the error correction device 200 according to the first embodiment.

Hereinafter, FIGS. 10A, 10B, and 10C are collectively denoted as FIG. 10.

The error correction device 200 repeatedly executes the processing of the flowchart illustrated in FIG. 10.

First, in step ST1000, the reception modulation symbol group information generating unit 210 generates the reception modulation symbol group information.

Specifically, the reception modulation symbol group information generating unit 210 performs processing of step ST1000 by performing processing from step ST1001 to step ST1002 in processing D below.

In step ST1001, the reception polarization multiplexing symbol generating unit 211 included in the reception modulation symbol group information generating unit 210 generates the reception QAM symbol.

Next, in step ST1002, the reception modulation symbol generating unit 212 included in the reception modulation symbol group information generating unit 210 generates the reception modulation symbol group information.

After step ST1002, the reception modulation symbol group information generating unit 210 ends the processing D. That is, after step ST1002, the reception modulation symbol group information generating unit 210 ends the processing of step ST1000.

After step ST1000, in step ST1010, the hard decision candidate generating unit 220 generates the first hard decision candidate bit array information, the second hard decision candidate bit array information, and the third hard decision candidate bit array information.

Specifically, the hard decision candidate generating unit 220 performs processing of step ST1010 by performing processing from step ST1011 to step ST1013 in processing E below.

In step ST1011, the first hard decision candidate generating unit 221 included in the hard decision candidate generating unit 220 generates the first hard decision candidate bit array information.

Next, in step ST1012, the second hard decision candidate generating unit 222 included in the hard decision candidate generating unit 220 generates the second hard decision candidate bit array information.

Next, in step ST1013, the third hard decision candidate generating unit 223 included in the hard decision candidate generating unit 220 generates the third hard decision candidate bit array information.

Note that, the order of the processing from step ST1011 to step ST1013 is any order.

After step ST1013, the hard decision candidate generating unit 220 ends the processing E. That is, after step ST1013, the hard decision candidate generating unit 220 ends the processing of step ST1010.

After step ST1010, in step ST1020, the soft decision information generating unit 230 generates the first posterior L value sequence, the second posterior L value sequence, and the third posterior L value sequence.

Specifically, the soft decision information generating unit 230 performs processing of step ST1020 by performing processing from step ST1021 to step ST1023 in processing F below.

In step ST1021, the first soft decision information generating unit 231 included in the soft decision information generating unit 230 generates the first posterior L value sequence.

Next, in step ST1022, the second soft decision information generating unit 232 included in the soft decision information generating unit 230 generates the second posterior L value sequence.

Next, in step ST1023, the third soft decision information generating unit 233 included in the soft decision information generating unit 230 generates the third posterior L value sequence.

After step ST1023, the soft decision information generating unit 230 ends the processing F. That is, after step ST1023, the soft decision information generating unit 230 ends the processing of step ST1020.

Note that the order of the processing from step ST1021 to step ST1023 is any order.

In addition, the processing order of the processing of step ST1010 and the processing of step ST1020 is any order.

After step ST1020, in step ST1030, the decoding unit 240 generates the output information by performing the multi-stage error correction processing.

Specifically, the decoding unit 240 performs processing of step ST1030 by performing processing from step ST1031 to step ST1036 in processing G below.

In step ST1031, the soft decision error correction decoding unit 241 included in the decoding unit 240 generates the inverted first reception LSB information and the second reception LSB information by performing the soft decision error correction processing.

Next, in step ST1032, the selection unit 242 included in the decoding unit 240 generates the first reception MSB information, the first reception SSB information, and the second reception SSB information.

Specifically, the selection unit 242 performs processing of step ST1032 by performing processing from step ST1041 to step ST1043 in processing H below.

In step ST1041, the first selection unit 2421 included in the selection unit 242 generates the first reception MSB information.

Next, in step ST1042, the second selection unit 2422 included in the selection unit 242 generates the first reception SSB information.

Next, in step ST1043, the third selection unit 2423 included in the selection unit 242 generates the second reception SSB information.

After step ST1043, the selection unit 242 included in the decoding unit 240 ends the processing H. That is, after step ST1043, the selection unit 242 included in the decoding unit 240 ends the processing of step ST1032.

Note that, the order of the processing from step ST1041 to step ST1043 is any order.

After step ST1032, in step ST1033, the second output bit array generating unit 245 included in the decoding unit 240 generates the first reception LSB information.

Next, in step ST1034, the probability distribution shaping decoding unit 244 included in the decoding unit 240 generates the first output bit array information.

Next, in step ST1035, the second output bit array generating unit 245 included in the decoding unit 240 generates the second output bit array information.

Next, in step ST1036, the output information generating unit 246 included in the decoding unit 240 generates the output information.

After step ST1036, the decoding unit 240 ends the processing G. That is, after step ST1036, the decoding unit 240 ends the processing of step ST1030.

After step ST1030, in step ST1050, the information output unit 290 outputs the output information.

After step ST1050, the error correction device 200 ends the processing of the flowchart illustrated in FIG. 10, and the error correction device 200 returns to the processing of step ST1000 and repeatedly executes the processing of the flowchart illustrated in FIG. 10.

As described above, the error correction encoding device 100 includes: the input information acquiring unit 110 to acquire the input information; the encoding unit 120 to generate the soft decision error correction frame information including the bit array of m rows and N columns on the basis of the input information acquired by the input information acquiring unit 110, the bit array being obtained by combining the first bit string group information and the second bit string group information, the first bit string group information including the bit array of m rows and N1 columns in which it is enabled to perform the pulse amplitude modulation of the combination of bit values of each column of the first bit string group information into the modulation symbol by using the predetermined first symbol mapping rule, the second bit string group information including the bit array of m rows and N2 columns in which it is enabled to perform the pulse amplitude modulation of the combination of bit values of each column of the second bit string group information into the modulation symbol by using the predetermined second symbol mapping rule; the modulation symbol conversion unit 130 to generate the modulation symbol group information including N pieces of the modulation symbols by performing the pulse amplitude modulation of the combination of bit values of each column of the soft decision error correction frame information generated by the encoding unit 120 into the modulation symbol for each column of the soft decision error correction frame information by using the first symbol mapping rule or the second symbol mapping rule; and the transmission waveform shaping unit 140 to generate the digital baseband modulation signal on the basis of the modulation symbol group information generated by the modulation symbol conversion unit 130 and output the digital baseband modulation signal generated, in which the encoding unit 120 generates the soft decision error correction frame information by: generating the first input bit array information including the bit array of m−1 rows and N columns and the second input bit array information including the bit array of one row and N3 columns on the basis of the input information acquired by the input information acquiring unit 110; storing the second input bit array information generated as a part of the first MSB information including the bit array of one row and N1 columns in the predetermined area of the first row in the first bit string group information; generating the shaped bit array information including the bit array of m−1 rows and N columns by performing the probability distribution shaping encoding processing on the first input bit array information generated; generating the first group bit array information including the combination of N1 predetermined columns and the second group bit array information including the combination of N2 predetermined columns by separating the shaped bit array information generated; generating the first LSB information including the bit array of one row and N1 columns by extracting, from the first group bit array information generated, the bit array of the (m−1)-th row in the first group bit array information, generating the inverted first LSB information including the bit array of one row and N1 columns by calculating exclusive ORs of bit values of each columns in the first LSB information generated and each bit values of each columns in the information of the first row in the first bit string group information after storing the second input bit array information, the columns in the information of the first row in the first bit string group information each corresponding to the columns in the first LSB information, and storing the inverted first LSB information generated in the m-th row in the first bit string group information; generating the second LSB information including the bit array of one row and N2 columns by extracting the bit array of the (m−1)-th row in the second group bit array information from the second group bit array information generated, and storing the second LSB information generated in the m-th row in the second bit string group information; generating the soft decision parity bit by performing the systematic soft decision error correction encoding processing by using the inverted first LSB information generated and the second LSB information generated, and storing the soft decision parity bit generated, in the first row in the second bit string group information as the second MSB information including the bit array of one row and N2 columns; in the case where m is greater than or equal to 3, generating the first SSB information including the bit array of m−2 rows and N1 columns by extracting, from the first group bit array information generated, the first row to the (m−2)-th row in the first group bit array information, and storing the first SSB information generated, in the second row to the (m−1)-th row in the first bit string group information; and in the case where m is greater than or equal to 3, generating the second SSB information including the bit array of m−2 rows and N2 columns by extracting, from the second group bit array information generated, the first row to the (m−2)-th row in the second group bit array information, and storing the second SSB information generated, in the second row to the (m−1)-th row in the second bit string group information.

With this configuration, the error correction encoding device 100 can reduce the number of bits to be protected by the soft decision error correction as compared with the conventional soft decision error correction encoding processing. For that reason, the error correction encoding device 100 can reduce the amount of calculation of the soft decision error correction encoding processing as compared with the conventional soft decision error correction encoding processing.

In addition, with this configuration, the error correction encoding device 100 can make the number of bits to be protected by the soft decision error correction constant even if the number of bits of the pulse amplitude modulation changes. For that reason, the error correction encoding device 100 can make the amount of calculation of the soft decision error correction encoding processing constant in the pulse amplitude modulation of any number of bits. Thus, the error correction encoding device 100 does not need to change the program or the processing circuit for performing the soft decision error correction encoding processing for each number of bits of the pulse amplitude modulation, in the pulse amplitude modulation of a plurality of number of bits.

In addition, as described above, in the above-described configuration, the error correction encoding device 100 is configured to use a symbol mapping rule such as: the first symbol mapping rule is a symbol mapping rule in which one combination of bit values including a bit array of m rows and one column corresponds to one of the modulation symbols subjected to one-dimensional pulse amplitude modulation, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols are adjacent to each other; and the second symbol mapping rule is a symbol mapping rule in which one combination of bit values including a bit array of m rows and one column corresponds to one of the modulation symbols subjected to one-dimensional pulse amplitude modulation, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols have an identical sign and are adjacent to each other, and are identical values between the modulation symbol of which an absolute vale of an amplitude value of the modulation symbol is minimum among the modulation symbols in which the amplitude values of the modulation symbols are positive and the modulation symbol of which an absolute value of an amplitude value of the modulation symbol is minimum among the modulation symbols in which the amplitude values of the modulation symbols are negative.

With this configuration, the error correction encoding device 100 can improve the SNR. Thus, the error correction encoding device 100 can improve the accuracy of determination of the bit value in the error correction device 200.

In addition, as described above, in the above-described configuration, the error correction encoding device 100 is configured so that the encoding unit 120 generates the first input bit array information and the second input bit array information by setting a bit value of a bit other than a bit corresponding to the input information to 0 in the first input bit array information or the second input bit array information when generating the first input bit array information and the second input bit array information on the basis of the input information acquired by the input information acquiring unit 110.

With this configuration, the error correction encoding device 100 can generate the soft decision error correction frame information for the input information having any number of bits.

Note that, the error correction encoding device 100 may include the soft decision parity bit generated by the soft decision error correction encoding unit 124 performing the systematic soft decision error correction encoding processing in other soft decision error correction frame information different from the soft decision error correction frame information instead of the soft decision error correction frame information including the inverted first LSB information and the second LSB information used to generate the soft decision parity bit. For example, the other soft decision error correction frame information is soft decision error correction frame information generated by the error correction encoding device 100 next to the soft decision error correction frame information including the inverted first LSB information and the second LSB information used by the error correction encoding device 100 to generate the soft decision parity bit.

With this configuration, the error correction encoding device 100 can disperse a burst error occurring in the transmission path 30. The burst error mentioned here is an error that occurs in a concentrated manner in a specific portion of a signal due to a change of the transmission path 30 when the signal is transmitted via the transmission path 30. The error correction encoding device 100 can reduce deterioration of information after the error correction by dispersing the burst error.

As described above, the error correction device 200 includes: the reception modulation symbol group information generating unit 210 to receive the reception digital baseband modulation signal that is the signal based on the soft decision error correction frame information generated by the error correction encoding device 100 and generate reception modulation symbol group information including N reception modulation symbols on the basis of the reception digital baseband modulation signal; the hard decision candidate generating unit 220 to generate first hard decision candidate bit array information including the bit array of one row and N1 columns, second hard decision candidate bit array information including the bit array of m−2 rows and N1 columns in the case where m is greater than or equal to 3, and third hard decision candidate bit array information including the bit array of m−2 rows and N2 columns in the case where m is greater than or equal to 3, by using the reception modulation symbol group information generated by the reception modulation symbol group information generating unit 210 on the basis of the first symbol mapping rule or the second symbol mapping rule; the soft decision information generating unit 230 to generate the first posterior L value sequence including N2 posterior L values corresponding to each columns of the first row of the second bit string group information, the second posterior L value sequence including N1 posterior L values corresponding to each columns of the m-th row of the first bit string group information, and the third posterior L value sequence including N2 posterior L values corresponding to each columns of the m-th row of the second bit string group information on the basis of the reception modulation symbol group information generated by the reception modulation symbol group information generating unit 210; the decoding unit 240 to perform multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230; and the information output unit 290 to output information generated by the decoding unit 240 performing the multi-stage error correction processing as output information, in which: in the first decoding processing in the multi-stage error correction processing, the decoding unit 240 generates inverted first reception LSB information including the bit array of one row and N1 columns corresponding to the inverted first LSB information and second reception LSB information including the bit array of one row and N2 columns corresponding to the second LSB information by performing soft decision error correction processing on the basis of the first posterior L value sequence, the second posterior L value sequence, and the third posterior L value sequence; in the second decoding processing in the multi-stage error correction processing, the decoding unit 240 generates first reception MSB information including the bit array of one row and N1 columns corresponding to the first MSB information on the basis of the first hard decision candidate bit array information and the inverted first reception LSB information, generates first reception SSB information including the bit array of m−2 rows and N1 columns corresponding to the first SSB information on the basis of the second hard decision candidate bit array information and the inverted first reception LSB information in the case where m is greater than or equal to 3, and generates second reception SSB information including the bit array of m−2 rows and N2 columns corresponding to the second SSB information on the basis of the third hard decision candidate bit array information and the second reception LSB information in the case where m is greater than or equal to 3; in the third decoding processing in the multi-stage error correction processing, the decoding unit 240 generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information; in the fourth decoding processing in the multi-stage error correction processing, the decoding unit 240 generates first output bit array information including the bit array of m−1 rows and N columns corresponding to the first input bit array information by performing probability distribution shaping decoding processing on the first reception SSB information, the second reception SSB information, the first reception LSB information, and the second reception LSB information; in the fifth decoding processing in the multi-stage error correction processing, the decoding unit 240 generates second output bit array information including the bit array of one row and N3 columns corresponding to the second input bit array information by extracting information of the predetermined area of the first reception MSB information; in the sixth decoding processing in the multi-stage error correction processing, the decoding unit 240 generates the output information corresponding to the input information on the basis of the first output bit array information and the second output bit array information; and the information output unit 290 outputs the output information generated by the decoding unit 240.

With this configuration, the error correction device 200 can reduce the number of bits to be protected by the soft decision error correction as compared with the conventional soft decision error correction encoding processing. For that reason, the error correction device 200 can reduce the amount of calculation of the soft decision error correction decoding processing as compared with the conventional soft decision error correction decoding processing.

In addition, with this configuration, the error correction device 200 can make the number of bits to be protected by the soft decision error correction constant even if the number of bits of the pulse amplitude modulation changes. For that reason, the error correction device 200 can make the amount of calculation of the soft decision error correction decoding processing constant in the pulse amplitude modulation of any number of bits. Thus, the error correction device 200 does not need to change the program or the processing circuit for performing the soft decision error correction decoding processing for each number of bits of the pulse amplitude modulation, in the pulse amplitude modulation of a plurality of number of bits.

In addition, as described above, in the above-described configuration, the error correction device 200 is configured to use a symbol mapping rule such as: the first symbol mapping rule is a symbol mapping rule in which one combination of bit values including a bit array of m rows and one column corresponds to one of the modulation symbols subjected to one-dimensional pulse amplitude modulation, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols are adjacent to each other; and the second symbol mapping rule is a symbol mapping rule in which one combination of bit values including a bit array of m rows and one column corresponds to one of the modulation symbols subjected to one-dimensional pulse amplitude modulation, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols have an identical sign and are adjacent to each other, and are identical values between the modulation symbol of which an absolute vale of an amplitude value of the modulation symbol is minimum among the modulation symbols in which the amplitude values of the modulation symbols are positive and the modulation symbol of which an absolute value of an amplitude value of the modulation symbol is minimum among the modulation symbols in which the amplitude values of the modulation symbols are negative.

With this configuration, the error correction device 200 can improve the SNR. Thus, the error correction device 200 can improve the accuracy of determination of the bit value.

As described above, the soft decision error correction frame data structure of the soft decision error correction frame information generated by the error correction encoding device 100 is a soft decision error correction frame data structure used in a communication system in which the transmission device 10 transmits a signal based on input information input to the transmission device 10 to the reception device 20, and the reception device 20 receives the signal transmitted by the transmission device 10 and generates output information corresponding to the input information on the basis of the signal, the soft decision error correction frame data structure including a bit array of m rows and N columns obtained by combining first bit string group information and second bit string group information, the first bit string group information including a bit array of m rows and N1 columns in which it is enabled to perform pulse amplitude modulation of a combination of bit values of each column of the first bit string group information into a modulation symbol on the basis of a predetermined first symbol mapping rule, the second bit string group information including a bit array of m rows and N2 columns in which it is enabled to perform pulse amplitude modulation of a combination of bit values of each column of the second bit string group information into a modulation symbol on the basis of a predetermined second symbol mapping rule, in which a soft decision parity bit is stored in a first row in the second bit string group information, the soft decision parity bit being generated by performing systematic soft decision error correction encoding processing using a bit value of each column of the m-th row in the first bit string group information and a bit value of each column of the m-th row in the second bit string group information.

With such a soft decision error correction frame data structure, the error correction encoding device 100 can reduce the number of bits to be protected by the soft decision error correction as compared with the conventional soft decision error correction encoding processing. For that reason, the error correction encoding device 100 can reduce the amount of calculation of the soft decision error correction encoding processing as compared with the conventional soft decision error correction encoding processing.

In addition, with such a soft decision error correction frame data structure, the error correction encoding device 100 can make the number of bits to be protected by the soft decision error correction constant even if the number of bits of the pulse amplitude modulation changes. For that reason, the error correction encoding device 100 can make the amount of calculation of the soft decision error correction encoding processing constant in the pulse amplitude modulation of any number of bits. Thus, the error correction encoding device 100 does not need to change the program or the processing circuit for performing the soft decision error correction encoding processing for each number of bits of the pulse amplitude modulation, in the pulse amplitude modulation of a plurality of number of bits.

In addition, with such a soft decision error correction frame data structure, the error correction device 200 can reduce the number of bits to be protected by the soft decision error correction as compared with the conventional soft decision error correction encoding processing. For that reason, the error correction device 200 can reduce the amount of calculation of the soft decision error correction decoding processing as compared with the conventional soft decision error correction decoding processing.

In addition, with such a soft decision error correction frame data structure, the error correction device 200 can make the number of bits to be protected by the soft decision error correction constant even if the number of bits of the pulse amplitude modulation changes. For that reason, the error correction device 200 can make the amount of calculation of the soft decision error correction decoding processing constant in the pulse amplitude modulation of any number of bits. Thus, the error correction device 200 does not need to change the program or the processing circuit for performing the soft decision error correction decoding processing for each number of bits of the pulse amplitude modulation, in the pulse amplitude modulation of a plurality of number of bits.

In addition, the soft decision error correction frame data structure of the soft decision error correction frame information generated by the error correction encoding device 100 enables: generation of reception modulation symbol group information including N reception modulation symbols on the basis of a reception digital baseband modulation signal generated from a signal based on soft decision error correction frame information having the soft decision error correction frame data structure; generation of first hard decision candidate bit array information including a bit array of one row and N1 columns, second hard decision candidate bit array information including a bit array of m−2 rows and N1 columns in the case where m is greater than or equal to 3, and third hard decision candidate bit array information including a bit array of m−2 rows and N2 columns in the case where m is greater than or equal to 3, by using the first symbol mapping rule or the second symbol mapping rule on the basis of the reception modulation symbol group information generated; generation of the first posterior L value sequence including N2 posterior L values corresponding to each columns of the first row of the second bit string group information, the second posterior L value sequence including N1 posterior L values corresponding to each columns of the m-th row of the first bit string group information, and the third posterior L value sequence including N2 posterior L values corresponding to each columns of the m-th row of the second bit string group information on the basis of the reception modulation symbol group information generated; and error correction by performing multi-stage error correction processing on the basis of the first hard decision candidate bit array information, the second hard decision candidate bit array information, the third hard decision candidate bit array information, the first posterior L value sequence, the second posterior L value sequence, and the third posterior L value sequence generated.

In addition, in the soft decision error correction frame data structure of the soft decision error correction frame information generated by the error correction encoding device 100, it is enabled to: generate inverted first reception LSB information including a bit array of one row and N1 columns and second reception LSB information including a bit array of one row and N2 columns by performing soft decision error correction processing on the basis of the first posterior L value sequence, the second posterior L value sequence, and the third posterior L value sequence, in the first decoding processing in the multi-stage error correction processing; generate first reception MSB information including a bit array of one row and N1 columns on the basis of the first hard decision candidate bit array information and the inverted first reception LSB information, generate first reception SSB information including a bit array of m−2 rows and N1 columns on the basis of the second hard decision candidate bit array information and the inverted first reception LSB information in the case where m is greater than or equal to 3, and generate second reception SSB information including a bit array of m−2 rows and N2 columns on the basis of the third hard decision candidate bit array information and the second reception LSB information in the case where m is greater than or equal to 3, in the second decoding processing in the multi-stage error correction processing; generate first reception LSB information by calculating exclusive ORs of bit values of each columns in the inverted first reception LSB information and each bit values of each columns in the first reception MSB information each corresponding to the columns in the inverted first reception LSB information, in the third decoding processing in the multi-stage error correction processing; generate first output bit array information including a bit array of m−1 rows and N columns by performing probability distribution shaping decoding processing on the first reception SSB information, the second reception SSB information, the first reception LSB information, and the second reception LSB information, in the fourth decoding processing in the multi-stage error correction processing; generate second output bit array information including a bit array of one row and N3 columns by extracting information of a predetermined area of the first reception MSB information, in the fifth decoding processing in the multi-stage error correction processing; and generate the output information corresponding to the input information on the basis of the first output bit array information and the second output bit array information, in the sixth decoding processing in the multi-stage error correction processing.

Modification of First Embodiment

A configuration of a main part of a communication system 1c according to a modification of the first embodiment will be described with reference to FIG. 28.

Figure 28:
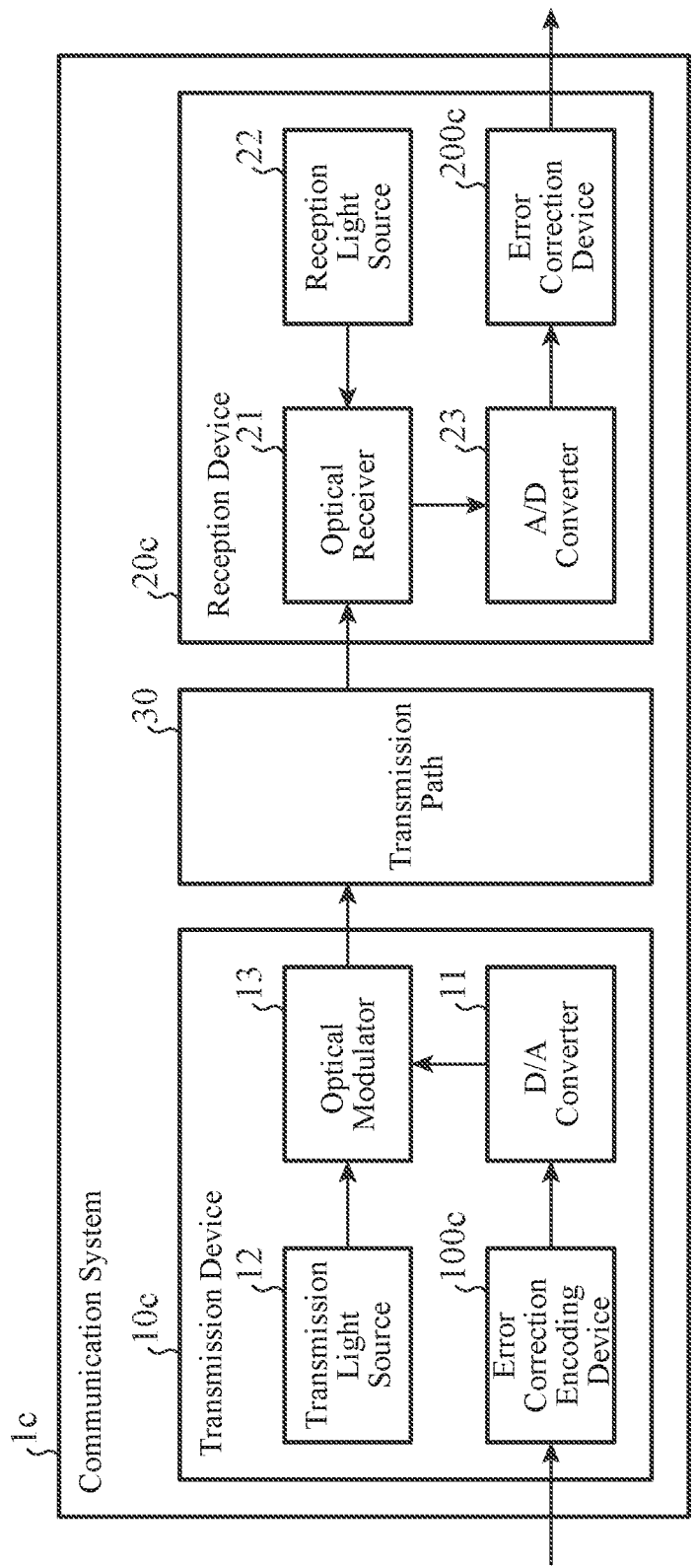
FIG. 28 is a configuration diagram illustrating an example of a configuration of a main part of a communication system according to a modification of the first embodiment.

FIG. 28 is a configuration diagram illustrating an example of the configuration of the main part of the communication system 1c according to the modification of the first embodiment.

In the modification of the first embodiment, as an example, the communication system 1c is described as an optical communication system, but the optical communication system is merely an example, and the communication system 1c is not limited to the optical communication system. For example, the communication system 1c may be a communication system by wireless communication, metal communication, or the like.

The communication system 1c includes a transmission device 10c, the transmission path 30, and a reception device 20c.

The communication system 1c is obtained by changing the transmission device 10 and the reception device 20 according to the first embodiment to the transmission device 10c and the reception device 20c.

Note that, in FIG. 28, blocks similar to the blocks illustrated in FIG. 1 are designated by the same reference numerals, and the description thereof will be omitted.

The transmission device 10c acquires input information and outputs a signal based on the acquired input information. Since the communication system 1c illustrated in FIG. 28 is the optical communication system, the transmission device 10c illustrated in FIG. 28 is an optical transmission device to output an optical signal.

The transmission device 10c includes an error correction encoding device 100c, the D/A converter 11, the transmission light source 12, and the optical modulator 13.

The transmission device 10c is obtained by changing the error correction encoding device 100 according to the first embodiment to the error correction encoding device 100c.

The error correction encoding device 100c acquires the input information input from the outside of the device, and generates a digital baseband modulation signal on the basis of the acquired input information. The error correction encoding device 100c outputs the generated digital baseband modulation signal to the D/A converter 11.

The reception device 20c receives the signal output by the transmission device 10c via the transmission path 30, generates output information corresponding to the input information on the basis of the signal, and outputs the generated output information. Since the communication system 1c illustrated in FIG. 28 is the optical communication system, the reception device 20c illustrated in FIG. 28 is an optical reception device to receive the optical signal.

The reception device 20c includes the reception light source 22, the optical receiver 21, the A/D converter 23, and an error correction device 200c.

The reception device 20c is obtained by changing the error correction device 200 according to the first embodiment to the error correction device 200c.

The error correction device 200c receives a reception digital baseband modulation signal output by the A/D converter 23, generates the output information corresponding to the input information on the basis of the reception digital baseband modulation signal, and outputs the generated output information.

A configuration of a main part of the error correction encoding device 100c according to the modification of the first embodiment will be described with reference to FIG. 29.

Figure 29:
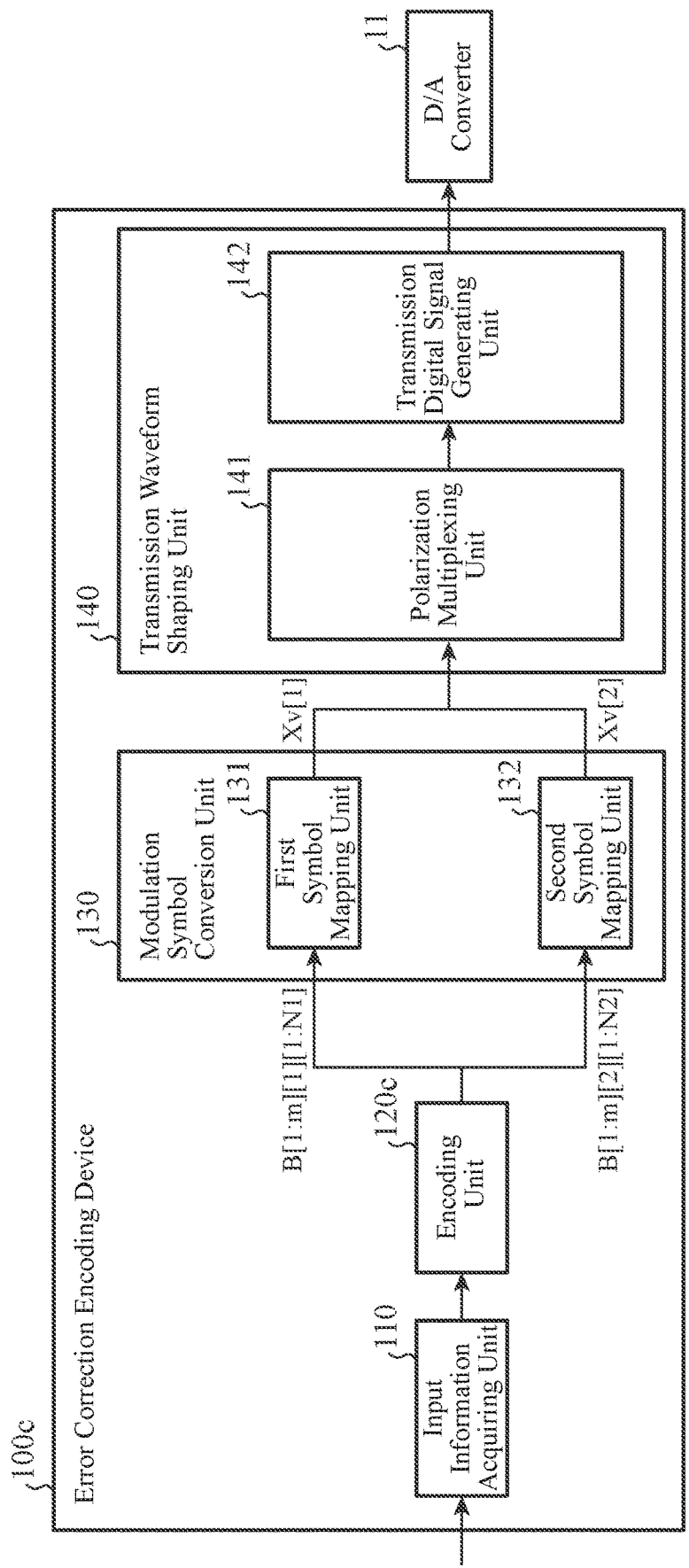
FIG. 29 is a configuration diagram illustrating an example of a configuration of a main part of an error correction encoding device according to the modification of the first embodiment.

FIG. 29 is a configuration diagram illustrating an example of the configuration of the main part of the error correction encoding device 100c according to the modification of the first embodiment.

The error correction encoding device 100c includes the input information acquiring unit 110, an encoding unit 120c, the modulation symbol conversion unit 130, and the transmission waveform shaping unit 140.

The error correction encoding device 100c is obtained by changing the encoding unit 120 according to the first embodiment to the encoding unit 120c.

Note that, in FIG. 29, blocks similar to the blocks illustrated in FIG. 2 are designated by the same reference numerals, and the description thereof will be omitted.

The encoding unit 120c generates soft decision error correction frame information obtained by combining the first bit string group information and the second bit string group information on the basis of the input information acquired by the input information acquiring unit 110.

A configuration of a main part of the encoding unit 120c according to the modification of the first embodiment will be described with reference to FIG. 30.

Figure 30:
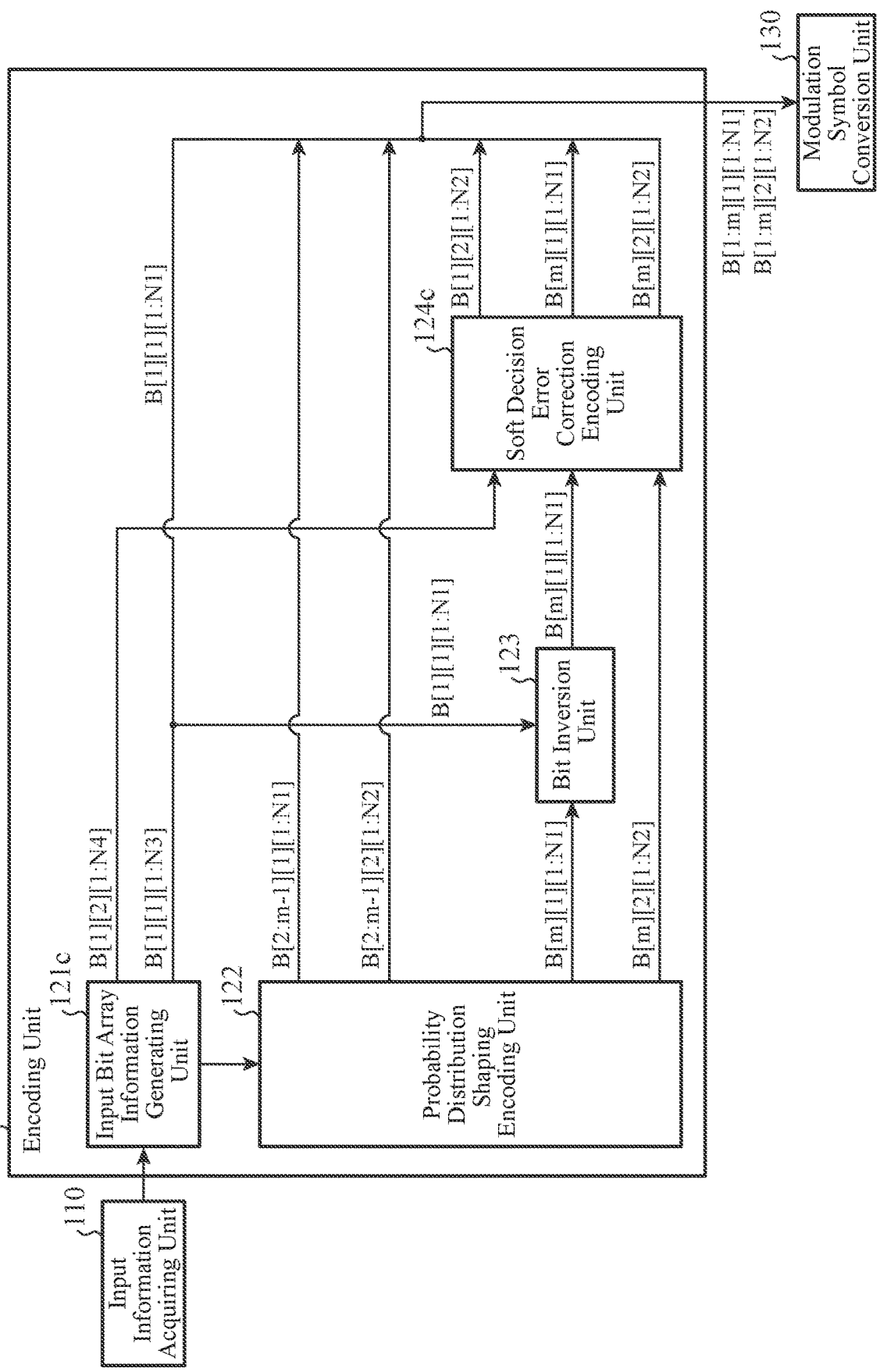
FIG. 30 is a configuration diagram illustrating an example of a configuration of a main part of an encoding unit according to the modification of the first embodiment.

FIG. 30 is a configuration diagram illustrating an example of the configuration of the main part of the encoding unit 120c according to the modification of the first embodiment.

The encoding unit 120c includes an input bit array information generating unit 121c, the probability distribution shaping encoding unit 122, the bit inversion unit 123, and a soft decision error correction encoding unit 124c.

The encoding unit 120c is obtained by changing the input bit array information generating unit 121 and the soft decision error correction encoding unit 124 included in the encoding unit 120 according to the first embodiment to the input bit array information generating unit 121c and the soft decision error correction encoding unit 124c.

The input bit array information generating unit 121 according to the first embodiment generates the first input bit array information including the bit array of m−1 rows and N columns and the second input bit array information including the bit array of one row and N3 columns on the basis of the input information.

On the other hand, the input bit array information generating unit 121c generates third input bit array information including a bit array of one row and N4 columns (N4 is a natural number of greater than or equal to 1 and less than N2) in addition to the first input bit array information and the second input bit array information on the basis of the input information.

The input bit array information generating unit 121c generates the first input bit array information, the second input bit array information, and the third input bit array information including the bit array of one row and N4 columns on the basis of the input information acquired by the input information acquiring unit 110.

In a case where the input information includes the first input bit array information, the second input bit array information, and the third input bit array information, the input bit array information generating unit 121c generates the first input bit array information, the second input bit array information, and the third input bit array information by extracting each of the first input bit array information, the second input bit array information, and the third input bit array information from the input information, or separating the input information into the first input bit array information, the second input bit array information, and the third input bit array information.

Similarly to the input bit array information generating unit 121 according to the first embodiment, the input bit array information generating unit 121c stores the generated second input bit array information in the second input bit area of the first bit string group information as a part of the first MSB information including the bit array of one row and N1 columns.

In addition, the input bit array information generating unit 121c stores the generated third input bit array information in a predetermined area (Hereinafter, the predetermined area is referred to as a "third input bit area".) of the first row in the second bit string group information as a part of the second MSB information including the bit array of one row and N2 columns.

Specifically, the input bit array information generating unit 121c stores the third input bit array information in the third input bit area of Dv[1][2] that is a bit array space in which the second MSB is stored. Hereinafter, the description will be given assuming that the third input bit area is D[1][2][1:N4].

The probability distribution shaping encoding unit 122 generates shaped bit array information including a bit array of m−1 rows and N columns by performing probability distribution shaping encoding processing on the first input bit array information generated by the input bit array information generating unit 121c.

In addition to the inverted first LSB information generated by the bit inversion unit 123 and the second LSB information generated by the probability distribution shaping encoding unit 122, the soft decision error correction encoding unit 124c generates a soft decision parity bit by performing systematic soft decision error correction encoding processing by using the third input bit array information stored in the third input bit area of the second MSB by the input bit array information generating unit 121c. The soft decision error correction encoding unit 124c stores the generated soft decision parity bit in a predetermined area (Hereinafter, the predetermined area is referred to as a "soft decision parity area".) different from the third input bit area in the second MSB information.

Specifically, the soft decision error correction encoding unit 124c generates the soft decision parity bit by performing the systematic soft decision error correction encoding processing by using B[m][1][1:N1] that is a bit value of each column in Dv[m][1] storing the inverted first LSB information, B[m][2][1:N2] that is a bit value of each column in Dv[m][2] storing the second LSB information, and B[1][2][1:N4] that is a bit value of each column in D[1][2][1:N4] storing the third input bit array information. The soft decision error correction encoding unit 124c stores the generated soft decision parity bit in the soft decision parity area of Dv[1][2] that is a bit array space in which the second MSB is stored. Hereinafter, the description will be given assuming that the soft decision parity area is D[1][2][N4+1:N2].

With the above configuration, the encoding unit 120c generates the soft decision error correction frame information by storing the soft decision error correction frame information in Dv[1:m][1:2] that is a bit array space.

As described above, the encoding unit 120c performs the systematic soft decision error correction encoding processing by using the bit value of each column in Dv[m][1] and the bit value of each column in Dv[m][2]. For that reason, bits to be protected by the soft decision error correction encoding processing are only the least significant bit of each column in Dd[1:2] and D[1][2][1:N4] in which the third input bit array information is stored, in the soft decision error correction frame information.

Thus, the encoding unit 120c can reduce the number of bits to be protected by the soft decision error correction as compared with the conventional soft decision error correction encoding processing.

Note that, functions of the input information acquiring unit 110, the encoding unit 120c, the modulation symbol conversion unit 130, and the transmission waveform shaping unit 140 included in the error correction encoding device 100c according to the modification of the first embodiment may be implemented by the processor 501 and the memory 502 in the hardware configuration illustrated as an example in FIGS. 5A and 5B in the first embodiment, or may be implemented by the processing circuit 503.

Operation of the error correction encoding device 100c according to the modification of the first embodiment will be described with reference to FIGS. 31A, 31B, and 31C.

Figure 31A:
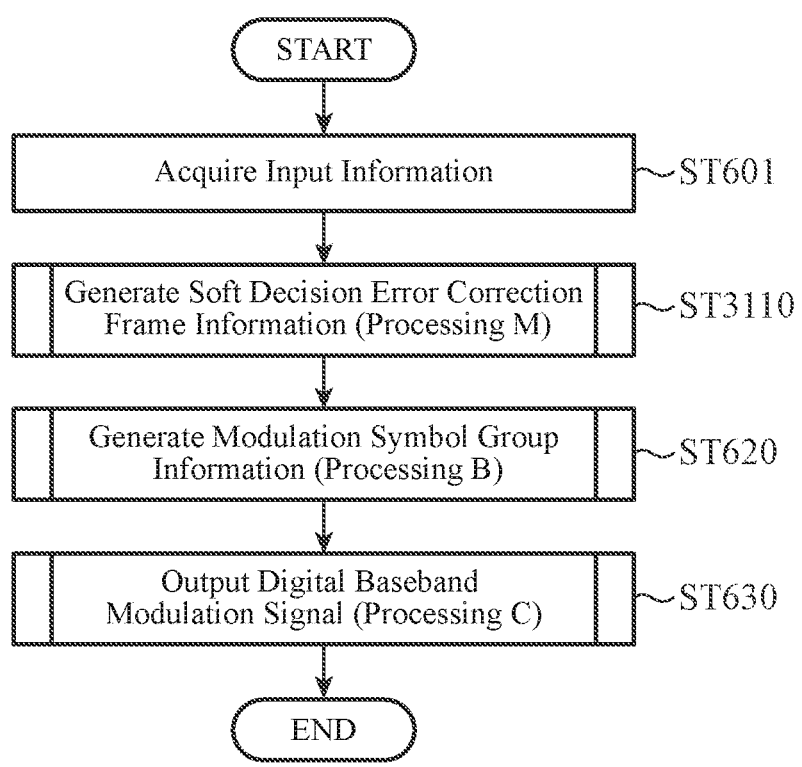
FIG. 31A is a part of a flowchart illustrating an example of processing performed by the error correction encoding device according to the modification of the first embodiment.

FIG. 31A is a part of a flowchart illustrating an example of processing performed by the error correction encoding device 100c according to the modification of the first embodiment.

Figure 31B:
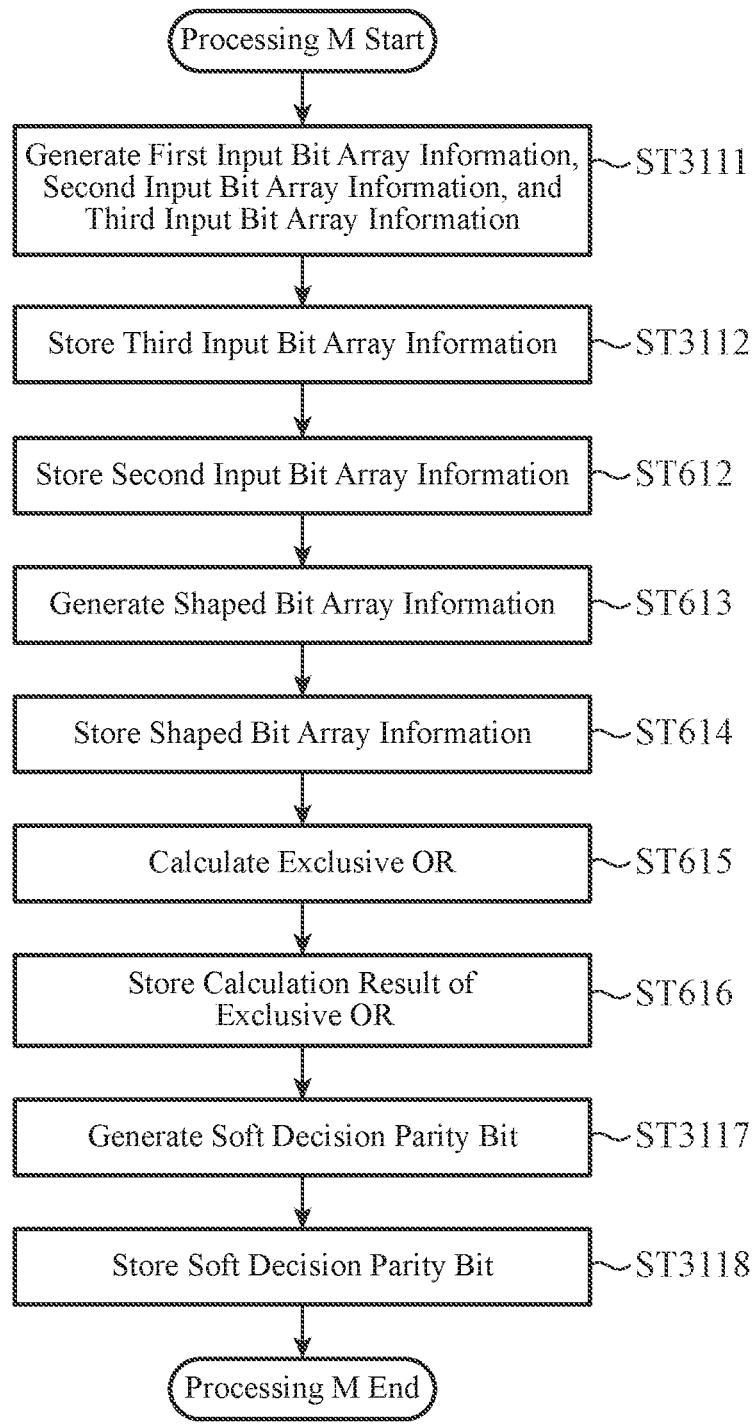
FIG. 31B is another part of the flowchart illustrating the example of the processing performed by the error correction encoding device according to the modification of the first embodiment.

FIG. 31B is another part of the flowchart illustrating the example of the processing performed by the error correction encoding device 100c according to the modification of the first embodiment.

FIG. 31C is a remaining part of the flowchart illustrating the example of the processing performed by the error correction encoding device 100c according to the modification of the first embodiment.

Hereinafter, FIGS. 31A, 31B, and 31C are collectively denoted as FIG. 31. The error correction encoding device 100c repeatedly executes the processing of the flowchart illustrated in FIG. 31.

Note that, the flowchart illustrated in FIG. 31 is obtained by changing step ST610 in the flowchart illustrated in FIG. 6 to step ST3110.

In FIG. 31, processing steps similar to processing steps of the flowchart illustrated in FIG. 6 are designated by the same reference numerals, and the description thereof will be omitted.

First, the error correction encoding device 100c performs processing of step ST601.

Next, in step ST3110, the encoding unit 120c generates the soft decision error correction frame information.

Specifically, the encoding unit 120c performs processing of step ST3110 by performing processing from step ST3111 to step ST3112, processing from step ST612 to step ST616, and processing from step ST3117 to step ST3118 in processing M below.

First, in step ST3111, the input bit array information generating unit 120c included in the encoding unit 121c generates the first input bit array information, the second input bit array information, and the third input bit array information.

Next, in step ST3112, the input bit array information generating unit 121c included in the encoding unit 120c stores the third input bit array information in the third input bit area of Dv[1][2].

After step ST3112, the encoding unit 120c performs the processing from ST612 to step ST616.

After step ST616, in step ST3117, the soft decision error correction encoding unit 124c included in the encoding unit 120c generates the soft decision parity bit by performing the systematic soft decision error correction encoding processing by using the bit value of each column in Dv[m][1], the bit value of each column in Dv[m][2], and the bit value of each column in D[1][2][1:N4] that is the third input bit area.

After step ST3117, in step ST3118, the soft decision error correction encoding unit 124c included in the encoding unit 120c stores the soft decision parity bit in Dv[1][2][N4+1] that is the soft decision parity area.

After step ST3118, the encoding unit 120c ends the processing M. That is, after step ST3118, the encoding unit 120c ends the processing of step ST3110.

After step ST3110, the error correction encoding device 100c performs processing from step ST620 to step ST630.

After step ST630, the error correction encoding device 100c ends the processing of the flowchart illustrated in FIG. 31, and the error correction encoding device 100c returns to the processing of step ST601 and repeatedly executes the processing of the flowchart illustrated in FIG. 31.

A configuration of a main part of the error correction device 200c according to the modification of the first embodiment will be described with reference to FIG. 32.

Figure 32:
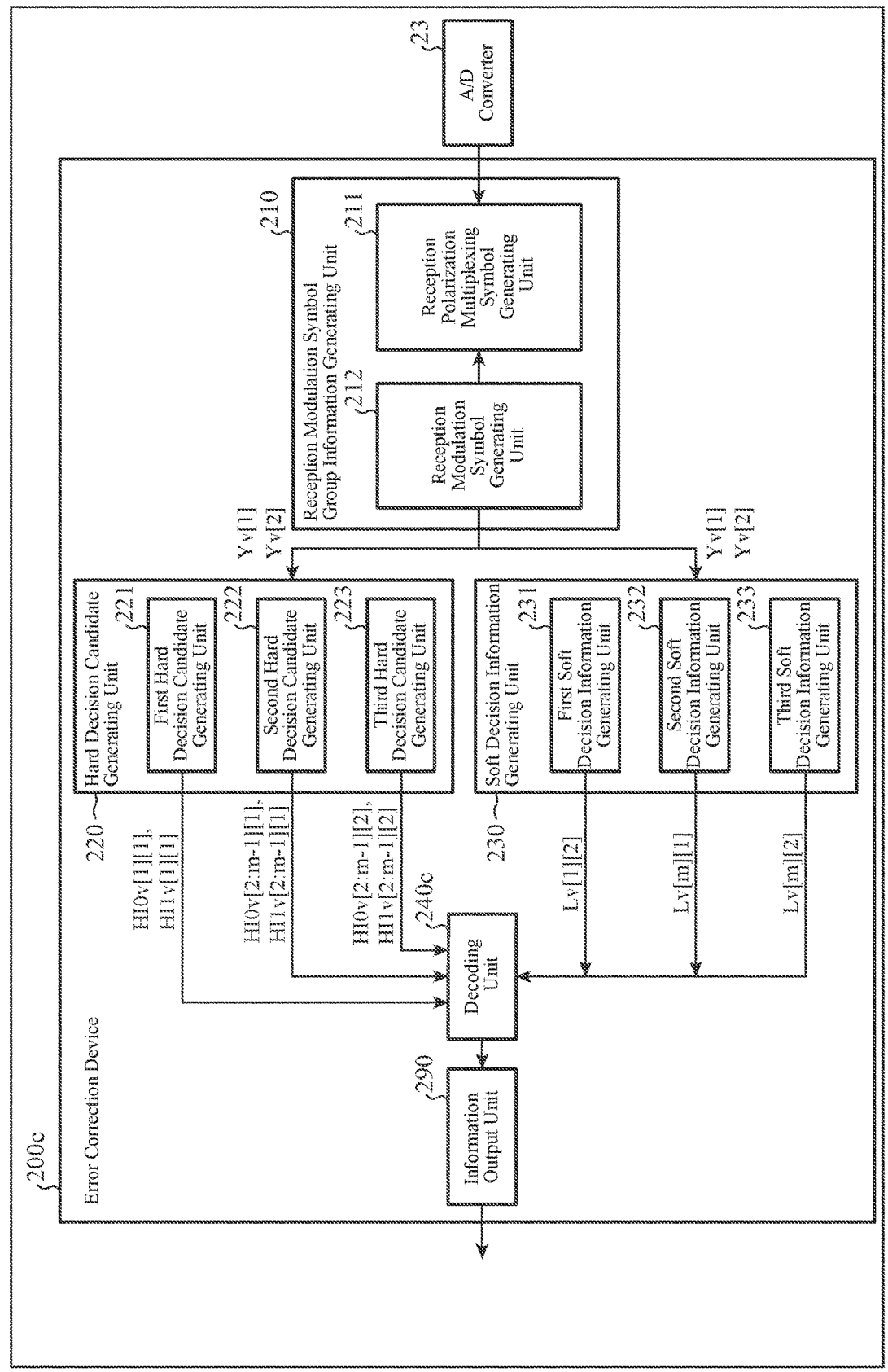
FIG. 32 is a configuration diagram illustrating an example of a configuration of a main part of an error correction device according to the modification of the first embodiment.

FIG. 32 is a configuration diagram illustrating an example of the configuration of the main part of the error correction device 200c according to the modification of the first embodiment.

The error correction device 200c includes the reception modulation symbol group information generating unit 210, the hard decision candidate generating unit 220, the soft decision information generating unit 230, a decoding unit 240c, and the information output unit 290.

The error correction device 200c is obtained by changing the decoding unit 240 according to the first embodiment to the decoding unit 240c.

Note that, in FIG. 32, blocks similar to the blocks illustrated in FIG. 7 are designated by the same reference numerals, and the description thereof will be omitted.

The decoding unit 240c generates the output information by performing the multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230.

A configuration of a main part of the decoding unit 240c according to the modification of the first embodiment will be described with reference to FIG. 33.

Figure 33:
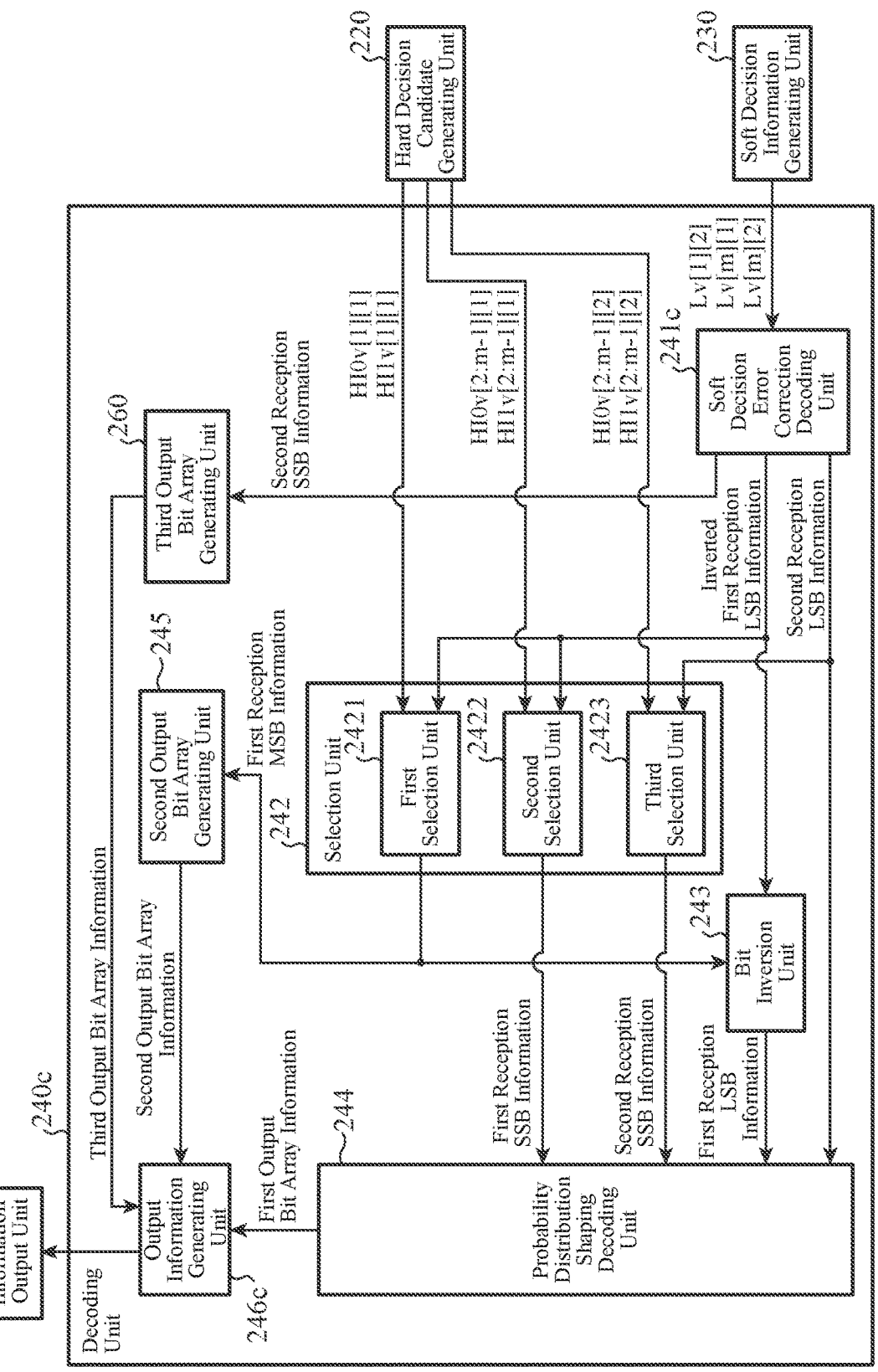
FIG. 33 is a configuration diagram illustrating an example of a configuration of a main part of a decoding unit according to the modification of the first embodiment.

FIG. 33 is a configuration diagram illustrating an example of the configuration of the main part of the decoding unit 240c according to the modification of the first embodiment.

The decoding unit 240c includes a soft decision error correction decoding unit 241c, the selection unit 242, the reception side bit inversion unit 243, the probability distribution shaping decoding unit 244, the second output bit array generating unit 245, an output information generating unit 246c, and a third output bit array generating unit 260.

The decoding unit 240c is obtained by adding the third output bit array generating unit 260 to the configuration of the decoding unit 240 according to the first embodiment, and changing the soft decision error correction decoding unit 241 and the output information generating unit 246 according to the first embodiment to the soft decision error correction decoding unit 241c and the output information generating unit 246c.

Note that, in FIG. 33, blocks similar to the blocks illustrated in FIG. 8 are designated by the same reference numerals, and the description thereof will be omitted.

The soft decision error correction decoding unit 241c performs the first decoding processing in the multi-stage error correction processing.

Specifically, the soft decision error correction decoding unit 241c performs the soft decision error correction processing by using the first posterior L value sequence, the second posterior L value sequence, and the third posterior L value sequence.

More specifically, the soft decision error correction decoding unit 241c performs the soft decision error correction processing by using L[1][2][1:N4] that is a posterior L value sequence corresponding to B[1][2][1:N4] that is the third input bit array information in the second reception MSB information, L[1][2][N4+1:N2] that is a posterior L value sequence corresponding to B[1][2][N4+1:N2] that is a soft decision parity bit in the second reception MSB information, Lv[m][1] that is the second posterior L value sequence, and Lv[m][2] that is the third posterior L value sequence.

The soft decision error correction decoding unit 241c generates the inverted first reception LSB information including the bit array of one row and N1 columns corresponding to the inverted first LSB information generated by the bit inversion unit 123 by performing the soft decision error correction processing.

In addition, the soft decision error correction decoding unit 241c generates the second reception LSB information including the bit array of one row and N2 columns corresponding to the second LSB information generated by the probability distribution shaping encoding unit 122 by performing the soft decision error correction processing.

In addition, the soft decision error correction decoding unit 241c generates the second reception MSB information including a bit array of one row and N2 columns corresponding to the second MSB information including the third input bit array information generated by the input bit array information generating unit 121c by performing the soft decision error correction processing.

Since each piece of processing from the second decoding processing to the fifth decoding processing in the multi-stage error correction processing is similar to that of the first embodiment, the description thereof will be omitted.

The third output bit array generating unit 260 performs eighth decoding processing in the multi-stage error correction processing.

Specifically, the third output bit array generating unit 260 generates third output bit array information including a bit array of one row and N4 columns corresponding to the third input bit array information by extracting information of an area corresponding to the third input bit area in the second MSB information in the second reception MSB information.

More specifically, for example, the third output bit array generating unit 260 generates the third output bit array information by extracting bit values from the first column to the N4-th column of the second reception MSB information.

The output information generating unit 246c performs the sixth decoding processing in the multi-stage error correction processing.

Specifically, the output information generating unit 246c generates the output information corresponding to the input information on the basis of the third output bit array information in addition to the first output bit array information and the second output bit array information.

Note that, functions of the reception modulation symbol group information generating unit 210, the hard decision candidate generating unit 220, the soft decision information generating unit 230, the decoding unit 240c, and the information output unit 290 included in the error correction device 200c according to the modification of the first embodiment may be implemented by the processor 901 and the memory 902 in the hardware configuration illustrated as an example in FIGS. 9A and 9B in the first embodiment, or may be implemented by the processing circuit 903.

Operation of the error correction device 200c according to the modification of the first embodiment will be described with reference to FIGS. 34A, 34B, and 34C.

Figure 34A:
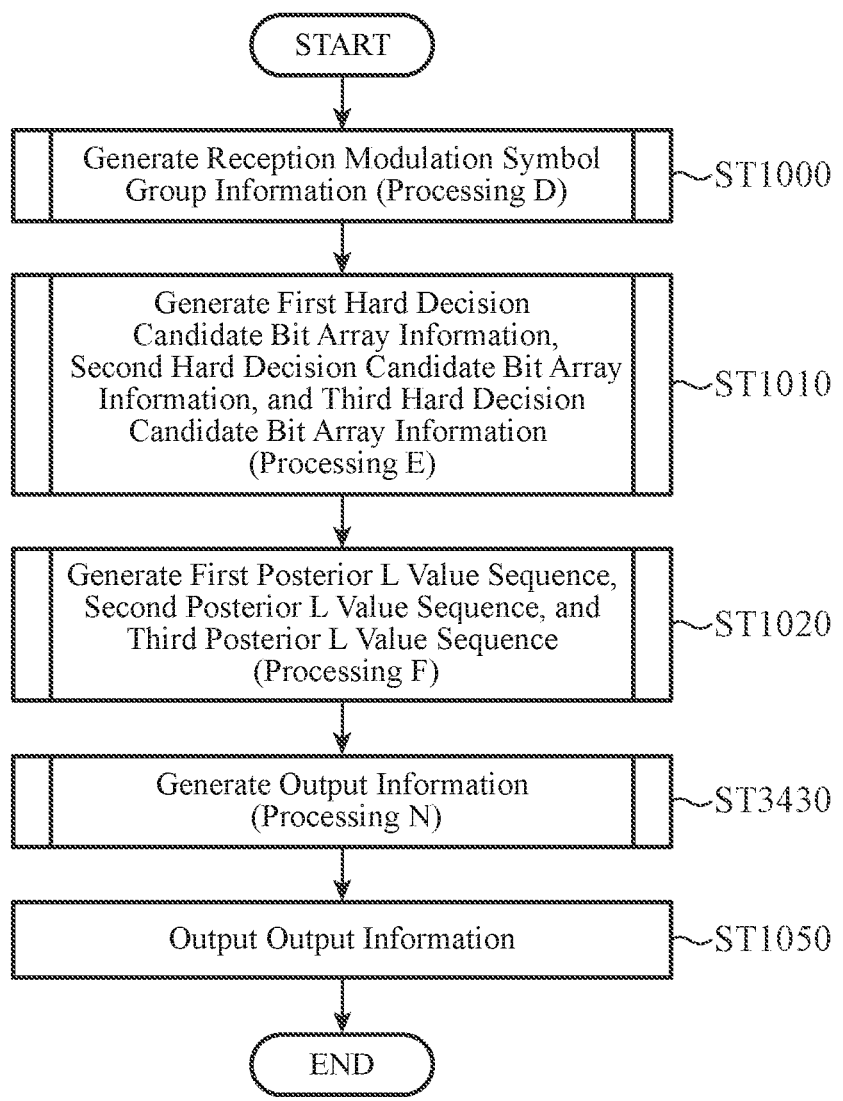
FIG. 34A is a part of a flowchart illustrating an example of processing performed by the error correction device according to the modification of the first embodiment.

FIG. 34A is a part of a flowchart illustrating an example of processing performed by the error correction device 200c according to the modification of the first embodiment.

Figure 34B:
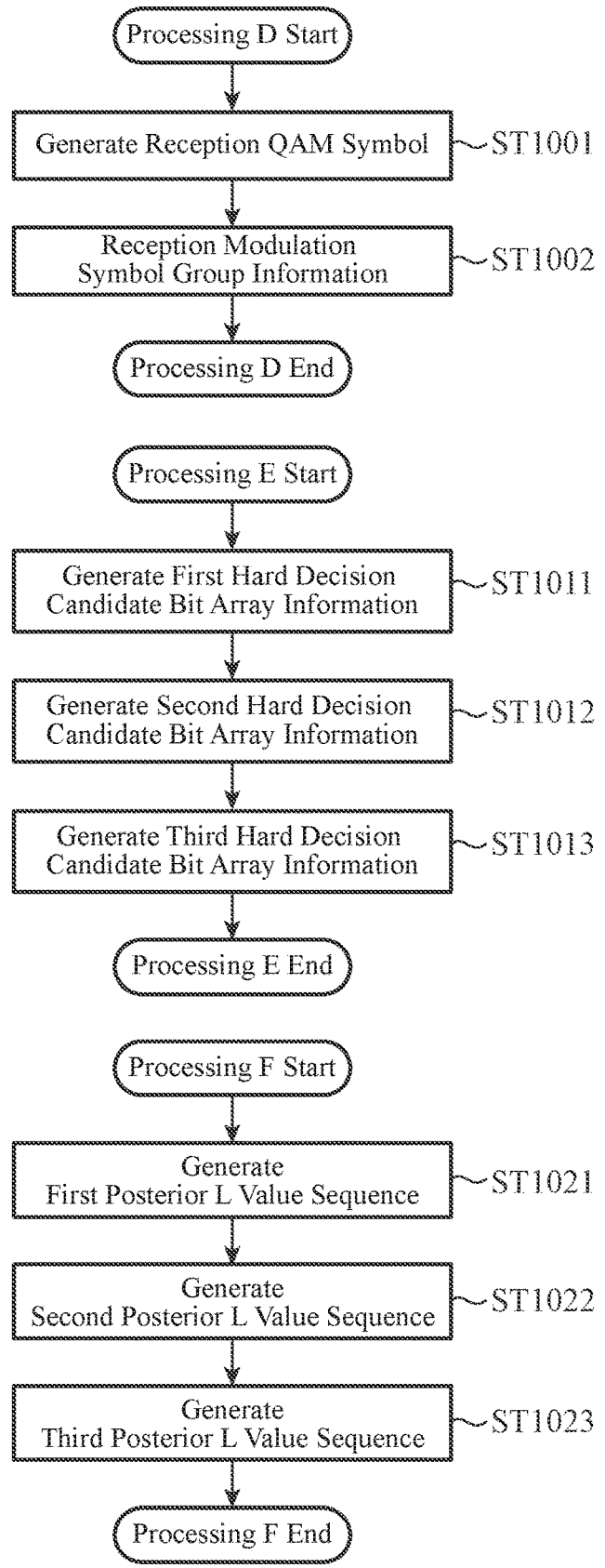
FIG. 34B is another part of the flowchart illustrating the example of the processing performed by the error correction device according to the modification of the first embodiment.

FIG. 34B is another part of the flowchart illustrating the example of the processing performed by the error correction device 200c according to the modification of the first embodiment.

FIG. 34C is a remaining part of the flowchart illustrating the example of the processing performed by the error correction device 200c according to the modification of the first embodiment.

Hereinafter, FIGS. 34A, 34B, and 34C are collectively denoted as FIG. 34. The error correction device 200c repeatedly executes the processing of the flowchart illustrated in FIG. 34.

Note that, the flowchart illustrated in FIG. 34 is obtained by changing step ST1030 in the flowchart illustrated in FIG. 10 to step ST3430.

In FIG. 34, processing steps similar to processing steps of the flowchart illustrated in FIG. 10 are designated by the same reference numerals, and the description thereof will be omitted.

First, the error correction device 200c performs processing from step ST1000 to step ST1020.

After step ST1020, in step ST3430, the decoding unit 240c generates the output information by performing the multi-stage error correction processing.

Specifically, the decoding unit 240c performs processing of step ST3430 by performing processing of step ST3431, processing from step ST1032 to step ST1036, and processing from step ST3436 to step ST3437 in processing N below.

First, in step ST3431, the soft decision error correction decoding unit 241c included in the decoding unit 240c generates the inverted first reception LSB information, the second reception LSB information, and the second reception MSB information by performing the soft decision error correction processing.

After step ST3431, the decoding unit 240c performs processing from step ST1032 to step ST1035.

After step ST1035, in step ST3436, the third output bit array generating unit 260 included in the decoding unit 240c generates the third output bit array information.

After step ST3436, in step ST3437, the output information generating unit 246c included in the decoding unit 240c generates the output information.

After step ST3437, the decoding unit 240c ends the processing N. That is, after step ST3437, the decoding unit 240c ends the processing of step ST3430.

After step ST3430, the error correction device 200c performs processing of step ST1050.

After step ST1050, the error correction device 200c ends the processing of the flowchart illustrated in FIG. 34, and the error correction device 200*c* returns to the processing of step ST1000 and repeatedly executes the processing of the flowchart illustrated in FIG. 34.

As described above, the error correction encoding device 100*c* includes: the input information acquiring unit 110 to acquire the input information; the encoding unit 120*c* to generate the soft decision error correction frame information including the bit array of m rows and N columns on the basis of the input information acquired by the input information acquiring unit 110, the bit array being obtained by combining the first bit string group information and the second bit string group information, the first bit string group information including the bit array of m rows and N1 columns in which it is enabled to perform the pulse amplitude modulation of the combination of bit values of each column of the first bit string group information into the modulation symbol by using the predetermined first symbol mapping rule, the second bit string group information including the bit array of m rows and N2 columns in which it is enabled to perform the pulse amplitude modulation of the combination of bit values of each column of the second bit string group information into the modulation symbol by using the predetermined second symbol mapping rule; the modulation symbol conversion unit 130 to generate the modulation symbol group information including N pieces of the modulation symbols by performing the pulse amplitude modulation of the combination of bit values of each column of the soft decision error correction frame information generated by the encoding unit 120*c* into the modulation symbol for each column of the soft decision error correction frame information by using the first symbol mapping rule or the second symbol mapping rule; and the transmission waveform shaping unit 140 to generate the digital baseband modulation signal on the basis of the modulation symbol group information generated by the modulation symbol conversion unit 130 and output the digital baseband modulation signal generated, in which the encoding unit 120*c* generates the soft decision error correction frame information by: generating the first input bit array information including the bit array of m−1 rows and N columns and the second input bit array information including the bit array of one row and N3 columns on the basis of the input information acquired by the input information acquiring unit 110; storing the second input bit array information generated as a part of the first MSB information including the bit array of one row and N1 columns in the predetermined area of the first row in the first bit string group information; generating the shaped bit array information including the bit array of m−1 rows and N columns by performing the probability distribution shaping encoding processing on the first input bit array information generated; generating the first group bit array information including the combination of N1 predetermined columns and the second group bit array information including the combination of N2 predetermined columns by separating the shaped bit array information generated; generating the first LSB information including the bit array of one row and N1 columns by extracting, from the first group bit array information generated, the bit array of the (m−1)-th row in the first group bit array information, generating the inverted first LSB information including the bit array of one row and N1 columns by calculating exclusive ORs of bit values of each columns in the first LSB information generated and each bit values of each columns in the information of the first row in the first bit string group information after storing the second input bit array information, the columns in the information of the first row in the first bit string group information each corresponding to the columns in the first LSB information, and storing the inverted first LSB information generated in the m-th row in the first bit string group information; generating the second LSB information including the bit array of one row and N2 columns by extracting the bit array of the (m−1)-th row in the second group bit array information from the second group bit array information generated, and storing the second LSB information generated in the m-th row in the second bit string group information; generating the soft decision parity bit by performing the systematic soft decision error correction encoding processing by using the inverted first LSB information generated and the second LSB information generated, and storing the soft decision parity bit generated, in the first row in the second bit string group information as the second MSB information including the bit array of one row and N2 columns; in the case where m is greater than or equal to 3, generating the first SSB information including the bit array of m−2 rows and N1 columns by extracting, from the first group bit array information generated, the first row to the (m−2)-th row in the first group bit array information, and storing the first SSB information generated, in the second row to the (m−1)-th row in the first bit string group information; and in the case where m is greater than or equal to 3, generating the second SSB information including the bit array of m−2 rows and N2 columns by extracting, from the second group bit array information generated, the first row to the (m−2)-th row in the second group bit array information, and storing the second SSB information generated, in the second row to the (m−1)-th row in the second bit string group information.

Further, in the above-described configuration, the error correction encoding device 100*c* is configured so that the encoding unit 120*c* generates the soft decision error correction frame information by: generating the third input bit array information including the bit array of one row and N4 columns in addition to the first input bit array information and the second input bit array information on the basis of the input information acquired by the input information acquiring unit 110; storing the third input bit array information generated as the part of the second MSB information including the bit array of one row and N2 columns in the predetermined area of the first row in the second bit string group information; and generating the soft decision parity bit by performing the systematic soft decision error correction encoding processing by using the third input bit array information stored as the part of the second MSB information in addition to the inverted first LSB information generated and the second LSB information generated, and storing the soft decision parity bit generated, in a predetermined area different from an area storing the second bit string group information of the first row of the second bit string group information.

With this configuration, the error correction encoding device 100*c* can reduce the number of bits to be protected by the soft decision error correction as compared with the conventional soft decision error correction encoding processing. For that reason, the error correction encoding device 100*c* can reduce the amount of calculation of the soft decision error correction encoding processing as compared with the conventional soft decision error correction encoding processing.

In addition, with this configuration, the error correction encoding device 100*c* can make the number of bits to be protected by the soft decision error correction constant even if the number of bits of the pulse amplitude modulation changes. For that reason, the error correction encoding device 100*c* can make the amount of calculation of the soft decision error correction encoding processing constant in the pulse amplitude modulation of any number of bits. Thus, the error correction encoding device 100c does not need to change the program or the processing circuit for performing the soft decision error correction encoding processing for each number of bits of the pulse amplitude modulation, in the pulse amplitude modulation of a plurality of number of bits.

Further, with this configuration, the error correction encoding device 100c can transmit the third input bit array information to the error correction device 200c in addition to the first input bit array information and the second input bit array information, so that it is possible to increase the number of pieces of valid information in one piece of soft decision error correction frame information as compared with the error correction encoding device 100 according to the first embodiment. For that reason, the error correction encoding device 100c can efficiently transmit information to the error correction device 200c as compared with the error correction encoding device 100 according to the first embodiment.

In addition, as described above, the error correction device 200c includes: the reception modulation symbol group information generating unit 210 to receive the reception digital baseband modulation signal that is the signal based on the soft decision error correction frame information generated by the error correction encoding device 100c and generate reception modulation symbol group information including N reception modulation symbols on the basis of the reception digital baseband modulation signal; the hard decision candidate generating unit 220 to generate first hard decision candidate bit array information including the bit array of one row and N1 columns, second hard decision candidate bit array information including the bit array of m−2 rows and N1 columns in the case where m is greater than or equal to 3, and third hard decision candidate bit array information including the bit array of m−2 rows and N2 columns in the case where m is greater than or equal to 3, by using the reception modulation symbol group information generated by the reception modulation symbol group information generating unit 210 on the basis of the first symbol mapping rule or the second symbol mapping rule; the soft decision information generating unit 230 to generate the first posterior L value sequence including N2 posterior L values corresponding to each columns of the first row of the second bit string group information, the second posterior L value sequence including N1 posterior L values corresponding to each columns of the m-th row of the first bit string group information, and the third posterior L value sequence including N2 posterior L values corresponding to each columns of the m-th row of the second bit string group information on the basis of the reception modulation symbol group information generated by the reception modulation symbol group information generating unit 210; the decoding unit 240c to perform multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230; and the information output unit 290 to output information generated by the decoding unit 240c performing the multi-stage error correction processing as output information, in which: in the first decoding processing in the multi-stage error correction processing, the decoding unit 240c generates inverted first reception LSB information including the bit array of one row and N1 columns corresponding to the inverted first LSB information and second reception LSB information including the bit array of one row and N2 columns corresponding to the second LSB information by performing soft decision error correction processing on the basis of the first posterior L value sequence, the second posterior L value sequence, and the third posterior L value sequence; in the second decoding processing in the multi-stage error correction processing, the decoding unit 240c generates first reception MSB information including the bit array of one row and N1 columns corresponding to the first MSB information on the basis of the first hard decision candidate bit array information and the inverted first reception LSB information, generates first reception SSB information including the bit array of m−2 rows and N1 columns corresponding to the first SSB information on the basis of the second hard decision candidate bit array information and the inverted first reception LSB information in the case where m is greater than or equal to 3, and generates second reception SSB information including the bit array of m−2 rows and N2 columns corresponding to the second SSB information on the basis of the third hard decision candidate bit array information and the second reception LSB information in the case where m is greater than or equal to 3; in the third decoding processing in the multi-stage error correction processing, the decoding unit 240c generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information; in the fourth decoding processing in the multi-stage error correction processing, the decoding unit 240c generates first output bit array information including the bit array of m−1 rows and N columns corresponding to the first input bit array information by performing probability distribution shaping decoding processing on the first reception SSB information, the second reception SSB information, the first reception LSB information, and the second reception LSB information; in the fifth decoding processing in the multi-stage error correction processing, the decoding unit 240c generates second output bit array information including the bit array of one row and N3 columns corresponding to the second input bit array information by extracting information of the predetermined area of the first reception MSB information; in the sixth decoding processing in the multi-stage error correction processing, the decoding unit 240c generates the output information corresponding to the input information on the basis of the first output bit array information and the second output bit array information; and the information output unit 290 outputs the output information generated by the decoding unit 240c.

Further, in the above-described configuration, the error correction device 200c is configured so that the decoding unit 240c: generates the second reception MSB information including the bit array of one row and N2 columns corresponding to the second MSB information, in addition to the inverted first reception LSB information including the bit array of one row and N1 columns corresponding to the inverted first LSB information and the second reception LSB information including the bit array of one row and N2 columns corresponding to the second LSB information, by performing the soft decision error correction processing on the basis of the first posterior L value sequence, the second posterior L value sequence, and the third posterior L value sequence, in the first decoding processing in the multi-stage error correction processing; generates the third output bit array information including the bit array of one row and N4 columns corresponding to the third input bit array information by extracting information of a predetermined area of the second reception MSB information in the eighth decoding processing in the multi-stage error correction processing; and generates the output information corresponding to the input information on the basis of the third output bit array information, in addition to the first output bit array information and the second output bit array information, in the sixth decoding processing in the multi-stage error correction processing.

With this configuration, the error correction device 200c can reduce the number of bits to be protected by the soft decision error correction as compared with the conventional soft decision error correction encoding processing. For that reason, the error correction device 200c can reduce the amount of calculation of the soft decision error correction decoding processing as compared with the conventional soft decision error correction decoding processing.

In addition, with this configuration, the error correction device 200c can make the number of bits to be protected by the soft decision error correction constant even if the number of bits of the pulse amplitude modulation changes. For that reason, the error correction device 200c can make the amount of calculation of the soft decision error correction decoding processing constant in the pulse amplitude modulation of any number of bits. Thus, the error correction device 200c does not need to change the program or the processing circuit for performing the soft decision error correction decoding processing for each number of bits of the pulse amplitude modulation, in the pulse amplitude modulation of a plurality of number of bits.

Further, with this configuration, the error correction device 200c can restore the third output bit array information corresponding to the third input bit array information by the multi-stage error correction processing in addition to the first output bit array information and the second output bit array information corresponding to the first input bit array information and the second input bit array information.

Thus, as compared with the error correction device 200 according to the first embodiment, the error correction device 200c can increase the number of pieces of valid information restored from the reception digital baseband modulation signal that is a signal based on one piece of soft decision error correction frame information. For that reason, the error correction device 200c can efficiently receive information as compared with the error correction device 200 according to the first embodiment.

Second Embodiment

A configuration of a main part of a communication system 1a according to a second embodiment will be described with reference to FIG. 11.

Figure 11:
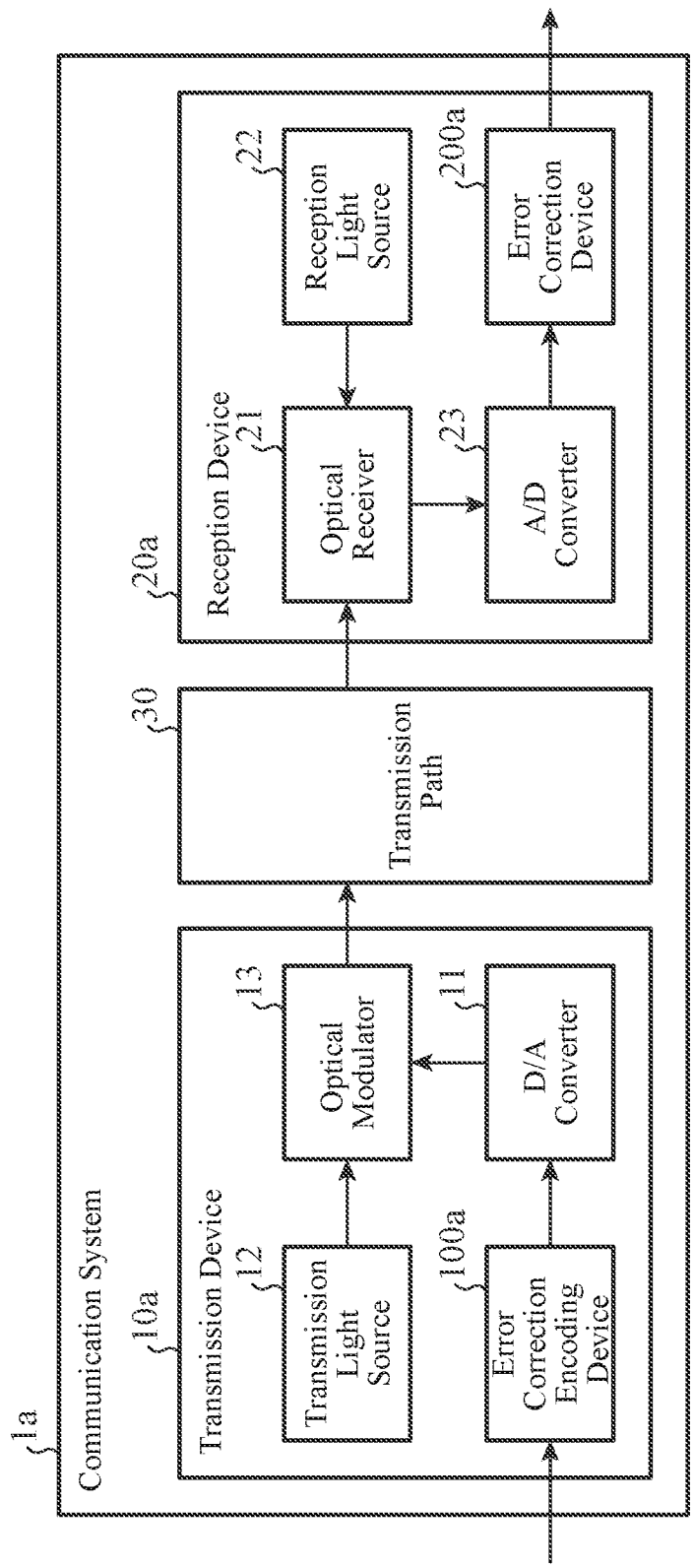
FIG. 11 is a configuration diagram illustrating an example of a configuration of a main part of a communication system according to a second embodiment.

FIG. 11 is a configuration diagram illustrating an example of the configuration of the main part of the communication system 1a according to the second embodiment.

In the second embodiment, as an example, the communication system 1a is described as an optical communication system, but the optical communication system is merely an example, and the communication system 1a is not limited to the optical communication system. For example, the communication system 1a may be a communication system by wireless communication, metal communication, or the like.

The communication system 1a includes a transmission device 10a, the transmission path 30, and a reception device 20a.

The communication system 1a is obtained by changing the transmission device 10 and the reception device 20 according to the first embodiment to the transmission device 10a and the reception device 20a.

Note that, in FIG. 11, blocks similar to the blocks illustrated in FIG. 1 are designated by the same reference numerals, and the description thereof will be omitted.

The transmission device 10a acquires input information and outputs a signal based on the acquired input information. Since the communication system 1a illustrated in FIG. 11 is the optical communication system, the transmission device 10a illustrated in FIG. 11 is an optical transmission device to output an optical signal.

The transmission device 10a includes an error correction encoding device 100a, the D/A converter 11, the transmission light source 12, and the optical modulator 13.

The transmission device 10a is obtained by changing the error correction encoding device 100 according to the first embodiment to the error correction encoding device 100a.

The error correction encoding device 100a acquires the input information input from the outside of the device, and generates a digital baseband modulation signal on the basis of the acquired input information. The error correction encoding device 100a outputs the generated digital baseband modulation signal to the D/A converter 11.

The reception device 20a receives the signal output by the transmission device 10a via the transmission path 30, generates output information corresponding to the input information on the basis of the signal, and outputs the generated output information. Since the communication system 1a illustrated in FIG. 11 is the optical communication system, the reception device 20a illustrated in FIG. 11 is an optical reception device to receive the optical signal.

The reception device 20a includes the reception light source 22, the optical receiver 21, the A/D converter 23, and an error correction device 200a.

The reception device 20a is obtained by changing the error correction device 200 according to the first embodiment to the error correction device 200a.

The error correction device 200a receives the reception digital baseband modulation signal output by the A/D converter 23, generates the output information corresponding to the input information on the basis of the reception digital baseband modulation signal, and outputs the generated output information.

A configuration of a main part of the error correction encoding device 100a according to the second embodiment will be described with reference to FIG. 12.

Figure 12:
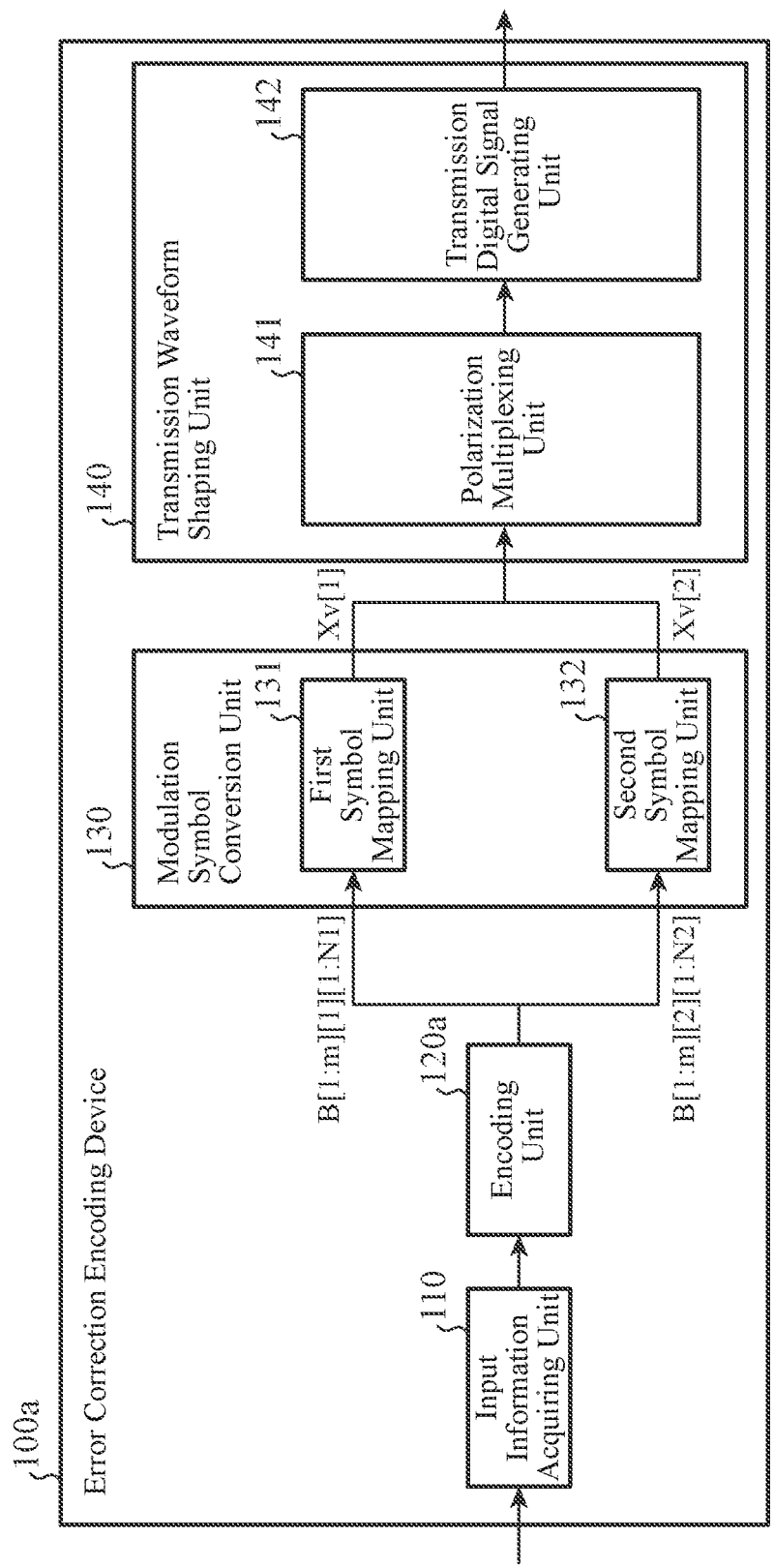
FIG. 12 is a configuration diagram illustrating an example of a configuration of a main part of an error correction encoding device according to the second embodiment.

FIG. 12 is a configuration diagram illustrating an example of the configuration of the main part of the error correction encoding device 100a according to the second embodiment.

The error correction encoding device 100a includes the input information acquiring unit 110, an encoding unit 120a, the modulation symbol conversion unit 130, and the transmission waveform shaping unit 140.

The error correction encoding device 100a is obtained by changing the encoding unit 120 according to the first embodiment to the encoding unit 120a.

Note that, in FIG. 12, blocks similar to the blocks illustrated in FIG. 2 are designated by the same reference numerals, and the description thereof will be omitted.

The encoding unit 120a generates soft decision error correction frame information obtained by combining the first bit string group information and the second bit string group information on the basis of the input information acquired by the input information acquiring unit 110.

A configuration of a main part of the encoding unit 120a according to the second embodiment will be described with reference to FIG. 13.

Figure 13:
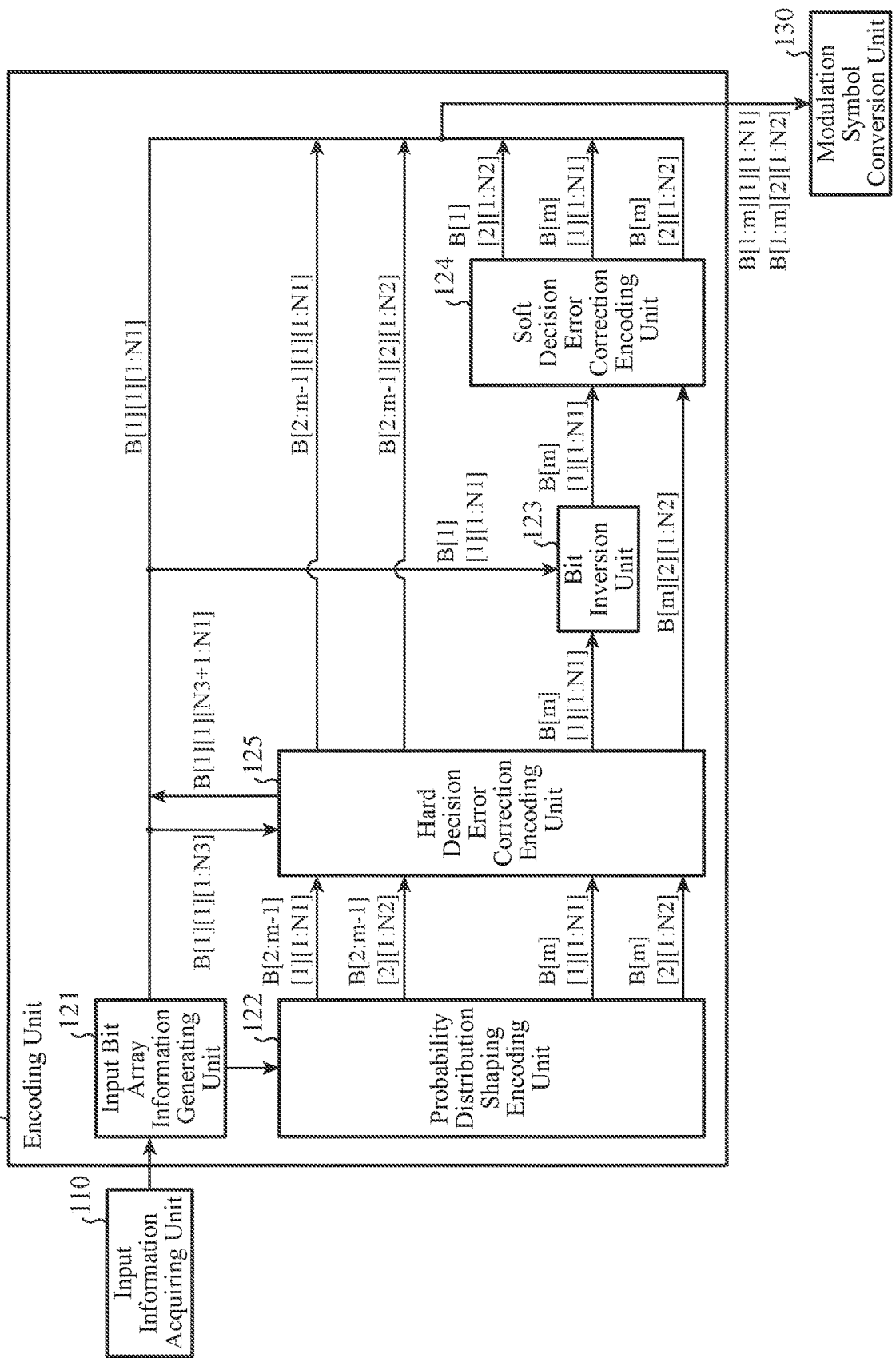
FIG. 13 is a configuration diagram illustrating an example of a configuration of a main part of an encoding unit according to the second embodiment.

FIG. 13 is a configuration diagram illustrating an example of the main part of the encoding unit 120a according to the second embodiment.

The encoding unit 120a includes the input bit array information generating unit 121, the probability distribution shaping encoding unit 122, the bit inversion unit 123, the soft decision error correction encoding unit 124, and the hard decision error correction encoding unit 125.

The encoding unit 120a is obtained by adding the hard decision error correction encoding unit 125 to the configuration of the encoding unit 120 according to the first embodiment.

Note that, in FIG. 13, blocks similar to the blocks illustrated in FIG. 3 are designated by the same reference numerals, and the description thereof will be omitted.

The hard decision error correction encoding unit 125 performs systematic hard decision error correction encoding processing by using the first input bit array information generated by the input bit array information generating unit 121 and the second input bit array information generated by the input bit array information generating unit 121.

The hard decision error correction encoding unit 125 may perform the systematic hard decision error correction encoding processing by using the first input bit array information generated by the input bit array information generating unit 121, and the first SSB information, the second SSB information, the second LSB information, and the first LSB information generated by the probability distribution shaping encoding unit 122.

In addition, the hard decision error correction encoding unit 125 may perform the systematic hard decision error correction encoding processing by using the first input bit array information generated by the input bit array information generating unit 121, the first SSB information, the second SSB information, and the second LSB information generated by the probability distribution shaping encoding unit 122, and the inverted first LSB information generated by the bit inversion unit 123.

FIG. 13 is a diagram illustrating a case where the hard decision error correction encoding unit 125 performs the systematic hard decision error correction encoding processing by using the first input bit array information generated by the input bit array information generating unit 121, and the first SSB information, the second SSB information, the second LSB information, and the first LSB information generated by the probability distribution shaping encoding unit 122.

The hard decision error correction encoding unit 125 generates a hard decision parity bit by performing the systematic hard decision error correction encoding processing, and stores the generated hard decision parity bit as a part of the first MSB information in a predetermined area (Hereinafter, the predetermined area is referred to as a "hard decision parity area".) different from the second input bit area of the first row in the first bit string group information.

Specifically, the hard decision error correction encoding unit 125 stores the generated hard decision parity bit in the hard decision parity area of Dv[1][1] that is a bit array space in which the first MSB is stored. Hereinafter, the description will be given assuming that the hard decision parity area is D[1][1][N3+1:N1].

As the systematic hard decision error correction encoding processing, a BCH code, a Reed-Solomon code, or the like is used.

Note that, functions of the input information acquiring unit 110, the encoding unit 120a, the modulation symbol conversion unit 130, and the transmission waveform shaping unit 140 included in the error correction encoding device 100a according to the second embodiment may be implemented by the processor 501 and the memory 502 in the hardware configuration illustrated as an example in FIGS. 5A and 5B in the first embodiment, or may be implemented by the processing circuit 503.

Operation of the error correction encoding device 100a according to the second embodiment will be described with reference to FIGS. 14A, 14B, and 14C.

Figure 14A:
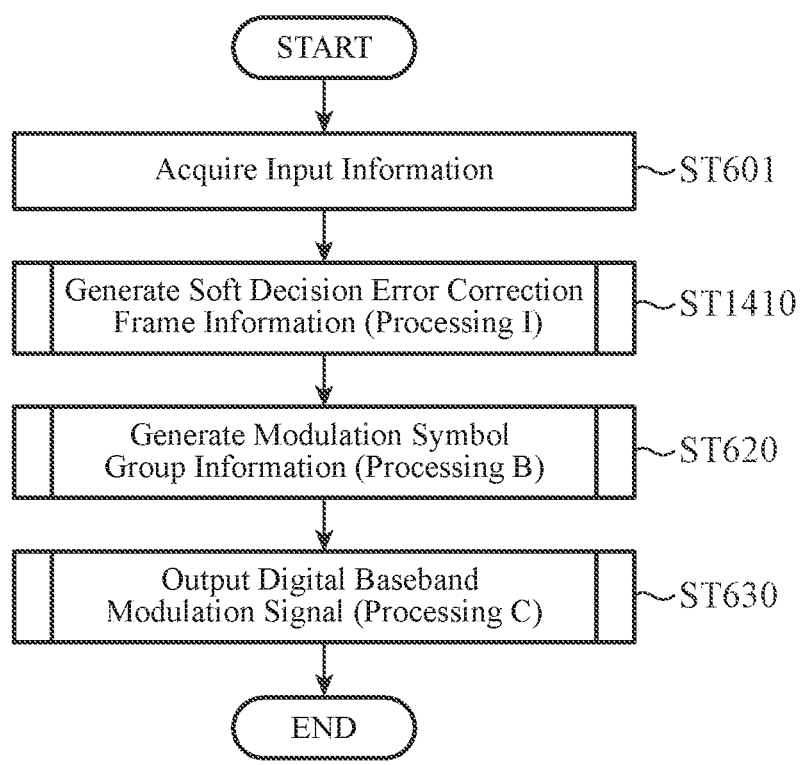
FIG. 14A is a part of a flowchart illustrating an example of processing performed by the error correction encoding device according to the second embodiment.

FIG. 14A is a part of a flowchart illustrating an example of processing performed by the error correction encoding device 100a according to the second embodiment.

Figure 14B:
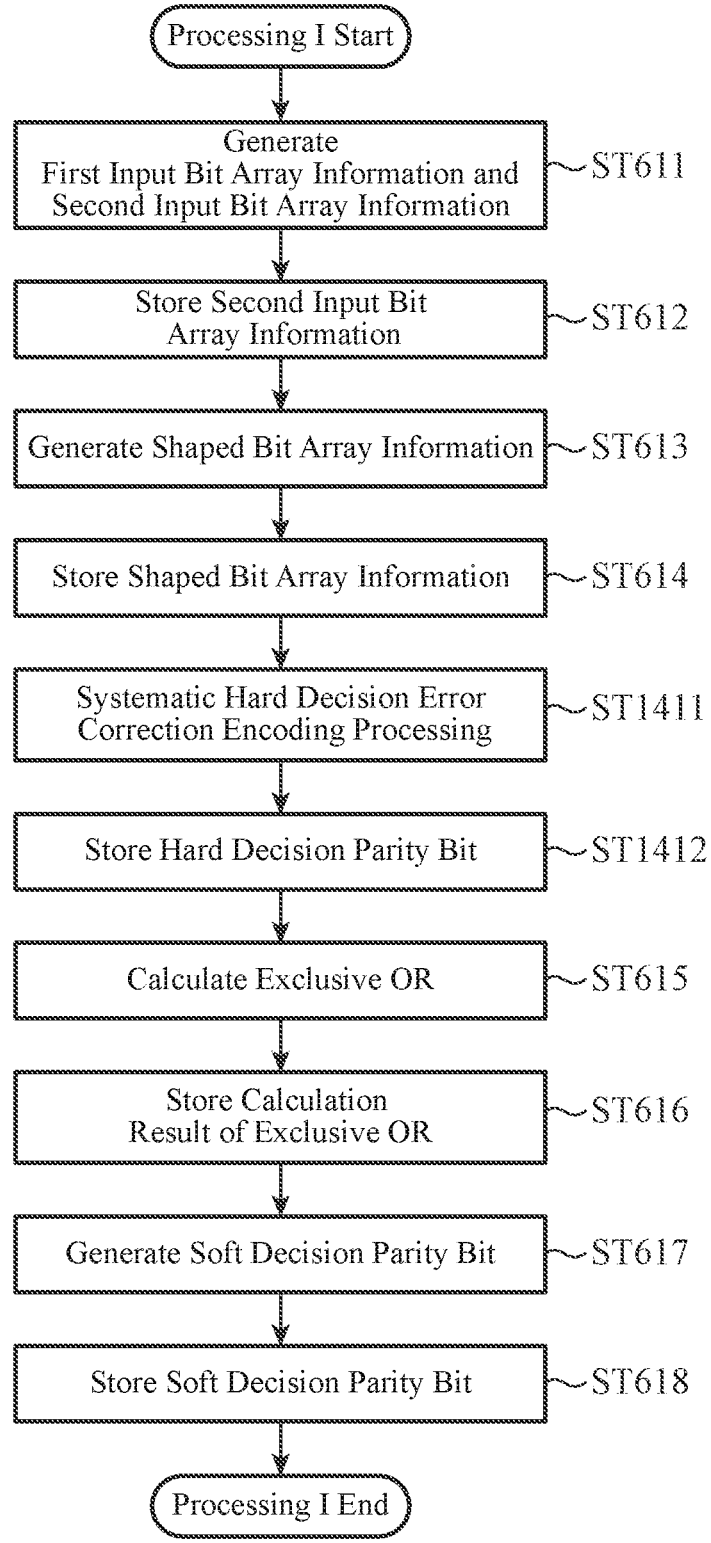
FIG. 14B is another part of the flowchart illustrating the example of the processing performed by the error correction encoding device according to the second embodiment.

FIG. 14B is another part of the flowchart illustrating the example of the processing performed by the error correction encoding device 100a according to the second embodiment.

FIG. 14C is a remaining part of the flowchart illustrating the example of the processing performed by the error correction encoding device 100a according to the second embodiment.

Hereinafter, FIGS. 14A, 14B, and 14C are collectively denoted as FIG. 14.

The error correction encoding device 100a repeatedly executes the processing of the flowchart illustrated in FIG. 14.

Note that, the flowchart illustrated in FIG. 14 is obtained by changing step ST610 in the flowchart illustrated in FIG. 6 to step ST1410.

In addition, the flowchart illustrated in FIG. 14 illustrates, as an example, operation in a case where the hard decision error correction encoding unit 125 performs the systematic hard decision error correction encoding processing by using the first input bit array information generated by the input bit array information generating unit 121, and the first SSB information, the second SSB information, the second LSB information, and the first LSB information generated by the probability distribution shaping encoding unit 122.

In FIG. 14, processing steps similar to processing steps of the flowchart illustrated in FIG. 6 are designated by the same reference numerals, and the description thereof will be omitted.

First, the error correction encoding device 100a performs processing of step ST601.

Next, in step ST1410, the encoding unit 120a generates the soft decision error correction frame information.

Specifically, the encoding unit 120a performs processing of step ST1410 by performing processing from step ST611 to step ST618, and processing from step ST1411 to step ST1412 in processing I below.

First, the encoding unit 120a performs the processing from step ST611 to step ST614.

After step ST614, in step ST1411, the hard decision error correction encoding unit 125 included in the encoding unit 120a performs the systematic hard decision error correction encoding processing by using the first input bit array information, the first SSB information, the second SSB information, the second LSB information, and the first LSB information.

Next, in step ST1412, the hard decision error correction encoding unit 125 included in the encoding unit 120a stores the hard decision parity bit in the hard decision parity area of Dv[1][1].

After step ST1412, the encoding unit 120a performs the processing from step ST615 to step ST618.

After step ST618, the encoding unit 120a ends the processing I. That is, after step ST618, the encoding unit 120a ends the processing of step ST1410.

After step ST1410, the error correction encoding device 100a performs processing from step ST620 to step ST630.

After step ST630, the error correction encoding device 100a ends the processing of the flowchart illustrated in FIG. 14, and the error correction encoding device 100a returns to the processing of step ST601 and repeatedly executes the processing of the flowchart illustrated in FIG. 14.

A configuration of a main part of the error correction device 200a according to the second embodiment will be described with reference to FIG. 15.

Figure 15:
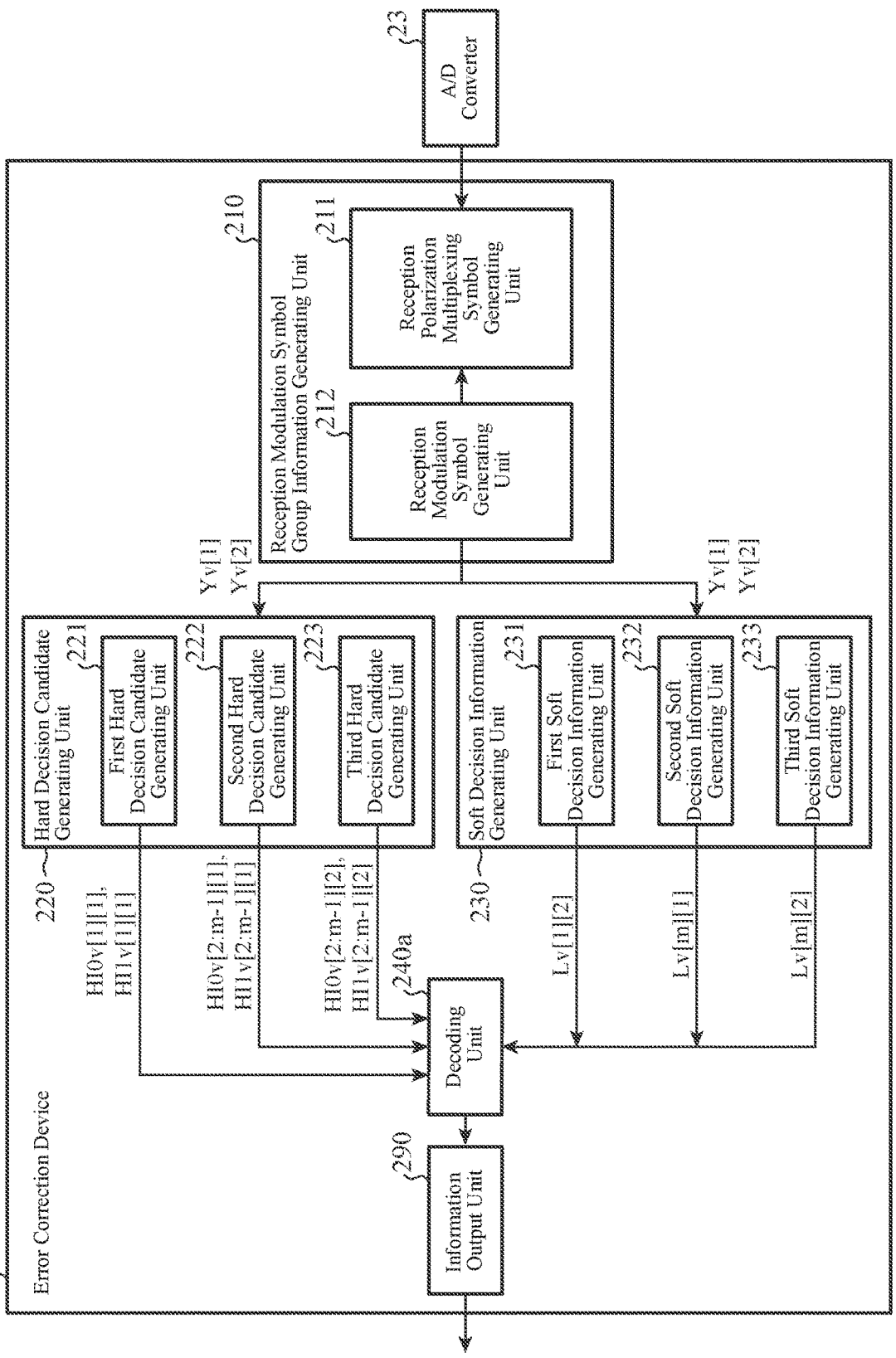
FIG. 15 is a configuration diagram illustrating an example of a configuration of a main part of an error correction device according to the second embodiment.

FIG. 15 is a configuration diagram illustrating an example of the main part of the error correction device 200a according to the second embodiment.

The error correction device 200a includes the reception modulation symbol group information generating unit 210, the hard decision candidate generating unit 220, the soft decision information generating unit 230, a decoding unit 240a, and the information output unit 290.

The error correction device 200a is obtained by changing the decoding unit 240 according to the first embodiment to the decoding unit 240a.

Note that, in FIG. 15, blocks similar to the blocks illustrated in FIG. 7 are designated by the same reference numerals, and the description thereof will be omitted.

The decoding unit 240a generates the output information by performing the multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230.

A configuration of a main part of the decoding unit 240a according to the second embodiment will be described with reference to FIG. 16.

Figure 16:
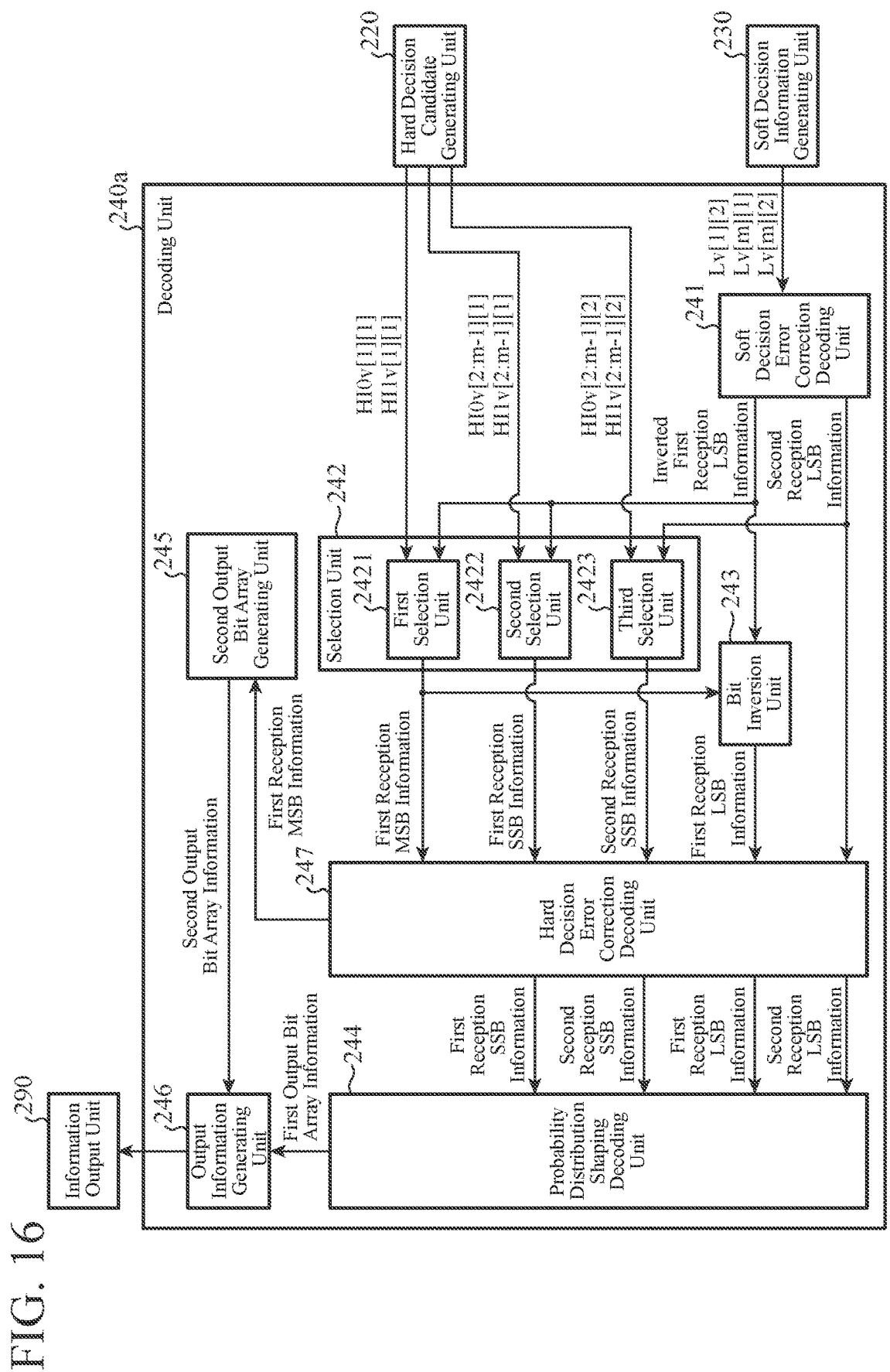
FIG. 16 is a configuration diagram illustrating an example of a configuration of a main part of a decoding unit according to the second embodiment.

FIG. 16 is a configuration diagram illustrating an example of the configuration of the main part of the decoding unit 240a according to the second embodiment.

The decoding unit 240a includes the soft decision error correction decoding unit 241, the selection unit 242, the reception side bit inversion unit 243, the probability distribution shaping decoding unit 244, the second output bit array generating unit 245, the output information generating unit 246, and a hard decision error correction decoding unit 247.

The decoding unit 240a is obtained by adding the hard decision error correction decoding unit 247 to the configuration of the decoding unit 240 according to the first embodiment.

Note that, in FIG. 16, blocks similar to the blocks illustrated in FIG. 8 are designated by the same reference numerals, and the description thereof will be omitted.

The hard decision error correction decoding unit 247 performs seventh decoding processing in the multi-stage error correction processing.

The hard decision error correction decoding unit 247 performs hard decision error correction processing on information corresponding to the second output bit array information of the first reception MSB information, and the first reception SSB information, the second reception SSB information, the second reception LSB information, and the inverted first reception LSB information on the basis of information stored in an area (Hereinafter, the area is referred to as a "reception hard decision parity area".) that is a predetermined area of the first reception MSB information and corresponds to the hard decision parity area of the first MSB information.

The hard decision error correction decoding unit 247 may perform the hard decision error correction processing on the information corresponding to the second output bit array information of the first reception MSB information, and the first reception SSB information, the second reception SSB information, the second reception LSB information, and the first reception LSB information on the basis of the information stored in the reception hard decision parity area of the first reception MSB information.

In addition, the hard decision error correction decoding unit 247 may perform the hard decision error correction processing on the information corresponding to the second output bit array information of the first reception MSB information, and the first output bit array information on the basis of the information stored in the reception hard decision parity area of the first reception MSB information.

FIG. 16 is a diagram illustrating a case where the hard decision error correction decoding unit 247 performs the hard decision error correction processing on the information corresponding to the second output bit array information of the first reception MSB information, and the first reception SSB information, the second reception SSB information, the second reception LSB information, and the first reception LSB information on the basis of the information stored in the reception hard decision parity area of the first reception MSB information.

Note that, in a case where the hard decision error correction decoding unit 247 performs the hard decision error correction processing on the information corresponding to the second output bit array information of the first reception MSB information, and the first reception SSB information, the second reception SSB information, the second reception LSB information, and the inverted first reception LSB information, the reception side bit inversion unit 243 calculates an exclusive OR by using the inverted first reception LSB information after the seventh decoding processing and the first reception MSB information in the third decoding processing, and the second output bit array generating unit 245 generates the second output bit array information by extracting information of a predetermined area of the first reception MSB information after the seventh decoding processing in the fifth decoding processing.

In addition, in a case where the hard decision error correction decoding unit 247 performs the hard decision error correction processing on the information corresponding to the second output bit array information of the first reception MSB information, and the first reception SSB information, the second reception SSB information, the second reception LSB information, and the first reception LSB information, the probability distribution shaping decoding unit 244 performs the probability distribution shaping decoding processing on the first reception SSB information, the second reception SSB information, the first reception LSB information, and the second reception LSB information after the seventh decoding processing in the fourth decoding processing, and the second output bit array generating unit 245 generates the second output bit array information by extracting the information of the predetermined area of the first reception MSB information after the seventh decoding processing in the fifth decoding processing.

In addition, in a case where the hard decision error correction decoding unit 247 performs the hard decision error correction processing on the information corresponding to the second output bit array information of the first reception MSB information, and the first output bit array information, the second output bit array generating unit 245 generates the second output bit array information by extracting the information of the predetermined area of the first reception MSB information after the seventh decoding processing in the fifth decoding processing, and the output information generating unit 246 generates the output information on the basis of the second output bit array information and the first output bit array information after the seventh decoding processing in the sixth decoding processing.

The error correction device 200a can obtain output information with less residual error by performing error correction by the hard decision error correction processing as compared with a case where the hard decision error correction processing is not performed.

Note that, functions of the reception modulation symbol group information generating unit 210, the hard decision candidate generating unit 220, the soft decision information generating unit 230, the decoding unit 240a, and the information output unit 290 included in the error correction device 200a according to the second embodiment may be implemented by the processor 901 and the memory 902 in the hardware configuration illustrated as an example in FIGS. 9A and 9B in the first embodiment, or may be implemented by the processing circuit 903.

Operation of the error correction device 200a according to the second embodiment will be described with reference to FIGS. 17A, 17B, and 17C.

Figure 17A:
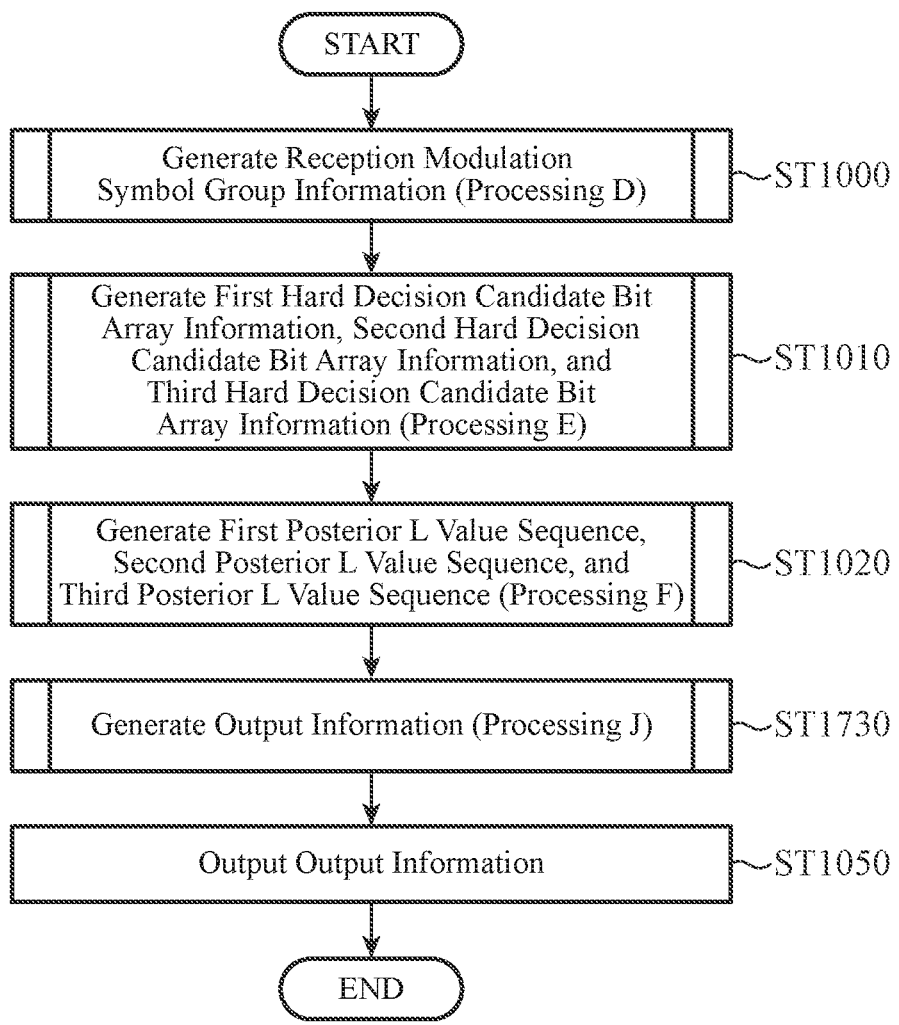
FIG. 17A is a part of a flowchart illustrating an example of processing performed by the error correction device according to the second embodiment.

FIG. 17A is a part of a flowchart illustrating an example of processing performed by the error correction device 200a according to the second embodiment.

Figure 17B:
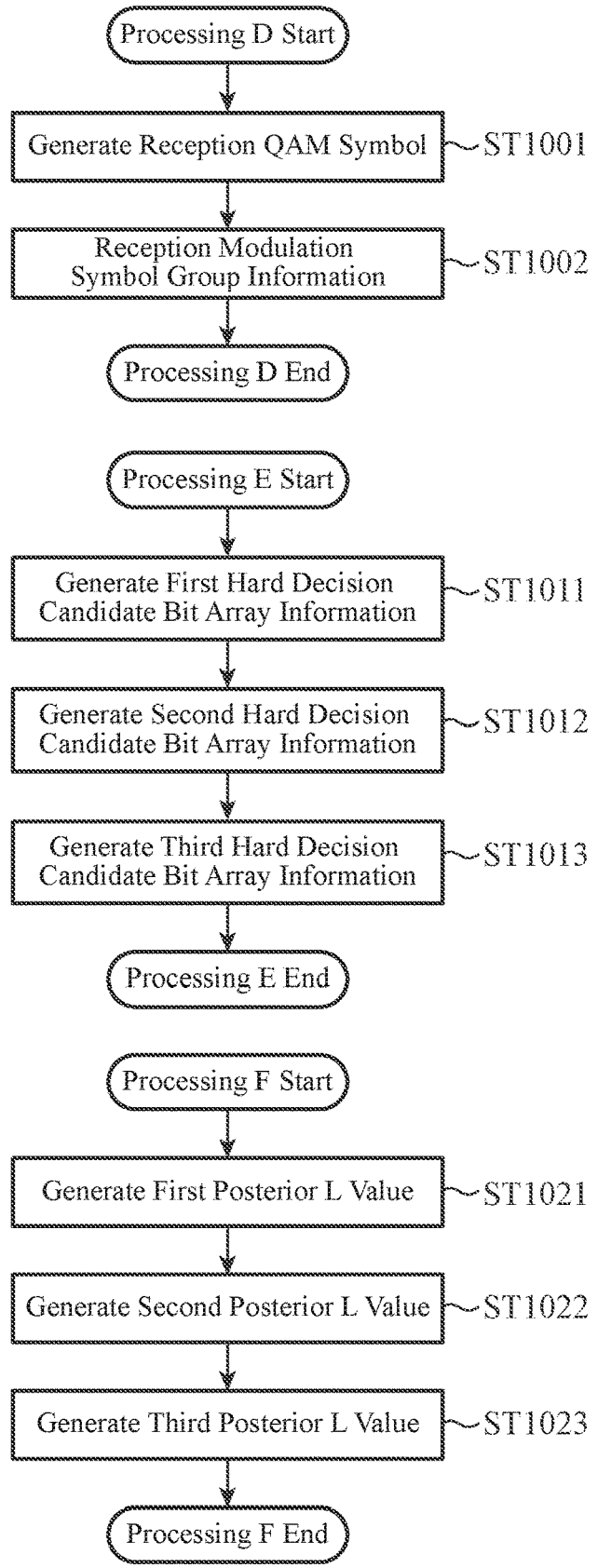
FIG. 17B is another part of the flowchart illustrating the example of the processing performed by the error correction device according to the second embodiment.

FIG. 17B is another part of the flowchart illustrating the example of the processing performed by the error correction device 200a according to the second embodiment.

Figure 17C:
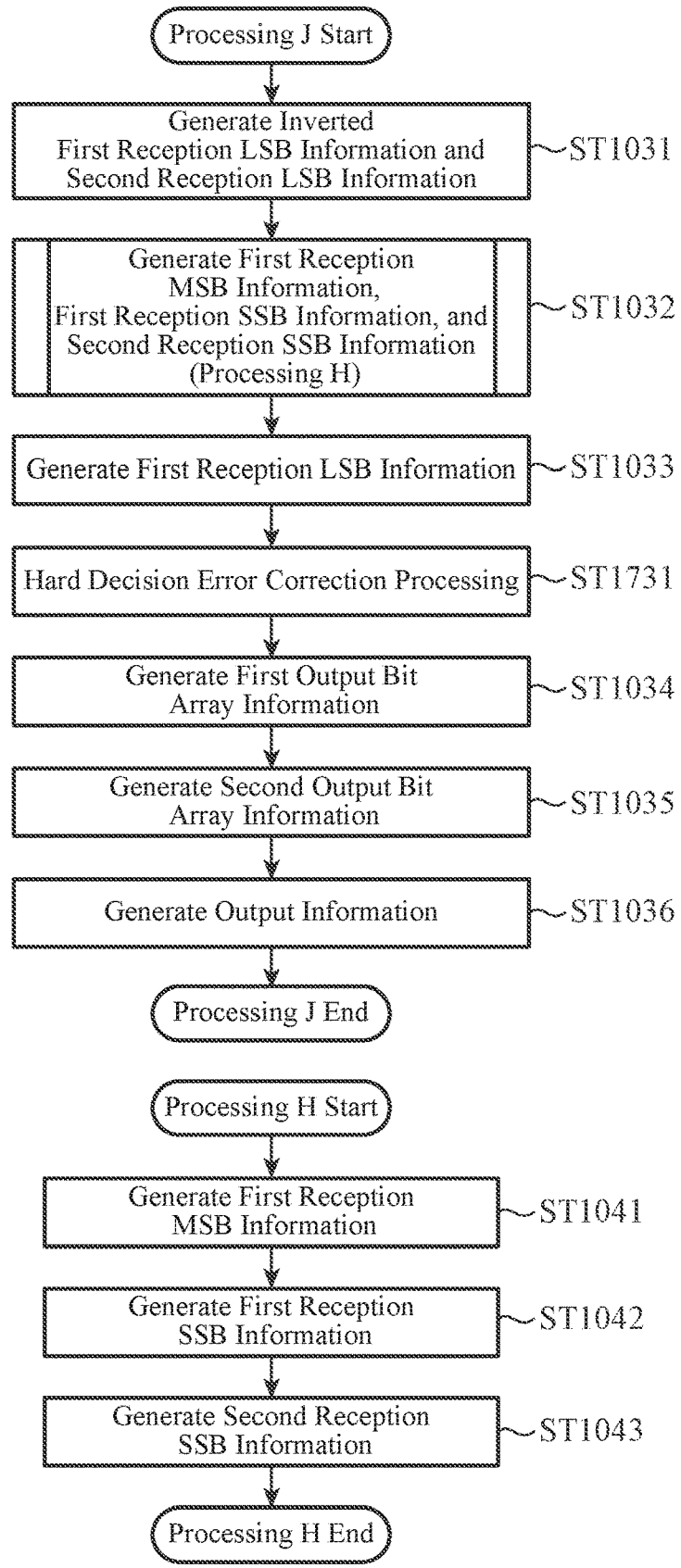
FIG. 17C is a remaining part of the flowchart illustrating the example of the processing performed by the error correction device according to the second embodiment.

FIG. 17C is a remaining part of the flowchart illustrating the example of the processing performed by the error correction device 200a according to the second embodiment.

Hereinafter, FIGS. 17A, 17B, and 17C are collectively denoted as FIG. 17.

The error correction device 200a repeatedly executes the processing of the flowchart illustrated in FIG. 17.

Note that, the flowchart illustrated in FIG. 17 is obtained by changing step ST1030 in the flowchart illustrated in FIG. 10 to step ST1730.

In addition, the flowchart illustrated in FIG. 17 illustrates, as an example, operation in a case where the hard decision error correction decoding unit 247 performs the hard decision error correction processing on the information corresponding to the second output bit array information of the first reception MSB information, and the first reception SSB information, the second reception SSB information, the second reception LSB information, and the first reception LSB information on the basis of the information stored in the reception hard decision parity area of the first reception MSB information.

In FIG. 17, processing steps similar to processing steps of the flowchart illustrated in FIG. 10 are designated by the same reference numerals, and the description thereof will be omitted.

First, the error correction device 200a performs processing from step ST1000 to step ST1020.

After step ST1020, in step ST1730, the decoding unit 240a generates the output information by performing the multi-stage error correction processing.

Specifically, the decoding unit 240a performs processing of step ST1730 by performing processing from step ST1031 to step ST1036 and processing of step ST1731 in processing J below.

The decoding unit 240a performs processing from step ST1031 to step ST1033.

After step ST1033, in step ST1731, the hard decision error correction decoding unit 247 included in the decoding unit 240a performs the hard decision error correction processing.

After step ST1731, the decoding unit 240a performs processing from step ST1034 to step ST1036.

After step ST1036, the decoding unit 240a ends the processing J. That is, after step ST1036, the decoding unit 240a ends the processing of step ST1730.

After step ST1730, the error correction device 200a performs processing of step ST1050.

After step ST1050, the error correction device 200a ends the processing of the flowchart illustrated in FIG. 17, and the error correction device 200a returns to the processing of step ST1000 and repeatedly executes the processing of the flowchart illustrated in FIG. 17.

As described above, the error correction encoding device 100a includes: the input information acquiring unit 110 to acquire the input information; the encoding unit 120a to generate the soft decision error correction frame information including the bit array of m rows and N columns on the basis of the input information acquired by the input information acquiring unit 110, the bit array being obtained by combining the first bit string group information and the second bit string group information, the first bit string group information including the bit array of m rows and N1 columns in which it is enabled to perform the pulse amplitude modulation of the combination of bit values of each column of the first bit string group information into the modulation symbol by using the predetermined first symbol mapping rule, the second bit string group information including the bit array of m rows and N2 columns in which it is enabled to perform the pulse amplitude modulation of the combination of bit values of each column of the second bit string group information into the modulation symbol by using the predetermined second symbol mapping rule; the modulation symbol conversion unit 130 to generate the modulation symbol group information including N pieces of the modulation symbols by performing the pulse amplitude modulation of the combination of bit values of each column of the soft decision error correction frame information generated by the encoding unit 120a into the modulation symbol for each column of the soft decision error correction frame information by using the first symbol mapping rule or the second symbol mapping rule; and the transmission waveform shaping unit 140 to generate the digital baseband modulation signal on the basis of the modulation symbol group information generated by the modulation symbol conversion unit 130 and output the digital baseband modulation signal generated, in which the encoding unit 120a generates the soft decision error correction frame information by: generating the first input bit array information including the bit array of m−1 rows and N columns and the second input bit array information including the bit array of one row and N3 columns on the basis of the input information acquired by the input information acquiring unit 110; storing the second input bit array information generated as a part of the first MSB information including the bit array of one row and N1 columns in the predetermined area of the first row in the first bit string group information; generating the shaped bit array information including the bit array of m−1 rows and N columns by performing the probability distribution shaping encoding processing on the first input bit array information generated; generating the first group bit array information including the combination of N1 predetermined columns and the second group bit array information including the combination of N2 predetermined columns by separating the shaped bit array information generated; generating the first LSB information including the bit array of one row and N1 columns by extracting, from the first group bit array information generated, the bit array of the (m−1)-th row in the first group bit array information, generating the inverted first LSB information including the bit array of one row and N1 columns by calculating exclusive ORs of bit values of each columns in the first LSB information generated and each bit values of each columns in the information of the first row in the first bit string group information after storing the second input bit array information, the columns in the information of the first row in the first bit string group information each corresponding to the columns in the first LSB information, and storing the inverted first LSB information generated in the m-th row in the first bit string group information; generating the second LSB information including the bit array of one row and N2 columns by extracting the bit array of the (m−1)-th row in the second group bit array information from the second group bit array information generated, and storing the second LSB information generated in the m-th row in the second bit string group information; generating the soft decision parity bit by performing the systematic soft decision error correction encoding processing by using the inverted first LSB information generated and the second LSB information generated, and storing the soft decision parity bit generated, in the first row in the second bit string group information as the second MSB information including the bit array of one row and N2 columns; in the case where m is greater than or equal to 3, generating the first SSB information including the bit array of m−2 rows and N1 columns by extracting, from the first group bit array information generated, the first row to the (m−2)-th row in the first group bit array information, and storing the first SSB information generated, in the second row to the (m−1)-th row in the first bit string group information; and in the case where m is greater than or equal to 3, generating the second SSB information including the bit array of m−2 rows and N2 columns by extracting, from the second group bit array information generated, the first row to the (m−2)-th row in the second group bit array information, and storing the second SSB information generated, in the second row to the (m−1)-th row in the second bit string group information.

Further, in the above-described configuration, the error correction encoding device 100a is configured so that the encoding unit 120a generates the hard decision parity bit by performing the systematic hard decision error correction encoding processing, by using the first input bit array information and the second input bit array information, or by using the first input bit array information, the first SSB information, the second SSB information, the second LSB information, and the first LSB information or the inverted first LSB information, and stores the hard decision parity bit generated, as the part of the first MSB information in the predetermined area different from the area storing the second input bit array information of the first row in the first bit string group information.

With this configuration, the error correction encoding device 100a can reduce the number of bits to be protected by the soft decision error correction as compared with the conventional soft decision error correction encoding processing. For that reason, the error correction encoding device 100a can reduce the amount of calculation of the soft decision error correction encoding processing as compared with the conventional soft decision error correction encoding processing.

In addition, with this configuration, the error correction encoding device 100a can make the number of bits to be protected by the soft decision error correction constant even if the number of bits of the pulse amplitude modulation changes. For that reason, the error correction encoding device 100a can make the amount of calculation of the soft decision error correction encoding processing constant in the pulse amplitude modulation of any number of bits. Thus, the error correction encoding device 100a does not need to change the program or the processing circuit for performing the soft decision error correction encoding processing for each number of bits of the pulse amplitude modulation, in the pulse amplitude modulation of a plurality of number of bits.

In addition, with this configuration, it is possible to perform the error correction by the hard decision error correction processing in the error correction device 200a, so that the error correction encoding device 100a can cause the error correction device 200a to output information with less residual error as compared with the case where the hard decision error correction processing is not performed.

Note that, the hard decision error correction encoding unit 125 included in the encoding unit 120a may store the second MSB information that is the soft decision parity bit generated by the soft decision error correction encoding unit 124 performing the systematic soft decision error correction encoding processing in Dv[1][2] that is the bit array space of the first row in the second bit string group information, and then perform the systematic hard decision error correction encoding processing on the basis of the second input bit array information stored in the second input bit area, the second MSB information stored in Dv[1][2], and the first SSB information, the second SSB information, the inverted first LSB information, and the second LSB information stored in Dv[2:m][1:2].

With this configuration, the error correction encoding device 100a can reduce a burst error of the second reception MSB information corresponding to the soft decision parity bit that is the second MSB information, in the soft decision error correction decoding processing in the error correction device 200a.

In addition, as described above, the error correction device 200a includes: the reception modulation symbol group information generating unit 210 to receive the reception digital baseband modulation signal that is the signal based on the soft decision error correction frame information generated by the error correction encoding device 100a and generate reception modulation symbol group information including N reception modulation symbols on the basis of the reception digital baseband modulation signal; the hard decision candidate generating unit 220 to generate first hard decision candidate bit array information including the bit array of one row and N1 columns, second hard decision candidate bit array information including the bit array of m−2 rows and N1 columns in the case where m is greater than or equal to 3, and third hard decision candidate bit array information including the bit array of m−2 rows and N2 columns in the case where m is greater than or equal to 3, by using the reception modulation symbol group information generated by the reception modulation symbol group information generating unit 210 on the basis of the first symbol mapping rule or the second symbol mapping rule; the soft decision information generating unit 230 to generate the first posterior L value sequence including N2 posterior L values corresponding to each columns of the first row of the second bit string group information, the second posterior L value sequence including N1 posterior L values corresponding to each columns of the m-th row of the first bit string group information, and the third posterior L value sequence including N2 posterior L values corresponding to each columns of the m-th row of the second bit string group information on the basis of the reception modulation symbol group information generated by the reception modulation symbol group information generating unit 210; the decoding unit 240a to perform multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230; and the information output unit 290 to output information generated by the decoding unit 240a performing the multi-stage error correction processing as output information, in which: in the first decoding processing in the multi-stage error correction processing, the decoding unit 240a generates inverted first reception LSB information including the bit array of one row and N1 columns corresponding to the inverted first LSB information and second reception LSB information including the bit array of one row and N2 columns corresponding to the second LSB information by performing soft decision error correction processing on the basis of the first posterior L value sequence, the second posterior L value sequence, and the third posterior L value sequence; in the second decoding processing in the multi-stage error correction processing, the decoding unit 240a generates first reception MSB information including the bit array of one row and N1 columns corresponding to the first MSB information on the basis of the first hard decision candidate bit array information and the inverted first reception LSB information, generates first reception SSB information including the bit array of m−2 rows and N1 columns corresponding to the first SSB information on the basis of the second hard decision candidate bit array information and the inverted first reception LSB information in the case where m is greater than or equal to 3, and generates second reception SSB information including the bit array of m−2 rows and N2 columns corresponding to the second SSB information on the basis of the third hard decision candidate bit array information and the second reception LSB information in the case where m is greater than or equal to 3; in the third decoding processing in the multi-stage error correction processing, the decoding unit 240a generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information; in the fourth decoding processing in the multi-stage error correction processing, the decoding unit 240a generates first output bit array information including the bit array of m−1 rows and N columns corresponding to the first input bit array information by performing probability distribution shaping decoding processing on the first reception SSB information, the second reception SSB information, the first reception LSB information, and the second reception LSB information; in the fifth decoding processing in the multi-stage error correction processing, the decoding unit 240a generates second output bit array information including the bit array of one row and N3 columns corresponding to the second input bit array information by extracting information of the predetermined area of the first reception MSB information; in the sixth decoding processing in the multi-stage error correction processing, the decoding unit 240a generates the output information corresponding to the input information on the basis of the first output bit array information and the second output bit array information; and the information output unit 290 outputs the output information generated by the decoding unit 240a.

Further, in the above-described configuration, the error correction device 200a is configured so that: the decoding unit 240a performs the hard decision error correction processing on the information corresponding to the second output bit array information of the first reception MSB information, and the first reception SSB information, the second reception SSB information, the second reception LSB information, and the first reception LSB information or the inverted first reception LSB information, or on the information corresponding to the second output bit array information of the first reception MSB information and the first output bit array information, on the basis of the information stored in the predetermined area of the first reception MSB information, in the seventh decoding processing in the multi-stage error correction processing; and in a case where the decoding unit 240a performs the hard decision error correction processing on the information corresponding to the second output bit array information of the first reception MSB information, and the first reception SSB information, the second reception SSB information, the second reception LSB information, and the inverted first reception LSB information, the decoding unit 240a generates the second output bit array information by calculating the exclusive OR by using the inverted first reception LSB information and the first reception MSB information after the seventh decoding processing, in the third decoding processing, and extracting the information of the predetermined area of the first reception MSB information after the seventh decoding processing, in the fifth decoding processing; and in a case where the decoding unit 240a performs the hard decision error correction processing on the information corresponding to the second output bit array information of the first reception MSB information, and the first reception SSB information, the second reception SSB information, the second reception LSB information, and the first reception LSB information, the decoding unit 240a generates the second output bit array information by performing the probability distribution shaping decoding processing on the first reception SSB information, the second reception SSB information, the first reception LSB information, and the second reception LSB information after the seventh decoding processing, in the fourth decoding processing, and extracting the information of the predetermined area of the first reception MSB information after the seventh decoding processing, in the fifth decoding processing; and in a case where the decoding unit 240a performs the hard decision error correction processing on the information corresponding to the second output bit array information of the first reception MSB information, and the first output bit array information, the decoding unit 240a generates the second output bit array information by extracting the information of the predetermined area of the first reception MSB information after the seventh decoding processing, in the fifth decoding processing, and generates the output information on the basis of the second output bit array information and the first output bit array information after the seventh decoding processing, in the sixth decoding processing.

With this configuration, the error correction device 200a can reduce the number of bits to be protected by the soft decision error correction as compared with the conventional soft decision error correction encoding processing. For that reason, the error correction device 200a can reduce the amount of calculation of the soft decision error correction decoding processing as compared with the conventional soft decision error correction decoding processing.

In addition, with this configuration, the error correction device 200a can make the number of bits to be protected by the soft decision error correction constant even if the number of bits of the pulse amplitude modulation changes. For that reason, the error correction device 200a can make the amount of calculation of the soft decision error correction decoding processing constant in the pulse amplitude modulation of any number of bits. Thus, the error correction device 200a does not need to change the program or the processing circuit for performing the soft decision error correction decoding processing for each number of bits of the pulse amplitude modulation, in the pulse amplitude modulation of a plurality of number of bits.

In addition, with this configuration, the error correction device 200a can perform the error correction by the hard decision error correction processing, so that it is possible to output information with less residual error as compared with the case where the hard decision error correction processing is not performed.

Modification of Second Embodiment

A modification of the second embodiment is a particularly effective embodiment in a case where the input information is information corresponding to the second input bit array information and the information includes information of the number of bits less than N3, or in a case where the input information does not include information corresponding to the first input bit array information or the second input bit array information.

Hereinafter, the description will be given assuming that the input information includes the first input bit array information including a bit array of m−1 rows and N columns and information corresponding to the second input bit array information including N5 (N5 is an integer of greater than or equal to 0 and less than N3.) bits.

A configuration of a main part of a communication system 1d according to the modification of the second embodiment will be described with reference to FIG. 35.

Figure 35:
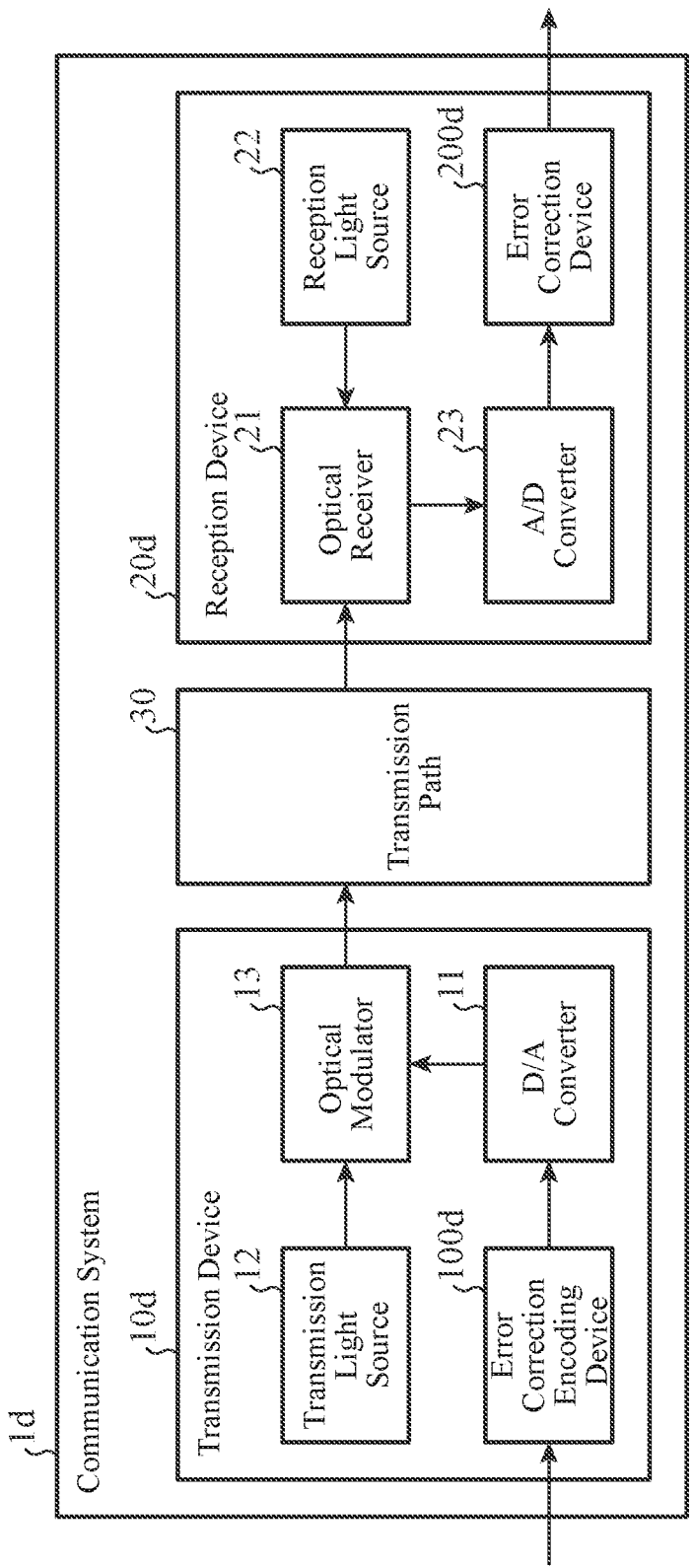
FIG. 35 is a configuration diagram illustrating an example of a configuration of a main part of a communication system according to a modification of the second embodiment.

FIG. 35 is a configuration diagram illustrating an example of the configuration of the main part of the communication system 1d according to the modification of the second embodiment.

In the modification of the second embodiment, as an example, the communication system 1d is described as an optical communication system, but the optical communication system is merely an example, and the communication system 1d is not limited to the optical communication system. For example, the communication system 1d may be a communication system by wireless communication, metal communication, or the like.

The communication system 1d includes a transmission device 10d, the transmission path 30, and a reception device 20d.

The communication system 1d is obtained by changing the transmission device 10a and the reception device 20a according to the second embodiment to the transmission device 10d and the reception device 20d.

Note that, in FIG. 35, blocks similar to the blocks illustrated in FIG. 11 are designated by the same reference numerals, and the description thereof will be omitted.

The transmission device 10d acquires input information and outputs a signal based on the acquired input information. Since the communication system 1d illustrated in FIG. 35 is the optical communication system, the transmission device 10d illustrated in FIG. 35 is an optical transmission device to output an optical signal.

The transmission device 10d includes an error correction encoding device 100d, the D/A converter 11, the transmission light source 12, and the optical modulator 13.

The transmission device 10d is obtained by changing the error correction encoding device 100a according to the second embodiment to the error correction encoding device 100d.

The error correction encoding device 100d acquires the input information input from the outside of the device, and generates a digital baseband modulation signal on the basis of the acquired input information. The error correction encoding device 100d outputs the generated digital baseband modulation signal to the D/A converter 11.

The reception device 20d receives the signal output by the transmission device 10d via the transmission path 30, generates output information corresponding to the input information on the basis of the signal, and outputs the generated output information. Since the communication system 1d illustrated in FIG. 35 is the optical communication system, the reception device 20d illustrated in FIG. 35 is an optical reception device to receive the optical signal.

The reception device 20d includes the reception light source 22, the optical receiver 21, the A/D converter 23, and an error correction device 200d.

The reception device 20d is obtained by changing the error correction device 200a according to the second embodiment to the error correction device 200d.

The error correction device 200d receives the reception digital baseband modulation signal output by the A/D converter 23, generates the output information corresponding to the input information on the basis of the reception digital baseband modulation signal, and outputs the generated output information.

A configuration of a main part of the error correction encoding device 100d according to the modification the second embodiment will be described with reference to FIG. 36.

Figure 36:
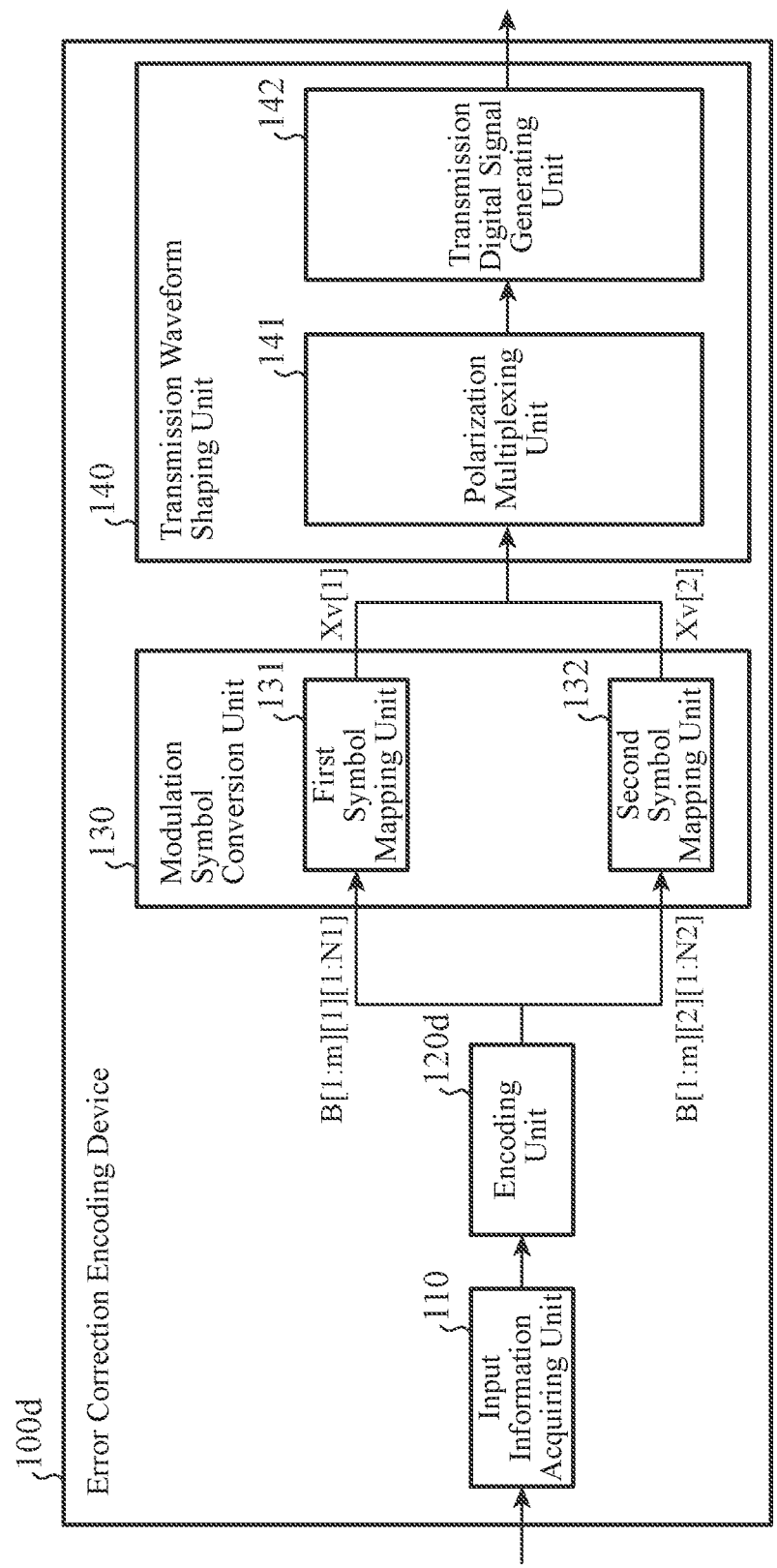
FIG. 36 is a configuration diagram illustrating an example of a configuration of a main part of an error correction encoding device according to the modification of the second embodiment.

FIG. 36 is a configuration diagram illustrating an example of the configuration of the main part of the error correction encoding device 100d according to the modification of the second embodiment.

The error correction encoding device 100d includes the input information acquiring unit 110, an encoding unit 120d, the modulation symbol conversion unit 130, and the transmission waveform shaping unit 140.

The error correction encoding device 100d is obtained by changing the encoding unit 120a according to the second embodiment to the encoding unit 120d.

Note that, in FIG. 36, blocks similar to the blocks illustrated in FIG. 12 are designated by the same reference numerals, and the description thereof will be omitted.

The encoding unit 120d generates soft decision error correction frame information obtained by combining the first bit string group information and the second bit string group information on the basis of the input information acquired by the input information acquiring unit 110.

A configuration of a main part of the encoding unit 120d according to the modification of the second embodiment will be described with reference to FIG. 37.

Figure 37:
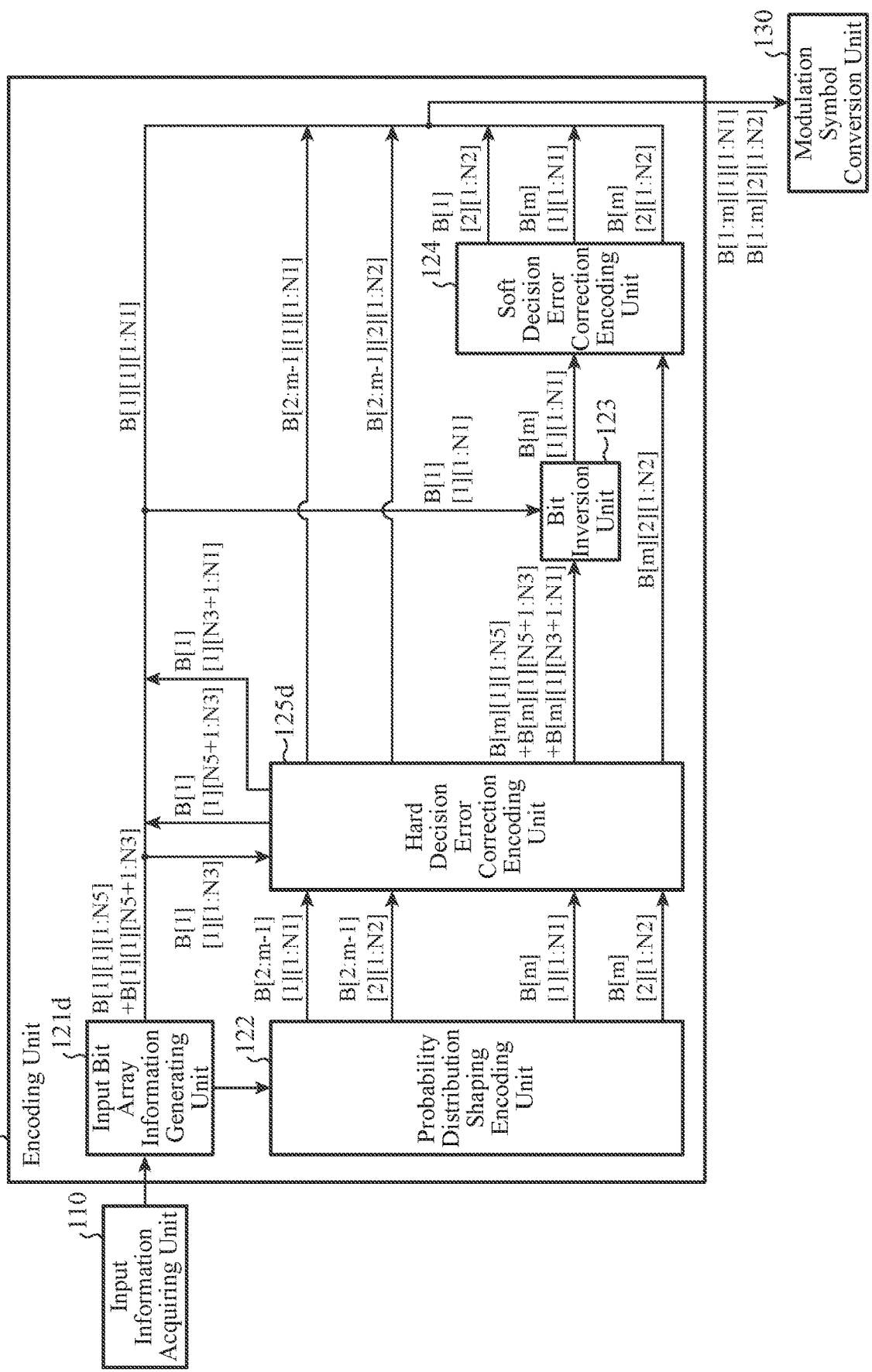
FIG. 37 is a configuration diagram illustrating an example of a configuration of a main part of an encoding unit according to the modification of the second embodiment.

FIG. 37 is a configuration diagram illustrating an example of the configuration of the main part of the encoding unit 120d according to the modification of the second embodiment.

The encoding unit 120d includes an input bit array information generating unit 121d, the probability distribution shaping encoding unit 122, the bit inversion unit 123, the soft decision error correction encoding unit 124, and a hard decision error correction encoding unit 125d.

The encoding unit 120d is obtained by changing the input bit array information generating unit 121 and the hard decision error correction encoding unit 125 according to the second embodiment to the input bit array information generating unit 121d and the hard decision error correction encoding unit 125d.

Note that, in FIG. 37, blocks similar to the blocks illustrated in FIG. 13 are designated by the same reference numerals, and the description thereof will be omitted.

The input bit array information generating unit 121d generates the first input bit array information including the bit array of m−1 rows and N columns and the second input bit array information including the bit array of one row and N3 columns on the basis of the input information acquired by the input information acquiring unit 110.

Specifically, for example, the input bit array information generating unit 121d generates the first input bit array information by extracting the first input bit array information including the bit array of m−1 rows and N columns included in the input information.

In addition, when generating the second input bit array information on the basis of the input information acquired by the input information acquiring unit 110, the input bit array information generating unit 121d generates the second input bit array information by setting a bit value of a bit other than a bit corresponding to the input information to a predetermined value in the second input bit array information.

More specifically, for example, the input bit array information generating unit 121d generates the second input bit array information by extracting information corresponding to the second input bit array information including the N5 bits included in the input information, setting a part of the second input bit array information as the information, and setting a remaining part of the second input bit array information to the predetermined value.

The value to be applied to the remaining part of the second input bit array information is, for example, "0". The value may be "1". In addition, if it is an array of predetermined values, an array of any values using "0" or "1" for each column in the remaining part of the second input bit array information may be used.

The input bit array information generating unit 121d stores the generated second input bit array information in the second input bit area, as a part of the first MSB information including a bit array of one row and N1 columns.

Specifically, the input bit array information generating unit 121d stores the second input bit array information in the second input bit area of Dv[1][1] that is a bit array space in which the first MSB is stored. Hereinafter, the description will be given assuming that the second input bit area is D[1][1][1:N3].

In particular, in the modification of the second embodiment, the description will be given assuming that the information including the N5 bits extracted from the input information by the input bit array information generating unit 121d is stored in D[1][1][1:N5] of D[1][1][1:N3] that is the second input bit area. In addition, the description will be given assuming that the remaining part of the second input bit array information set to the predetermined value for generating the second input bit array information by the input bit array information generating unit 121d is stored in D[1][1][N5+1:N3] of D[1][1][1:N3] that is the second input bit area. That is, the predetermined value such as "0" or "1" is stored in D[1][1][N5+1:N3].

The hard decision error correction encoding unit 125d performs systematic hard decision error correction encoding processing by using the first input bit array information generated by the input bit array information generating unit 121d and the second input bit array information generated by the input bit array information generating unit 121d.

When performing the systematic hard decision error correction encoding processing, the hard decision error correction encoding unit 125d performs the following processing as preprocessing.

As first preprocessing, the hard decision error correction encoding unit 125d switches bit values of columns corresponding to each other between a bit value of an area storing the predetermined value, of a predetermined area of the first row in the first bit string group information storing the second input bit array information as the part of the first MSB information, and a bit value of a column corresponding to one of the columns of the area storing the predetermined value of the predetermined area of the first row in the first bit string group information, of an area of the m-th row in the first bit string group information storing the first LSB information.

As second preprocessing, the hard decision error correction encoding unit 125d calculates an exclusive OR for each of the columns corresponding to each other between a bit value after switching the bit value of the area storing the predetermined value, of the predetermined area of the first row in the first bit string group information, and a bit value after switching the bit value of the column corresponding to one of the columns of the area storing the predetermined value of the predetermined area of the first row in the first bit string group information, of the area of the m-th row in the first bit string group information.

As third preprocessing, the hard decision error correction encoding unit 125d overwrites the bit value after switching the bit value in the area storing the predetermined value of the predetermined area of the first row in the first bit string group information, by using a calculation result of the exclusive OR in the columns corresponding to each other.

Specifically, as the first preprocessing, the hard decision error correction encoding unit 125d first switches values of the columns corresponding to each other between B[1][1][N5+1:N3] that are bit values of D[1][1][N5+1:N3] and B[m][1][N5+1:N3] that are bit values of D[m][1][N5+1:N3].

Next, as the second preprocessing, the hard decision error correction encoding unit 125d calculates the exclusive OR for each of the columns corresponding to each other between B[1][1][N5+1:N3] after switching the values and B[m][1][N5+1:N3] after switching the values.

Next, as the third preprocessing, the hard decision error correction encoding unit 125d overwrites each of values of B[1][1][N5+1:N3] after switching the values by using a calculation result of the exclusive OR in the columns corresponding to each other.

After performing the above-described preprocessing, the hard decision error correction encoding unit 125d generates a hard decision parity bit by performing the systematic hard decision error correction encoding processing, and stores the generated hard decision parity bit as a part of the first MSB information in the hard decision parity area.

Specifically, the hard decision error correction encoding unit 125d stores the generated hard decision parity bit in the hard decision parity area of Dv[1][1] that is a bit array space in which the first MSB is stored. Hereinafter, the description will be given assuming that the hard decision parity area is D[1][1][N3+1:N1].

Note that, functions of the input information acquiring unit 110, the encoding unit 120d, the modulation symbol conversion unit 130, and the transmission waveform shaping unit 140 included in the error correction encoding device 100d according to the modification of the second embodiment may be implemented by the processor 501 and the memory 502 in the hardware configuration illustrated as an example in FIGS. 5A and 5B in the second embodiment, or may be implemented by the processing circuit 503.

Operation of the error correction encoding device 100d according to the modification of the second embodiment will be described with reference to FIGS. 38A, 38B, and 38C.

Figure 38A:
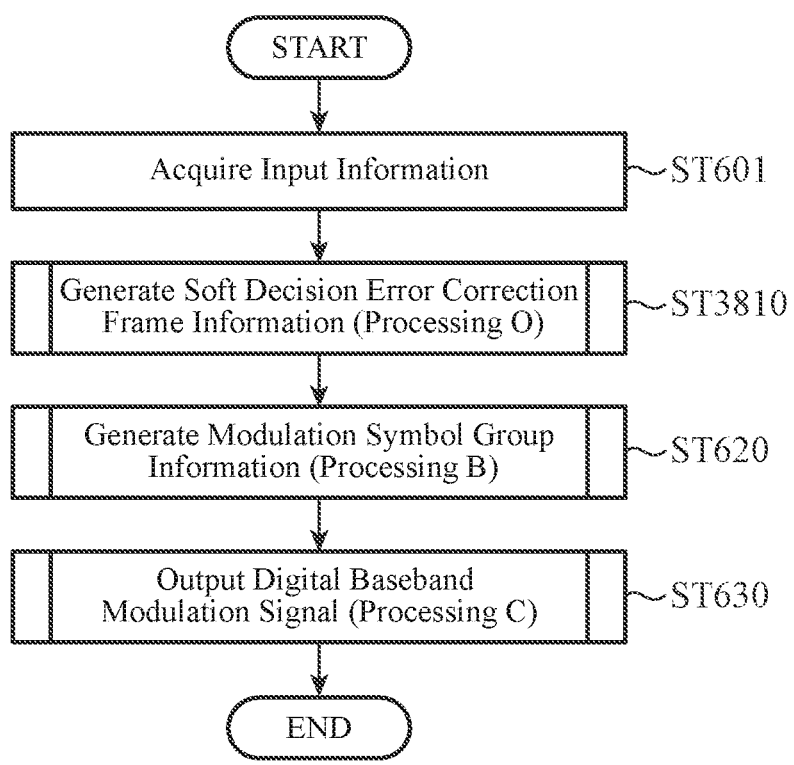
FIG. 38A is a part of a flowchart illustrating an example of processing performed by the error correction encoding device according to the modification of the second embodiment.

FIG. 38A is a part of a flowchart illustrating an example of processing performed by the error correction encoding device 100d according to the modification of the second embodiment.

Figure 38B:
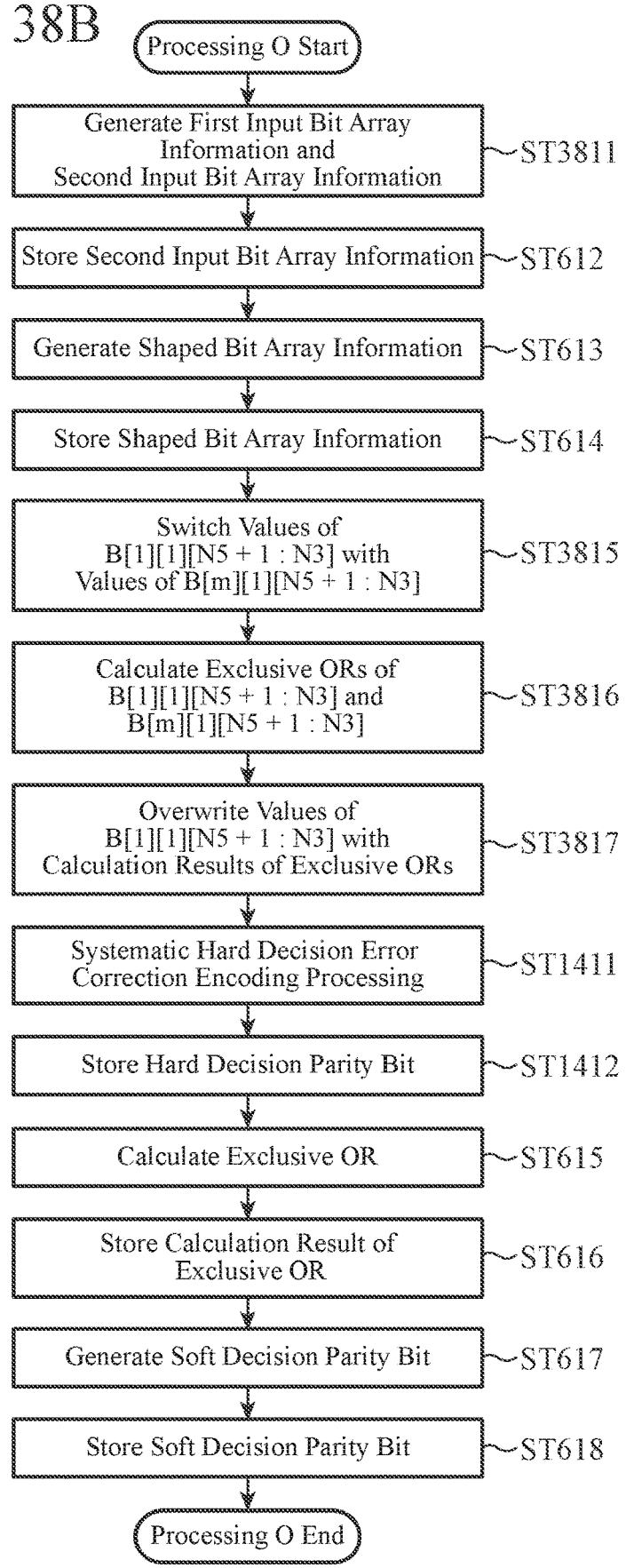
FIG. 38B is another part of the flowchart illustrating the example of the processing performed by the error correction encoding device according to the modification of the second embodiment.

FIG. 38B is another part of the flowchart illustrating the example of the processing performed by the error correction encoding device 100d according to the modification of the second embodiment.

FIG. 38C is a remaining part of the flowchart illustrating the example of the processing performed by the error correction encoding device 100d according to the modification of the second embodiment.

Hereinafter, FIGS. 38A, 38B, and 38C are collectively denoted as FIG. 38.

The error correction encoding device 100d repeatedly executes the processing of the flowchart illustrated in FIG. 38.

Note that, the flowchart illustrated in FIG. 38 is obtained by changing step ST1410 in the flowchart illustrated in FIG. 14 to step ST3810.

In FIG. 38, processing steps similar to processing steps of the flowchart illustrated in FIG. 14 are designated by the same reference numerals, and the description thereof will be omitted.

First, the error correction encoding device 100d performs processing of step ST601.

Next, in step ST3810, the encoding unit 120d generates the soft decision error correction frame information.

Specifically, the encoding unit 120d performs processing of step ST3810 by performing processing from step ST612 to step ST618, processing from step ST1411 to step ST1412, processing of step ST3811, and processing from step ST3815 to step ST3817 in processing O below.

First, in step ST3811, the input bit array information generating unit 121d included in the encoding unit 120d generates the first input bit array information and the second input bit array information.

After step ST3811, the encoding unit 120d performs the processing from step ST612 to step ST614.

After step ST614, in step ST3815, the hard decision error correction encoding unit 125d included in the encoding unit 120d switches the values of B[1][1][N5+1: N3] with the values of B[m][1][N5+1:N3].

After step ST3815, in step ST3816, the hard decision error correction encoding unit 125d included in the encoding unit 120d calculates exclusive ORs of B[1][1][N5+1:N3] and B[m][1][N5+1:N3].

After step ST3816, in step ST3817, the hard decision error correction encoding unit 125d included in the encoding unit 120d overwrites the values of B[1][1][N5+1:N3] with calculation results of the exclusive ORs.

After step ST3817, the encoding unit 120d performs the processing from step ST1411 to step ST1412.

After step ST1412, the encoding unit 120d performs the processing from step ST615 to step ST618.

After step ST618, the encoding unit 120d ends the processing O. That is, after step ST618, the encoding unit 120d ends the processing of step ST3810.

After step ST3810, the error correction encoding device 100d performs processing from step ST620 to step ST630.

After step ST630, the error correction encoding device 100d ends the processing of the flowchart illustrated in FIG. 38, and the error correction encoding device 100d returns to the processing of step ST601 and repeatedly executes the processing of the flowchart illustrated in FIG. 38.

A configuration of a main part of the error correction device 200d according to the modification of the second embodiment will be described with reference to FIG. 39.

Figure 39:
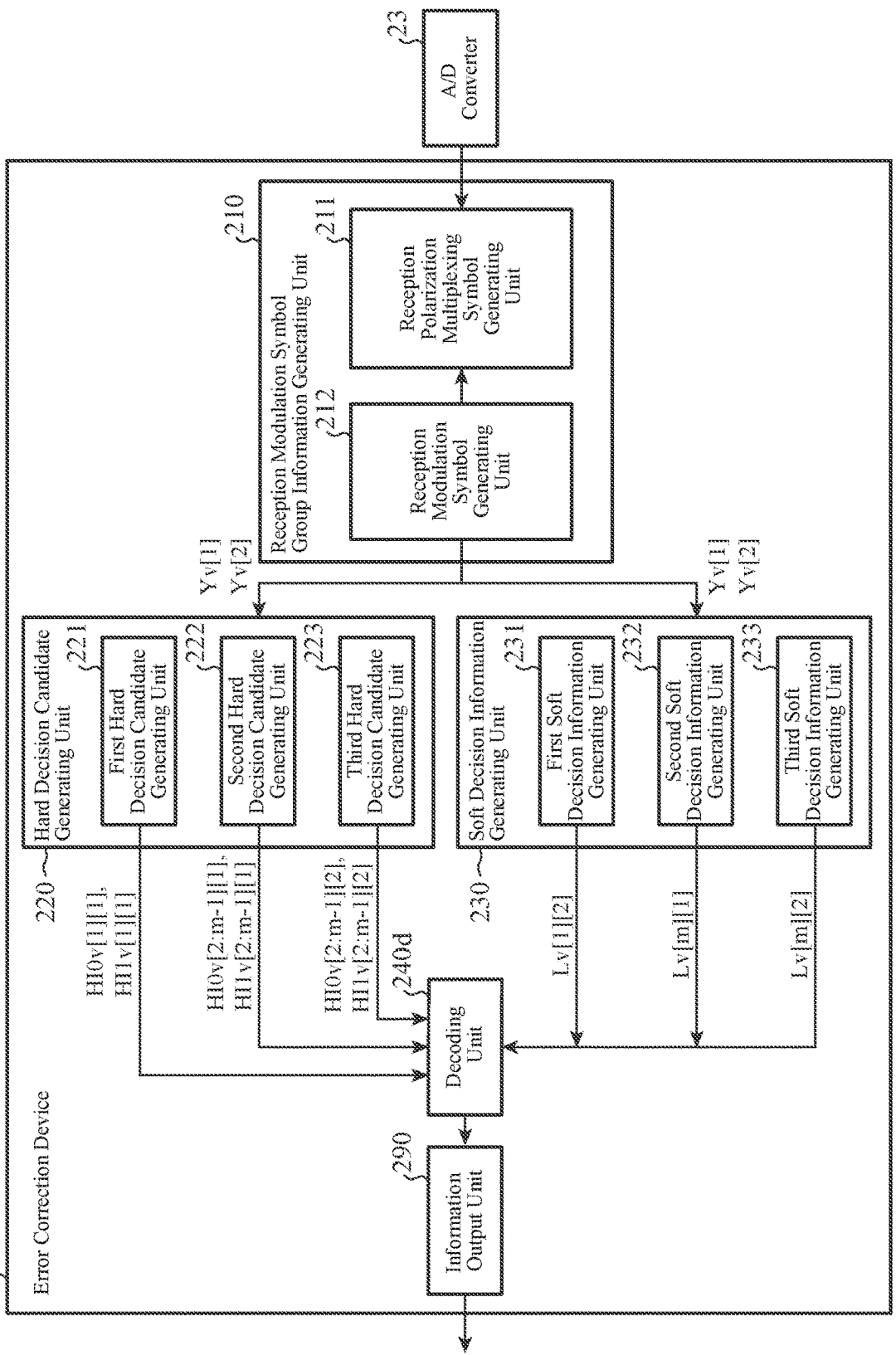
FIG. 39 is a configuration diagram illustrating an example of a configuration of a main part of an error correction device according to the modification of the second embodiment.

FIG. 39 is a configuration diagram illustrating an example of the configuration of the main part of the error correction device 200d according to the modification of the second embodiment.

The error correction device 200d includes the reception modulation symbol group information generating unit 210, the hard decision candidate generating unit 220, the soft decision information generating unit 230, a decoding unit 240d, and the information output unit 290.

The error correction device 200d is obtained by changing the decoding unit 240a according to the second embodiment to the decoding unit 240d.

Note that, in FIG. 39, blocks similar to the blocks illustrated in FIG. 15 are designated by the same reference numerals, and the description thereof will be omitted.

The decoding unit 240d generates the output information by performing the multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230.

A configuration of a main part of the decoding unit 240d according to the modification of the second embodiment will be described with reference to FIG. 40.

Figure 40:
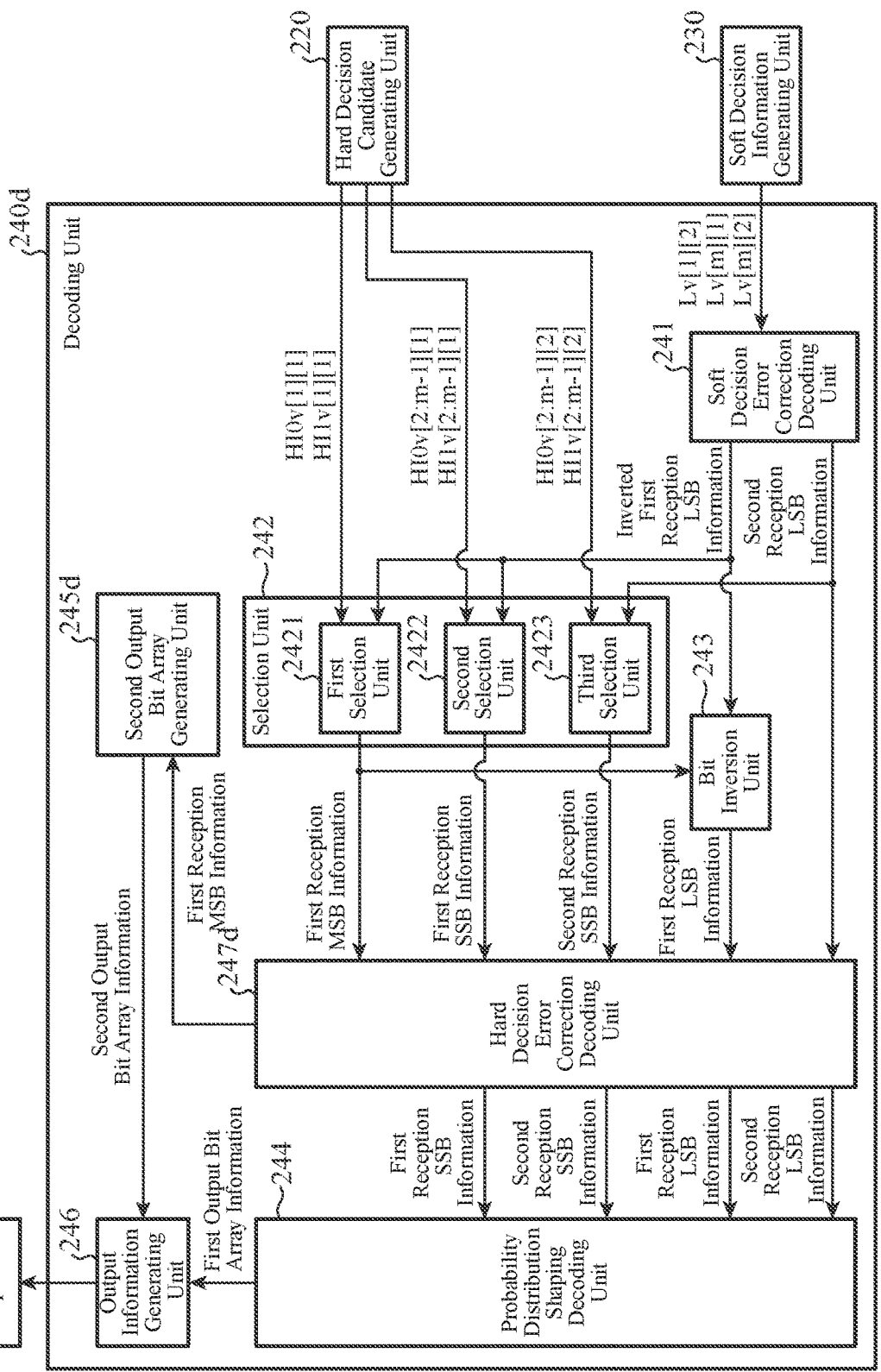
FIG. 40 is a configuration diagram illustrating an example of a configuration of a main part of a decoding unit according to the modification of the second embodiment.

FIG. 40 is a configuration diagram illustrating an example of the configuration of the main part of the decoding unit 240d according to the modification of the second embodiment.

The decoding unit 240*d* includes the soft decision error correction decoding unit 241, the selection unit 242, the reception side bit inversion unit 243, the probability distribution shaping decoding unit 244, a second output bit array generating unit 245*d*, the output information generating unit 246, and a hard decision error correction decoding unit 247*d*.

The decoding unit 240*d* is obtained by changing the second output bit array generating unit 245 and the hard decision error correction decoding unit 247 according to the second embodiment to the second output bit array generating unit 245*d* and the hard decision error correction decoding unit 247*d*.

Note that, in FIG. 40, blocks similar to the blocks illustrated in FIG. 16 are designated by the same reference numerals, and the description thereof will be omitted.

The hard decision error correction decoding unit 247*d* performs seventh decoding processing in the multi-stage error correction processing.

The hard decision error correction decoding unit 247*d* performs hard decision error correction processing on information corresponding to the second output bit array information of the first reception MSB information, and the first reception SSB information, the second reception SSB information, the second reception LSB information, and the inverted first reception LSB information on the basis of information stored in the reception hard decision parity area corresponding to the hard decision parity area of the first MSB information, which is a predetermined area of the first reception MSB information.

After performing the hard decision error correction processing, the hard decision error correction decoding unit 247*d* performs processing below as post-processing, in the seventh decoding processing in the multi-stage error correction processing.

First, as first post-processing, the hard decision error correction decoding unit 247*d* calculates an exclusive OR for each of columns corresponding to each other between a bit value of a column in the first reception MSB information corresponding to one of the columns of an area storing a predetermined value in a predetermined area of the first row in the first bit string group information storing the second input bit array information as a part of the first MSB information, and a bit value of a column in the first reception LSB information corresponding to one of the columns of the area storing the predetermined value in the predetermined area of the first row in the first bit string group information storing the second input bit array information as the part of the first MSB information.

Next, as second post-processing, the hard decision error correction decoding unit 247*d* overwrites the bit value of the column in the first reception MSB information corresponding to one of the columns of the area storing the predetermined value in the predetermined area of the first row in the first bit string group information, by using a calculation result of the exclusive OR in the columns corresponding to each other.

Specifically, first, as the first post-processing, the hard decision error correction decoding unit 247*d* calculates the exclusive OR for each of the columns corresponding to each other between values from the (N5+1)-th column to the N3-th column of the first reception MSB information corresponding to B[1][1][N5+1:N3] that are bit values of D[1][1][N5+1:N3] that is a bit array space in which the first MSB information is stored, and values from the (N5+1)-th column to the N3-th column of the first reception LSB information corresponding to B[m][1][N5+1:N3] that are bit values of D[m][1][N5+1:N3] that is a bit array space in which the first LSB information is stored. When performing the first post-processing, the hard decision error correction decoding unit 247*d* may use N3-N5 predetermined fixed values stored in D[1][1][N5+1:N3] when the input bit array information generating unit 121*d* included in the encoding unit 120*d* of the error correction encoding device 100*d* generates the second input bit array information, instead of the values from the (N5+1)-th column to the N3-th column of the first reception LSB information, and calculate the exclusive OR for each of the columns corresponding to each other between the values from the (N5+1)-th column to the N3-th column of the first reception MSB information and the N3-N5 predetermined fixed values. Hereinafter, the description will be given assuming that, as the first post-processing, the hard decision error correction decoding unit 247*d* calculates the exclusive OR for each of the columns corresponding to each other between the values from the (N5+1)-th column to the N3-th column of the first reception MSB information and the values from the (N5+1)-th column to the N3-th column of the first reception LSB information.

Next, as the second post-processing, the hard decision error correction decoding unit 247*d* overwrites each of the values from the (N5+1)-th column to the N3-th column of the first reception LSB information by using the calculation result of the exclusive OR in the columns corresponding to each other.

The second output bit array generating unit 245*d* performs the fifth decoding processing in the multi-stage error correction processing.

Specifically, the second output bit array generating unit 245*d* generates the second output bit array information including a bit array of one row and N5 columns corresponding to the information including the N5 bits included in the input information by extracting information in an area of the first reception MSB information corresponding to an area storing the information corresponding to the second input bit array information including the N5 bits included in the input information, of an area in which the error correction encoding device 100*d* stores the first MSB information.

More specifically, for example, the second output bit array generating unit 245*d* generates the second output bit array information by extracting bit values from the first column to the N5-th column of the area in which the error correction encoding device 100*d* stores the first MSB information.

The error correction device 200*d* can obtain output information with less residual error by performing error correction by the hard decision error correction processing as compared with the case where the hard decision error correction processing is not performed.

In particular, the error correction device 200*d* can perform the error correction with higher performance as compared with the error correction in the error correction device 200*a* according to the second embodiment, by performing the multi-stage error correction processing on the basis of the reception digital baseband modulation signal that is a signal based on the soft decision error correction frame information generated by the error correction encoding device 100*d* described above.

Note that, functions of the reception modulation symbol group information generating unit 210, the hard decision candidate generating unit 220, the soft decision information generating unit 230, the decoding unit 240*d*, and the information output unit 290 included in the error correction device 200*d* according to the modification of the second embodiment may be implemented by the processor 901 and the memory 902 in the hardware configuration illustrated as an example in FIGS. 9A and 9B in the second embodiment, or may be implemented by the processing circuit 903.

Operation of the error correction device 200d according to the modification of the second embodiment will be described with reference to FIGS. 41A, 41B, and 41C.

Figure 41A:
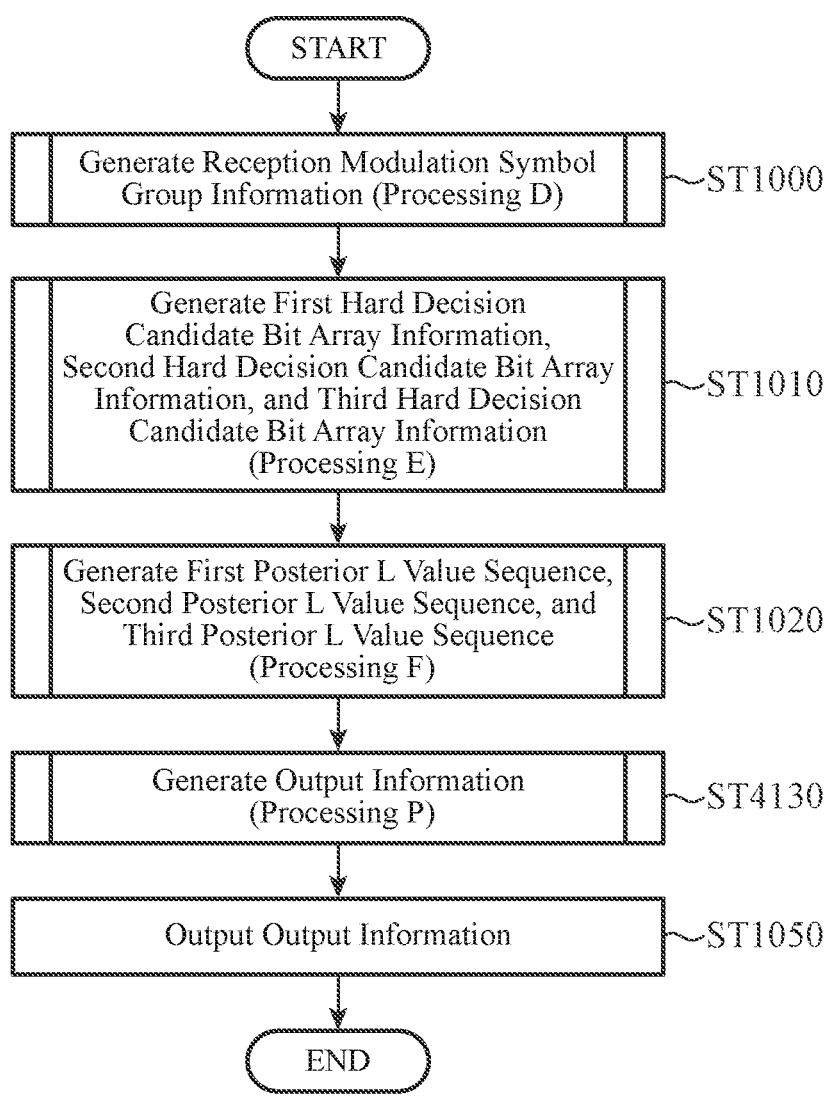
FIG. 41A is a part of a flowchart illustrating an example of processing performed by the error correction device according to the modification of the second embodiment.

FIG. 41A is a part of a flowchart illustrating an example of processing performed by the error correction device 200d according to the modification of the second embodiment.

Figure 41B:
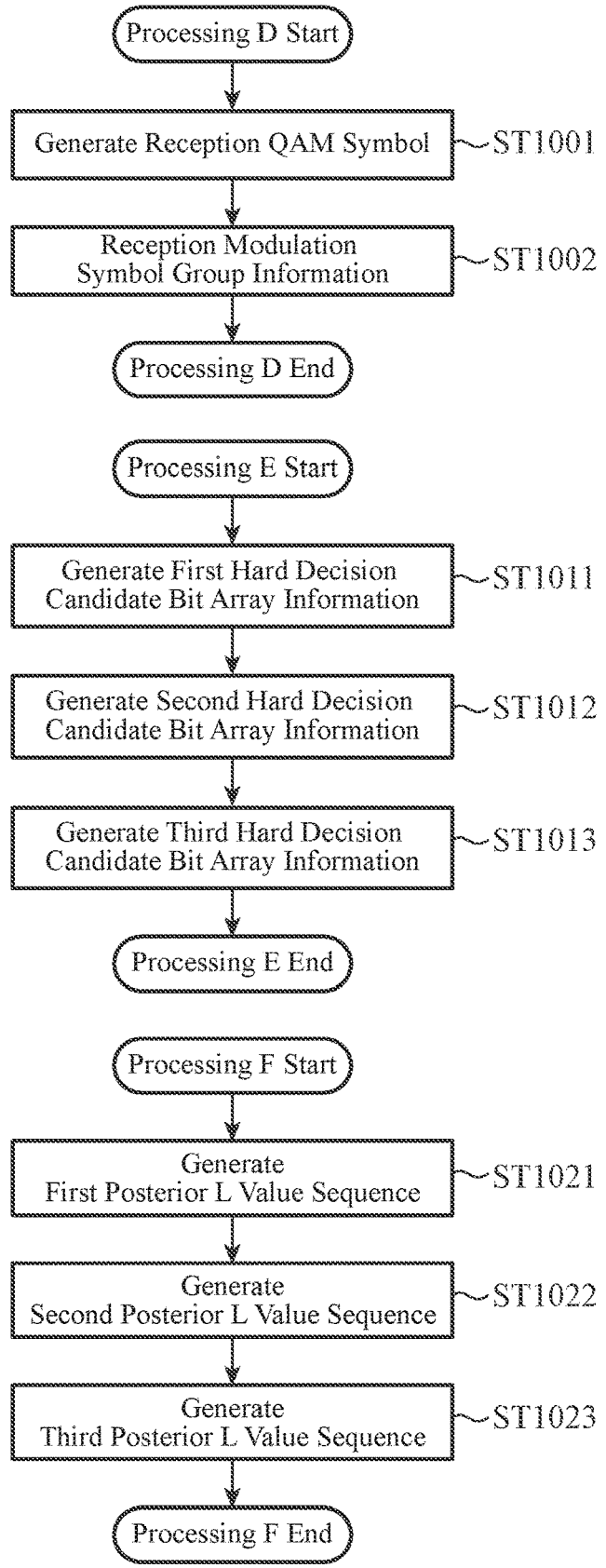
FIG. 41B is another part of the flowchart illustrating the example of the processing performed by the error correction device according to the modification of the second embodiment.

FIG. 41B is another part of the flowchart illustrating the example of the processing performed by the error correction device 200d according to the modification of the second embodiment.

Figure 41C:
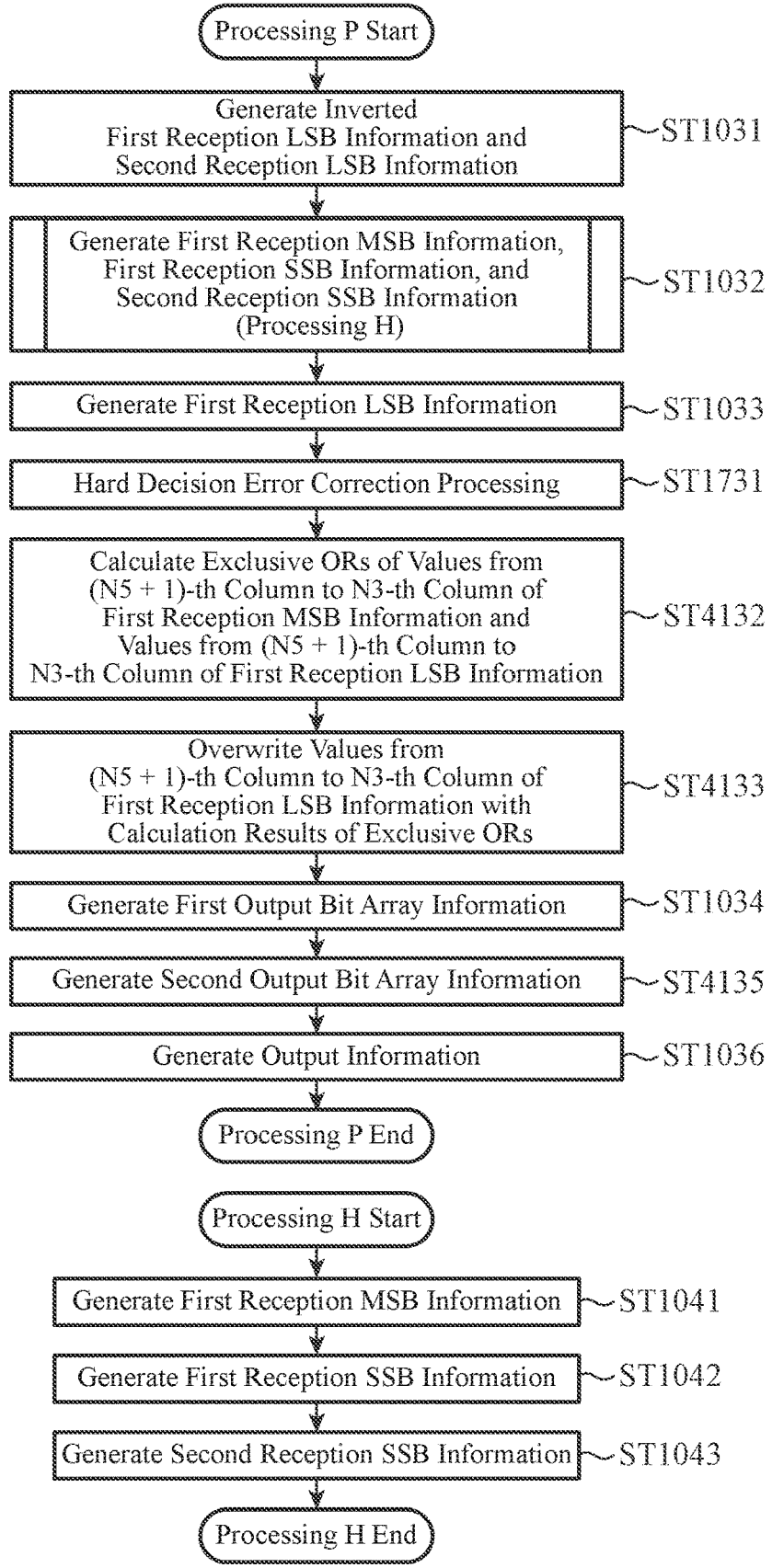
FIG. 41C is a remaining part of the flowchart illustrating the example of the processing performed by the error correction device according to the modification of the second embodiment.

FIG. 41C is a remaining part of the flowchart illustrating the example of the processing performed by the error correction device 200d according to the modification of the second embodiment.

Hereinafter, FIGS. 41A, 41B, and 41C are collectively denoted as FIG. 41.

The error correction device 200d repeatedly executes the processing of the flowchart illustrated in FIG. 41.

Note that, the flowchart illustrated in FIG. 41 is obtained by changing step ST1730 in the flowchart illustrated in FIG. 17 to step ST4130.

In FIG. 41, processing steps similar to processing steps of the flowchart illustrated in FIG. 17 are designated by the same reference numerals, and the description thereof will be omitted.

First, the error correction device 200d performs processing from step ST1000 to step ST1020.

After step ST1020, in step ST4130, the decoding unit 240d generates the output information by performing the multi-stage error correction processing.

Specifically, the decoding unit 240d performs processing of step ST4130 by performing processing from step ST1031 to step ST1034 and step ST1036, processing of step ST1731, and processing from step ST4132 to step ST4133 and step ST4135 in processing P below.

More specifically, first, the decoding unit 240d performs the processing from step ST1031 to step ST1033.

After step ST1033, the decoding unit 240d performs the processing of step ST1731.

After step ST1731, in step ST4132, the hard decision error correction decoding unit 247d included in the decoding unit 240d calculates exclusive ORs of the values from the (N5+1)-th column to the N3-th column of the first reception MSB information and the values from the (N5+1)-th column to the N3-th column of the first reception LSB information.

After step ST4132, in step ST4133, the hard decision error correction decoding unit 247d included in the decoding unit 240d overwrites the values from the (N5+1)-th column to the N3-th column of the first reception LSB information with the calculation results of the exclusive OR in the columns corresponding to each other.

After step ST4133, the decoding unit 240d performs the processing of step ST1034.

After step ST1034, in step ST4135, the second output bit array generating unit 245d included in the decoding unit 240d generates the second output bit array information including the bit array of one row and N5 columns.

After step ST4135, the decoding unit 240d performs the processing of step ST1036.

After step ST1036, the decoding unit 240d ends the processing P. That is, after step ST1036, the decoding unit 240d ends the processing of step ST4130.

After step ST4130, the error correction device 200d performs processing of step ST1050.

After step ST1050, the error correction device 200d ends the processing of the flowchart illustrated in FIG. 41, and the error correction device 200d returns to the processing of step ST1000 and repeatedly executes the processing of the flowchart illustrated in FIG. 41.

As described above, the error correction encoding device 100d includes: the input information acquiring unit 110 to acquire the input information; the encoding unit 120d to generate the soft decision error correction frame information including the bit array of m rows and N columns on the basis of the input information acquired by the input information acquiring unit 110, the bit array being obtained by combining the first bit string group information and the second bit string group information, the first bit string group information including the bit array of m rows and N1 columns in which it is enabled to perform the pulse amplitude modulation of the combination of bit values of each column of the first bit string group information into the modulation symbol by using the predetermined first symbol mapping rule, the second bit string group information including the bit array of m rows and N2 columns in which it is enabled to perform the pulse amplitude modulation of the combination of bit values of each column of the second bit string group information into the modulation symbol by using the predetermined second symbol mapping rule; the modulation symbol conversion unit 130 to generate the modulation symbol group information including N pieces of the modulation symbols by performing the pulse amplitude modulation of the combination of bit values of each column of the soft decision error correction frame information generated by the encoding unit 120d into the modulation symbol for each column of the soft decision error correction frame information by using the first symbol mapping rule or the second symbol mapping rule; and the transmission waveform shaping unit 140 to generate the digital baseband modulation signal on the basis of the modulation symbol group information generated by the modulation symbol conversion unit 130 and output the digital baseband modulation signal generated, in which the encoding unit 120d generates the soft decision error correction frame information by: generating the first input bit array information including the bit array of m−1 rows and N columns and the second input bit array information including the bit array of one row and N3 columns on the basis of the input information acquired by the input information acquiring unit 110; storing the second input bit array information generated as a part of the first MSB information including the bit array of one row and N1 columns in the predetermined area of the first row in the first bit string group information; generating the shaped bit array information including the bit array of m−1 rows and N columns by performing the probability distribution shaping encoding processing on the first input bit array information generated; generating the first group bit array information including the combination of N1 predetermined columns and the second group bit array information including the combination of N2 predetermined columns by separating the shaped bit array information generated; generating the first LSB information including the bit array of one row and N1 columns by extracting, from the first group bit array information generated, the bit array of the (m−1)-th row in the first group bit array information, generating the inverted first LSB information including the bit array of one row and N1 columns by calculating exclusive ORs of bit values of each columns in the first LSB information generated and each bit values of each columns in the information of the first row in the first bit string group information after storing the second input bit array information, the columns in the information of the first row in the first bit string group information each corresponding to the columns in the first LSB information, and storing the inverted first LSB information generated in the m-th row in the first bit string group information; generating the second LSB information including the bit array of one row and N2 columns by extracting the bit array of the (m−1)-th row in the second group bit array information from the second group bit array information generated, and storing the second LSB information generated in the m-th row in the second bit string group information; generating the soft decision parity bit by performing the systematic soft decision error correction encoding processing by using the inverted first LSB information generated and the second LSB information generated, and storing the soft decision parity bit generated, in the first row in the second bit string group information as the second MSB information including the bit array of one row and N2 columns; in the case where m is greater than or equal to 3, generating the first SSB information including the bit array of m−2 rows and N1 columns by extracting, from the first group bit array information generated, the first row to the (m−2)-th row in the first group bit array information, and storing the first SSB information generated, in the second row to the (m−1)-th row in the first bit string group information; and in the case where m is greater than or equal to 3, generating the second SSB information including the bit array of m−2 rows and N2 columns by extracting, from the second group bit array information generated, the first row to the (m−2)-th row in the second group bit array information, and storing the second SSB information generated, in the second row to the (m−1)-th row in the second bit string group information.

Further, in the above-described configuration, the error correction encoding device 100d is configured so that the encoding unit 120d generates the hard decision parity bit by performing the systematic hard decision error correction encoding processing, by using the first input bit array information and the second input bit array information, or by using the first input bit array information, the first SSB information, the second SSB information, the second LSB information, and the first LSB information or the inverted first LSB information, and stores the hard decision parity bit generated, as the part of the first MSB information in the predetermined area different from the area storing the second input bit array information of the first row in the first bit string group information.

Further, in the above-described configuration, the error correction encoding device 100d is configured so that: the encoding unit 120d generates the second input bit array information by setting the bit value of the bit other than the bit corresponding to the input information to the predetermined value in the second input bit array information when generating the second input bit array information on the basis of the input information acquired by the input information acquiring unit 110; and the encoding unit 120d, when performing the systematic hard decision error correction encoding processing, as the first preprocessing, switches the bit values of the columns corresponding to each other between the bit value of the area storing the predetermined value, of the predetermined area of the first row in the first bit string group information storing the second input bit array information as the part of the first MSB information, and the bit value of the column corresponding to one of the columns of the area storing the predetermined value of the predetermined area of the first row in the first bit string group information, of the area of the m-th row in the first bit string group information storing the first LSB information, and as the second preprocessing, calculates the exclusive OR for each of the columns corresponding to each other between the bit value after switching the bit value of the area storing the predetermined value, of the predetermined area of the first row in the first bit string group information, and the bit value after switching the bit value of the column corresponding to one of the columns of the area storing the predetermined value of the predetermined area of the first row in the first bit string group information, of the area of the m-th row in the first bit string group information, and as the third preprocessing, overwrites the bit value after switching the bit value of the area storing the predetermined value, of the predetermined area of the first row in the first bit string group information, by using the calculation result of the exclusive OR in the columns corresponding to each other.

With this configuration, the error correction device 200d can perform the error correction with higher performance as compared with the error correction device 200a according to the second embodiment that performs the error correction by the hard decision error correction processing, so that the error correction encoding device 100d can cause the error correction device 200d to output the output information with less residual error as compared with the case where the hard decision error correction processing is not performed.

In addition, as described above, the error correction device 200d includes: the reception modulation symbol group information generating unit 210 to receive the reception digital baseband modulation signal that is the signal based on the soft decision error correction frame information generated by the error correction encoding device 100d and generate reception modulation symbol group information including N reception modulation symbols on the basis of the reception digital baseband modulation signal; the hard decision candidate generating unit 220 to generate first hard decision candidate bit array information including the bit array of one row and N1 columns, second hard decision candidate bit array information including the bit array of m−2 rows and N1 columns in the case where m is greater than or equal to 3, and third hard decision candidate bit array information including the bit array of m−2 rows and N2 columns in the case where m is greater than or equal to 3, by using the reception modulation symbol group information generated by the reception modulation symbol group information generating unit 210 on the basis of the first symbol mapping rule or the second symbol mapping rule; the soft decision information generating unit 230 to generate the first posterior L value sequence including N2 posterior L values corresponding to each columns of the first row of the second bit string group information, the second posterior L value sequence including N1 posterior L values corresponding to each columns of the m-th row of the first bit string group information, and the third posterior L value sequence including N2 posterior L values corresponding to each columns of the m-th row of the second bit string group information on the basis of the reception modulation symbol group information generated by the reception modulation symbol group information generating unit 210; the decoding unit 240d to perform multi-stage error correction processing on the basis of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230; and the information output unit 290 to output information generated by the decoding unit 240d performing the multi-stage error correction processing as output information, in which: in the first decoding processing in the multi-stage error correction processing, the decoding unit 240d generates inverted first reception LSB information including the bit array of one row and N1 columns corresponding to the inverted first LSB information and second reception LSB information including the bit array of one row and N2 columns corresponding to the second LSB information by performing soft decision error correction processing on the basis of the first posterior L value sequence, the second posterior L value sequence, and the third posterior L value sequence; in the second decoding processing in the multi-stage error correction processing, the decoding unit 240d generates first reception MSB information including the bit array of one row and N1 columns corresponding to the first MSB information on the basis of the first hard decision candidate bit array information and the inverted first reception LSB information, generates first reception SSB information including the bit array of m−2 rows and N1 columns corresponding to the first SSB information on the basis of the second hard decision candidate bit array information and the inverted first reception LSB information in the case where m is greater than or equal to 3, and generates second reception SSB information including the bit array of m−2 rows and N2 columns corresponding to the second SSB information on the basis of the third hard decision candidate bit array information and the second reception LSB information in the case where m is greater than or equal to 3; in the third decoding processing in the multi-stage error correction processing, the decoding unit 240d generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information; in the fourth decoding processing in the multi-stage error correction processing, the decoding unit 240d generates first output bit array information including the bit array of m−1 rows and N columns corresponding to the first input bit array information by performing probability distribution shaping decoding processing on the first reception SSB information, the second reception SSB information, the first reception LSB information, and the second reception LSB information; in the fifth decoding processing in the multi-stage error correction processing, the decoding unit 240d generates second output bit array information including the bit array of one row and N3 columns corresponding to the second input bit array information by extracting information of the predetermined area of the first reception MSB information; in the sixth decoding processing in the multi-stage error correction processing, the decoding unit 240d generates the output information corresponding to the input information on the basis of the first output bit array information and the second output bit array information; and the information output unit 290 outputs the output information generated by the decoding unit 240d.

Further, in the above-described configuration, the error correction device 200d is configured so that: the decoding unit 240d performs the hard decision error correction processing on the information corresponding to the second output bit array information of the first reception MSB information, and the first reception SSB information, the second reception SSB information, the second reception LSB information, and the first reception LSB information or the inverted first reception LSB information, or on the information corresponding to the second output bit array information of the first reception MSB information and the first output bit array information, on the basis of the information stored in the predetermined area of the first reception MSB information, in the seventh decoding processing in the multi-stage error correction processing; and in a case where the decoding unit 240d performs the hard decision error correction processing on the information corresponding to the second output bit array information of the first reception MSB information, and the first reception SSB information, the second reception SSB information, the second reception LSB information, and the inverted first reception LSB information, the decoding unit 240d generates the second output bit array information by calculating the exclusive OR by using the inverted first reception LSB information and the first reception MSB information after the seventh decoding processing, in the third decoding processing, and extracting the information of the predetermined area of the first reception MSB information after the seventh decoding processing, in the fifth decoding processing; and in a case where the decoding unit 240d performs the hard decision error correction processing on the information corresponding to the second output bit array information of the first reception MSB information, and the first reception SSB information, the second reception SSB information, the second reception LSB information, and the first reception LSB information, the decoding unit 240d generates the second output bit array information by performing the probability distribution shaping decoding processing on the first reception SSB information, the second reception SSB information, the first reception LSB information, and the second reception LSB information after the seventh decoding processing, in the fourth decoding processing, and extracting the information of the predetermined area of the first reception MSB information after the seventh decoding processing, in the fifth decoding processing; and in a case where the decoding unit 240d performs the hard decision error correction processing on the information corresponding to the second output bit array information of the first reception MSB information, and the first output bit array information, the decoding unit 240d generates the second output bit array information by extracting the information of the predetermined area of the first reception MSB information after the seventh decoding processing, in the fifth decoding processing, and generates the output information on the basis of the second output bit array information and the first output bit array information after the seventh decoding processing, in the sixth decoding processing.

Further, in the above-described configuration, the error correction device 200d is configured so that the decoding unit 240d performs the hard decision error correction processing, and then, in the seventh decoding processing in the multi-stage error correction processing, as the first post-processing, calculates the exclusive OR for each of columns corresponding to each other between the bit value of the column in the first reception MSB information corresponding to one of the columns of the area storing the predetermined value of the predetermined area of the first row in the first bit string group information storing the second input bit array information as the part of the first MSB information, and the bit value of the column in the first reception LSB information corresponding to one of the columns of the area storing the predetermined value in the predetermined area in the first row in the first bit string group information storing the second input bit array information as the part of the first MSB information, and as the second post-processing, over-writes the bit value of the column in the first reception MSB information corresponding to one of the columns of the area storing the predetermined value of the predetermined area of the first row in the first bit string group information, by using the calculation result of the exclusive OR in the columns corresponding to each other.

With this configuration, the error correction device 200d can perform the error correction with higher performance as compared with the error correction device 200a according to the second embodiment that performs the error correction by the hard decision error correction processing.

Third Embodiment

A configuration of a main part of a communication system 1b according to a third embodiment will be described with reference to FIG. 18.

Figure 18:
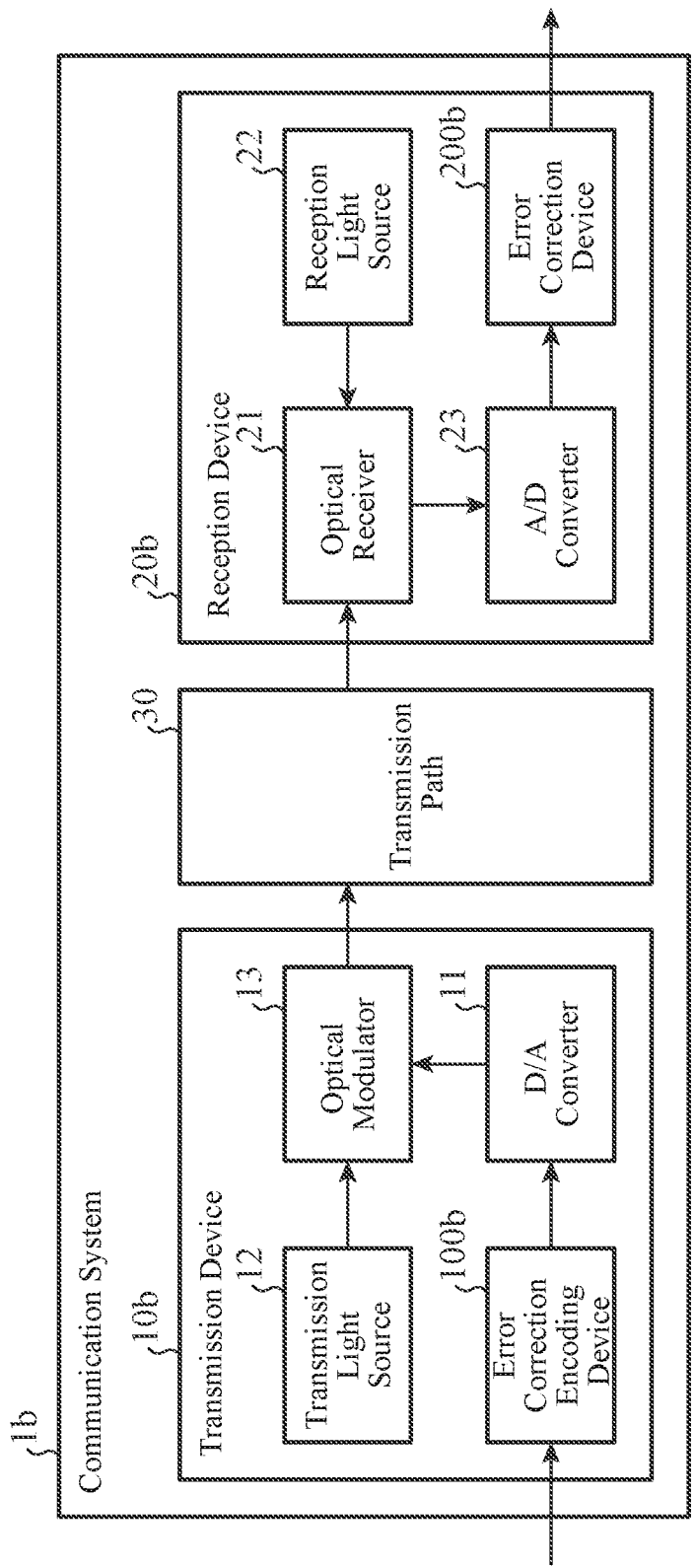
FIG. 18 is a configuration diagram illustrating an example of a configuration of a main part of a communication system according to a third embodiment.

FIG. 18 is a configuration diagram illustrating an example of the configuration of the main part of the communication system 1b according to the third embodiment.

In the third embodiment, as an example, the communication system 1b is described as an optical communication system, but the optical communication system is merely an example, and the communication system 1b is not limited to the optical communication system. For example, the communication system 1b may be a communication system by wireless communication, metal communication, or the like.

The communication system 1b includes a transmission device 10b, the transmission path 30, and a reception device 20b.

The communication system 1b is obtained by changing the transmission device 10 and the reception device 20 according to the first embodiment to the transmission device 10b and the reception device 20b.

Note that, in FIG. 18, blocks similar to the blocks illustrated in FIG. 1 are designated by the same reference numerals, and the description thereof will be omitted.

The transmission device 10b acquires input information and outputs a signal based on the acquired input information. Since the communication system 1b illustrated in FIG. 18 is the optical communication system, the transmission device 10b illustrated in FIG. 18 is an optical transmission device to output an optical signal.

The transmission device 10b includes an error correction encoding device 100b, the D/A converter 11, the transmission light source 12, and the optical modulator 13.

The transmission device 10b is obtained by changing the error correction encoding device 100 according to the first embodiment to the error correction encoding device 100b.

The error correction encoding device 100b acquires the input information input from the outside of the device, and generates a digital baseband modulation signal on the basis of the acquired input information. The error correction encoding device 100b outputs the generated digital baseband modulation signal to the D/A converter 11.

The reception device 20b receives the signal output by the transmission device 10b via the transmission path 30, generates output information corresponding to the input information on the basis of the signal, and outputs the generated output information. Since the communication system 1b illustrated in FIG. 18 is the optical communication system, the reception device 20b illustrated in FIG. 18 is an optical reception device to receive the optical signal.

The reception device 20b includes the reception light source 22, the optical receiver 21, the A/D converter 23, and an error correction device 200b.

The reception device 20b is obtained by changing the error correction device 200 according to the first embodiment to the error correction device 200b.

The error correction device 200b receives the reception digital baseband modulation signal output by the A/D converter 23, generates the output information corresponding to the input information on the basis of the reception digital baseband modulation signal, and outputs the generated output information.

A configuration of a main part of the error correction encoding device 100b according to the third embodiment will be described with reference to FIG. 19.

Figure 19:
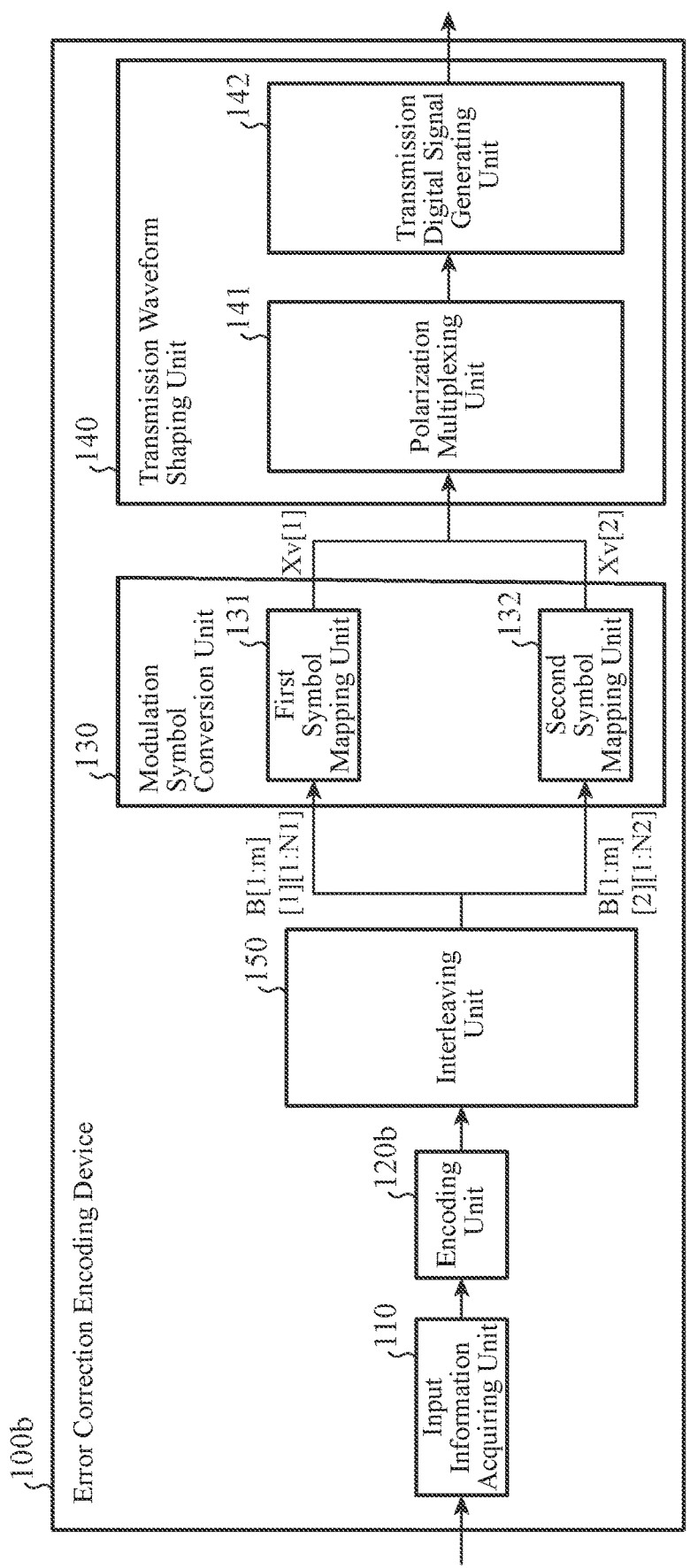
FIG. 19 is a configuration diagram illustrating an example of a configuration of a main part of an error correction encoding device according to the third embodiment.

FIG. 19 is a configuration diagram illustrating an example of the configuration of the main part of the error correction encoding device 100b according to the third embodiment.

The error correction encoding device 100b includes the input information acquiring unit 110, an encoding unit 120b, the modulation symbol conversion unit 130, the transmission waveform shaping unit 140, and an interleaving unit 150.

The error correction encoding device 100b is obtained by adding the interleaving unit 150 to the configuration of the error correction encoding device 100 according to the first embodiment, and changing the encoding unit 120 according to the first embodiment to the encoding unit 120b.

Note that, in FIG. 19, blocks similar to the blocks illustrated in FIG. 2 are designated by the same reference numerals, and the description thereof will be omitted.

The encoding unit 120b generates soft decision error correction frame information obtained by combining the first bit string group information and the second bit string group information on the basis of the input information acquired by the input information acquiring unit 110.

Details of the encoding unit 120b will be described later.

The interleaving unit 150 switches information of any column with information of any other column, in the soft decision error correction frame information generated by the encoding unit 120b, on the basis of a predetermined switching rule (Hereinafter, it is referred to as a "first switching rule".).

A bit array space in which the soft decision error correction frame information is stored will be described with reference to FIG. 25.

Note that, D that is a bit array space in which the soft decision error correction frame information illustrated in FIG. 25 is stored, illustrates, as an example, a case where N1 and N2 are equal.

FIG. 25A is an explanatory diagram illustrating an example of the bit array space in which soft decision error correction frame information before the interleaving unit 150 performs switching is stored.

As illustrated in FIG. 25A, in D that is a bit array space in which the soft decision error correction frame information before the interleaving unit 150 performs switching is stored, Dd[1] that is a bit array space of m rows and N1 columns in which the first bit string group information is stored and Dd[2] that is a bit array space of m rows and N2 columns in which the second bit string group information is stored are arranged in one bit array space.

The interleaving unit 150 switches information of any column with information of any other column, in D that is the bit array space illustrated in FIG. 25A, on the basis of the first switching rule.

FIG. 25B is an explanatory diagram illustrating an example of the bit array space in which soft decision error correction frame information after the interleaving unit 150 performs switching is stored.

For example, as illustrated in FIG. 25B, the interleaving unit 150 switches arrangements of columns in the soft decision error correction frame information so that D[1:m]

[2][k] that is a bit array space storing information of the k-th column of the second bit string group information is disposed between D[1:m][1][k] that is a bit array space storing information of the k-th column of the first bit string group information and D[1:m][1][k+1].

The bit array space illustrated in FIG. 25B is merely an example, and as long as the interleaving unit 150 performs switching on the basis of the first switching rule, the mode of the bit array space after performing switching is not limited to the bit array space illustrated in FIG. 25B.

The modulation symbol conversion unit 130 performs pulse amplitude modulation on the basis of the soft decision error correction frame information after performing switching of the interleaving unit 150 columns.

The modulation symbol group information stored in the bit array space in which the modulation symbol group information generated by the modulation symbol conversion unit 130 is stored will be described with reference to FIG. 26.

FIG. 26A is an explanatory diagram illustrating an example of the modulation symbol group information in a case where the error correction encoding device 100b does not include the interleaving unit 150.

As illustrated in FIG. 26A, in the modulation symbol group information in the case where the error correction encoding device 100b does not include the interleaving unit 150, Xv[1] that is the first modulation symbol group information and Xv[2] that is the second modulation symbol group information are arranged in one bit array space.

FIG. 26B is an explanatory diagram illustrating an example of the modulation symbol group information in a case where the error correction encoding device 100b includes the interleaving unit 150.

As illustrated in FIG. 26B, in the modulation symbol group information in the case where the error correction encoding device 100b includes the interleaving unit 150, X[2][k] that is a PAM symbol belonging to Xv[2] that is the second modulation symbol group information is disposed between X[1][k] and X[1][k+1] that are PAM symbols belonging to Xv[1] that is the first modulation symbol group information so that the modulation symbol group information corresponds to the soft decision error correction frame information after the interleaving unit 150 performs the switching as illustrated as an example in FIG. 25B.

Note that, the interleaving unit 150 may switch information of any column with information of any other column, in the modulation symbol group information generated by the modulation symbol conversion unit 130, on the basis of the first switching rule.

Hereinafter, the description will be given assuming that the interleaving unit 150 switches information of any column with information of any other column, in the soft decision error correction frame information generated by the encoding unit 120b, on the basis of the first permutation rule.

A configuration of a main part of the encoding unit 120b according to the third embodiment will be described with reference to FIG. 20.

Figure 20:
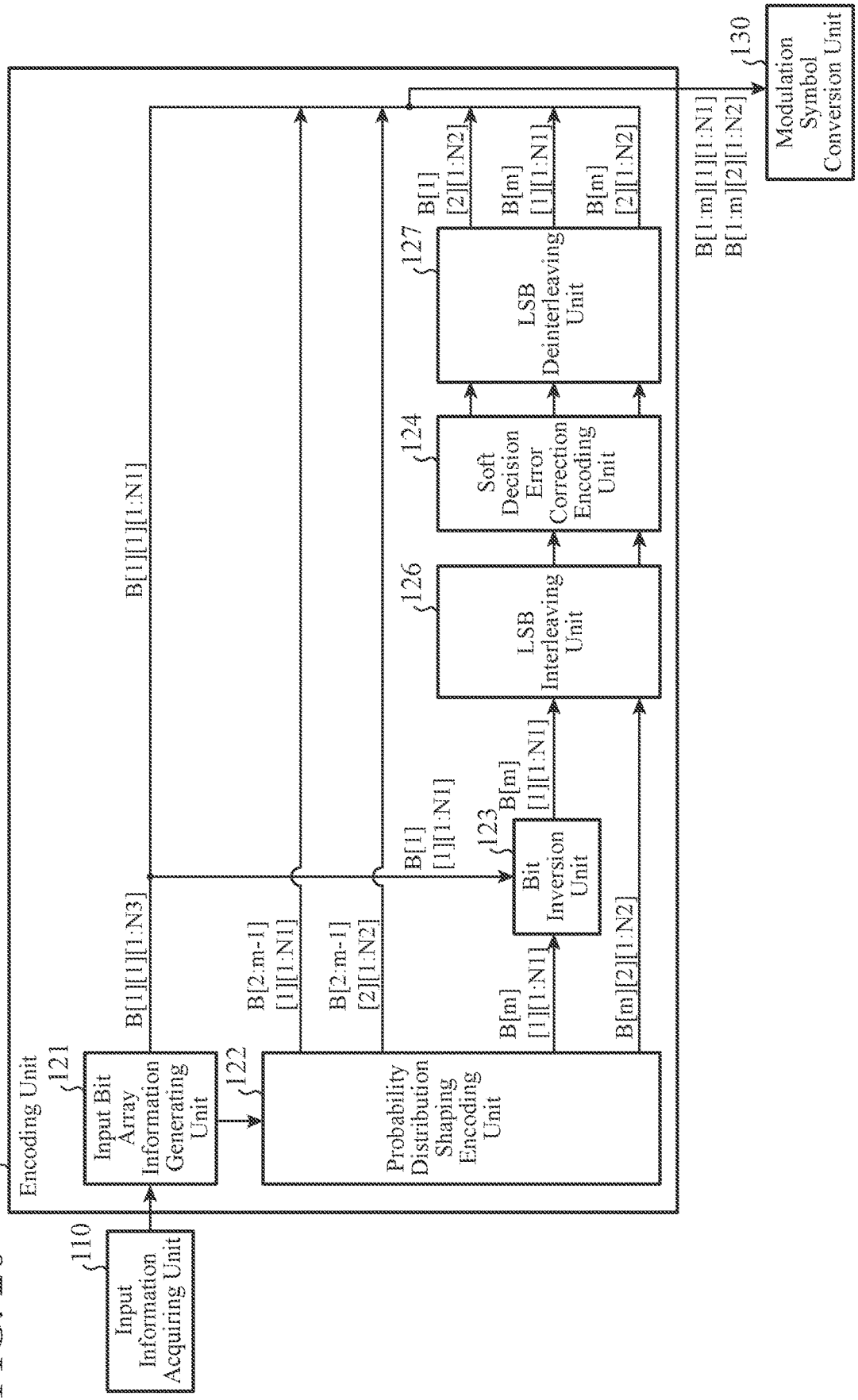
FIG. 20 is a configuration diagram illustrating an example of a configuration of a main part of an encoding unit according to the third embodiment.

FIG. 20 is a configuration diagram illustrating an example of the main part of the encoding unit 120b according to the third embodiment.

The encoding unit 120b includes the input bit array information generating unit 121, the probability distribution shaping encoding unit 122, the bit inversion unit 123, the soft decision error correction encoding unit 124, an LSB interleaving unit 126, and an LSB deinterleaving unit 127.

The encoding unit 120b is obtained by adding the LSB interleaving unit 126 and the LSB deinterleaving unit 127 to the configuration of the encoding unit 120 according to the first embodiment.

Note that, in FIG. 20, blocks similar to the blocks illustrated in FIG. 3 are designated by the same reference numerals, and the description thereof will be omitted.

The LSB interleaving unit 126 switches information of any column in the inverted first LSB information generated by the bit inversion unit 123 with information of any other column in the inverted first LSB information, on the basis of a predetermined switching rule (Hereinafter, it is referred to as a "second switching rule".).

In addition, the LSB interleaving unit 126 switches information of any column in the second LSB information generated by the probability distribution shaping encoding unit 122 with information of any other column in the second LSB information, on the basis of the second switching rule.

A bit array space in which the inverted first LSB information and the second LSB information are stored will be described with reference to FIG. 27.

FIG. 27A is an explanatory diagram illustrating an example of a bit array space in which soft decision error correction frame information before the LSB interleaving unit 126 performs switching is stored.

As illustrated in FIG. 27A, in the inverted first LSB information before the LSB interleaving unit 126 performs switching, D[1:m−1][1][k] in which the k-th information in the first MSB information and the second SSB information is stored and D[m][1][k] in which the k-th information in the inverted first LSB information is stored are arranged in one column in Dd[1] that is a bit array space in which the first bit string group information is stored.

In addition, as illustrated in FIG. 27A, in the second LSB information before the LSB interleaving unit 126 performs switching, D[1:m−1][2][k] in which the k-th information in the second MSB information and the second SSB information is stored and D[m][2][k] in which the k-th information in the second LSB information is stored are arranged in one column in Dd[2] that is a bit array space in which the second bit string group information is stored.

The LSB interleaving unit 126 switches information of any column with information of any other column, in Dv[m][1] in which the inverted first LSB information illustrated in FIG. 27A is stored, on the basis of the second switching rule.

In addition, the LSB interleaving unit 126 switches information of any column with information of any other column, in Dv[m][2] in which the second LSB information illustrated in FIG. 27A is stored, on the basis of the second switching rule.

FIG. 27B is an explanatory diagram illustrating an example of the bit array space in which soft decision error correction frame information after the LSB interleaving unit 126 performs switching is stored.

For example, as illustrated in FIG. 27B, the LSB interleaving unit 126 switches arrangements of columns in the inverted first LSB information so that pieces of information of odd-numbered columns in the inverted first LSB information are adjacent to each other, and pieces of information of even-numbered columns in the inverted first LSB information are adjacent to each other, in Dv[m][1] in which the inverted first LSB information is stored.

In addition, for example, as illustrated in FIG. 27B, the LSB interleaving unit 126 switches arrangements of columns in the second LSB information so that pieces of information of odd-numbered columns in the second LSB information are adjacent to each other, and pieces of information of even-numbered columns in the second LSB information are adjacent to each other, in Dv[m][2] in which the second LSB information is stored.

Note that, the function f( ) illustrated in FIG. 27B is a ceiling function.

The bit array space illustrated in FIG. 27B is merely an example, and as long as the LSB interleaving unit 126 performs switching on the basis of the second switching rule, the mode of the bit array space after performing switching is not limited to the bit array space illustrated in FIG. 27B.

The modulation symbol conversion unit 130 performs pulse amplitude modulation on the basis of the soft decision error correction frame information after performing switching of the interleaving unit 150 columns.

The soft decision error correction encoding unit 124 generates a soft decision parity bit by performing systematic soft decision error correction encoding processing by using the inverted first LSB information and the second LSB information after the LSB interleaving unit 126 performs switching. The soft decision error correction encoding unit 124 stores the generated soft decision parity bit as the second MSB information in Dv[1][2] that is a bit array space.

On the basis of the second switching rule, the LSB deinterleaving unit 127 restores the arrangements of the columns in the inverted first LSB information after the soft decision error correction encoding unit 124 generates the soft decision parity bit, to a state before the LSB interleaving unit 126 switches the arrangements of the columns.

In addition, on the basis of the second switching rule, the LSB deinterleaving unit 127 restores the arrangements of the columns in the second LSB information after the soft decision error correction encoding unit 124 generates the soft decision parity bit, to a state before the LSB interleaving unit 126 switches the arrangements of the columns.

In addition, the LSB deinterleaving unit 127 switches the arrangements of the columns of the soft decision parity bit stored as the second MSB information in Dv[1][2] that is the bit array space on the basis of the second switching rule, to cause an arrangement of a column of the soft decision parity bit stored in Dv[1][2] to be an arrangement of a column similar to a case where the encoding unit 120b does not include the LSB interleaving unit 126.

Note that, functions of the input information acquiring unit 110, the encoding unit 120b, the modulation symbol conversion unit 130, the transmission waveform shaping unit 140, and the interleaving unit 150 included in the error correction encoding device 100b according to the third embodiment may be implemented by the processor 501 and the memory 502 in the hardware configuration illustrated as an example in FIGS. 5A and 5B in the first embodiment, or may be implemented by the processing circuit 503.

Operation of the error correction encoding device 100b according to the third embodiment will be described with reference to FIGS. 21A, 21B, and 21C.

Figure 21A:
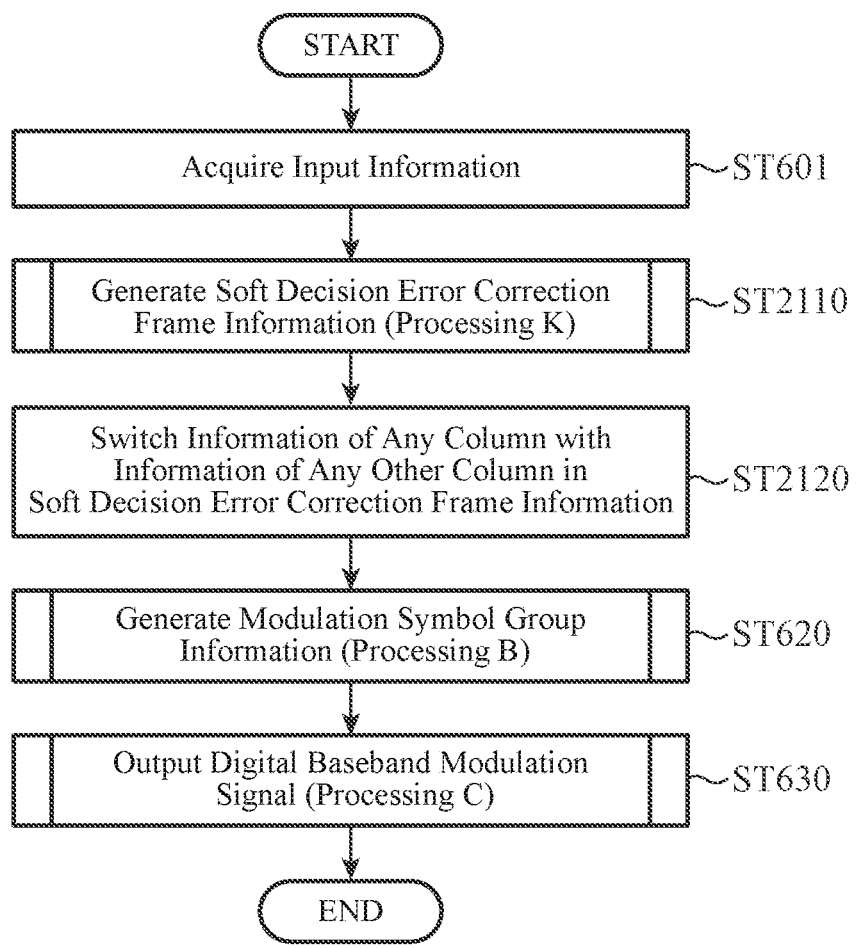
FIG. 21A is a part of a flowchart illustrating an example of processing performed by the error correction encoding device according to the third embodiment.

FIG. 21A is a part of a flowchart illustrating an example of processing performed by the error correction encoding device 100b according to the third embodiment.

Figure 21B:
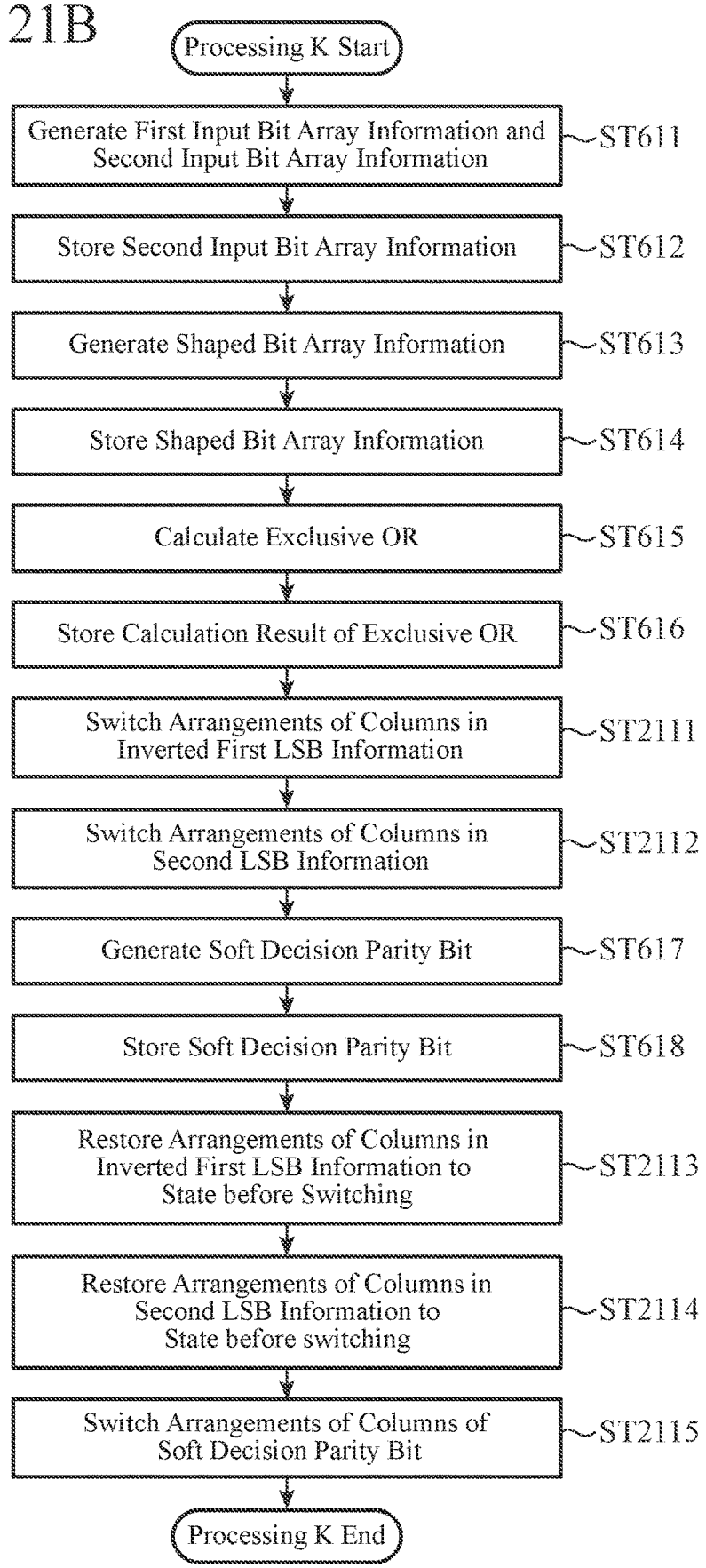
FIG. 21B is another part of the flowchart illustrating the example of the processing performed by the error correction encoding device according to the third embodiment.

FIG. 21B is another part of the flowchart illustrating the example of the processing performed by the error correction encoding device 100b according to the third embodiment.

FIG. 21C is a remaining part of the flowchart illustrating the example of the processing performed by the error correction encoding device 100b according to the third embodiment.

Hereinafter, FIGS. 21A, 21B, and 21C are collectively denoted as FIG. 21.

The error correction encoding device 100b repeatedly executes the processing of the flowchart illustrated in FIG. 21.

Note that, the flowchart illustrated in FIG. 21 is obtained by changing step ST610 in the flowchart illustrated in FIG. 6 to step ST2110, and adding step ST2120 between step ST610 and step ST620.

In FIG. 21, processing steps similar to processing steps of the flowchart illustrated in FIG. 6 are designated by the same reference numerals, and the description thereof will be omitted.

First, the error correction encoding device 100b performs processing of step ST601.

Next, in step ST2110, the encoding unit 120b generates the soft decision error correction frame information.

Specifically, the encoding unit 120b performs processing of step ST2110 by performing processing from step ST611 to step ST618, and processing from step ST2111 to step ST2115 in processing K below.

First, the encoding unit 120b performs the processing from step ST611 to step ST616.

After step ST616, in step ST2111, the LSB interleaving unit 126 included in the encoding unit 120b switches the arrangements of the columns in the inverted first LSB information.

Next, in step ST2112, the LSB interleaving unit 126 included in the encoding unit 120b switches the arrangements of the columns in the second LSB information.

After step ST2112, the encoding unit 120b performs the processing of step ST617 and step ST618.

After step ST618, in step ST2113, the LSB deinterleaving unit 127 included in the encoding unit 120b restores the arrangements of the columns in the inverted first LSB information to the state before the LSB interleaving unit 126 switches the arrangements of the columns.

Next, in step ST2114, the LSB deinterleaving unit 127 included in the encoding unit 120b restores the arrangements of the columns in the second LSB information to the state before the LSB interleaving unit 126 switches the arrangements of the columns.

Next, in step ST2115, the LSB deinterleaving unit 127 included in the encoding unit 120b switches the arrangements of the column of the soft decision parity bit.

After step ST2115, the encoding unit 120b ends the processing K. That is, after step ST2115, the encoding unit 120b ends the processing of step ST2110.

Note that, the order of the processing of step ST2111 and step ST2112 is any order, and the order of the processing from step ST2113 to ST2115 is any order.

After step ST2110, in step ST2120, the interleaving unit 150 switches information of any column with information of any other column, in the soft decision error correction frame information.

After step ST2120, the error correction encoding device 100b performs processing from step ST620 to step ST630.

After step ST630, the error correction encoding device 100b ends the processing of the flowchart illustrated in FIG. 21, and the error correction encoding device 100b returns to the processing of step ST601 and repeatedly executes the processing of the flowchart illustrated in FIG. 21.

Figure 22:
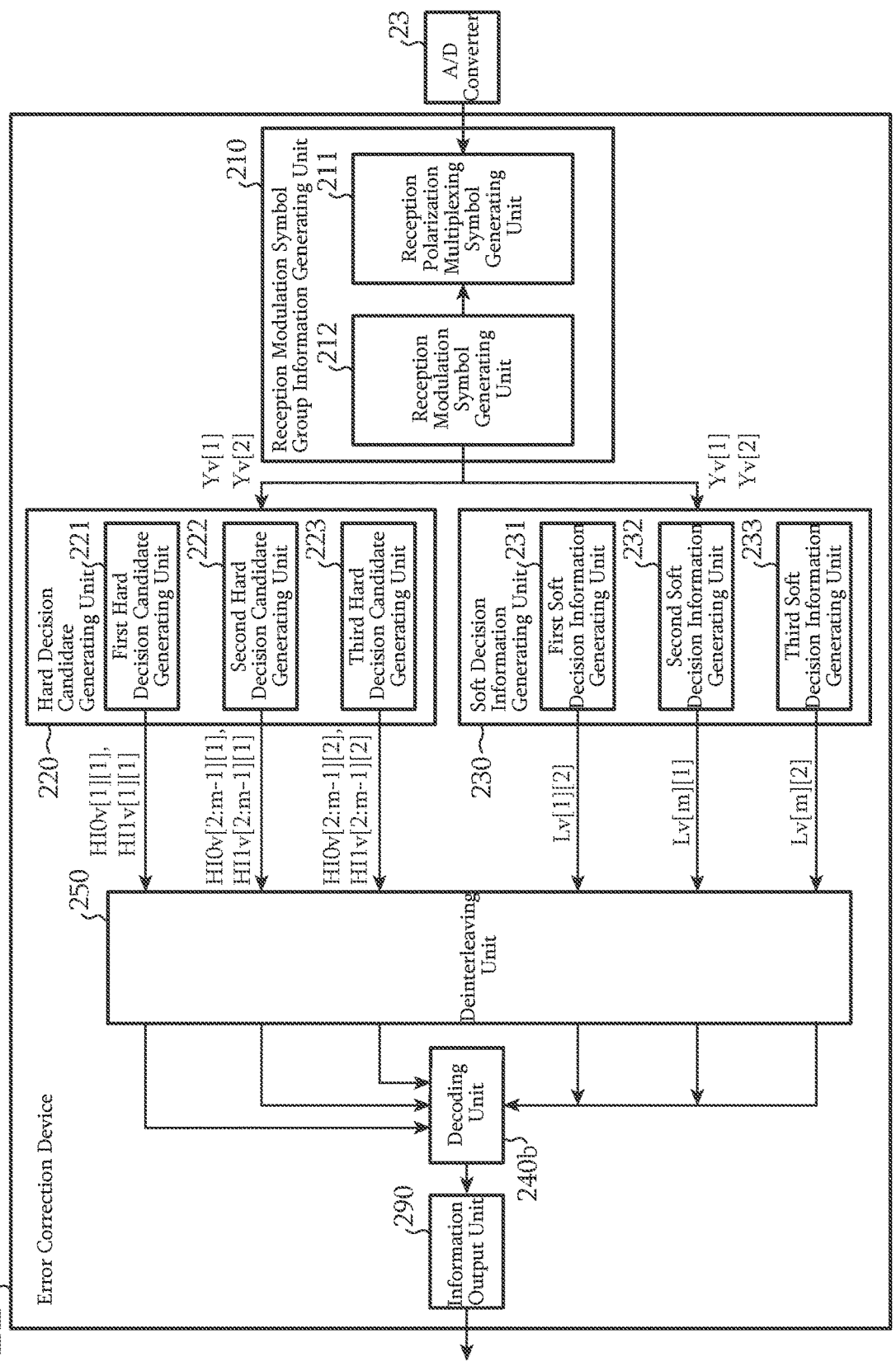
FIG. 22 is a configuration diagram illustrating an example of a configuration of a main part of an error correction device according to the third embodiment.

A configuration of a main part of the error correction encoding device 200b according to the third embodiment will be described with reference to FIG. 22. FIG. 22 is a configuration diagram illustrating an example of the main part of the error correction device 200b according to the third embodiment.

The error correction device 200b includes the reception modulation symbol group information generating unit 210, the hard decision candidate generating unit 220, the soft decision information generating unit 230, a decoding unit 240b, a deinterleaving unit 250, and the information output unit 290.

The error correction device 200b is obtained by adding the deinterleaving unit 250 to the configuration of the error correction device 200 according to the first embodiment, and changing the decoding unit 240 according to the first embodiment to the decoding unit 240b.

Note that, in FIG. 22, blocks similar to the blocks illustrated in FIG. 7 are designated by the same reference numerals, and the description thereof will be omitted.

The deinterleaving unit 250 switches the arrangements of the columns of each of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230, on the basis of the first switching rule, thereby restoring the arrangements of the columns of each of the first hard decision candidate bit array information, the second hard decision candidate bit array information, the third hard decision candidate bit array information, the first posterior L value sequence, the second posterior L value sequence, and the third posterior L value sequence to cause them to be the arrangements equivalent to the arrangements of the columns of each of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230 in the case where the error correction encoding device 100b does not include the interleaving unit 150.

Note that, the deinterleaving unit 250 may switch the arrangements of the reception PAM symbols in the reception modulation symbol group information generated by the reception modulation symbol generating unit 212 on the basis of the first switching rule, thereby restoring the arrangements of the reception PAM symbols to cause them to be the arrangements equivalent to the arrangements of the reception PAM symbols in the reception modulation symbol group information generated by the reception modulation symbol generating unit 212 in the case where the error correction encoding device 100b does not include the interleaving unit 150.

Hereinafter, the description will be given assuming that the deinterleaving unit 250 switches the arrangements of the columns of each of the first hard decision candidate bit array information, the second hard decision candidate bit array information, and the third hard decision candidate bit array information generated by the hard decision candidate generating unit 220, and the first posterior L value sequence, the second posterior L value sequence, and the third posterior L value sequence generated by the soft decision information generating unit 230.

The decoding unit 240b generates the output information by performing the multi-stage error correction processing on the basis of the first hard decision candidate bit array information, the second hard decision candidate bit array information, the third hard decision candidate bit array information, the first posterior L value sequence, the second posterior L value sequence, and the third posterior L value sequence.

A configuration of a main part of the decoding unit 240b according to the third embodiment will be described with reference to FIG. 23.

Figure 23:
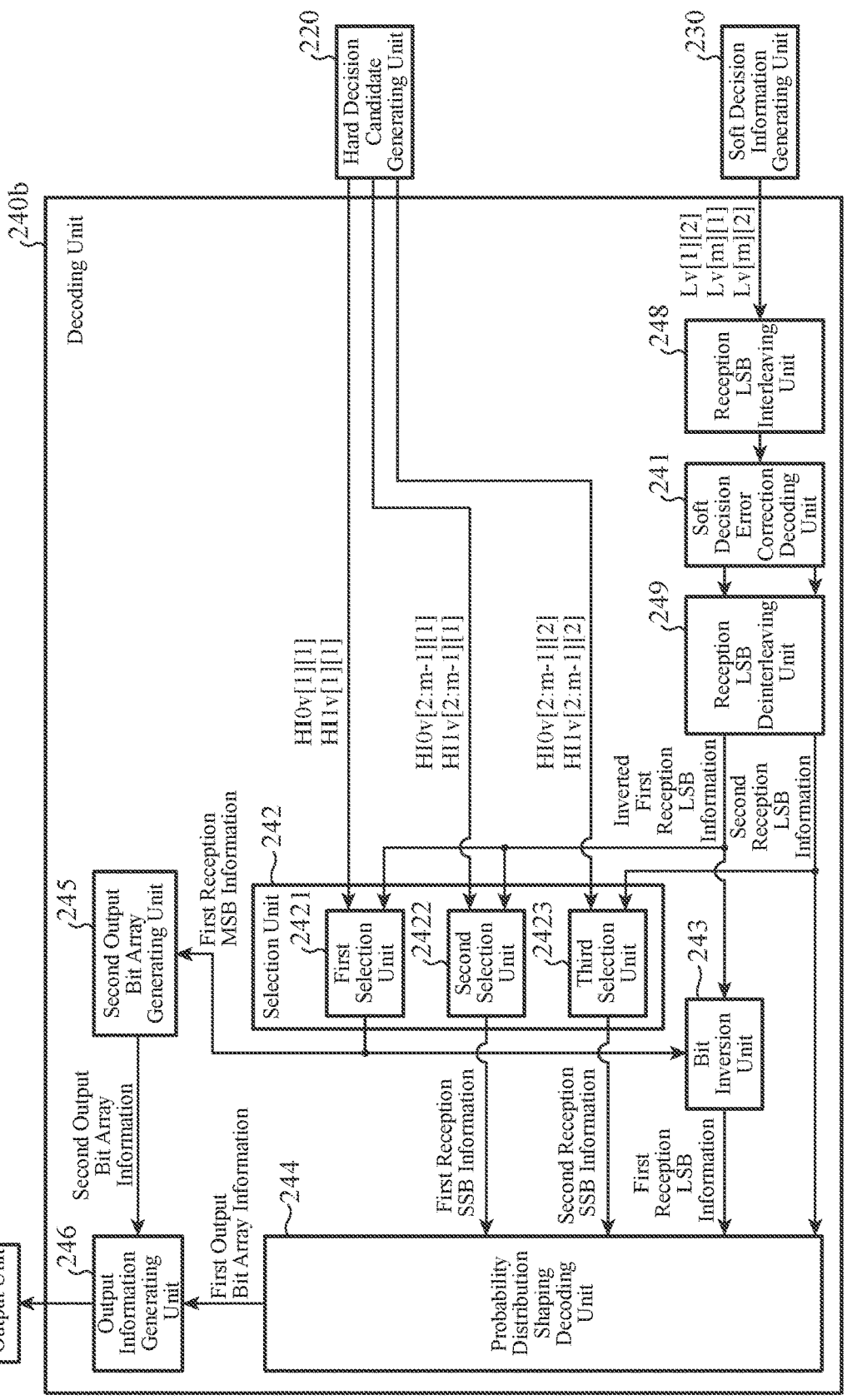
FIG. 23 is a configuration diagram illustrating an example of a configuration of a main part of a decoding unit according to the third embodiment.

FIG. 23 is a configuration diagram illustrating an example of the configuration of the main part of the decoding unit 240b according to the third embodiment.

The decoding unit 240b includes the soft decision error correction decoding unit 241, the selection unit 242, the reception side bit inversion unit 243, the probability distribution shaping decoding unit 244, the second output bit array generating unit 245, the output information generating unit 246, a reception LSB interleaving unit 248, and a reception LSB deinterleaving unit 249.

The decoding unit 240b is obtained by adding the reception LSB interleaving unit 248 and the reception LSB deinterleaving unit 249 to the configuration of the decoding unit 240 according to the first embodiment.

Note that, in FIG. 23, blocks similar to the blocks illustrated in FIG. 8 are designated by the same reference numerals, and the description thereof will be omitted.

The reception LSB interleaving unit 248 switches the arrangements of the columns in the second posterior L value sequence by switching information of any column in the second posterior L value sequence with information of any other column in the second posterior L value sequence on the basis of the second switching rule.

In addition, the reception LSB interleaving unit 248 switches the arrangements of the columns in the third posterior L value sequence by switching information of any column in the third posterior L value sequence with information of any other column in the third posterior L value sequence on the basis of the second switching rule.

The soft decision error correction decoding unit 241 performs the soft decision error correction processing by using the first posterior L value sequence, the second posterior L value sequence after the reception LSB interleaving unit 248 performs the switching, and the third posterior L value sequence after the reception LSB interleaving unit 248 performs the switching.

The reception LSB deinterleaving unit 249 switches the arrangements of the columns in the inverted first reception LSB information generated by the soft decision error correction decoding unit 241, on the basis of the second switching rule, thereby switching the arrangements of the columns in the inverted first reception LSB information to cause them to be equivalent to the arrangements of the columns in the inverted first reception LSB information generated by the soft decision error correction decoding unit 241 in a case where the decoding unit 240b does not include the reception LSB interleaving unit 248.

In addition, the reception LSB deinterleaving unit 249 switches the arrangements of the columns in the second reception LSB information generated by the soft decision error correction decoding unit 241, on the basis of the second switching rule, thereby switching the arrangements of the columns in the second reception LSB information to cause them to be equivalent to the arrangements of the columns in the second reception LSB information generated by the soft decision error correction decoding unit 241 in the case where the decoding unit 240b does not include the reception LSB interleaving unit 248.

Note that, functions of the reception modulation symbol group information generating unit 210, the hard decision candidate generating unit 220, the soft decision information generating unit 230, the decoding unit 240*b*, the deinterleaving unit 250, and the information output unit 290 included in the error correction device 200*b* according to the third embodiment may be implemented by the processor 901 and the memory 902 in the hardware configuration illustrated as an example in FIGS. 9A and 9B in the first embodiment, or may be implemented by the processing circuit 903.

Operation of the error correction device 200*b* according to the third embodiment will be described with reference to FIGS. 24A, 24B, and 24C.

Figure 24A:
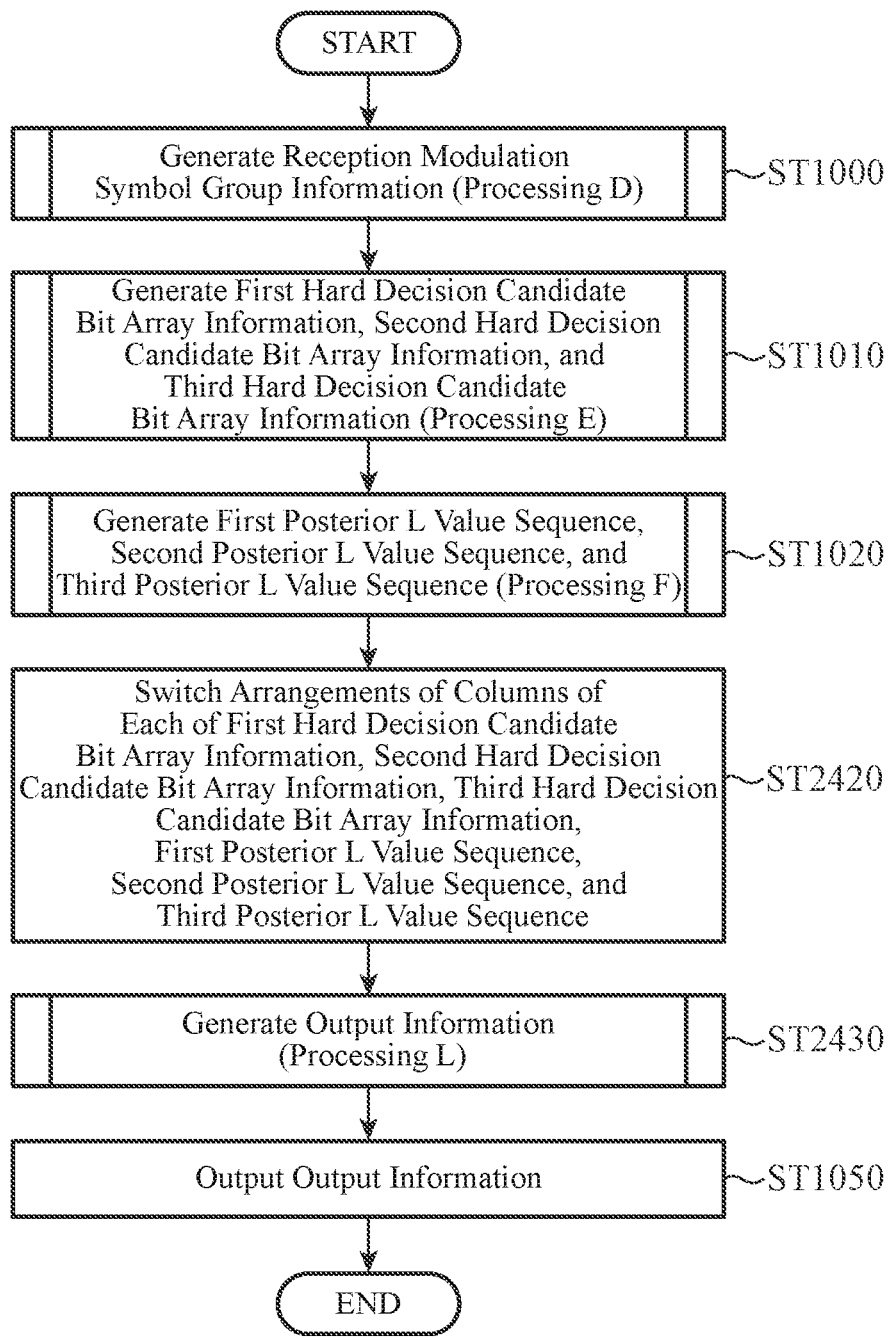
FIG. 24A is a part of a flowchart illustrating an example of processing performed by the error correction device according to the third embodiment.

FIG. 24A is a part of a flowchart illustrating an example of processing performed by the error correction device 200*b* according to the third embodiment.

Figure 24B:
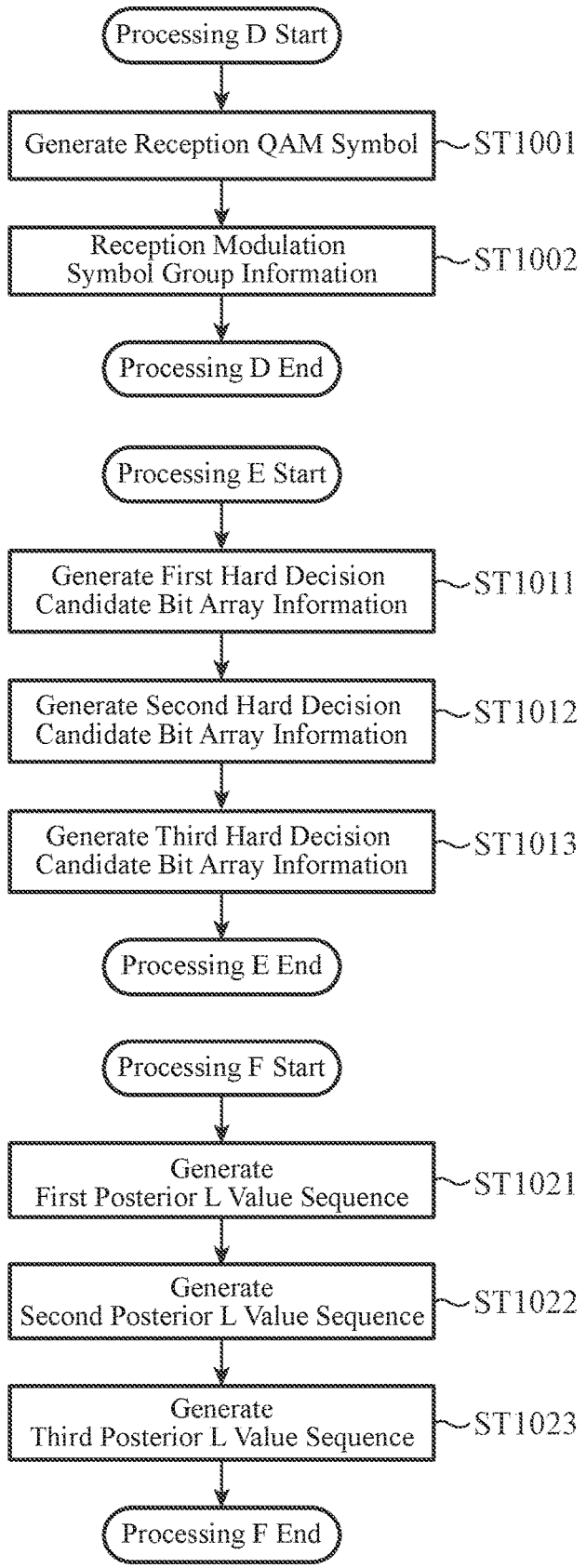
FIG. 24B is another part of the flowchart illustrating the example of the processing performed by the error correction device according to the third embodiment.

FIG. 24B is another part of the flowchart illustrating the example of the processing performed by the error correction device 200*b* according to the third embodiment.

Figure 24C:
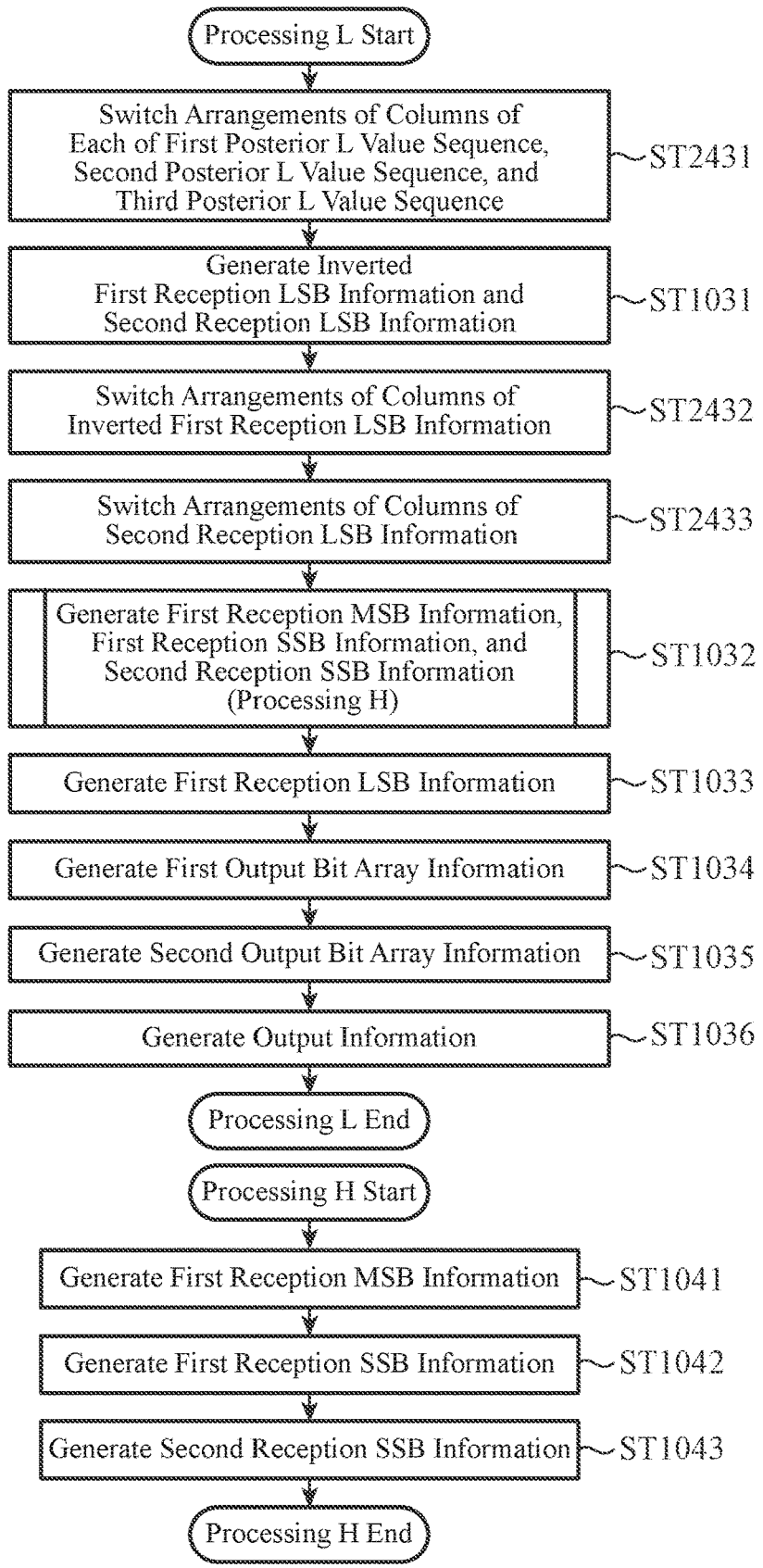
FIG. 24C is a remaining part of the flowchart illustrating the example of the processing performed by the error correction device according to the third embodiment.

FIG. 24C is a remaining part of the flowchart illustrating the example of the processing performed by the error correction device 200*b* according to the third embodiment.

Hereinafter, FIGS. 24A, 24B, and 24C are collectively denoted as FIG. 24.

The error correction device 200*b* repeatedly executes the processing of the flowchart illustrated in FIG. 24.

Note that, the flowchart illustrated in FIG. 24 is obtained by adding step ST2420 between processing steps of step ST1020 and step ST1030 in the flowchart illustrated in FIG. 10, and changing step ST1030 to ST2430.

In FIG. 24, processing steps similar to processing steps of the flowchart illustrated in FIG. 10 are designated by the same reference numerals, and the description thereof will be omitted.

First, the error correction device 200*b* performs processing from step ST1000 to step ST1020.

After step ST1020, in step ST2420, the deinterleaving unit 250 switches the arrangements of the columns of each of the first hard decision candidate bit array information, the second hard decision candidate bit array information, the third hard decision candidate bit array information, the first posterior L value sequence, the second posterior L value sequence, and the third posterior L value sequence.

After step ST2420, in step ST2430, the decoding unit 240*b* generates the output information by performing the multi-stage error correction processing.

Specifically, the decoding unit 240*b* performs processing of step ST2430 by performing processing from step ST1031 to step ST1036, and processing from step ST2431 to step ST2433 in processing L below.

In step ST2431, the reception LSB interleaving unit 248 included in the decoding unit 240*b* switches the arrangements of the columns of each of the first posterior L value sequence, the second posterior L value sequence, and the third posterior L value sequence.

After step ST2431, the decoding unit 240*b* performs the processing of step ST1031.

After step ST1031, in step ST2432, the reception LSB deinterleaving unit 249 included in the decoding unit 240*b* switches the arrangements of the columns of the inverted first reception LSB information.

Next, in step ST2433, the reception LSB deinterleaving unit 249 included in the decoding unit 240*b* switches the arrangements of the columns of the second reception LSB information.

After step ST2433, the decoding unit 240*b* performs the processing from step ST1032 to step ST1036.

After step ST1036, the decoding unit 240*b* ends the processing L. That is, after step ST1036, the decoding unit 240*b* ends the processing of step ST2430.

After step ST2430, the error correction device 200*b* performs processing of step ST1050.

After step ST1050, the error correction device 200*b* ends the processing of the flowchart illustrated in FIG. 24, and the error correction device 200*b* returns to the processing of step ST1000 and repeatedly executes the processing of the flowchart illustrated in FIG. 24.

With this configuration, the error correction encoding device 100*b* can disperse a burst error occurring in the transmission path 30. For that reason, the error correction encoding device 100*b* can suppress performance degradation of the soft decision error correction decoding processing in the error correction device 200*b*.

Note that, in the above description, the error correction encoding device 100*b* has been described as including the interleaving unit 150, the LSB interleaving unit 126, and the LSB deinterleaving unit 127, but it is not limited thereto.

For example, the error correction encoding device 100*b* may be one including the interleaving unit 150 and neither the LSB interleaving unit 126 nor the LSB deinterleaving unit 127.

In addition, the error correction encoding device 100*b* may be one including the LSB interleaving unit 126 and the LSB deinterleaving unit 127 and not including the interleaving unit 150.

In addition, in the above description, the error correction device 200*b* has been described as including the deinterleaving unit 250, the reception LSB interleaving unit 248, and the reception LSB deinterleaving unit 249, but it is not limited thereto.

For example, in a case where the error correction encoding device 100*b* includes the interleaving unit 150 and includes neither the LSB interleaving unit 126 nor the LSB deinterleaving unit 127, the error correction device 200*b* is one including the deinterleaving unit 250 and neither the reception LSB interleaving unit 248 nor the reception LSB deinterleaving unit 249.

In addition, in a case where the error correction encoding device 100*b* includes the LSB interleaving unit 126 and the LSB deinterleaving unit 127 and does not include the interleaving unit 150, the error correction device 200*b* is one including the reception LSB interleaving unit 248 and the reception LSB deinterleaving unit 249 and not including the deinterleaving unit 250.

Note that, in the present disclosure, within the scope of the invention, free combination of embodiments, a modification of any component of each embodiment, or omission of any component in each embodiment is possible.

INDUSTRIAL APPLICABILITY

The present disclosure is suitable for a communication system in which, when information is transmitted from a transmission device to a reception device, the transmission device performs error correction encoding on the information to be transmitted, and the reception device performs error correction on the information received.

REFERENCE SIGNS LIST

1, 1*a*, 1*b*, 1*c*, 1*d*: communication system, 30: transmission path, 10, 10*a*, 10*b*, 10*c*, 10*d*: transmission device, 11: D/A converter, 12: transmission light source, 13: optical modulator, 100, 100a, 100b, 100c, 100d: error correction encoding device, 110: input information acquiring unit, 120, 120a, 120b, 120c, 120d: encoding unit, 121, 121c, 121d: input bit array information generating unit, 122: probability distribution shaping encoding unit, 123: bit inversion unit, 124, 124c: soft decision error correction encoding unit, 125, 125d: hard decision error correction encoding unit, 126: LSB interleaving unit, 127: LSB deinterleaving unit, 130: modulation symbol conversion unit, 131: first symbol mapping unit, 132: second symbol mapping unit, 140: transmission waveform shaping unit, 141: polarization multiplexing unit, 142: transmission digital signal generating unit, 150: interleaving unit, 20, 20a, 20b, 20c, 20d: reception device, 21: optical receiver, 22: reception light source, 23: A/D converter, 200, 200a, 200b, 200c, 200d: error correction device, 210: reception modulation symbol group information generating unit, 211: reception polarization multiplexing symbol generating unit, 212: reception modulation symbol generating unit, 220: hard decision candidate generating unit, 221: first hard decision candidate generating unit, 222: second hard decision candidate generating unit, 223: third hard decision candidate generating unit, 230: soft decision information generating unit, 231: first soft decision information generating unit, 232: second soft decision information generating unit, 233: third soft decision information generating unit, 240, 240a, 240b, 240c, 240d: decoding unit, 241, 241c: soft decision error correction decoding unit, 242: selection unit, 2421: first selection unit, 2422: second selection unit, 2423: third selection unit, 243: reception side bit inversion unit, 244: probability distribution shaping decoding unit, 245, 245d: second output bit array generating unit, 246, 246c: output information generating unit, 247, 247d: hard decision error correction decoding unit, 248: reception LSB interleaving unit, 249: reception LSB deinterleaving unit, 250: deinterleaving unit, 260: third output bit array generating unit, 290: information output unit, 501, 901: processor, 502, 902: memory, 503, 903: processing circuit.

The invention claimed is:

1. An error correction encoding device comprising:
    an input information acquirer to acquire input information;
    an encoder to generate soft decision error correction frame information including a bit array of m rows and N columns on a basis of the input information acquired by the input information acquirer, the bit array being obtained by combining first bit string group information and second bit string group information, the first bit string group information including a bit array of m rows and N1 columns in which it is enabled to perform pulse amplitude modulation of a combination of bit values of each column of the first bit string group information into a modulation symbol by using a predetermined first symbol mapping rule, the second bit string group information including a bit array of m rows and N2 columns in which it is enabled to perform pulse amplitude modulation of a combination of bit values of each column of the second bit string group information into a modulation symbol by using a predetermined second symbol mapping rule, where m is a natural number of greater than or equal to 2, N1 is a natural number of greater than or equal to 2, N2 is a natural number of greater than or equal to 1, and N is a number obtained by adding N1 and N2 together;
    a modulation symbol convertor to generate modulation symbol group information including N pieces of the modulation symbols by performing pulse amplitude modulation of a combination of bit values of each column of the soft decision error correction frame information generated by the encoder into the modulation symbol for each column of the soft decision error correction frame information by using the first symbol mapping rule or the second symbol mapping rule; and
    a transmission waveform shaper to generate a digital baseband modulation signal on a basis of the modulation symbol group information generated by the modulation symbol convertor and output the digital baseband modulation signal generated,
    wherein
    the encoder
    generates the soft decision error correction frame information by:
    generating first input bit array information including a bit array of m−1 rows and N columns and second input bit array information including a bit array of one row and N3 columns on the basis of the input information acquired by the input information acquirer, where N3 is a natural number of greater than or equal to 1 and less than N1;
    storing the second input bit array information generated as a part of first most significant bit (MSB) information including a bit array of one row and N1 columns in a predetermined area of a first row in the first bit string group information;
    generating shaped bit array information including a bit array of m−1 rows and N columns by performing probability distribution shaping encoding processing on the first input bit array information generated;
    generating first group bit array information including a combination of N1 predetermined columns and second group bit array information including a combination of N2 predetermined columns by separating the shaped bit array information generated;
    generating first least significant bit (LSB) information including a bit array of one row and N1 columns by extracting, from the first group bit array information generated, a bit array of an (m−1)-th row in the first group bit array information, generating inverted first LSB information including a bit array of one row and N1 columns by calculating exclusive ORs of bit values of each columns in the first LSB information generated and each bit values of each columns in information of the first row in the first bit string group information after storing the second input bit array information, the columns in the information of the first row in the first bit string group information each corresponding to the columns in the first LSB information, and storing the inverted first LSB information generated in an m-th row in the first bit string group information;
    generating second LSB information including a bit array of one row and N2 columns by extracting a bit array of the (m−1)-th row in the second group bit array information from the second group bit array information generated, and storing the second LSB information generated in the m-th row in the second bit string group information;
    generating a soft decision parity bit by performing systematic soft decision error correction encoding processing by using the inverted first LSB information generated and the second LSB information generated, and storing the soft decision parity bit generated, in the first row in the second bit string group information as second MSB information including a bit array of one row and N2 columns;

in a case where m is greater than or equal to 3, generating first secondary significant bit (SSB) information including a bit array of m−2 rows and N1 columns by extracting, from the first group bit array information generated, the first row to an (m−2)-th row in the first group bit array information, and storing the first SSB information generated, in a second row to the (m−1)-th row in the first bit string group information; and in the case where m is greater than or equal to 3, generating second SSB information including a bit array of m−2 rows and N2 columns by extracting, from the second group bit array information generated, the first row to the (m−2)-th row in the second group bit array information, and storing the second SSB information generated, in the second row to the (m−1)-th row in the second bit string group information.

2. The error correction encoding device according to claim 1, wherein the first symbol mapping rule is a symbol mapping rule in which one combination of bit values including a bit array of m rows and one column corresponds to one of the modulation symbols subjected to one-dimensional pulse amplitude modulation, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols are adjacent to each other, and the second symbol mapping rule is a symbol mapping rule in which one combination of bit values including a bit array of m rows and one column corresponds to one of the modulation symbols subjected to one-dimensional pulse amplitude modulation, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols have an identical sign and are adjacent to each other, and are identical values between the modulation symbol of which an absolute value of an amplitude value of the modulation symbol is minimum among the modulation symbols in which the amplitude values of the modulation symbols are positive and the modulation symbol of which an absolute value of an amplitude value of the modulation symbol is minimum among the modulation symbols in which the amplitude values of the modulation symbols are negative.

3. The error correction encoding device according to claim 1, wherein the encoder generates the first input bit array information and the second input bit array information by setting a bit value of a bit other than a bit corresponding to the input information to 0 in the first input bit array information or the second input bit array information when generating the first input bit array information and the second input bit array information on the basis of the input information acquired by the input information acquirer.

4. The error correction encoding device according to claim 1, wherein the encoder generates a hard decision parity bit by performing systematic hard decision error correction encoding processing, by using the first input bit array information and the second input bit array information, or by using the first input bit array information, the first SSB information, the second SSB information, the second LSB information, and the first LSB information or the inverted first LSB information, and stores the hard decision parity bit generated, as a part of the first MSB information in a predetermined area different from an area storing the second input bit array information of the first row in the first bit string group information.

5. The error correction encoding device according to claim 4, wherein the encoder generates the second input bit array information by setting a bit value of a bit other than a bit corresponding to the input information to a predetermined value in the second input bit array information when generating the second input bit array information on the basis of the input information acquired by the input information acquirer, and the encoder, when performing the systematic hard decision error correction encoding processing, as first preprocessing, switches bit values of columns corresponding to each other between a bit value of an area storing the predetermined value, of a predetermined area of the first row in the first bit string group information storing the second input bit array information as a part of the first MSB information, and a bit value of a column corresponding to one of the columns of an area storing the predetermined value of a predetermined area of the first row in the first bit string group information, of an area of the m-th row in the first bit string group information storing the first LSB information, and as second preprocessing, calculates an exclusive OR for each of the columns corresponding to each other between a bit value after switching the bit value of the area storing the predetermined value, of the predetermined area of the first row in the first bit string group information, and a bit value after switching the bit value of the column corresponding to one of the columns of the area storing the predetermined value of the predetermined area of the first row in the first bit string group information, of the area of the m-th row in the first bit string group information, and as third preprocessing, overwrites the bit value after switching the bit value of the area storing the predetermined value, of the predetermined area of the first row in the first bit string group information, by using a calculation result of the exclusive OR in the columns corresponding to each other.

6. The error correction encoding device according to claim 1, wherein the encoder generates the soft decision error correction frame information by:

generating third input bit array information including a bit array of one row and N4 columns in addition to the first input bit array information and the second input bit array information on the basis of the input information acquired by the input information acquirer, where N4 is a natural number of greater than or equal to 1 and less than N2;

storing the third input bit array information generated as a part of the second MSB information including the bit array of one row and N2 columns in a predetermined area of the first row in the second bit string group information; and generating the soft decision parity bit by performing the systematic soft decision error correction encoding processing by using the third input bit array information stored as the part of the second MSB information in addition to the inverted first LSB information generated and the second LSB information generated, and storing the soft decision parity bit generated, in a predetermined area different from an area storing the third input bit array information of the first row of the second bit string group information.

7. An error correction encoding method comprising:
acquiring input information; and
generating soft decision error correction frame information including a bit array of m rows and N columns on a basis of the input information acquired, the bit array being obtained by combining first bit string group information and second bit string group information, the first bit string group information including a bit array of m rows and N1 columns in which it is enabled to perform pulse amplitude modulation of a combination of bit values of each column of the first bit string group information into a modulation symbol by using a predetermined first symbol mapping rule, the second bit string group information including a bit array of m rows and N2 columns in which it is enabled to perform pulse amplitude modulation of a combination of bit values of each column of the second bit string group information into a modulation symbol by using a predetermined second symbol mapping rule, where m is a natural number of greater than or equal to 2, N1 is a natural number of greater than or equal to 2, N2 is a natural number of greater than or equal to 1, and N is a number obtained by adding N1 and N2 together,
wherein
the method
includes:
generating first input bit array information including a bit array of m−1 rows and N columns and second input bit array information including a bit array of one row and N3 columns on the basis of the input information acquired b, where N3 is a natural number of greater than or equal to 1 and less than N1;
storing the second input bit array information generated as a part of first most significant bit (MSB) information including a bit array of one row and N1 columns in a predetermined area of a first row in the first bit string group information;
generating shaped bit array information including a bit array of m−1 rows and N columns by performing probability distribution shaping encoding processing on the first input bit array information generated;
generating first group bit array information including a combination of N1 predetermined columns and second group bit array information including a combination of N2 predetermined columns by separating the shaped bit array information generated;
generating first least significant bit (LSB) information including a bit array of one row and N1 columns by extracting, from the first group bit array information generated, a bit array of an (m−1)-th row in the first group bit array information, generating inverted first LSB information including a bit array of one row and N1 columns by calculating exclusive ORs of bit values of each columns in the first LSB information generated and each bit values of each columns in information of the first row in the first bit string group information after storing the second input bit array information, the columns in the information of the first row in the first bit string group information each corresponding to the columns in the first LSB information, and storing the inverted first LSB information generated in an m-th row in the first bit string group information;
generating second LSB information including a bit array of one row and N2 columns by extracting a bit array of the (m−1)-th row in the second group bit array information from the second group bit array information generated, and storing the second LSB information generated in the m-th row in the second bit string group information;
generating a soft decision parity bit by performing systematic soft decision error correction encoding processing by using the inverted first LSB information generated and the second LSB information generated, and storing the soft decision parity bit generated, in the first row in the second bit string group information as second MSB information including a bit array of one row and N2 columns;
generating first secondary significant bit (SSB) information including a bit array of m−2 rows and N1 columns by extracting, from the first group bit array information generated, the first row to an (m−2)-th row in the first group bit array information, and storing the first SSB information generated, in a second row to the (m−1)-th row in the first bit string group information, in a case where m is greater than or equal to 3; and
generating second SSB information including a bit array of m−2 rows and N2 columns by extracting, from the second group bit array information generated, the first row to the (m−2)-th row in the second group bit array information, and storing the second SSB information generated, in the second row to the (m−1)-th row in the second bit string group information, in the case where m is greater than or equal to 3.

8. An error correction device comprising:
a reception modulation symbol group information generator to receive a reception digital baseband modulation signal that is a signal based on the soft decision error correction frame information generated by the error correction encoding method according to claim 7 and generate reception modulation symbol group information including N reception modulation symbols on a basis of the reception digital baseband modulation signal;
a hard decision candidate generator to generate first hard decision candidate bit array information including a bit array of one row and N1 columns, second hard decision candidate bit array information including a bit array of m−2 rows and N1 columns in a case where m is greater than or equal to 3, and third hard decision candidate bit array information including a bit array of m−2 rows and N2 columns in the case where m is greater than or equal to 3, by using the reception modulation symbol group information generated by the reception modulation symbol group information generator on a basis of the first symbol mapping rule or the second symbol mapping rule;
a soft decision information generator to generate a first posterior L value sequence including N2 posterior L values corresponding to each columns of a first row of the second bit string group information, a second posterior L value sequence including N1 posterior L values corresponding to each columns of the m-th row of the first bit string group information, and a third posterior L value sequence including N2 posterior L values corresponding to each columns of the m-th row of the second bit string group information on a basis of the reception modulation symbol group information generated by the reception modulation symbol group information generator;
a decoder to perform multi-stage error correction processing on a basis of the first hard decision candidate bit array information, the second hard decision candidate bit array information, and the third hard decision candidate bit array information generated by the hard decision candidate generator, and the first posterior L value sequence, the second posterior L value sequence, and the third posterior L value sequence generated by the soft decision information generator; and
an information outputter to output information generated by the decoder performing the multi-stage error correction processing as output information,
wherein
in first decoding processing in the multi-stage error correction processing, the decoder generates inverted first reception least significant bit (LSB) information including a bit array of one row and N1 columns corresponding to the inverted first LSB information and second reception LSB information including a bit array of one row and N2 columns corresponding to the second LSB information by performing soft decision error correction processing on the basis of the first posterior L value sequence, the second posterior L value sequence, and the third posterior L value sequence,
in second decoding processing in the multi-stage error correction processing, the decoder generates first reception most significant bit (MSB) information including a bit array of one row and N1 columns corresponding to the first MSB information on a basis of the first hard decision candidate bit array information and the inverted first reception LSB information, generates first reception secondary significant bit (SSB) information including a bit array of m−2 rows and N1 columns corresponding to the first SSB information on a basis of the second hard decision candidate bit array information and the inverted first reception LSB information in the case where m is greater than or equal to 3, and generates second reception SSB information including a bit array of m−2 rows and N2 columns corresponding to the second SSB information on a basis of the third hard decision candidate bit array information and the second reception LSB information in the case where m is greater than or equal to 3,
in third decoding processing in the multi-stage error correction processing, the decoder generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information,
in fourth decoding processing in the multi-stage error correction processing, the decoder generates first output bit array information including a bit array of m−1 rows and N columns corresponding to the first input bit array information by performing probability distribution shaping decoding processing on the first reception SSB information, the second reception SSB information, the first reception LSB information, and the second reception LSB information, in fifth decoding processing in the multi-stage error correction processing, the decoder generates second output bit array information including a bit array of one row and N3 columns corresponding to the second input bit array information by extracting information of a predetermined area of the first reception MSB information,
in sixth decoding processing in the multi-stage error correction processing, the decoder generates the output information corresponding to the input information on a basis of the first output bit array information and the second output bit array information, and
the information outputter outputs the output information generated by the decoder.

9. The error correction device according to claim 8, wherein
the first symbol mapping rule is a symbol mapping rule in which one of the modulation symbols subjected to one-dimensional pulse amplitude modulation corresponds to one combination of bit values including a bit array of m rows and one column, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols are adjacent to each other, and
the second symbol mapping rule is a symbol mapping rule in which one of the modulation symbols subjected to one-dimensional pulse amplitude modulation corresponds to one combination of bit values including a bit array of m rows and one column, and is the symbol mapping rule in which a combination of the bit values from the first row to the (m−1)-th row of the bit array of m rows and one column is a combination corresponding to a binary reflected Gray code, and bit values of the m-th row are values different from each other in the modulation symbols in which amplitude values of the modulation symbols have an identical sign and are adjacent to each other, and are identical values between the modulation symbol of which an absolute vale of an amplitude value of the modulation symbol is minimum among the modulation symbols in which the amplitude values of the modulation symbols are positive and the modulation symbol of which an absolute value of an amplitude value of the modulation symbol is minimum among the modulation symbols in which the amplitude values of the modulation symbols are negative.

10. The error correction device according to claim 8, wherein
the decoder performs hard decision error correction processing on information corresponding to the second output bit array information of the first reception MSB information, and the first reception SSB information, the second reception SSB information, the second reception LSB information, and the first reception LSB information or the inverted first reception LSB information, or on the information corresponding to the second output bit array information of the first reception MSB information and the first output bit array information, on a basis of information stored in a predetermined area of the first reception MSB information, in seventh decoding processing in the multi-stage error correction processing, and
in a case where the decoder performs the hard decision error correction processing on the information corresponding to the second output bit array information of the first reception MSB information, and the first reception SSB information, the second reception SSB information, the second reception LSB information, and the inverted first reception LSB information, the decoder generates the second output bit array information by calculating an exclusive OR by using the inverted first reception LSB information and the first reception MSB information after the seventh decoding processing, in the third decoding processing, and extracting information of a predetermined area of the first reception MSB information after the seventh decoding processing, in the fifth decoding processing, and in a case where the decoder performs the hard decision error correction processing on the information corresponding to the second output bit array information of the first reception MSB information, and the first reception SSB information, the second reception SSB information, the second reception LSB information, and the first reception LSB information, the decoder generates the second output bit array information by performing probability distribution shaping decoding processing on the first reception SSB information, the second reception SSB information, the first reception LSB information, and the second reception LSB information after the seventh decoding processing, in the fourth decoding processing, and extracting the information of the predetermined area of the first reception MSB information after the seventh decoding processing, in the fifth decoding processing, and in a case where the decoder performs the hard decision error correction processing on the information corresponding to the second output bit array information of the first reception MSB information, and the first output bit array information, the decoder generates the second output bit array information by extracting the information of the predetermined area of the first reception MSB information after the seventh decoding processing, in the fifth decoding processing, and generates the output information on a basis of the second output bit array information and the first output bit array information after the seventh decoding processing, in the sixth decoding processing.

11. The error correction device according to claim 10, wherein the decoder performs the hard decision error correction processing, and then, in the seventh decoding processing in the multi-stage error correction processing, as first post-processing, calculates an exclusive OR for each of columns corresponding to each other between a bit value of a column in the first reception MSB information corresponding to each column of an area storing a predetermined value of a predetermined area of the first row in the first bit string group information storing the second input bit array information as a part of the first MSB information, and a bit value of a column in the first reception LSB information corresponding to each column of the area storing the predetermined value in the predetermined area in the first row in the first bit string group information storing the second input bit array information as the part of the first MSB information, and as second post-processing, overwrites the bit value of the column in the first reception MSB information corresponding to each column of the area storing the predetermined value of the predetermined area of the first row in the first bit string group information, by using a calculation result of the exclusive OR in the columns corresponding to each other.

12. The error correction device according to claim 8, wherein the first encoding step generates third input bit array information including a bit array of one row and N4 columns in addition to the first input bit array information and the second input bit array information on the basis of the input information acquired by the input information acquirer, where N4 is a natural number of greater than or equal to 1 and less than N2, the second encoding step stores the second input bit array information generated by the first encoding step as a part of the first MSB information in a predetermined area of the first row in the first bit string group information, and stores the third input bit array information generated by the first encoding step as a part of the second MSB information in a predetermined area of the first row in the second bit string group information, the seventh encoding step generates the soft decision parity bit by performing the systematic soft decision error correction encoding processing by using the third input bit array information generated by the first encoding step in addition to the inverted first LSB information generated by the fifth encoding step and the second LSB information generated by the sixth encoding step, and stores the soft decision parity bit generated, in an area different from the area in which the third input bit array information is stored of the second MSB information, and the decoder generates second reception MSB information including a bit array of one row and N2 columns corresponding to the second MSB information, in addition to the inverted first reception LSB information including the bit array of one row and N1 columns corresponding to the inverted first LSB information and the second reception LSB information including the bit array of one row and N2 columns corresponding to the second LSB information, by performing soft decision error correction processing on the basis of the first posterior L value sequence, the second posterior L value sequence, and the third posterior L value sequence, in the first decoding processing in the multi-stage error correction processing, generates third output bit array information including a bit array of one row and N4 columns corresponding to the third input bit array information by extracting information of a predetermined area of the second reception MSB information in eighth decoding processing in the multi-stage error correction processing, and generates the output information corresponding to the input information on a basis of the third output bit array information, in addition to the first output bit array information and the second output bit array information, in the sixth decoding processing in the multi-stage error correction processing.

13. An error correction method comprising:

receiving a reception digital baseband modulation signal that is a signal based on the soft decision error correction frame information generated by the error correction encoding method according to claim 7 and generating reception modulation symbol group information including N reception modulation symbols on a basis of the reception digital baseband modulation signal;

generating first hard decision candidate bit array information including a bit array of one row and N1 columns, second hard decision candidate bit array information including a bit array of m−2 rows and N1 columns in a case where m is greater than or equal to 3, and third hard decision candidate bit array information including a bit array of m−2 rows and N2 columns in the case where m is greater than or equal to 3, by using the first symbol mapping rule or the second symbol mapping rule, on a basis of the reception modulation symbol group information generated;

generating a first posterior L value sequence including N2 posterior L values corresponding to each columns of a first row of the second bit string group information, a second posterior L value sequence including N1 posterior L values corresponding to each columns of the m-th row of the first bit string group information, and a third posterior L value sequence including N2 posterior L values corresponding to each columns of the m-th row of the second bit string group information on a basis of the reception modulation symbol group information generated;

performing, multi-stage error correction processing on a basis of the first hard decision candidate bit array information, the second hard decision candidate bit array information, and the third hard decision candidate bit array information generated, and the first posterior L value sequence, the second posterior L value sequence, and the third posterior L value sequence generated; and outputting information generated performing the multi-stage error correction processing as output information, wherein in first decoding processing in the multi-stage error correction processing, the method generates inverted first reception least significant bit (LSB) information including a bit array of one row and N1 columns corresponding to the inverted first LSB information and second reception LSB information including a bit array of one row and N2 columns corresponding to the second LSB information by performing soft decision error correction processing on the basis of the first posterior L value sequence, the second posterior L value sequence, and the third posterior L value sequence, in second decoding processing in the multi-stage error correction processing, the method generates first reception most significant bit (MSB) information including a bit array of one row and N1 columns corresponding to the first MSB information on a basis of the first hard decision candidate bit array information and the inverted first reception LSB information, generates first reception secondary significant bit (SSB) information including a bit array of m−2 rows and N1 columns corresponding to the first SSB information on a basis of the second hard decision candidate bit array information and the inverted first reception LSB information in the case where m is greater than or equal to 3, and generates second reception SSB information including a bit array of m−2 rows and N2 columns corresponding to the second SSB information on a basis of the third hard decision candidate bit array information and the second reception LSB information in the case where m is greater than or equal to 3, in third decoding processing in the multi-stage error correction processing, the method generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information, in fourth decoding processing in the multi-stage error correction processing, the method generates first output bit array information including a bit array of m−1 rows and N columns corresponding to the first input bit array information by performing probability distribution shaping decoding processing on the first reception SSB information, the second reception SSB information, the first reception LSB information, and the second reception LSB information, in fifth decoding processing in the multi-stage error correction processing, the method generates second output bit array information including a bit array of one row and N3 columns corresponding to the second input bit array information by extracting information of a predetermined area of the first reception MSB information, in sixth decoding processing in the multi-stage error correction processing, the method generates the output information corresponding to the input information on a basis of the first output bit array information and the second output bit array information, and the method outputs the output information generated.

14. A communication method comprising:

generating the soft decision error correction frame information based on the input information by an error correction encoding method, the error correction encoding method comprising:

acquiring input information; and generating soft decision error correction frame information including a bit array of m rows and N columns on a basis of the input information acquired, the bit array being obtained by combining first bit string group information and second bit string group information, the first bit string group information including a bit array of m rows and N1 columns in which it is enabled to perform pulse amplitude modulation of a combination of bit values of each column of the first bit string group information into a modulation symbol by using a predetermined first symbol mapping rule, the second bit string group information including a bit array of m rows and N2 columns in which it is enabled to perform pulse amplitude modulation of a combination of bit values of each column of the second bit string group information into a modulation symbol by using a predetermined second symbol mapping rule, where m is a natural number of greater than or equal to 2, N1 is a natural number of greater than or equal to 2, N2 is a natural number of greater than or equal to 1, and N is a number obtained by adding N1 and N2 together, wherein the error correction encoding method includes:

generating first input bit array information including a bit array of m−1 rows and N columns and second input bit array information including a bit array of one row and N3 columns on the basis of the input information acquired, where N3 is a natural number of greater than or equal to 1 and less than N1;

storing the second input bit array information generated as a part of first most significant bit (MSB) information including a bit array of one row and N1 columns in a predetermined area of a first row in the first bit string group information;

generating shaped bit array information including a bit array of m−1 rows and N columns by performing probability distribution shaping encoding processing on the first input bit array information generated;

generating first group bit array information including a combination of N1 predetermined columns and second group bit array information including a combination of N2 predetermined columns by separating the shaped bit array information generated;

generating first least significant bit (LSB) information including a bit array of one row and N1 columns by extracting, from the first group bit array information generated, a bit array of an (m−1)-th row in the first group bit array information, generating inverted first LSB information including a bit array of one row and N1 columns by calculating exclusive ORs of bit values of each columns in the first LSB information generated and each bit values of each columns in information of the first row in the first bit string group information after storing the second input bit array information, the columns in the information of the first row in the first bit string group information each corresponding to the columns in the first LSB information, and storing the inverted first LSB information generated in an m-th row in the first bit string group information;

generating second LSB information including a bit array of one row and N2 columns by extracting a bit array of the (m−1)-th row in the second group bit array information from the second group bit array information generated, and storing the second LSB information generated in the m-th row in the second bit string group information;

generating a soft decision parity bit by performing systematic soft decision error correction encoding processing by using the inverted first LSB information generated and the second LSB information generated, and storing the soft decision parity bit generated, in the first row in the second bit string group information as second MSB information including a bit array of one row and N2 columns;

generating first secondary significant bit (SSB) information including a bit array of m−2 rows and N1 columns by extracting, from the first group bit array information generated, the first row to an (m−2)-th row in the first group bit array information, and storing the first SSB information generated, in a second row to the (m−1)-th row in the first bit string group information, in a case where m is greater than or equal to 3; and generating second SSB information including a bit array of m−2 rows and N2 columns by extracting, from the second group bit array information generated, the first row to the (m−2)-th row in the second group bit array information, and storing the second SSB information generated, in the second row to the (m−1)-th row in the second bit string group information, in the case where m is greater than or equal to 3, the communication method including generating modulation symbol group information including N pieces of the modulation symbols by performing pulse amplitude modulation on a combination of bit values of each column of the soft decision error correction frame information generated into the modulation symbol for each column of the soft decision error correction frame information on a basis of the first symbol mapping rule or the second symbol mapping rule;

generating a digital baseband modulation signal on a basis of the modulation symbol group information generated, and outputting the digital baseband modulation signal generated;

receiving the digital baseband modulation signal output and transmitting a signal based on the digital baseband modulation signal;

receiving the signal transmitted and generating a reception digital baseband modulation signal from the signal; and generating and outputting output information corresponding to the input information on a basis of the reception digital baseband modulation signal generated by an error correction method, the error correction method comprising generating reception modulation symbol group information including N reception modulation symbols on a basis of the reception digital baseband modulation signal;

generating first hard decision candidate bit array information including a bit array of one row and N1 columns, second hard decision candidate bit array information including a bit array of m−2 rows and N1 columns in a case where m is greater than or equal to 3, and third hard decision candidate bit array information including a bit array of m−2 rows and N2 columns in the case where m is greater than or equal to 3, by using the first symbol mapping rule or the second symbol mapping rule, on a basis of the reception modulation symbol group information generated;

generating a first posterior L value sequence including N2 posterior L values corresponding to each columns of a first row of the second bit string group information, a second posterior L value sequence including N1 posterior L values corresponding to each columns of the m-th row of the first bit string group information, and a third posterior L value sequence including N2 posterior L values corresponding to each columns of the m-th row of the second bit string group information on a basis of the reception modulation symbol group information generated;

performing, multi-stage error correction processing on a basis of the first hard decision candidate bit array information, the second hard decision candidate bit array information, and the third hard decision candidate bit array information generated, and the first posterior L value sequence, the second posterior L value sequence, and the third posterior L value sequence generated; and outputting information generated performing the multi-stage error correction processing as output information, wherein in first decoding processing in the multi-stage error correction processing, the error correction method generates inverted first reception LSB information including a bit array of one row and N1 columns corresponding to the inverted first LSB information and second reception LSB information including a bit array of one row and N2 columns corresponding to the second LSB information by performing soft decision error correction processing on the basis of the first posterior L value sequence, the second posterior L value sequence, and the third posterior L value sequence, in second decoding processing in the multi-stage error correction processing, the error correction method generates first reception MSB information including a bit array of one row and N1 columns corresponding to the first MSB information on a basis of the first hard decision candidate bit array information and the inverted first reception LSB information, generates first reception SSB information including a bit array of m−2 rows and N1 columns corresponding to the first SSB information on a basis of the second hard decision candidate bit array information and the inverted first reception LSB information in the case where m is greater than or equal to 3, and generates second reception SSB information including a bit array of m−2 rows and N2 columns corresponding to the second SSB information on a basis of the third hard decision candidate bit array information and the second reception LSB information in the case where m is greater than or equal to 3, in third decoding processing in the multi-stage error correction processing, the error correction method generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information, in fourth decoding processing in the multi-stage error correction processing, the error correction method generates first output bit array information including a bit array of m−1 rows and N columns corresponding to the first input bit array information by performing probability distribution shaping decoding processing on the first reception SSB information, the second reception SSB information, the first reception LSB information, and the second reception LSB information, in fifth decoding processing in the multi-stage error correction processing, the error correction method generates second output bit array information including a bit array of one row and N3 columns corresponding to the second input bit array information by extracting information of a predetermined area of the first reception MSB information, in sixth decoding processing in the multi-stage error correction processing, the error correction method generates the output information corresponding to the input information on a basis of the first output bit array information and the second output bit array information, and the error correction method outputs the output information generated.

15. An optical communication system comprising: an optical transmission path to transmit an optical signal; a transmission device; and a reception device, wherein
the transmission device
includes:
the error correction encoding device comprising:
an input information acquirer to acquire input information;
an encoder to generate soft decision error correction frame information including a bit array of m rows and N columns on a basis of the input information acquired by the input information acquirer, the bit array being obtained by combining first bit string group information and second bit string group information, the first bit string group information including a bit array of m rows and N1 columns in which it is enabled to perform pulse amplitude modulation of a combination of bit values of each column of the first bit string group information into a modulation symbol by using a predetermined first symbol mapping rule, the second bit string group information including a bit array of m rows and N2 columns in which it is enabled to perform pulse amplitude modulation of a combination of bit values of each column of the second bit string group information into a modulation symbol by using a predetermined second symbol mapping rule, where m is a natural number of greater than or equal to 2, N1 is a natural number of greater than or equal to 2, N2 is a natural number of greater than or equal to 1, and N is a number obtained by adding N1 and N2 together;

a modulation symbol convertor to generate modulation symbol group information including N pieces of the modulation symbols by performing pulse amplitude modulation of a combination of bit values of each column of the soft decision error correction frame information generated by the encoder into the modulation symbol for each column of the soft decision error correction frame information by using the first symbol mapping rule or the second symbol mapping rule; and a transmission waveform shaper to generate a digital baseband modulation signal on a basis of the modulation symbol group information generated by the modulation symbol convertor and output the digital baseband modulation signal generated, wherein
the encoder
generates the soft decision error correction frame information by:
generating first input bit array information including a bit array of m−1 rows and N columns and second input bit array information including a bit array of one row and N3 columns on the basis of the input information acquired by the input information acquirer, where N3 is a natural number of greater than or equal to 1 and less than N1;

storing the second input bit array information generated as a part of first most significant bit (MSB) information including a bit array of one row and N1 columns in a predetermined area of a first row in the first bit string group information;

generating shaped bit array information including a bit array of m−1 rows and N columns by performing probability distribution shaping encoding processing on the first input bit array information generated;

generating first group bit array information including a combination of N1 predetermined columns and second group bit array information including a combination of N2 predetermined columns by separating the shaped bit array information generated;

generating first least significant bit (LSB) information including a bit array of one row and N1 columns by extracting, from the first group bit array information generated, a bit array of an (m−1)-th row in the first group bit array information, generating inverted first LSB information including a bit array of one row and N1 columns by calculating exclusive ORs of bit values of each columns in the first LSB information generated and each bit values of each columns in information of the first row in the first bit string group information after storing the second input bit array information, the columns in the information of the first row in the first bit string group information each corresponding to the columns in the first LSB information, and storing the inverted first LSB information generated in an m-th row in the first bit string group information;

generating second LSB information including a bit array of one row and N2 columns by extracting a bit array of the (m−1)-th row in the second group bit array information from the second group bit array information generated, and storing the second LSB information generated in the m-th row in the second bit string group information;

generating a soft decision parity bit by performing systematic soft decision error correction encoding processing by using the inverted first LSB information generated and the second LSB information generated, and storing the soft decision parity bit generated, in the first row in the second bit string group information as second MSB information including a bit array of one row and N2 columns;

in a case where m is greater than or equal to 3, generating first secondary significant bit (SSB) information including a bit array of m−2 rows and N1 columns by extracting, from the first group bit array information generated, the first row to an (m−2)-th row in the first group bit array information, and storing the first SSB information generated, in a second row to the (m−1)-th row in the first bit string group information; and in the case where m is greater than or equal to 3, generating second SSB information including a bit array of m−2 rows and N2 columns by extracting, from the second group bit array information generated, the first row to the (m−2)-th row in the second group bit array information, and storing the second SSB information generated, in the second row to the (m−1)-th row in the second bit string group information:

a D/A converter to receive the digital baseband modulation signal output by the error correction encoding device, convert the digital baseband modulation signal into a transmission electrical signal that is an analog baseband modulation signal, and output the transmission electrical signal after conversion;

a transmission light source to output unmodulated light having a single wavelength; and an optical modulator to receive the transmission electrical signal output by the D/A converter and the unmodulated light output by the transmission light source, modulate the unmodulated light with the transmission electrical signal to generate modulated light, and output the modulated light generated as a modulated optical signal to the optical transmission path, and the reception device includes:

a reception light source to output unmodulated light having a single wavelength corresponding to a center wavelength of the modulated light that is a modulated optical signal output to the optical transmission path by the transmission device;

an optical receiver to receive the modulated optical signal output to the optical transmission path by the transmission device and the unmodulated light output by the reception light source, generate a reception electrical signal that is a reception analog baseband modulation signal by performing coherent detection using the modulated light that is the modulated optical signal and the unmodulated light, and output the reception electrical signal generated;

an A/D converter to receive the reception electrical signal output by the optical receiver, convert the reception electrical signal into a reception digital baseband modulation signal, and output the reception digital baseband modulation signal after conversion; and the error correction device comprising:

a reception modulation symbol group information generator to generate reception modulation symbol group information including N reception modulation symbols on a basis of the reception digital baseband modulation signal;

a hard decision candidate generator to generate first hard decision candidate bit array information including a bit array of one row and N1 columns, second hard decision candidate bit array information including a bit array of m−2 rows and N1 columns in a case where m is greater than or equal to 3, and third hard decision candidate bit array information including a bit array of m−2 rows and N2 columns in the case where m is greater than or equal to 3, by using the reception modulation symbol group information generated by the reception modulation symbol group information generator on a basis of the first symbol mapping rule or the second symbol mapping rule;

a soft decision information generator to generate a first posterior L value sequence including N2 posterior L values corresponding to each columns of a first row of the second bit string group information, a second posterior L value sequence including N1 posterior L values corresponding to each columns of the m-th row of the first bit string group information, and a third posterior L value sequence including N2 posterior L values corresponding to each columns of the m-th row of the second bit string group information on a basis of the reception modulation symbol group information generated by the reception modulation symbol group information generator;

a decoder to perform multi-stage error correction processing on a basis of the first hard decision candidate bit array information, the second hard decision candidate bit array information, and the third hard decision candidate bit array information generated by the hard decision candidate generator, and the first posterior L value sequence, the second posterior L value sequence, and the third posterior L value sequence generated by the soft decision information generator; and an information outputter to output information generated by the decoder performing the multi-stage error correction processing as output information, wherein in first decoding processing in the multi-stage error correction processing, the decoder generates inverted first reception LSB information including a bit array of one row and N1 columns corresponding to the inverted first LSB information and second reception LSB information including a bit array of one row and N2 columns corresponding to the second LSB information by performing soft decision error correction processing on the basis of the first posterior L value sequence, the second posterior L value sequence, and the third posterior L value sequence, in second decoding processing in the multi-stage error correction processing, the decoder generates first reception MSB information including a bit array of one row and N1 columns corresponding to the first MSB information on a basis of the first hard decision candidate bit array information and the inverted first reception LSB information, generates first reception SSB information including a bit array of m−2 rows and N1 columns corresponding to the first SSB information on a basis of the second hard decision candidate bit array information and the inverted first reception LSB information in the case where m is greater than or equal to 3, and generates second reception SSB information including a bit array of m−2 rows and N2 columns corresponding to the second SSB information on a basis of the third hard decision candidate bit array information and the second reception LSB information in the case where m is greater than or equal to 3, in third decoding processing in the multi-stage error correction processing, the decoder generates first reception LSB information corresponding to the first LSB information by calculating exclusive ORs of bit values of each columns in the inverted first reception LSB information and each bit values of each columns in the first reception MSB information each corresponding to the columns in the inverted first reception LSB information, in fourth decoding processing in the multi-stage error correction processing, the decoder generates first output bit array information including a bit array of m−1 rows and N columns corresponding to the first input bit array information by performing probability distribution shaping decoding processing on the first reception SSB information, the second reception SSB information, the first reception LSB information, and the second reception LSB information, in fifth decoding processing in the multi-stage error correction processing, the decoder generates second output bit array information including a bit array of one row and N3 columns corresponding to the second input bit array information by extracting information of a predetermined area of the first reception MSB information, in sixth decoding processing in the multi-stage error correction processing, the decoder generates the output information corresponding to the input information on a basis of the first output bit array information and the second output bit array information, and the information outputter outputs the output information generated by the decoder.

16. A soft decision error correction frame data structure used in a communication system in which a transmission device transmits a signal based on input information input to the transmission device to a reception device, and the reception device receives the signal transmitted by the transmission device and generates output information corresponding to the input information on a basis of the signal, the soft decision error correction frame data structure comprising:

a bit array of m rows and N columns obtained by combining first bit string group information and second bit string group information, the first bit string group information including a bit array of m rows and N1 columns in which it is enabled to perform pulse amplitude modulation of a combination of bit values of each column of the first bit string group information into a modulation symbol on a basis of a predetermined first symbol mapping rule, the second bit string group information including a bit array of m rows and N2 columns in which it is enabled to perform pulse amplitude modulation of a combination of bit values of each column of the second bit string group information into a modulation symbol on a basis of a predetermined second symbol mapping rule, where m is a natural number of greater than or equal to 2, N1 is a natural number of greater than or equal to 2, N2 is a natural number of greater than or equal to 1, and N is a number obtained by adding N1 and N2 together, wherein a soft decision parity bit is stored in a first row in the second bit string group information, the soft decision parity bit being generated by performing systematic soft decision error correction encoding processing using a bit value of each column of an m-th row in the first bit string group information and a bit value of each column of the m-th row in the second bit string group information the soft decision error correction frame data structure to enable generation of reception modulation symbol group information including N reception modulation symbols on a basis of a reception digital baseband modulation signal generated from a signal based on soft decision error correction frame information having the soft decision error correction frame data structure, generation of first hard decision candidate bit array information including a bit array of one row and N1 columns, second hard decision candidate bit array information including a bit array of m−2 rows and N1 columns in a case where m is greater than or equal to 3, and third hard decision candidate bit array information including a bit array of m−2 rows and N2 columns in the case where m is greater than or equal to 3, by using the first symbol mapping rule or the second symbol mapping rule on a basis of the reception modulation symbol group information generated, generation of a first posterior L value sequence including N2 posterior L values corresponding to each columns of the first row of the second bit string group information, a second posterior L value sequence including N1 posterior L values corresponding to each columns of the m-th row of the first bit string group information, and a third posterior L value sequence including N2 posterior L values corresponding to each columns of the m-th row of the second bit string group information on the basis of the reception modulation symbol group information generated, and error correction by performing multi-stage error correction processing on a basis of the first hard decision candidate bit array information, the second hard decision candidate bit array information, the third hard decision candidate bit array information, the first posterior L value sequence, the second posterior L value sequence, and the third posterior L value sequence generated, wherein it is enabled to generate inverted first reception least significant bit (LSB) information including a bit array of one row and N1 columns and second reception LSB information including a bit array of one row and N2 columns by performing soft decision error correction processing on a basis of the first posterior L value sequence, the second posterior L value sequence, and the third posterior L value sequence, in first decoding processing in the multi-stage error correction processing, generate first reception most significant bit (MSB) information including a bit array of one row and N1 columns on a basis of the first hard decision candidate bit array information and the inverted first reception LSB information, generate first reception secondary significant bit (SSB) information including a bit array of m−2 rows and N1 columns on a basis of the second hard decision candidate bit array information and the inverted first reception LSB information in the case where m is greater than or equal to 3, and generate second reception SSB information including a bit array of m−2 rows and N2 columns on a basis of the third hard decision candidate bit array information and the second reception LSB information in the case where m is greater than or equal to 3, in second decoding processing in the multi-stage error correction processing, generate first reception LSB information by calculating exclusive ORs of bit values of each columns in the inverted first reception LSB information and each bit values of each columns in the first reception MSB information each corresponding to the columns in the inverted first reception LSB information, in third decoding processing in the multi-stage error correction processing, generate first output bit array information including a bit array of m−1 rows and N columns by performing probability distribution shaping decoding processing on the first reception SSB information, the second reception SSB information, the first reception LSB information, and the second reception LSB information, in fourth decoding processing in the multi-stage error correction processing, generate second output bit array information including a bit array of one row and N3 columns by extracting information of a predetermined area of the first reception MSB information, in fifth decoding processing in the multi-stage error correction processing, and generate the output information corresponding to the input information on a basis of the first output bit array information and the second output bit array information, in sixth decoding processing in the multi-stage error correction processing.

\* \* \* \* \*